US012113548B2

(12) United States Patent
Trofimiuk et al.

(10) Patent No.: US 12,113,548 B2
(45) Date of Patent: Oct. 8, 2024

(54) METHOD AND APPARATUS FOR ENCODING POLAR CODE, AND METHOD AND APPARATUS FOR DECODING POLAR CODE

(71) Applicant: HUAWEI TECHNOLOGIES CO., LTD., Shenzhen (CN)

(72) Inventors: Grigorii Trofimiuk, Boxitogorsk (RU); Ludmila Karakchieva, Saint Petersburg (RU); Peter Trifonov, Saint Petersburg (RU); Jiaqi Gu, Shenzhen (CN); Bin Li, Shenzhen (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 18/183,272

(22) Filed: Mar. 14, 2023

(65) Prior Publication Data

US 2023/0223956 A1 Jul. 13, 2023

Related U.S. Application Data

(63) Continuation of application No. PCT/CN2021/115206, filed on Aug. 30, 2021.

(30) Foreign Application Priority Data

Sep. 17, 2020 (RU) ........................... RU2020130551

(51) Int. Cl.
*H03M 13/13* (2006.01)
*H04L 1/00* (2006.01)

(52) U.S. Cl.
CPC .......... *H03M 13/13* (2013.01); *H04L 1/0057* (2013.01); *H04L 1/0072* (2013.01)

(58) Field of Classification Search
None
See application file for complete search history.

(56) References Cited

U.S. PATENT DOCUMENTS

2020/0127680 A1 4/2020 Kim
2022/0329786 A1* 10/2022 Huo .................... H04N 19/593

FOREIGN PATENT DOCUMENTS

CA 3113988 A1 * 3/2020 ........... H04N 19/119
CN 110868226 A * 3/2020 ........... H03M 13/13
(Continued)

OTHER PUBLICATIONS

Trifonov Peter: "Trellis-based Decoding Techniques for Polar Codeswith Large Kernels",2019 IEEE Information Theory Workshop (ITW), IEEE, Aug. 25, 2019 (Aug. 25, 2019), pp. 1-5, XP033709299.
(Continued)

*Primary Examiner* — Guerrier Merant
(74) *Attorney, Agent, or Firm* — HAUPTMAN HAM, LLP

(57) ABSTRACT

A method and an apparatus for encoding and for decoding a polar code to reduce complexity and improve speed. For encoding, information bits are obtained, an original kernel matrix is adjusted to construct one or more kernel matrices, an appropriate target kernel matrix is selected from the one or more kernel matrices, and polar encoding is performed on the information bits based on the target kernel matrix. For decoding, a to-be-decoded sequence is obtained, and the to-be-decoded sequence is decoded based on a plurality of trellises, where intermediate results obtained in different decoding stages may be reused. For example, in a $(t+i)^{th}$ stage of decoding, an intermediate result obtained in a $t^{th}$ stage of decoding is reused.

10 Claims, 35 Drawing Sheets

(56) References Cited

FOREIGN PATENT DOCUMENTS

| | | | | | |
|---|---|---|---|---|---|
| CN | 110868226 B | * | 9/2021 | ............ | H03M 13/13 |
| JP | 2022513203 A | * | 2/2022 | | |

OTHER PUBLICATIONS

V. Miloslavskaya and P. Trifonov, Sequential decoding of polar codes with arbitrary binary kernel, In Proceedings of IEEE Information Theory Workshop, pp. 377 381, Hobart, Australia, 2014. IEEE.

Valerio Bioglio et al: "Multi-Kernel Polar Codes: Concept and DesignPrinciples",arxiv.org, Cornell University Library, 201 Olin LibraryCornell University Ithaca, NY 14853, Jan. 14, 2020 (Jan. 14, 2020), XP081578300.

G. Trofimiuk and P. Trifonov, Reduced complexity window processing of binary polarization kernels. In Proceedings of IEEE International Symposium on Information Theory, Paris, France, Jul. 2019.

Juntan Zhang and Marc P.C. Fossorier. Shuffled iterative decoding. IEEE Transactions on Communications, 53(2), Feb. 2005.

Z. Huang, S. Zhang, F. Zhang, C. Duanmu, F. Zhong, and M. Chen. Simplified successive cancellation decoding of polar codes with medium-dimensional binary kernels. IEEE Access, 6:26707-26717, 2018.

Valerio Bioglio and Ingmar Land. On the marginalization of polarizing kernels. In Proceedings of International Symposium on Turbo Codes and Iterative Information Processing, 2018.

Satish Babu Korada, Polar Codes: Characterization of Exponent, Bounds, and Constructions, Jan. 2009, 10 pages.

Noam Presman, Binary Polarization Kernels from Code Decompositions, Mar. 2015, 22 pages.

Extended European Search Report issued in corresponding European Application No. 21868427.2, dated Jan. 19, 2024, pp. 1-12.

* cited by examiner $$K_{16} = \begin{pmatrix}
1&0&0&0&0&0&0&0&0&0&0&0&0&0&0&0\\
1&1&0&0&0&0&0&0&0&0&0&0&0&0&0&0\\
1&0&1&0&0&0&0&0&0&0&0&0&0&0&0&0\\
1&0&0&0&1&0&0&0&0&0&0&0&0&0&0&0\\
1&0&0&0&0&0&0&0&1&0&0&0&0&0&0&0\\
1&1&0&0&0&0&0&0&1&1&0&0&0&0&0&0\\
1&1&0&0&1&1&0&0&0&0&0&0&0&0&0&0\\
1&1&1&1&0&0&0&0&0&0&0&0&0&0&0&0\\
1&0&0&0&1&0&0&0&1&0&0&0&1&0&0&0\\
1&0&1&0&0&1&1&0&1&1&0&0&0&0&0&0\\
0&1&1&0&1&1&0&0&1&0&1&0&0&0&0&0\\
1&1&1&1&1&1&1&1&0&0&0&0&0&0&0&0\\
1&1&1&1&0&0&0&0&1&1&1&1&0&0&0&0\\
1&1&0&0&1&1&0&0&1&1&0&0&1&1&0&0\\
1&0&1&0&1&0&1&0&1&0&1&0&1&0&1&0\\
1&1&1&1&1&1&1&1&1&1&1&1&1&1&1&1
\end{pmatrix}$$

FIG. 7

$$K'_{16} = \begin{pmatrix}
1&0&0&0&0&0&0&0&0&0&0&0&0&0&0&0\\
1&1&0&0&0&0&0&0&0&0&0&0&0&0&0&0\\
1&0&1&0&0&0&0&0&0&0&0&0&0&0&0&0\\
1&1&1&1&0&0&0&0&0&0&0&0&0&0&0&0\\
1&0&0&0&1&0&0&0&0&0&0&0&0&0&0&0\\
1&0&0&0&0&0&0&0&1&0&0&0&0&0&0&0\\
1&1&0&0&0&0&0&0&1&1&0&0&0&0&0&0\\
1&1&0&0&1&1&0&0&0&0&0&0&0&0&0&0\\
1&0&1&0&0&1&1&0&1&1&0&0&0&0&0&0\\
0&1&1&0&1&1&0&0&1&0&1&0&0&0&0&0\\
1&1&1&1&1&1&1&1&0&0&0&0&0&0&0&0\\
1&1&1&1&0&0&0&0&1&1&1&1&0&0&0&0\\
1&0&0&0&1&0&0&0&1&0&0&0&1&0&0&0\\
1&1&0&0&1&1&0&0&1&1&0&0&1&1&0&0\\
1&0&1&0&1&0&1&0&1&0&1&0&1&0&1&0\\
1&1&1&1&1&1&1&1&1&1&1&1&1&1&1&1
\end{pmatrix}$$

FIG. 8

$$K_{32} = \begin{pmatrix}
1&0&0&0&0&0&0&0&0&0&0&0&0&0&0&0&0&0&0&0&0&0&0&0&0&0&0&0&0&0&0&0\\
1&0&0&0&0&0&0&0&0&0&0&0&0&0&0&0&1&0&0&0&0&0&0&0&0&0&0&0&0&0&0&0\\
1&0&0&0&0&0&0&0&1&0&0&0&0&0&0&0&0&0&0&0&0&0&0&0&0&0&0&0&0&0&0&0\\
1&0&0&0&0&0&0&0&1&0&0&0&0&0&0&0&1&0&0&0&0&0&0&0&1&0&0&0&0&0&0&0\\
1&0&0&0&1&0&0&0&0&0&0&0&0&0&0&0&0&0&0&0&0&0&0&0&0&0&0&0&0&0&0&0\\
1&0&0&0&1&0&0&0&0&0&0&0&0&0&0&0&1&0&0&0&1&0&0&0&0&0&0&0&0&0&0&0\\
1&0&1&0&0&0&0&0&0&0&0&0&0&0&0&0&0&0&0&0&0&0&0&0&0&0&0&0&0&0&0&0\\
1&0&1&0&0&0&0&0&0&0&0&0&0&0&0&0&1&0&1&0&0&0&0&0&0&0&0&0&0&0&0&0\\
0&0&1&0&1&0&0&0&1&0&0&0&1&0&0&0&1&0&1&0&0&0&0&0&0&0&0&0&0&0&0&0\\
1&0&0&0&1&0&0&0&1&0&0&0&1&0&0&0&1&0&0&0&1&0&0&0&1&0&0&0&1&0&0&0\\
1&1&0&0&0&0&0&0&0&0&0&0&0&0&0&0&0&0&0&0&0&0&0&0&0&0&0&0&0&0&0&0\\
1&1&0&0&0&0&0&0&0&0&0&0&0&0&0&0&1&1&0&0&0&0&0&0&0&0&0&0&0&0&0&0\\
0&1&1&0&0&0&0&0&1&0&1&0&0&0&0&0&1&1&0&0&0&0&0&0&0&0&0&0&0&0&0&0\\
1&0&1&0&0&0&0&0&1&0&1&0&0&0&0&0&1&0&1&0&0&0&0&0&1&0&1&0&0&0&0&0\\
1&0&1&0&1&0&1&0&0&0&0&0&0&0&0&0&0&0&0&0&0&0&0&0&0&0&0&0&0&0&0&0\\
0&1&1&0&1&0&1&0&1&1&0&0&0&0&0&0&0&0&0&0&0&0&0&0&0&0&0&0&0&0&0&0\\
1&1&0&0&0&0&0&0&1&1&0&0&0&0&0&0&1&1&0&0&0&0&0&0&1&1&0&0&0&0&0&0\\
0&1&1&0&1&0&1&0&1&1&0&0&0&0&0&0&0&1&1&0&1&0&1&0&1&1&0&0&0&0&0&0\\
1&1&0&0&1&1&0&0&0&0&0&0&0&0&0&0&0&0&0&0&0&0&0&0&0&0&0&0&0&0&0&0\\
1&1&0&0&1&1&0&0&0&0&0&0&0&0&0&0&1&1&0&0&1&1&0&0&0&0&0&0&0&0&0&0\\
0&1&1&0&0&1&1&0&1&0&1&0&1&0&1&0&1&1&0&0&1&1&0&0&0&0&0&0&0&0&0&0\\
1&0&1&0&1&0&1&0&1&0&1&0&1&0&1&0&1&0&1&0&1&0&1&0&1&0&1&0&1&0&1&0\\
1&1&1&1&0&0&0&0&0&0&0&0&0&0&0&0&0&0&0&0&0&0&0&0&0&0&0&0&0&0&0&0\\
1&1&1&1&0&0&0&0&0&0&0&0&0&0&0&0&1&1&1&1&0&0&0&0&0&0&0&0&0&0&0&0\\
0&0&1&1&1&1&0&0&1&1&0&0&1&1&0&0&1&1&1&1&0&0&0&0&0&0&0&0&0&0&0&0\\
1&1&0&0&1&1&0&0&1&1&0&0&1&1&0&0&1&1&0&0&1&1&0&0&1&1&0&0&1&1&0&0\\
1&1&1&1&0&0&0&0&1&1&1&1&0&0&0&0&0&0&0&0&0&0&0&0&0&0&0&0&0&0&0&0\\
1&1&1&1&0&0&0&0&1&1&1&1&0&0&0&0&1&1&1&1&0&0&0&0&1&1&1&1&0&0&0&0\\
1&1&1&1&1&1&1&1&0&0&0&0&0&0&0&0&0&0&0&0&0&0&0&0&0&0&0&0&0&0&0&0\\
1&1&1&1&1&1&1&1&0&0&0&0&0&0&0&0&1&1&1&1&1&1&1&1&0&0&0&0&0&0&0&0\\
1&1&1&1&1&1&1&1&1&1&1&1&1&1&1&1&0&0&0&0&0&0&0&0&0&0&0&0&0&0&0&0\\
1&1&1&1&1&1&1&1&1&1&1&1&1&1&1&1&1&1&1&1&1&1&1&1&1&1&1&1&1&1&1&1
\end{pmatrix}$$

$$K'_{32} = \begin{pmatrix}
1&0&0&0&0&0&0&0&0&0&0&0&0&0&0&0&0&0&0&0&0&0&0&0&0&0&0&0&0&0&0&0\\
1&1&0&0&0&0&0&0&0&0&0&0&0&0&0&0&0&0&0&0&0&0&0&0&0&0&0&0&0&0&0&0\\
1&0&1&0&0&0&0&0&0&0&0&0&0&0&0&0&0&0&0&0&0&0&0&0&0&0&0&0&0&0&0&0\\
1&0&0&0&1&0&0&0&0&0&0&0&0&0&0&0&0&0&0&0&0&0&0&0&0&0&0&0&0&0&0&0\\
1&0&0&0&0&0&0&0&1&0&0&0&0&0&0&0&0&0&0&0&0&0&0&0&0&0&0&0&0&0&0&0\\
1&1&0&0&0&0&0&0&1&1&0&0&0&0&0&0&0&0&0&0&0&0&0&0&0&0&0&0&0&0&0&0\\
1&1&1&1&0&0&0&0&0&0&0&0&0&0&0&0&0&0&0&0&0&0&0&0&0&0&0&0&0&0&0&0\\
1&1&0&0&1&1&0&0&0&0&0&0&0&0&0&0&0&0&0&0&0&0&0&0&0&0&0&0&0&0&0&0\\
0&1&1&0&1&0&1&0&1&1&0&0&0&0&0&0&0&0&0&0&0&0&0&0&0&0&0&0&0&0&0&0\\
1&0&0&0&0&0&0&0&0&0&0&0&0&0&0&0&1&0&0&0&0&0&0&0&0&0&0&0&0&0&0&0\\
1&1&0&0&0&0&0&0&0&0&0&0&0&0&0&0&1&1&0&0&0&0&0&0&0&0&0&0&0&0&0&0\\
1&0&0&0&1&0&0&0&1&0&0&0&1&0&0&0&0&0&0&0&0&0&0&0&0&0&0&0&0&0&0&0\\
0&1&1&0&0&0&0&0&1&0&1&0&0&0&0&0&1&1&0&0&0&0&0&0&0&0&0&0&0&0&0&0\\
0&0&1&0&1&0&0&0&1&0&0&0&1&0&0&0&1&0&1&0&0&0&0&0&0&0&0&0&0&0&0&0\\
1&1&1&1&0&0&0&0&0&0&0&0&0&0&0&0&1&1&1&1&0&0&0&0&0&0&0&0&0&0&0&0\\
1&0&0&0&1&0&0&0&0&0&0&0&0&0&0&0&1&0&0&0&1&0&0&0&0&0&0&0&0&0&0&0\\
1&1&0&0&1&1&0&0&0&0&0&0&0&0&0&0&1&1&0&0&1&1&0&0&0&0&0&0&0&0&0&0\\
1&0&0&0&0&0&0&0&1&0&0&0&0&0&0&0&1&0&0&0&0&0&0&0&1&0&0&0&0&0&0&0\\
1&1&0&0&0&0&0&0&1&1&0&0&0&0&0&0&1&1&0&0&0&0&0&0&1&1&0&0&0&0&0&0\\
1&0&1&0&0&0&0&0&1&0&1&0&0&0&0&0&1&0&1&0&0&0&0&0&1&0&1&0&0&0&0&0\\
1&0&0&0&1&0&0&0&1&0&0&0&1&0&0&0&1&0&0&0&1&0&0&0&1&0&0&0&1&0&0&0\\
0&1&0&0&1&0&0&0&1&0&1&1&1&0&0&0&1&0&1&1&1&0&0&0&0&1&0&0&1&0&0&0\\
1&0&1&0&1&1&1&1&1&0&1&0&0&0&0&0&0&1&0&1&0&0&0&0&1&0&1&0&0&0&0&0\\
0&1&1&0&1&0&1&0&1&1&0&0&0&0&0&0&0&1&1&0&1&0&1&0&1&1&0&0&0&0&0&0\\
0&1&1&0&0&1&1&0&1&0&1&0&1&0&1&0&1&1&0&0&1&1&0&0&0&0&0&0&0&0&0&0\\
0&0&1&1&1&1&0&0&1&1&0&0&1&1&0&0&1&1&1&1&0&0&0&0&0&0&0&0&0&0&0&0\\
1&1&1&1&1&1&1&1&1&1&1&1&1&1&1&1&0&0&0&0&0&0&0&0&0&0&0&0&0&0&0&0\\
1&1&1&1&1&1&1&1&0&0&0&0&0&0&0&0&1&1&1&1&1&1&1&1&0&0&0&0&0&0&0&0\\
1&1&1&1&0&0&0&0&1&1&1&1&0&0&0&0&1&1&1&1&0&0&0&0&1&1&1&1&0&0&0&0\\
1&1&0&0&1&1&0&0&1&1&0&0&1&1&0&0&1&1&0&0&1&1&0&0&1&1&0&0&1&1&0&0\\
1&0&1&0&1&0&1&0&1&0&1&0&1&0&1&0&1&0&1&0&1&0&1&0&1&0&1&0&1&0&1&0\\
1&1&1&1&1&1&1&1&1&1&1&1&1&1&1&1&1&1&1&1&1&1&1&1&1&1&1&1&1&1&1&1
\end{pmatrix}$$

FIG. 11

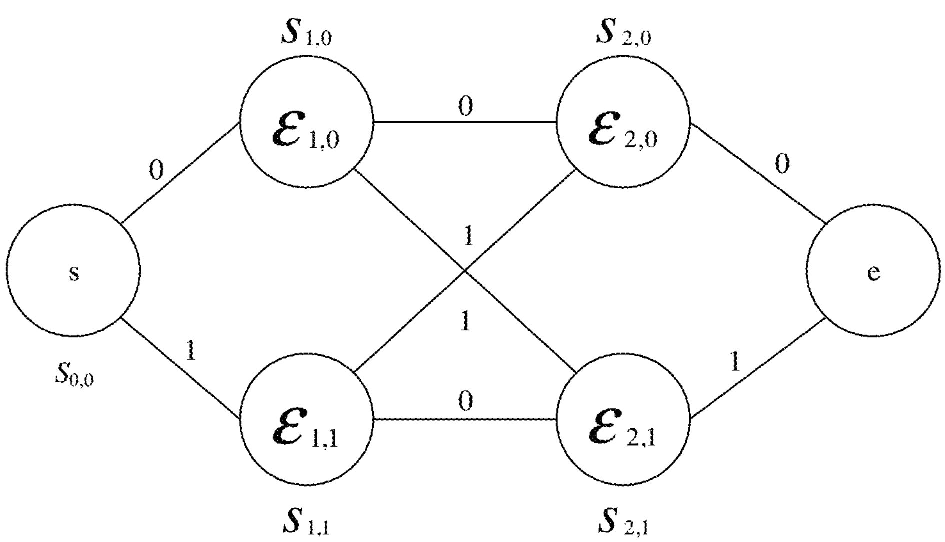

FIG. 12

$$
K_{20} = \begin{pmatrix}
1&0&0&0&0&0&0&0&0&0&0&0&0&0&0&0&0&0&0&0\\
1&0&0&0&0&0&0&0&0&0&0&0&1&0&0&0&0&0&0&0\\
1&0&0&0&0&0&0&0&1&0&0&0&0&0&0&0&0&0&0&0\\
1&0&0&0&0&0&0&0&1&0&0&0&1&0&0&0&1&0&0&0\\
1&0&1&0&0&0&0&0&0&0&0&0&0&0&0&0&0&0&0&0\\
1&0&0&0&1&0&0&0&0&0&0&0&0&0&0&0&0&0&0&0\\
1&0&0&0&1&0&0&0&1&0&1&0&0&0&0&0&0&0&0&0\\
1&0&1&0&0&0&0&0&1&0&1&0&1&0&1&0&0&0&0&0\\
1&1&0&0&0&0&0&0&0&0&0&0&0&0&0&0&0&0&0&0\\
1&1&0&0&0&0&0&0&1&1&0&0&0&0&0&0&0&0&0&0\\
1&0&1&0&1&0&1&0&0&0&0&0&0&0&0&0&0&0&0&0\\
1&0&1&0&1&0&1&0&1&1&0&0&1&1&0&0&0&0&0&0\\
1&1&0&0&0&0&0&0&1&1&0&0&1&0&1&0&1&0&1&0\\
1&1&0&0&1&1&0&0&0&0&0&0&0&0&0&0&0&0&0&0\\
1&1&1&1&0&0&0&0&0&0&0&0&0&0&0&0&0&0&0&0\\
1&1&1&1&0&0&0&0&0&0&0&0&1&1&0&0&1&1&0&0\\
1&1&0&0&1&1&0&0&1&1&1&1&0&0&0&0&0&0&0&0\\
1&1&1&1&0&0&0&0&1&1&1&1&1&1&1&1&0&0&0&0\\
1&1&1&1&1&1&1&1&0&0&0&0&0&0&0&0&0&0&0&0\\
1&1&1&1&1&1&1&1&0&0&0&0&1&1&1&1&1&1&1&1
\end{pmatrix}
$$

FIG. 19

$$
K_{20} = \begin{pmatrix}
1&0&0&0&0&0&0&0&0&0&0&0&0&0&0&0&0&0&0&0\\
1&0&0&0&0&0&0&0&0&0&0&0&1&0&0&0&0&0&0&0\\
1&0&0&0&0&0&0&0&1&0&0&0&0&0&0&0&0&0&0&0\\
1&0&0&0&0&0&0&0&1&0&0&0&1&0&0&0&1&0&0&0\\
1&0&1&0&0&0&0&0&0&0&0&0&0&0&0&0&0&0&0&0\\
1&0&0&0&1&0&0&0&0&0&0&0&0&0&0&0&0&0&0&0\\
1&0&0&0&1&0&0&0&1&0&1&0&0&0&0&0&0&0&0&0\\
1&0&1&0&0&0&0&0&1&0&1&0&1&0&1&0&0&0&0&0\\
1&1&0&0&0&0&0&0&0&0&0&0&0&0&0&0&0&0&0&0\\
1&1&0&0&0&0&0&0&1&1&0&0&0&0&0&0&0&0&0&0\\
1&0&1&0&1&0&1&0&0&0&0&0&0&0&0&0&0&0&0&0\\
1&0&1&0&1&0&1&0&1&1&0&0&1&1&0&0&0&0&0&0\\
1&1&0&0&0&0&0&0&1&1&0&0&1&0&1&0&1&0&1&0\\
1&1&0&0&1&1&0&0&0&0&0&0&0&0&0&0&0&0&0&0\\
1&1&1&1&0&0&0&0&0&0&0&0&0&0&0&0&0&0&0&0\\
1&1&1&1&0&0&0&0&0&0&0&0&1&1&0&0&1&1&0&0\\
1&1&0&0&1&1&0&0&1&1&1&1&0&0&0&0&0&0&0&0\\
1&1&1&1&0&0&0&0&1&1&1&1&1&1&1&1&0&0&0&0\\
1&1&1&1&1&1&1&1&0&0&0&0&0&0&0&0&0&0&0&0\\
1&1&1&1&1&1&1&1&0&0&0&0&1&1&1&1&1&1&1&1
\end{pmatrix}
$$

$$K'_{20} = \begin{pmatrix}
1&0&0&0&0&0&0&0&0&0&0&0&0&0&0&0&0&0&0&0\\
1&0&0&0&0&0&0&0&0&0&0&0&1&0&0&0&0&0&0&0\\
1&0&0&0&0&0&0&0&1&0&0&0&0&0&0&0&0&0&0&0\\
1&0&0&0&1&0&0&0&0&0&0&0&0&0&0&0&0&0&0&0\\
1&0&1&0&0&0&0&0&0&0&0&0&0&0&0&0&0&0&0&0\\
1&0&0&0&1&0&0&0&1&0&1&0&0&0&0&0&0&0&0&0\\
1&1&0&0&0&0&0&0&0&0&0&0&0&0&0&0&0&0&0&0\\
0&1&1&0&1&0&1&0&0&0&0&0&0&0&0&0&0&0&0&0\\
1&1&1&1&0&0&0&0&0&0&0&0&0&0&0&0&0&0&0&0\\
0&1&0&1&1&0&0&0&1&0&0&0&1&0&0&0&1&0&0&0\\
1&0&1&0&1&1&0&0&0&0&0&0&0&0&0&0&0&0&0&0\\
0&0&0&0&1&1&0&0&1&0&1&0&1&0&1&0&0&0&0&0\\
1&0&1&0&1&1&0&0&0&0&0&0&1&0&1&0&1&0&1&0\\
0&1&1&0&1&1&0&0&1&0&1&0&0&0&0&0&1&1&0&0\\
1&0&1&0&1&0&1&0&1&1&0&0&0&0&0&0&0&0&0&0\\
0&0&1&1&1&1&0&0&1&1&0&0&1&1&0&0&0&0&0&0\\
1&1&0&0&1&1&0&0&1&1&0&0&1&1&0&0&1&1&1&1\\
1&1&1&1&0&0&0&0&1&1&1&1&0&0&0&0&0&0&0&0\\
1&1&1&1&1&1&1&1&0&0&0&0&0&0&0&0&0&0&0&0\\
1&1&1&1&1&1&1&1&1&1&1&1&1&1&1&1&0&0&0&0
\end{pmatrix}$$

$$K''_{20} = \begin{pmatrix}
1&0&0&0&0&0&0&0&0&0&0&0&0&0&0&0&0&0&0&0\\
1&0&0&0&0&0&1&0&0&0&0&0&0&0&0&0&0&0&0&0\\
1&0&0&0&0&1&0&0&0&0&0&0&0&0&0&0&0&0&0&0\\
1&0&0&1&0&0&0&0&0&0&0&0&0&0&0&0&0&0&0&0\\
1&0&1&0&0&0&0&0&0&0&0&0&0&0&0&0&0&0&0&0\\
1&1&0&0&0&0&0&0&0&0&0&0&0&0&0&0&0&0&0&0\\
1&0&0&1&0&1&0&0&0&0&0&0&1&0&0&0&0&0&0&0\\
1&1&0&0&0&1&0&0&0&0&0&0&0&0&0&0&1&0&0&0\\
0&0&0&1&0&1&1&1&0&0&0&0&0&0&0&0&0&0&0&0\\
1&1&1&0&1&0&0&0&0&0&0&0&0&0&0&0&0&0&0&0\\
1&0&1&1&1&0&0&1&0&0&1&0&0&0&0&0&0&0&0&0\\
1&1&0&1&1&0&1&0&1&0&0&0&0&0&0&0&0&0&0&0\\
1&0&1&1&0&1&0&0&1&0&0&0&1&0&0&0&1&0&1&0\\
0&1&1&0&1&1&0&0&1&0&1&0&0&0&0&0&1&1&0&0\\
1&0&1&0&1&0&1&0&1&0&1&0&1&0&1&0&0&0&0&0\\
0&0&1&1&1&1&1&1&1&1&0&0&0&0&0&0&0&0&0&0\\
1&1&0&0&1&1&0&0&1&1&0&0&1&1&0&0&0&0&0&0\\
1&1&1&1&0&0&0&0&1&1&1&1&0&0&0&0&0&0&0&0\\
1&1&1&1&1&1&1&1&0&0&0&0&0&0&0&0&1&1&1&1\\
1&1&1&1&1&1&1&1&1&1&1&1&1&1&1&1&0&0&0&0
\end{pmatrix}$$

$$
\begin{pmatrix}
1&0&0&0&0&0&0&0&0&0&0&0&0&0&0&0&0&0&0&0&0\\
1&0&0&0&0&0&0&0&1&0&0&0&0&0&0&0&0&0&0&0&0\\
1&0&1&0&0&0&0&0&0&0&0&0&0&0&0&0&0&0&0&0&0\\
1&1&0&0&0&0&0&0&0&0&0&0&0&0&0&0&0&0&0&0&0\\
1&0&0&0&0&1&0&0&0&0&0&0&0&0&0&0&0&0&0&0&0\\
0&1&0&1&0&0&0&0&0&0&0&0&0&0&0&0&0&0&0&0&0\\
1&1&1&0&1&0&0&0&0&0&0&0&0&0&0&0&0&0&0&0&0\\
0&0&1&1&1&0&1&0&0&0&0&0&0&0&0&0&0&0&0&0&0\\
0&1&0&0&1&0&0&1&0&1&0&0&0&0&0&0&0&0&0&0&0\\
0&0&0&1&0&1&1&1&0&0&0&0&0&0&0&0&0&0&0&0&0\\
1&0&1&0&1&0&1&0&0&0&1&0&0&0&1&0&0&0&0&0&0\\
1&1&1&0&0&0&0&0&1&1&0&0&0&1&0&0&0&0&0&0&0\\
1&0&1&1&0&0&1&1&0&0&0&1&0&0&0&0&0&0&0&0&0\\
1&0&0&1&0&0&0&0&1&1&0&1&1&0&0&0&0&0&0&0&0\\
1&0&1&0&0&0&1&0&1&0&1&1&1&0&0&0&1&0&0&0&0\\
1&0&1&0&1&0&0&1&0&1&0&1&0&1&0&1&0&0&0&0&0\\
1&1&0&1&0&1&0&1&1&1&1&0&0&0&0&0&0&0&0&0&0\\
1&1&1&0&0&1&1&0&0&1&1&0&0&1&1&0&0&0&0&1&0\\
1&1&1&1&1&0&0&0&0&1&1&1&1&0&0&0&0&0&1&0&0\\
1&1&1&1&1&1&1&1&1&0&0&0&0&0&0&0&0&0&1&1&1\\
1&1&1&1&1&1&1&1&1&1&1&1&1&1&1&1&1&1&0&0&0
\end{pmatrix}
$$

$$\begin{pmatrix} 1&0&0&0&0&0&0&0&0&0&0&0&0&0&0&0&0&0&0&0&0 \\ 1&0&0&0&0&1&0&0&0&0&0&0&0&0&0&0&0&0&0&0&0 \\ 1&0&0&1&0&0&0&0&0&0&0&0&0&0&0&0&0&0&0&0&0 \\ 1&0&0&0&1&0&0&0&0&0&0&0&0&0&0&0&0&0&0&0&0 \\ 1&0&1&0&0&0&0&0&0&0&0&0&0&0&0&0&0&0&0&0&0 \\ 1&1&0&0&0&0&0&0&0&0&0&0&0&0&0&0&0&0&0&0&0 \\ 1&0&0&1&1&0&0&1&0&0&0&0&0&0&0&0&0&0&0&0&0 \\ 0&0&1&1&1&0&0&0&1&0&0&0&0&0&0&0&0&0&0&0&0 \\ 0&0&1&0&0&1&1&1&0&0&0&0&0&0&0&0&0&0&0&0&0 \\ 0&1&1&0&1&0&1&1&0&0&0&0&0&0&1&0&0&0&0&0&0 \\ 1&0&0&0&0&0&0&0&1&1&1&0&0&0&0&0&0&0&0&0&0 \\ 0&1&1&1&0&1&1&0&0&0&0&0&1&0&0&0&0&0&0&0&0 \\ 0&1&0&0&0&1&1&1&0&1&0&0&0&1&0&0&0&0&0&0&0 \\ 1&0&1&1&0&1&0&1&0&0&1&0&0&0&0&0&0&0&0&0&0 \\ 1&1&0&0&1&1&0&0&1&0&0&0&1&0&1&0&1&0&0&0&0 \\ 1&0&1&1&0&1&0&0&1&0&1&0&1&1&0&0&1&0&1&0&0 \\ 0&0&0&0&0&1&1&0&1&1&0&0&1&1&1&1&0&0&0&0&0 \\ 1&1&0&0&0&1&1&0&1&1&1&1&0&0&0&0&0&0&0&0&0 \\ 1&1&1&1&1&0&0&0&1&1&0&0&0&0&0&0&0&0&0&0&1 \\ 1&1&1&1&1&1&1&1&0&0&0&0&0&0&0&0&0&0&1&1&0 \\ 1&1&1&1&1&1&1&1&1&1&1&1&1&1&1&1&1&1&0&0&0 \end{pmatrix}$$

FIG. 24

$$K_{24} = \begin{pmatrix}
1&0&0&0&0&0&0&0&0&0&0&0&0&0&0&0&0&0&0&0&0&0&0&0\\
1&0&0&0&0&0&0&0&0&0&0&0&0&0&0&0&1&0&0&0&0&0&0&0\\
1&0&0&0&0&0&0&0&1&0&0&0&0&0&0&0&0&0&0&0&0&0&0&0\\
1&0&0&0&0&0&0&0&1&0&0&0&0&0&0&0&1&0&0&0&1&0&0&0\\
1&0&1&0&0&0&0&0&0&0&0&0&0&0&0&0&0&0&0&0&0&0&0&0\\
1&0&1&0&0&0&0&0&1&0&0&0&1&0&0&0&0&0&0&0&0&0&0&0\\
1&0&0&0&1&0&0&0&0&0&0&0&0&0&0&0&0&0&0&0&0&0&0&0\\
1&0&0&0&1&0&0&0&1&0&1&0&0&0&0&0&0&0&0&0&0&0&0&0\\
1&0&1&0&0&0&0&0&1&0&1&0&0&0&0&0&1&0&1&0&0&0&0&0\\
1&1&0&0&0&0&0&0&0&0&0&0&0&0&0&0&0&0&0&0&0&0&0&0\\
1&1&0&0&0&0&0&0&1&1&0&0&0&0&0&0&0&0&0&0&0&0&0&0\\
1&0&1&0&1&0&1&0&0&0&0&0&0&0&0&0&0&0&0&0&0&0&0&0\\
1&0&1&0&1&0&1&0&1&1&0&0&0&0&0&0&1&1&0&0&0&0&0&0\\
0&1&1&0&1&0&1&0&0&1&1&0&1&0&1&0&0&0&0&0&0&0&0&0\\
1&0&1&0&1&0&1&0&1&0&1&0&1&0&1&0&1&0&1&0&1&0&1&0\\
1&1&0&0&1&1&0&0&0&0&0&0&0&0&0&0&0&0&0&0&0&0&0&0\\
1&1&1&1&0&0&0&0&0&0&0&0&0&0&0&0&0&0&0&0&0&0&0&0\\
0&0&1&1&1&1&0&0&1&1&0&0&1&1&0&0&0&0&0&0&0&0&0&0\\
1&1&0&0&1&1&0&0&1&1&1&1&0&0&0&0&0&0&0&0&0&0&0&0\\
1&1&0&0&1&1&0&0&1&1&0&0&1&1&0&0&1&1&0&0&1&1&0&0\\
1&1&1&1&0&0&0&0&1&1&1&1&0&0&0&0&1&1&1&1&0&0&0&0\\
1&1&1&1&1&1&1&1&0&0&0&0&0&0&0&0&0&0&0&0&0&0&0&0\\
1&1&1&1&1&1&1&1&0&0&0&0&0&0&0&0&1&1&1&1&1&1&1&1\\
1&1&1&1&1&1&1&1&1&1&1&1&1&1&1&1&0&0&0&0&0&0&0&0
\end{pmatrix}$$

$$K'_{24} = \begin{pmatrix}
1&0&0&0&0&0&0&0&0&0&0&0&0&0&0&0&0&0&0&0&0&0&0&0\\
1&0&0&0&0&0&0&0&0&0&0&0&0&0&0&0&1&0&0&0&0&0&0&0\\
1&0&0&0&0&0&0&0&1&0&0&0&0&0&0&0&0&0&0&0&0&0&0&0\\
1&0&0&0&1&0&0&0&0&0&0&0&0&0&0&0&0&0&0&0&0&0&0&0\\
1&0&1&0&0&0&0&0&0&0&0&0&0&0&0&0&0&0&0&0&0&0&0&0\\
1&0&0&0&1&0&0&0&1&0&0&0&1&0&0&0&0&0&0&0&0&0&0&0\\
1&0&1&0&0&0&0&0&1&0&1&0&0&0&0&0&0&0&0&0&0&0&0&0\\
1&1&0&0&0&0&0&0&0&0&0&0&0&0&0&0&0&0&0&0&0&0&0&0\\
1&1&0&0&0&0&0&0&1&1&0&0&0&0&0&0&0&0&0&0&0&0&0&0\\
1&0&1&0&1&0&1&0&0&0&0&0&0&0&0&0&0&0&0&0&0&0&0&0\\
1&0&0&0&1&0&0&0&1&0&1&0&0&0&0&0&1&0&1&0&0&0&0&0\\
1&1&0&0&1&1&0&0&0&0&0&0&0&0&0&0&0&0&0&0&0&0&0&0\\
0&0&0&0&0&1&1&0&1&1&1&0&1&0&0&0&1&0&0&0&1&0&0&0\\
1&0&1&0&1&0&1&0&1&1&0&0&0&0&0&0&1&1&0&0&0&0&0&0\\
0&1&1&0&1&0&1&0&0&1&1&0&1&0&1&0&0&0&0&0&0&0&0&0\\
1&0&1&0&1&0&1&0&1&0&1&0&1&0&1&0&1&0&1&0&1&0&1&0\\
1&1&1&1&0&0&0&0&0&0&0&0&0&0&0&0&0&0&0&0&0&0&0&0\\
0&0&1&1&1&1&0&0&1&1&0&0&1&1&0&0&0&0&0&0&0&0&0&0\\
1&1&0&0&1&1&0&0&1&1&1&1&0&0&0&0&0&0&0&0&0&0&0&0\\
1&1&0&0&1&1&0&0&1&1&0&0&1&1&0&0&1&1&0&0&1&1&0&0\\
1&1&1&1&1&1&1&1&0&0&0&0&0&0&0&0&0&0&0&0&0&0&0&0\\
1&1&1&1&0&0&0&0&1&1&1&1&0&0&0&0&1&1&1&1&0&0&0&0\\
1&1&1&1&1&1&1&1&0&0&0&0&0&0&0&0&1&1&1&1&1&1&1&1\\
1&1&1&1&1&1&1&1&1&1&1&1&1&1&1&1&0&0&0&0&0&0&0&0
\end{pmatrix}$$

$$K''_{24} = \begin{pmatrix}
1&0&0&0&0&0&0&0&0&0&0&0&0&0&0&0&0&0&0&0&0&0&0&0\\
1&0&0&0&0&0&0&0&0&0&0&0&0&0&0&0&1&0&0&0&0&0&0&0\\
1&0&1&0&0&0&0&0&0&0&0&0&0&0&0&0&0&0&0&0&0&0&0&0\\
1&0&0&0&1&0&0&0&0&0&0&0&0&0&0&0&0&0&0&0&0&0&0&0\\
1&0&0&0&0&0&0&0&1&0&0&0&0&0&0&0&0&0&0&0&0&0&0&0\\
1&1&0&0&0&0&0&0&0&0&0&0&0&0&0&0&0&0&0&0&0&0&0&0\\
1&0&0&0&1&0&0&0&1&0&0&0&1&0&0&0&0&0&0&0&0&0&0&0\\
1&0&1&0&0&0&0&0&1&0&1&0&0&0&0&0&0&0&0&0&0&0&0&0\\
1&1&0&0&0&0&0&0&1&1&0&0&0&0&0&0&0&0&0&0&0&0&0&0\\
1&0&1&0&1&0&1&0&0&0&0&0&0&0&0&0&0&0&0&0&0&0&0&0\\
1&1&0&0&1&1&0&0&0&0&0&0&0&0&0&0&0&0&0&0&0&0&0&0\\
1&1&1&1&0&0&0&0&0&0&0&0&0&0&0&0&0&0&0&0&0&0&0&0\\
0&0&0&0&0&1&1&0&1&1&1&0&1&0&0&0&1&0&0&0&1&0&0&0\\
0&1&1&1&0&0&1&0&1&0&0&0&1&0&0&0&1&0&1&0&0&0&0&0\\
1&0&1&0&1&0&1&0&1&1&0&0&0&0&0&0&1&1&0&0&0&0&0&0\\
0&1&1&0&1&0&1&0&0&1&1&0&1&0&1&0&0&0&0&0&0&0&0&0\\
0&0&1&1&1&1&0&0&1&1&0&0&1&1&0&0&0&0&0&0&0&0&0&0\\
1&1&0&0&1&1&0&0&1&1&1&1&0&0&0&0&0&0&0&0&0&0&0&0\\
1&1&1&1&1&1&1&1&0&0&0&0&0&0&0&0&0&0&0&0&0&0&0&0\\
1&0&1&0&1&0&1&0&1&0&1&0&1&0&1&0&1&0&1&0&1&0&1&0\\
1&1&0&0&1&1&0&0&1&1&0&0&1&1&0&0&1&1&0&0&1&1&0&0\\
1&1&1&1&0&0&0&0&1&1&1&1&0&0&0&0&1&1&1&1&0&0&0&0\\
1&1&1&1&1&1&1&1&0&0&0&0&0&0&0&0&1&1&1&1&1&1&1&1\\
1&1&1&1&1&1&1&1&1&1&1&1&1&1&1&1&0&0&0&0&0&0&0&0
\end{pmatrix}$$

$$
\begin{pmatrix}
1&0&0&0&0&0&0&0&0&0&0&0&0&0&0&0&0&0&0&0&0&0&0&0&0\\
1&0&0&0&0&0&0&1&0&0&0&0&0&0&0&0&0&0&0&0&0&0&0&0&0\\
1&0&0&0&1&0&0&0&0&0&0&0&0&0&0&0&0&0&0&0&0&0&0&0&0\\
1&1&0&0&0&0&0&0&0&0&0&0&0&0&0&0&0&0&0&0&0&0&0&0&0\\
0&1&0&0&0&1&0&0&0&0&0&0&0&0&0&0&0&0&0&0&0&0&0&0&0\\
0&1&1&0&0&0&0&0&0&0&0&0&0&0&0&0&0&0&0&0&0&0&0&0&0\\
0&0&1&0&1&0&0&1&0&0&0&0&1&0&0&0&0&0&0&0&0&0&0&0&0\\
1&0&1&0&1&0&0&0&0&0&0&1&0&0&0&0&0&0&0&0&0&0&0&0&0\\
0&0&0&1&1&0&0&0&0&0&0&0&0&1&1&0&0&0&0&0&0&0&0&0&0\\
1&1&0&0&0&1&1&0&0&0&0&0&0&0&0&0&0&0&0&0&0&0&0&0&0\\
1&1&1&1&0&0&0&0&0&0&0&0&0&0&0&0&0&0&0&0&0&0&0&0&0\\
0&1&0&1&0&0&1&0&0&0&0&0&1&0&0&1&1&0&0&0&0&0&0&0&0\\
0&0&0&0&0&1&1&1&0&0&0&1&0&1&0&0&1&0&0&0&0&0&0&0&0\\
1&0&0&0&1&1&1&1&0&1&0&0&0&0&0&0&0&0&0&0&0&0&0&0&0\\
1&1&1&0&1&0&0&1&1&0&0&0&0&0&0&0&0&0&0&0&0&0&0&0&0\\
0&1&0&1&0&0&1&1&0&1&0&1&0&0&0&0&1&0&0&0&0&1&0&0&0\\
0&0&1&0&1&1&0&1&1&1&0&0&1&0&1&0&0&0&0&0&0&0&0&0&0\\
1&1&1&1&1&1&1&0&0&0&1&0&0&0&0&0&0&0&0&0&0&0&0&0&0\\
1&1&0&0&1&0&1&0&1&1&0&1&0&1&1&0&0&0&0&1&0&0&0&0&0\\
1&0&1&1&0&1&1&1&1&1&0&1&0&0&0&0&0&0&1&0&0&0&0&0&0\\
1&1&0&1&0&1&0&1&0&1&0&1&0&1&0&1&0&0&0&1&0&1&0&1&0\\
1&1&1&0&0&1&1&0&0&1&1&0&0&1&1&0&0&0&1&0&0&1&1&0&0\\
1&1&1&1&1&0&0&0&0&1&1&1&1&0&0&0&0&0&1&1&1&0&0&0&0\\
1&1&1&1&1&1&1&1&1&0&0&0&0&0&0&0&0&0&1&1&1&1&1&1&1\\
1&1&1&1&1&1&1&1&1&1&1&1&1&1&1&1&1&1&0&0&0&0&0&0&0
\end{pmatrix}
$$

$$\begin{pmatrix}
1&0&0&0&0&0&0&0&0&0&0&0&0&0&0&0&0&0&0&0&0&0&0&0&0\\
1&0&0&0&1&0&0&0&0&0&0&0&0&0&0&0&0&0&0&0&0&0&0&0&0\\
1&1&0&0&0&0&0&0&0&0&0&0&0&0&0&0&0&0&0&0&0&0&0&0&0\\
1&0&1&0&0&0&0&0&0&0&0&0&0&0&0&0&0&0&0&0&0&0&0&0&0\\
1&0&0&0&0&0&0&0&1&0&0&0&0&0&0&0&0&0&0&0&0&0&0&0&0\\
1&0&0&0&0&0&0&0&0&0&1&0&0&0&0&0&0&0&0&0&0&0&0&0&0\\
0&0&1&0&1&0&0&0&1&1&0&0&0&0&0&0&0&0&0&0&0&0&0&0&0\\
1&1&0&0&0&0&0&0&1&0&0&0&0&0&0&0&1&0&0&0&0&0&0&0&0\\
1&0&1&0&0&0&0&0&1&0&0&0&1&0&0&0&0&0&0&0&0&0&0&0&0\\
1&0&0&0&0&0&0&0&1&0&1&0&0&0&0&0&0&0&0&0&0&0&1&0&0\\
0&1&1&0&1&0&1&0&0&0&0&0&0&0&0&0&0&0&0&0&0&0&0&0&0\\
1&1&0&0&1&1&0&0&0&0&0&0&0&0&0&0&0&0&0&0&0&0&0&0&0\\
1&1&1&1&0&0&0&0&0&0&0&0&0&0&0&0&0&0&0&0&0&0&0&0&0\\
0&0&0&1&1&1&1&0&1&0&1&0&0&0&0&0&1&0&0&0&0&0&0&0&1\\
0&1&1&0&1&1&0&0&0&0&1&0&1&0&0&0&1&0&0&0&1&0&0&0&0\\
1&1&0&1&1&0&0&0&1&0&0&0&1&0&0&0&1&0&1&0&0&0&0&0&0\\
0&1&1&0&1&0&1&0&1&1&0&0&0&0&0&0&1&1&0&0&0&0&0&0&0\\
1&0&1&0&1&0&1&0&1&0&1&0&1&0&1&0&0&0&0&0&0&0&0&0&0\\
0&0&1&1&1&1&0&0&1&1&0&0&1&1&0&0&0&0&0&0&0&0&0&0&0\\
1&1&0&0&1&1&0&0&1&1&1&1&0&0&0&0&0&0&0&0&0&0&0&0&0\\
1&1&1&1&1&1&1&1&0&0&0&0&0&0&0&0&0&0&0&0&0&0&0&0&0\\
1&1&0&0&1&1&0&0&1&1&0&0&1&1&0&0&1&1&0&0&1&1&0&0&0\\
1&1&1&1&0&0&0&0&1&1&1&1&0&0&0&0&1&1&1&1&0&0&0&0&0\\
1&1&1&1&1&1&1&1&0&0&0&0&0&0&0&0&1&1&1&1&1&1&1&1&0\\
1&1&1&1&1&1&1&1&1&1&1&1&1&1&1&1&0&0&0&0&0&0&0&0&0
\end{pmatrix}$$

FIG. 29

$$K_{28} = \begin{pmatrix}
1&0&0&0&0&0&0&0&0&0&0&0&0&0&0&0&0&0&0&0&0&0&0&0&0&0&0&0\\
1&0&0&0&0&0&0&0&0&0&0&0&0&0&0&0&1&0&0&0&0&0&0&0&0&0&0&0\\
1&0&0&0&0&0&0&0&1&0&0&0&0&0&0&0&0&0&0&0&0&0&0&0&0&0&0&0\\
1&0&0&0&0&0&0&0&1&0&0&0&0&0&0&0&1&0&0&0&1&0&0&0&0&0&0&0\\
1&0&0&0&1&0&0&0&0&0&0&0&0&0&0&0&0&0&0&0&0&0&0&0&0&0&0&0\\
1&0&0&0&1&0&0&0&0&0&0&0&0&0&0&0&1&0&1&0&0&0&0&0&0&0&0&0\\
1&0&1&0&0&0&0&0&0&0&0&0&0&0&0&0&0&0&0&0&0&0&0&0&0&0&0&0\\
0&0&0&0&0&0&0&0&1&0&1&0&0&0&0&0&0&0&0&0&1&0&1&0&0&0&0&0\\
1&0&0&0&1&0&0&0&0&0&1&0&1&0&0&0&0&0&0&0&1&0&1&0&0&0&0&0\\
1&0&0&0&1&0&0&0&1&0&0&0&1&0&0&0&1&0&1&0&1&0&0&0&1&0&0&0\\
1&1&0&0&0&0&0&0&0&0&0&0&0&0&0&0&0&0&0&0&0&0&0&0&0&0&0&0\\
1&1&0&0&0&0&0&0&0&0&0&0&0&0&0&0&1&1&0&0&0&0&0&0&0&0&0&0\\
0&1&1&0&0&0&0&0&1&0&1&0&0&0&0&0&1&1&0&0&0&0&0&0&0&0&0&0\\
1&0&1&0&1&0&1&0&0&0&0&0&0&0&0&0&0&0&0&0&0&0&0&0&0&0&0&0\\
0&1&1&0&1&0&1&0&1&1&0&0&0&0&0&0&0&0&0&0&0&0&0&0&0&0&0&0\\
1&1&0&0&0&0&0&0&1&1&0&0&0&0&0&0&1&1&0&0&1&1&0&0&0&0&0&0\\
1&1&0&0&0&0&0&0&0&1&1&0&1&0&1&0&1&1&0&0&0&1&1&0&1&0&1&0\\
1&1&0&0&1&1&0&0&0&0&0&0&0&0&0&0&0&0&0&0&0&0&0&0&0&0&0&0\\
1&1&0&0&1&1&0&0&0&0&0&0&0&0&0&0&1&1&1&1&0&0&0&0&0&0&0&0\\
0&1&1&0&0&1&1&0&1&0&1&0&1&0&1&0&1&1&1&1&0&0&0&0&0&0&0&0\\
1&1&1&1&0&0&0&0&0&0&0&0&0&0&0&0&0&0&0&0&0&0&0&0&0&0&0&0\\
0&0&0&0&0&0&0&0&1&1&1&1&0&0&0&0&0&0&0&0&1&1&1&1&0&0&0&0\\
1&1&0&0&1&1&0&0&0&0&1&1&1&1&0&0&0&0&0&0&1&1&1&1&0&0&0&0\\
1&1&0&0&1&1&0&0&1&1&0&0&1&1&0&0&1&1&1&1&1&1&0&0&1&1&0&0\\
1&1&1&1&0&0&0&0&1&1&1&1&0&0&0&0&0&0&0&0&0&0&0&0&0&0&0&0\\
1&1&1&1&1&1&1&1&0&0&0&0&0&0&0&0&0&0&0&0&0&0&0&0&0&0&0&0\\
0&0&0&0&0&0&0&0&1&1&1&1&1&1&1&1&0&0&0&0&1&1&1&1&1&1&1&1\\
1&1&1&1&1&1&1&1&1&1&1&1&1&1&1&1&0&0&0&0&0&0&0&0&0&0&0&0
\end{pmatrix}$$

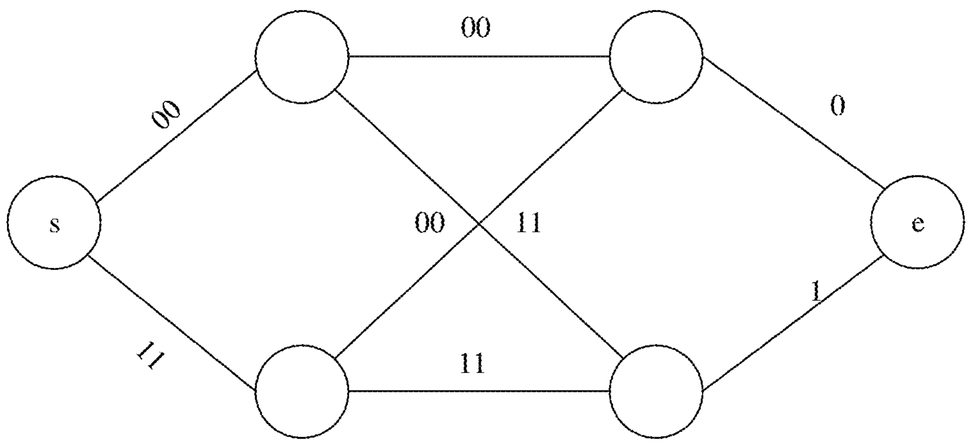

FIG. 37

$$K_1 = \begin{pmatrix}
1 & 0 & 0 & 0 & 0 & 0 & 0 & 0 & 0 & 0 & 0 & 0 & 0 & 0 & 0 & 0 \\
1 & 0 & 0 & 0 & 0 & 0 & 0 & 0 & 1 & 0 & 0 & 0 & 0 & 0 & 0 & 0 \\
1 & 0 & 0 & 0 & 1 & 0 & 0 & 0 & 0 & 0 & 0 & 0 & 0 & 0 & 0 & 0 \\
1 & 0 & 0 & 0 & 1 & 0 & 0 & 0 & 1 & 0 & 0 & 0 & 1 & 0 & 0 & 0 \\
1 & 0 & 1 & 0 & 0 & 0 & 0 & 0 & 0 & 0 & 0 & 0 & 0 & 0 & 0 & 0 \\
1 & 1 & 0 & 0 & 0 & 0 & 0 & 0 & 0 & 0 & 0 & 0 & 0 & 0 & 0 & 0 \\
1 & 0 & 1 & 0 & 0 & 0 & 0 & 0 & 1 & 0 & 1 & 0 & 0 & 0 & 0 & 0 \\
0 & 0 & 0 & 0 & 1 & 0 & 1 & 0 & 1 & 0 & 1 & 0 & 0 & 0 & 0 & 0 \\
0 & 1 & 1 & 0 & 1 & 0 & 1 & 0 & 1 & 1 & 0 & 0 & 0 & 0 & 0 & 0 \\
1 & 1 & 0 & 0 & 0 & 1 & 1 & 0 & 1 & 0 & 1 & 0 & 0 & 0 & 0 & 0 \\
1 & 0 & 1 & 0 & 1 & 0 & 1 & 0 & 1 & 0 & 1 & 0 & 1 & 0 & 1 & 0 \\
1 & 1 & 0 & 0 & 1 & 1 & 0 & 0 & 1 & 1 & 0 & 0 & 1 & 1 & 0 & 0 \\
1 & 1 & 1 & 1 & 0 & 0 & 0 & 0 & 0 & 0 & 0 & 0 & 0 & 0 & 0 & 0 \\
1 & 1 & 1 & 1 & 0 & 0 & 0 & 0 & 1 & 1 & 1 & 1 & 0 & 0 & 0 & 0 \\
1 & 1 & 1 & 1 & 1 & 1 & 1 & 1 & 0 & 0 & 0 & 0 & 0 & 0 & 0 & 0 \\
1 & 1 & 1 & 1 & 1 & 1 & 1 & 1 & 1 & 1 & 1 & 1 & 1 & 1 & 1 & 1
\end{pmatrix}$$

Apparatus 4400

METHOD AND APPARATUS FOR ENCODING POLAR CODE, AND METHOD AND APPARATUS FOR DECODING POLAR CODE

CROSS-REFERENCE TO RELATED APPLICATIONS

This application is a continuation of International Patent Application No. PCT/CN2021/115206, filed on Aug. 30, 2021, which claims priority to Russian Federation (RU) Patent Application No. RU2020130551, filed on Sep. 17, 2020. The disclosures of the aforementioned applications are hereby incorporated by reference in their entireties.

TECHNICAL FIELD

This application relates to the field of channel coding, and to a method and an apparatus for encoding a polar code, and a method and an apparatus for decoding a polar code.

BACKGROUND

A polar code has been strictly proved to be a channel encoding scheme that reaches a channel capacity, and has features such as high performance, low complexity, and a flexible matching manner. Currently, the polar code is determined by the $3^{rd}$ Generation Partnership Project (3GPP) as a control channel encoding scheme in some communication scenarios of the $5^{th}$ generation (5G).

An original polar code is based on a kernel matrix $$F_2 = \begin{pmatrix} 1 & 0 \\ 1 & 1 \end{pmatrix},$$

and an n-time Kronecker index $F_2^{\otimes m}$ of the kernel matrix corresponds to a linear code whose code length is $N=2^m$. As for a high-dimensional kernel matrix, researchers have proved that a polarization speed when some well-designed high-dimensional kernel matrices are used to encode the polar code is higher, in other words, decoding performance is better. However, the high-dimensional kernel matrix causes high decoding complexity, and how to reduce decoding complexity is an urgent problem to be resolved.

SUMMARY

Embodiments described herein provide a method and an apparatus for encoding a polar code, and a method and an apparatus for decoding a polar code, to reduce decoding complexity.

According to a first aspect, an encoding method is provided. The method is performed by an encoder device, or is performed by a chip, a chip system, or a circuit set in the encoder device. This is not limited in at least one embodiment.

The method includes: obtaining information bits; determining a target kernel matrix, where the target kernel matrix is obtained by adjusting an original kernel matrix; and performing polar encoding on the information bits based on the target kernel matrix.

For example, the obtaining information bits includes internally generating information bits, or includes receiving information bits from outside.

Based on the foregoing technical solution, in response to the polar encoding being performed, a plurality of kernel matrices is constructed based on the original kernel matrix, and an appropriate target kernel matrix is selected for encoding based on the constructed kernel matrices and an actual communication status. In this manner, in response to the kernel matrix being constructed or selected, performance and decoding complexity are comprehensively considered, so that decoding complexity is reduced by selecting the appropriate kernel matrix used during encoding.

With reference to the first aspect, in some implementations of the first aspect, a dimension of the target kernel matrix is less than a dimension of the original kernel matrix.

Based on the foregoing technical solution, a plurality of kernel matrices whose dimensions are small are constructed based on a kernel matrix whose dimension is known. Encoding is performed based on the kernel matrix whose dimension is small, so that lower decoding complexity is provided while the same performance is ensured.

With reference to the first aspect, in some implementations of the first aspect, the target kernel matrix is obtained by adjusting a partial distance of the original kernel matrix.

For example, the target kernel matrix is obtained by adjusting a partial distance profile (PDP) of the original kernel matrix.

For example, in response to the partial distance of the original kernel matrix being adjusted, the adjustment is performed based on partial distance close to that of an Arikan matrix.

With reference to the first aspect, in some implementations of the first aspect, the target kernel matrix is obtained by adjusting the partial distance of the original kernel matrix according to a depth-first search algorithm.

With reference to the first aspect, in some implementations of the first aspect, in response to processing being performed according to the depth-first search algorithm, one or more of the following constraints are used for processing:

a candidate line set M meets: $M[i]=\{v_0^{t-1} \in F_2^l | wt(v_0^{t-1})=D_i\}$; or in response to the $i^{th}$ line being selected from the bottom in the candidate line set M, a Hamming weight of a selected line v is greater than or equal to $D_i$; or selecting the line v from the candidate line set M and performing partial distance calculation on the line v and a constructed line, where in response to $c \in C_{\overline{K}}^{(\varphi+1)} \oplus \overline{K}[\varphi]$, and $wt(c)<D_\varphi$, the line v is directly discarded, and a new line from the candidate line set M is selected; or a line that belongs to a same coset is not selected again, where i indicates a line number, $i \in [0,l-1]$, wt(v) wt(c) and both indicate the Hamming weight, $\overline{K}$ indicates a currently constructed kernel matrix $\overline{K}$, $\overline{K}[\varphi]$ indicates the $q_{th}$ line of the kernel matrix $\overline{K}$, $D_i$ and $D_\varphi$ both indicate the partial distance; $C_{\overline{K}}^{(\varphi+1)}$ indicates a code corresponding to the kernel matrix $\overline{K}$, and $\oplus$ indicates a logical operation.

For example, the currently constructed kernel matrix $\overline{K}$ indicates that the kernel $\overline{K}$ is being constructed, or the kernel $\overline{K}$ been constructed indicates that the kernel $\overline{K}$ is constructed.

Based on the foregoing technical solution, a constraint condition about a candidate line and/or a selected line is designed, so as to accelerate convergence speed, thereby further reducing calculation amount.

With reference to the first aspect, in some implementations of the first aspect, the original kernel matrix is a kernel matrix $K_{24}$ whose dimension is (24×24), and the $K_{24}$ is:

| | | | | | | | | | | | | | | | | | | | | | | | |
|---|---|---|---|---|---|---|---|---|---|---|---|---|---|---|---|---|---|---|---|---|---|---|---|
| 1 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 |
| 1 | 0 | 0 | 0 | 0 | 0 | 0 | 0 | 0 | 0 | 0 | 0 | 0 | 0 | 0 | 0 | 1 | 0 | 0 | 0 | 0 | 0 | 0 | 0 |
| 1 | 0 | 0 | 0 | 0 | 0 | 0 | 0 | 1 | 0 | 0 | 0 | 0 | 0 | 0 | 0 | 0 | 0 | 0 | 0 | 0 | 0 | 0 | 0 |
| 1 | 0 | 0 | 0 | 0 | 0 | 0 | 0 | 1 | 0 | 0 | 0 | 0 | 0 | 0 | 0 | 1 | 0 | 0 | 0 | 1 | 0 | 0 | 0 |
| 1 | 0 | 1 | 0 | 0 | 0 | 0 | 0 | 0 | 0 | 0 | 0 | 0 | 0 | 0 | 0 | 0 | 0 | 0 | 0 | 0 | 0 | 0 | 0 |
| 1 | 0 | 1 | 0 | 0 | 0 | 0 | 0 | 1 | 0 | 0 | 0 | 1 | 0 | 0 | 0 | 0 | 0 | 0 | 0 | 0 | 0 | 0 | 0 |
| 1 | 0 | 0 | 0 | 1 | 0 | 0 | 0 | 0 | 0 | 0 | 0 | 0 | 0 | 0 | 0 | 0 | 0 | 0 | 0 | 0 | 0 | 0 | 0 |
| 1 | 0 | 0 | 0 | 1 | 0 | 0 | 0 | 1 | 0 | 1 | 0 | 0 | 0 | 0 | 0 | 0 | 0 | 0 | 0 | 0 | 0 | 0 | 0 |
| 1 | 0 | 1 | 0 | 0 | 0 | 0 | 0 | 1 | 0 | 1 | 0 | 0 | 0 | 0 | 0 | 1 | 0 | 1 | 0 | 0 | 0 | 0 | 0 |
| 1 | 1 | 0 | 0 | 0 | 0 | 0 | 0 | 0 | 0 | 0 | 0 | 0 | 0 | 0 | 0 | 0 | 0 | 0 | 0 | 0 | 0 | 0 | 0 |
| 1 | 1 | 0 | 0 | 0 | 0 | 0 | 0 | 1 | 1 | 0 | 0 | 0 | 0 | 0 | 0 | 0 | 0 | 0 | 0 | 0 | 0 | 0 | 0 |
| 1 | 0 | 1 | 0 | 1 | 0 | 1 | 0 | 0 | 0 | 0 | 0 | 0 | 0 | 0 | 0 | 0 | 0 | 0 | 0 | 0 | 0 | 0 | 0 |
| 1 | 0 | 1 | 0 | 1 | 0 | 1 | 0 | 1 | 1 | 0 | 0 | 0 | 0 | 0 | 0 | 1 | 1 | 0 | 0 | 0 | 0 | 0 | 0 |
| 0 | 1 | 1 | 0 | 1 | 0 | 1 | 0 | 0 | 1 | 1 | 0 | 1 | 0 | 1 | 0 | 0 | 0 | 0 | 0 | 0 | 0 | 0 | 0 |
| 1 | 0 | 1 | 0 | 1 | 0 | 1 | 0 | 1 | 0 | 1 | 0 | 1 | 0 | 1 | 0 | 1 | 0 | 1 | 0 | 1 | 0 | 1 | 0 |
| 1 | 1 | 0 | 0 | 1 | 1 | 0 | 0 | 0 | 0 | 0 | 0 | 0 | 0 | 0 | 0 | 0 | 0 | 0 | 0 | 0 | 0 | 0 | 0 |
| 1 | 1 | 1 | 1 | 0 | 0 | 0 | 0 | 0 | 0 | 0 | 0 | 0 | 0 | 0 | 0 | 0 | 0 | 0 | 0 | 0 | 0 | 0 | 0 |
| 0 | 0 | 1 | 1 | 1 | 1 | 0 | 0 | 1 | 1 | 0 | 0 | 1 | 1 | 0 | 0 | 0 | 0 | 0 | 0 | 0 | 0 | 0 | 0 |
| 1 | 1 | 0 | 0 | 1 | 1 | 0 | 0 | 1 | 1 | 1 | 1 | 0 | 0 | 0 | 0 | 0 | 0 | 0 | 0 | 0 | 0 | 0 | 0 |
| 1 | 1 | 0 | 0 | 1 | 1 | 0 | 0 | 1 | 1 | 0 | 0 | 1 | 1 | 0 | 0 | 1 | 1 | 0 | 0 | 1 | 1 | 0 | 0 |
| 1 | 1 | 1 | 1 | 0 | 0 | 0 | 0 | 1 | 1 | 1 | 1 | 0 | 0 | 0 | 0 | 1 | 1 | 1 | 1 | 0 | 0 | 0 | 0 |
| 1 | 1 | 1 | 1 | 1 | 1 | 1 | 1 | 0 | 0 | 0 | 0 | 0 | 0 | 0 | 0 | 0 | 0 | 0 | 0 | 0 | 0 | 0 | 0 |
| 1 | 1 | 1 | 1 | 1 | 1 | 1 | 1 | 0 | 0 | 0 | 0 | 0 | 0 | 0 | 0 | 1 | 1 | 1 | 1 | 1 | 1 | 1 | 1 |
| 1 | 1 | 1 | 1 | 1 | 1 | 1 | 1 | 1 | 1 | 1 | 1 | 1 | 1 | 1 | 1 | 0 | 0 | 0 | 0 | 0 | 0 | 0 | 0 |

With reference to the first aspect, in some implementations of the first aspect, the target kernel matrix is any one of the following:

$$K_{20} = \begin{pmatrix}
1&0&0&0&0&0&0&0&0&0&0&0&0&0&0&0&0&0&0&0\\
1&0&0&0&0&0&0&0&0&0&0&0&1&0&0&0&0&0&0&0\\
1&0&0&0&0&0&0&0&1&0&0&0&0&0&0&0&0&0&0&0\\
1&0&0&0&0&0&0&0&1&0&0&0&1&0&0&0&1&0&0&0\\
1&0&1&0&0&0&0&0&0&0&0&0&0&0&0&0&0&0&0&0\\
1&0&0&0&1&0&0&0&0&0&0&0&0&0&0&0&0&0&0&0\\
1&0&0&0&1&0&0&0&1&0&1&0&0&0&0&0&0&0&0&0\\
1&0&1&0&0&0&0&0&1&0&1&0&1&0&1&0&0&0&0&0\\
1&1&0&0&0&0&0&0&0&0&0&0&0&0&0&0&0&0&0&0\\
1&1&0&0&0&0&0&0&1&1&0&0&0&0&0&0&0&0&0&0\\
1&0&1&0&1&0&1&0&0&0&0&0&0&0&0&0&0&0&0&0\\
1&0&1&0&1&0&1&0&1&1&0&0&1&1&0&0&0&0&0&0\\
1&1&0&0&0&0&0&0&1&1&0&0&1&0&1&0&1&0&1&0\\
1&1&0&0&1&1&0&0&0&0&0&0&0&0&0&0&0&0&0&0\\
1&1&1&1&0&0&0&0&0&0&0&0&0&0&0&0&0&0&0&0\\
1&1&1&1&0&0&0&0&0&0&0&0&1&1&0&0&1&1&0&0\\
1&1&0&0&1&1&0&0&1&1&1&1&0&0&0&0&0&0&0&0\\
1&1&1&1&0&0&0&0&1&1&1&1&1&1&1&1&0&0&0&0\\
1&1&1&1&1&1&1&1&0&0&0&0&0&0&0&0&0&0&0&0\\
1&1&1&1&1&1&1&1&0&0&0&0&1&1&1&1&1&1&1&1
\end{pmatrix}; \text{or}$$

$$K'_{20} = \begin{pmatrix}
1&0&0&0&0&0&0&0&0&0&0&0&0&0&0&0&0&0&0&0\\
1&0&0&0&0&0&0&0&0&0&0&1&0&0&0&0&0&0&0&0\\
1&0&0&0&0&0&0&0&1&0&0&0&0&0&0&0&0&0&0&0\\
1&0&0&0&1&0&0&0&0&0&0&0&0&0&0&0&0&0&0&0\\
1&0&1&0&0&0&0&0&0&0&0&0&0&0&0&0&0&0&0&0\\
1&0&0&0&1&0&0&0&1&0&1&0&0&0&0&0&0&0&0&0\\
1&1&0&0&0&0&0&0&0&0&0&0&0&0&0&0&0&0&0&0\\
0&1&1&0&1&0&1&0&0&0&0&0&0&0&0&0&0&0&0&0\\
1&1&1&1&0&0&0&0&0&0&0&0&0&0&0&0&0&0&0&0\\
0&1&0&1&1&0&0&0&1&0&0&0&1&0&0&0&1&0&0&0\\
1&0&1&0&1&1&0&0&0&0&0&0&0&0&0&0&0&0&0&0\\
0&0&0&0&1&1&0&0&1&0&1&0&1&0&1&0&0&0&0&0\\
1&0&1&0&1&1&0&0&0&0&0&1&0&1&0&1&0&1&0&0\\
0&1&1&0&1&1&0&0&1&0&1&0&0&0&0&0&1&1&0&0\\
1&0&1&0&1&0&1&0&1&1&0&0&0&0&0&0&0&0&0&0\\
0&0&1&1&1&1&0&0&1&1&0&0&1&1&0&0&0&0&0&0\\
1&1&0&0&1&1&0&0&1&1&0&0&1&1&0&0&1&1&1&1\\
1&1&1&1&0&0&0&0&1&1&1&1&0&0&0&0&0&0&0&0\\
1&1&1&1&1&1&1&1&0&0&0&0&0&0&0&0&0&0&0&0\\
1&1&1&1&1&1&1&1&1&1&1&1&1&1&1&1&0&0&0&0
\end{pmatrix}; \text{or}$$

-continued $$K''_{20} = \begin{pmatrix}
1 & 0 & 0 & 0 & 0 & 0 & 0 & 0 & 0 & 0 & 0 & 0 & 0 & 0 & 0 & 0 & 0 & 0 & 0 & 0 \\
1 & 0 & 0 & 0 & 0 & 0 & 1 & 0 & 0 & 0 & 0 & 0 & 0 & 0 & 0 & 0 & 0 & 0 & 0 & 0 \\
1 & 0 & 0 & 0 & 0 & 1 & 0 & 0 & 0 & 0 & 0 & 0 & 0 & 0 & 0 & 0 & 0 & 0 & 0 & 0 \\
1 & 0 & 0 & 1 & 0 & 0 & 0 & 0 & 0 & 0 & 0 & 0 & 0 & 0 & 0 & 0 & 0 & 0 & 0 & 0 \\
1 & 0 & 1 & 0 & 0 & 0 & 0 & 0 & 0 & 0 & 0 & 0 & 0 & 0 & 0 & 0 & 0 & 0 & 0 & 0 \\
1 & 1 & 0 & 0 & 0 & 0 & 0 & 0 & 0 & 0 & 0 & 0 & 0 & 0 & 0 & 0 & 0 & 0 & 0 & 0 \\
1 & 0 & 0 & 1 & 0 & 1 & 0 & 0 & 0 & 0 & 0 & 0 & 1 & 0 & 0 & 0 & 0 & 0 & 0 & 0 \\
1 & 1 & 0 & 0 & 0 & 1 & 0 & 0 & 0 & 0 & 0 & 0 & 0 & 0 & 0 & 0 & 1 & 0 & 0 & 0 \\
0 & 0 & 0 & 1 & 0 & 1 & 1 & 1 & 0 & 0 & 0 & 0 & 0 & 0 & 0 & 0 & 0 & 0 & 0 & 0 \\
1 & 1 & 1 & 0 & 1 & 0 & 0 & 0 & 0 & 0 & 0 & 0 & 0 & 0 & 0 & 0 & 0 & 0 & 0 & 0 \\
1 & 0 & 1 & 1 & 1 & 0 & 0 & 1 & 0 & 0 & 1 & 0 & 0 & 0 & 0 & 0 & 0 & 0 & 0 & 0 \\
1 & 1 & 0 & 1 & 1 & 0 & 1 & 0 & 1 & 0 & 0 & 0 & 0 & 0 & 0 & 0 & 0 & 0 & 0 & 0 \\
1 & 0 & 1 & 1 & 0 & 1 & 0 & 0 & 1 & 0 & 0 & 0 & 1 & 0 & 0 & 0 & 1 & 0 & 1 & 0 \\
0 & 1 & 1 & 0 & 1 & 1 & 0 & 0 & 1 & 0 & 1 & 0 & 0 & 0 & 0 & 0 & 1 & 1 & 0 & 0 \\
1 & 0 & 1 & 0 & 1 & 0 & 1 & 0 & 1 & 0 & 1 & 0 & 1 & 0 & 1 & 0 & 0 & 0 & 0 & 0 \\
0 & 0 & 1 & 1 & 1 & 1 & 1 & 1 & 1 & 1 & 0 & 0 & 0 & 0 & 0 & 0 & 0 & 0 & 0 & 0 \\
1 & 1 & 0 & 0 & 1 & 1 & 0 & 0 & 1 & 1 & 0 & 0 & 1 & 1 & 0 & 0 & 0 & 0 & 0 & 0 \\
1 & 1 & 1 & 1 & 0 & 0 & 0 & 0 & 1 & 1 & 1 & 1 & 0 & 0 & 0 & 0 & 0 & 0 & 0 & 0 \\
1 & 1 & 1 & 1 & 1 & 1 & 1 & 1 & 0 & 0 & 0 & 0 & 0 & 0 & 0 & 0 & 1 & 1 & 1 & 1 \\
1 & 1 & 1 & 1 & 1 & 1 & 1 & 1 & 1 & 1 & 1 & 1 & 1 & 1 & 1 & 1 & 0 & 0 & 0 & 0
\end{pmatrix}; \text{ or}$$

$$K_{21} = \begin{pmatrix}
1 & 0 & 0 & 0 & 0 & 0 & 0 & 0 & 0 & 0 & 0 & 0 & 0 & 0 & 0 & 0 & 0 & 0 & 0 & 0 & 0 \\
1 & 0 & 0 & 0 & 0 & 0 & 0 & 0 & 1 & 0 & 0 & 0 & 0 & 0 & 0 & 0 & 0 & 0 & 0 & 0 & 0 \\
1 & 0 & 1 & 0 & 0 & 0 & 0 & 0 & 0 & 0 & 0 & 0 & 0 & 0 & 0 & 0 & 0 & 0 & 0 & 0 & 0 \\
1 & 1 & 0 & 0 & 0 & 0 & 0 & 0 & 0 & 0 & 0 & 0 & 0 & 0 & 0 & 0 & 0 & 0 & 0 & 0 & 0 \\
1 & 0 & 0 & 0 & 0 & 1 & 0 & 0 & 0 & 0 & 0 & 0 & 0 & 0 & 0 & 0 & 0 & 0 & 0 & 0 & 0 \\
0 & 1 & 0 & 1 & 0 & 0 & 0 & 0 & 0 & 0 & 0 & 0 & 0 & 0 & 0 & 0 & 0 & 0 & 0 & 0 & 0 \\
1 & 1 & 1 & 0 & 1 & 0 & 0 & 0 & 0 & 0 & 0 & 0 & 0 & 0 & 0 & 0 & 0 & 0 & 0 & 0 & 0 \\
0 & 0 & 1 & 1 & 1 & 0 & 1 & 0 & 0 & 0 & 0 & 0 & 0 & 0 & 0 & 0 & 0 & 0 & 0 & 0 & 0 \\
0 & 1 & 0 & 0 & 1 & 0 & 0 & 1 & 0 & 1 & 0 & 0 & 0 & 0 & 0 & 0 & 0 & 0 & 0 & 0 & 0 \\
0 & 0 & 0 & 1 & 0 & 1 & 1 & 1 & 0 & 0 & 0 & 0 & 0 & 0 & 0 & 0 & 0 & 0 & 0 & 0 & 0 \\
1 & 0 & 1 & 0 & 1 & 0 & 1 & 0 & 0 & 0 & 1 & 0 & 0 & 0 & 1 & 0 & 0 & 0 & 0 & 0 & 0 \\
1 & 1 & 1 & 0 & 0 & 0 & 0 & 0 & 1 & 1 & 0 & 0 & 0 & 1 & 0 & 0 & 0 & 0 & 0 & 0 & 0 \\
1 & 0 & 1 & 1 & 0 & 0 & 1 & 1 & 0 & 0 & 0 & 1 & 0 & 0 & 0 & 0 & 0 & 0 & 0 & 0 & 0 \\
1 & 0 & 0 & 1 & 0 & 0 & 0 & 0 & 1 & 1 & 0 & 1 & 1 & 0 & 0 & 0 & 0 & 0 & 0 & 0 & 0 \\
1 & 0 & 1 & 0 & 0 & 0 & 1 & 0 & 1 & 0 & 1 & 1 & 1 & 0 & 0 & 0 & 1 & 0 & 0 & 0 & 0 \\
1 & 0 & 1 & 0 & 1 & 0 & 0 & 1 & 0 & 1 & 0 & 1 & 0 & 1 & 0 & 1 & 0 & 0 & 0 & 0 & 0 \\
1 & 1 & 0 & 1 & 0 & 1 & 0 & 1 & 1 & 1 & 1 & 0 & 0 & 0 & 0 & 0 & 0 & 0 & 0 & 0 & 0 \\
1 & 1 & 1 & 0 & 0 & 1 & 1 & 0 & 0 & 1 & 1 & 0 & 0 & 1 & 1 & 0 & 0 & 0 & 0 & 1 & 0 \\
1 & 1 & 1 & 1 & 1 & 0 & 0 & 0 & 0 & 1 & 1 & 1 & 1 & 0 & 0 & 0 & 0 & 0 & 1 & 0 & 0 \\
1 & 1 & 1 & 1 & 1 & 1 & 1 & 1 & 1 & 0 & 0 & 0 & 0 & 0 & 0 & 0 & 0 & 0 & 1 & 1 & 1 \\
1 & 1 & 1 & 1 & 1 & 1 & 1 & 1 & 1 & 1 & 1 & 1 & 1 & 1 & 1 & 1 & 1 & 1 & 0 & 0 & 0
\end{pmatrix}; \text{ or}$$

$$K'_{21} = \begin{pmatrix}
1 & 0 & 0 & 0 & 0 & 0 & 0 & 0 & 0 & 0 & 0 & 0 & 0 & 0 & 0 & 0 & 0 & 0 & 0 & 0 & 0 \\
1 & 0 & 0 & 0 & 0 & 1 & 0 & 0 & 0 & 0 & 0 & 0 & 0 & 0 & 0 & 0 & 0 & 0 & 0 & 0 & 0 \\
1 & 0 & 0 & 1 & 0 & 0 & 0 & 0 & 0 & 0 & 0 & 0 & 0 & 0 & 0 & 0 & 0 & 0 & 0 & 0 & 0 \\
1 & 0 & 0 & 0 & 1 & 0 & 0 & 0 & 0 & 0 & 0 & 0 & 0 & 0 & 0 & 0 & 0 & 0 & 0 & 0 & 0 \\
1 & 0 & 1 & 0 & 0 & 0 & 0 & 0 & 0 & 0 & 0 & 0 & 0 & 0 & 0 & 0 & 0 & 0 & 0 & 0 & 0 \\
1 & 1 & 0 & 0 & 0 & 0 & 0 & 0 & 0 & 0 & 0 & 0 & 0 & 0 & 0 & 0 & 0 & 0 & 0 & 0 & 0 \\
1 & 0 & 0 & 1 & 1 & 0 & 0 & 1 & 0 & 0 & 0 & 0 & 0 & 0 & 0 & 0 & 0 & 0 & 0 & 0 & 0 \\
0 & 0 & 1 & 1 & 1 & 0 & 0 & 0 & 1 & 0 & 0 & 0 & 0 & 0 & 0 & 0 & 0 & 0 & 0 & 0 & 0 \\
0 & 0 & 1 & 0 & 0 & 1 & 1 & 1 & 0 & 0 & 0 & 0 & 0 & 0 & 0 & 0 & 0 & 0 & 0 & 0 & 0 \\
0 & 1 & 1 & 0 & 1 & 0 & 1 & 1 & 0 & 0 & 0 & 0 & 0 & 0 & 1 & 0 & 0 & 0 & 0 & 0 & 0 \\
1 & 0 & 0 & 0 & 0 & 0 & 0 & 0 & 0 & 1 & 1 & 1 & 0 & 0 & 0 & 0 & 0 & 0 & 0 & 0 & 0 \\
0 & 1 & 1 & 1 & 0 & 1 & 1 & 0 & 0 & 0 & 0 & 0 & 1 & 0 & 0 & 0 & 0 & 0 & 0 & 0 & 0 \\
0 & 1 & 0 & 0 & 0 & 1 & 1 & 1 & 0 & 1 & 0 & 0 & 0 & 1 & 0 & 0 & 0 & 0 & 0 & 0 & 0 \\
1 & 0 & 1 & 1 & 0 & 1 & 0 & 1 & 0 & 0 & 1 & 0 & 0 & 0 & 0 & 0 & 0 & 0 & 0 & 0 & 0 \\
1 & 1 & 0 & 0 & 1 & 1 & 0 & 0 & 1 & 0 & 0 & 0 & 1 & 0 & 1 & 0 & 1 & 0 & 0 & 0 & 0 \\
1 & 0 & 1 & 1 & 0 & 1 & 0 & 0 & 1 & 0 & 1 & 0 & 1 & 1 & 0 & 0 & 1 & 0 & 1 & 0 & 0 \\
0 & 0 & 0 & 0 & 0 & 1 & 1 & 0 & 1 & 1 & 0 & 0 & 1 & 1 & 1 & 1 & 0 & 0 & 0 & 0 & 0 \\
1 & 1 & 0 & 0 & 0 & 1 & 1 & 0 & 1 & 1 & 1 & 1 & 0 & 0 & 0 & 0 & 0 & 0 & 0 & 0 & 0 \\
1 & 1 & 1 & 1 & 1 & 0 & 0 & 0 & 1 & 1 & 0 & 0 & 0 & 0 & 0 & 0 & 0 & 0 & 0 & 0 & 1 \\
1 & 1 & 1 & 1 & 1 & 1 & 1 & 1 & 0 & 0 & 0 & 0 & 0 & 0 & 0 & 0 & 0 & 0 & 1 & 1 & 0 \\
1 & 1 & 1 & 1 & 1 & 1 & 1 & 1 & 1 & 1 & 1 & 1 & 1 & 1 & 1 & 1 & 1 & 1 & 0 & 0 & 0
\end{pmatrix}; \text{ or}$$

-continued $$K_{24} = \begin{pmatrix}
1&0&0&0&0&0&0&0&0&0&0&0&0&0&0&0&0&0&0&0&0&0&0&0\\
1&0&0&0&0&0&0&0&0&0&0&0&0&0&0&0&1&0&0&0&0&0&0&0\\
1&0&0&0&0&0&0&0&1&0&0&0&0&0&0&0&0&0&0&0&0&0&0&0\\
1&0&0&0&0&0&0&0&1&0&0&0&0&0&0&0&1&0&0&0&1&0&0&0\\
1&0&1&0&0&0&0&0&0&0&0&0&0&0&0&0&0&0&0&0&0&0&0&0\\
1&0&1&0&0&0&0&0&1&0&0&0&1&0&0&0&0&0&0&0&0&0&0&0\\
1&0&0&0&1&0&0&0&0&0&0&0&0&0&0&0&0&0&0&0&0&0&0&0\\
1&0&0&0&1&0&0&0&1&0&1&0&0&0&0&0&0&0&0&0&0&0&0&0\\
1&0&1&0&0&0&0&0&1&0&1&0&0&0&0&0&1&0&1&0&0&0&0&0\\
1&1&0&0&0&0&0&0&0&0&0&0&0&0&0&0&0&0&0&0&0&0&0&0\\
1&1&0&0&0&0&0&0&1&1&0&0&0&0&0&0&0&0&0&0&0&0&0&0\\
1&0&1&0&1&0&1&0&0&0&0&0&0&0&0&0&0&0&0&0&0&0&0&0\\
1&0&1&0&1&0&1&0&1&1&0&0&0&0&0&0&1&1&0&0&0&0&0&0\\
0&1&1&0&1&0&1&0&0&1&1&0&1&0&1&0&0&0&0&0&0&0&0&0\\
1&0&1&0&1&0&1&0&1&0&1&0&1&0&1&0&1&0&1&0&1&0&1&0\\
1&1&0&0&1&1&0&0&0&0&0&0&0&0&0&0&0&0&0&0&0&0&0&0\\
1&1&1&1&0&0&0&0&0&0&0&0&0&0&0&0&0&0&0&0&0&0&0&0\\
0&0&1&1&1&1&0&0&1&1&0&0&1&1&0&0&0&0&0&0&0&0&0&0\\
1&1&0&0&1&1&0&0&1&1&1&1&0&0&0&0&0&0&0&0&0&0&0&0\\
1&1&0&0&1&1&0&0&1&1&0&0&1&1&0&0&1&1&0&0&1&1&0&0\\
1&1&1&1&0&0&0&0&1&1&1&1&0&0&0&0&1&1&1&1&0&0&0&0\\
1&1&1&1&1&1&1&1&0&0&0&0&0&0&0&0&0&0&0&0&0&0&0&0\\
1&1&1&1&1&1&1&1&0&0&0&0&0&0&0&0&1&1&1&1&1&1&1&1\\
1&1&1&1&1&1&1&1&1&1&1&1&1&1&1&1&0&0&0&0&0&0&0&0
\end{pmatrix}; \text{or}$$

$$K'_{24} = \begin{pmatrix}
1&0&0&0&0&0&0&0&0&0&0&0&0&0&0&0&0&0&0&0&0&0&0&0\\
1&0&0&0&0&0&0&0&0&0&0&0&0&0&0&1&0&0&0&0&0&0&0&0\\
1&0&0&0&0&0&0&0&1&0&0&0&0&0&0&0&0&0&0&0&0&0&0&0\\
1&0&0&0&1&0&0&0&0&0&0&0&0&0&0&0&0&0&0&0&0&0&0&0\\
1&0&1&0&0&0&0&0&0&0&0&0&0&0&0&0&0&0&0&0&0&0&0&0\\
1&0&0&0&1&0&0&0&1&0&0&0&1&0&0&0&0&0&0&0&0&0&0&0\\
1&0&1&0&0&0&0&0&1&0&1&0&0&0&0&0&0&0&0&0&0&0&0&0\\
1&1&0&0&0&0&0&0&0&0&0&0&0&0&0&0&0&0&0&0&0&0&0&0\\
1&1&0&0&0&0&0&0&1&1&0&0&0&0&0&0&0&0&0&0&0&0&0&0\\
1&0&1&0&1&0&1&0&0&0&0&0&0&0&0&0&0&0&0&0&0&0&0&0\\
1&0&0&0&1&0&0&0&1&0&1&0&0&0&0&0&1&0&1&0&0&0&0&0\\
1&1&0&0&1&1&0&0&0&0&0&0&0&0&0&0&0&0&0&0&0&0&0&0\\
0&0&0&0&0&1&1&0&1&1&1&0&1&0&0&0&1&0&0&0&1&0&0&0\\
1&0&1&0&1&0&1&0&1&1&0&0&0&0&0&0&1&1&0&0&0&0&0&0\\
0&1&1&0&1&0&1&0&0&1&1&0&1&0&1&0&0&0&0&0&0&0&0&0\\
1&0&1&0&1&0&1&0&1&0&1&0&1&0&1&0&1&0&1&0&1&0&1&0\\
1&1&1&1&0&0&0&0&0&0&0&0&0&0&0&0&0&0&0&0&0&0&0&0\\
0&0&1&1&1&1&0&0&1&1&0&0&1&1&0&0&0&0&0&0&0&0&0&0\\
1&1&0&0&1&1&0&0&1&1&1&1&0&0&0&0&0&0&0&0&0&0&0&0\\
1&1&0&0&1&1&0&0&1&1&0&0&1&1&0&0&1&1&0&0&1&1&0&0\\
1&1&1&1&1&1&1&1&0&0&0&0&0&0&0&0&0&0&0&0&0&0&0&0\\
1&1&1&1&0&0&0&0&1&1&1&1&0&0&0&0&1&1&1&1&0&0&0&0\\
1&1&1&1&1&1&1&1&0&0&0&0&0&0&0&0&1&1&1&1&1&1&1&1\\
1&1&1&1&1&1&1&1&1&1&1&1&1&1&1&1&0&0&0&0&0&0&0&0
\end{pmatrix}; \text{or}$$

-continued $$K''_{24} = \begin{pmatrix}
1 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 \\
1 & 0 & 0 & 0 & 0 & 0 & 0 & 0 & 0 & 0 & 0 & 0 & 0 & 0 & 0 & 0 & 0 & 1 & 0 & 0 & 0 & 0 & 0 & 0 \\
1 & 0 & 1 & 0 & 0 & 0 & 0 & 0 & 0 & 0 & 0 & 0 & 0 & 0 & 0 & 0 & 0 & 0 & 0 & 0 & 0 & 0 & 0 & 0 \\
1 & 0 & 0 & 0 & 1 & 0 & 0 & 0 & 0 & 0 & 0 & 0 & 0 & 0 & 0 & 0 & 0 & 0 & 0 & 0 & 0 & 0 & 0 & 0 \\
1 & 0 & 0 & 0 & 0 & 0 & 0 & 0 & 1 & 0 & 0 & 0 & 0 & 0 & 0 & 0 & 0 & 0 & 0 & 0 & 0 & 0 & 0 & 0 \\
1 & 1 & 0 & 0 & 0 & 0 & 0 & 0 & 0 & 0 & 0 & 0 & 0 & 0 & 0 & 0 & 0 & 0 & 0 & 0 & 0 & 0 & 0 & 0 \\
1 & 0 & 0 & 0 & 1 & 0 & 0 & 0 & 1 & 0 & 0 & 0 & 1 & 0 & 0 & 0 & 0 & 0 & 0 & 0 & 0 & 0 & 0 & 0 \\
1 & 0 & 1 & 0 & 0 & 0 & 0 & 0 & 1 & 0 & 1 & 0 & 0 & 0 & 0 & 0 & 0 & 0 & 0 & 0 & 0 & 0 & 0 & 0 \\
1 & 1 & 0 & 0 & 0 & 0 & 0 & 0 & 1 & 1 & 0 & 0 & 0 & 0 & 0 & 0 & 0 & 0 & 0 & 0 & 0 & 0 & 0 & 0 \\
1 & 0 & 1 & 0 & 1 & 0 & 1 & 0 & 0 & 0 & 0 & 0 & 0 & 0 & 0 & 0 & 0 & 0 & 0 & 0 & 0 & 0 & 0 & 0 \\
1 & 1 & 0 & 0 & 1 & 1 & 0 & 0 & 0 & 0 & 0 & 0 & 0 & 0 & 0 & 0 & 0 & 0 & 0 & 0 & 0 & 0 & 0 & 0 \\
1 & 1 & 1 & 1 & 0 & 0 & 0 & 0 & 0 & 0 & 0 & 0 & 0 & 0 & 0 & 0 & 0 & 0 & 0 & 0 & 0 & 0 & 0 & 0 \\
0 & 0 & 0 & 0 & 0 & 1 & 1 & 0 & 1 & 1 & 1 & 0 & 1 & 0 & 0 & 0 & 1 & 0 & 0 & 0 & 1 & 0 & 0 & 0 \\
0 & 1 & 1 & 1 & 0 & 0 & 1 & 0 & 1 & 0 & 0 & 0 & 1 & 0 & 0 & 0 & 1 & 0 & 1 & 0 & 0 & 0 & 0 & 0 \\
1 & 0 & 1 & 0 & 1 & 0 & 1 & 0 & 1 & 1 & 0 & 0 & 0 & 0 & 0 & 0 & 1 & 1 & 0 & 0 & 0 & 0 & 0 & 0 \\
0 & 1 & 1 & 0 & 1 & 0 & 1 & 0 & 0 & 1 & 1 & 0 & 1 & 0 & 1 & 0 & 0 & 0 & 0 & 0 & 0 & 0 & 0 & 0 \\
0 & 0 & 1 & 1 & 1 & 1 & 0 & 0 & 1 & 1 & 0 & 0 & 1 & 1 & 0 & 0 & 0 & 0 & 0 & 0 & 0 & 0 & 0 & 0 \\
1 & 1 & 0 & 0 & 1 & 1 & 0 & 0 & 1 & 1 & 1 & 1 & 0 & 0 & 0 & 0 & 0 & 0 & 0 & 0 & 0 & 0 & 0 & 0 \\
1 & 1 & 1 & 1 & 1 & 1 & 1 & 1 & 0 & 0 & 0 & 0 & 0 & 0 & 0 & 0 & 0 & 0 & 0 & 0 & 0 & 0 & 0 & 0 \\
1 & 0 & 1 & 0 & 1 & 0 & 1 & 0 & 1 & 0 & 1 & 0 & 1 & 0 & 1 & 0 & 1 & 0 & 1 & 0 & 1 & 0 & 1 & 0 \\
1 & 1 & 0 & 0 & 1 & 1 & 0 & 0 & 1 & 1 & 0 & 0 & 1 & 1 & 0 & 0 & 1 & 1 & 0 & 0 & 1 & 1 & 0 & 0 \\
1 & 1 & 1 & 1 & 0 & 0 & 0 & 0 & 1 & 1 & 1 & 1 & 0 & 0 & 0 & 0 & 1 & 1 & 1 & 1 & 0 & 0 & 0 & 0 \\
1 & 1 & 1 & 1 & 1 & 1 & 1 & 1 & 0 & 0 & 0 & 0 & 0 & 0 & 0 & 0 & 1 & 1 & 1 & 1 & 1 & 1 & 1 & 1 \\
1 & 1 & 1 & 1 & 1 & 1 & 1 & 1 & 1 & 1 & 1 & 1 & 1 & 1 & 1 & 1 & 0 & 0 & 0 & 0 & 0 & 0 & 0 & 0
\end{pmatrix}; \text{or}$$

$$K_{25} = \begin{pmatrix}
1 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 \\
1 & 0 & 0 & 0 & 0 & 0 & 0 & 1 & 0 & 0 & 0 & 0 & 0 & 0 & 0 & 0 & 0 & 0 & 0 & 0 & 0 & 0 & 0 & 0 & 0 \\
1 & 0 & 0 & 0 & 1 & 0 & 0 & 0 & 0 & 0 & 0 & 0 & 0 & 0 & 0 & 0 & 0 & 0 & 0 & 0 & 0 & 0 & 0 & 0 & 0 \\
1 & 1 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 \\
0 & 1 & 0 & 0 & 0 & 1 & 0 & 0 & 0 & 0 & 0 & 0 & 0 & 0 & 0 & 0 & 0 & 0 & 0 & 0 & 0 & 0 & 0 & 0 & 0 \\
0 & 1 & 1 & 0 & 0 & 0 & 0 & 0 & 0 & 0 & 0 & 0 & 0 & 0 & 0 & 0 & 0 & 0 & 0 & 0 & 0 & 0 & 0 & 0 & 0 \\
0 & 0 & 1 & 0 & 1 & 0 & 0 & 1 & 0 & 0 & 0 & 0 & 1 & 0 & 0 & 0 & 0 & 0 & 0 & 0 & 0 & 0 & 0 & 0 & 0 \\
1 & 0 & 1 & 0 & 1 & 0 & 0 & 0 & 0 & 0 & 0 & 1 & 0 & 0 & 0 & 0 & 0 & 0 & 0 & 0 & 0 & 0 & 0 & 0 & 0 \\
0 & 0 & 0 & 1 & 1 & 0 & 0 & 0 & 0 & 0 & 0 & 0 & 0 & 1 & 1 & 0 & 0 & 0 & 0 & 0 & 0 & 0 & 0 & 0 & 0 \\
1 & 1 & 0 & 0 & 0 & 1 & 1 & 0 & 0 & 0 & 0 & 0 & 0 & 0 & 0 & 0 & 0 & 0 & 0 & 0 & 0 & 0 & 0 & 0 & 0 \\
1 & 1 & 1 & 1 & 0 & 0 & 0 & 0 & 0 & 0 & 0 & 0 & 0 & 0 & 0 & 0 & 0 & 0 & 0 & 0 & 0 & 0 & 0 & 0 & 0 \\
0 & 1 & 0 & 1 & 0 & 0 & 1 & 0 & 0 & 0 & 0 & 0 & 1 & 0 & 0 & 1 & 1 & 0 & 0 & 0 & 0 & 0 & 0 & 0 & 0 \\
0 & 0 & 0 & 0 & 0 & 1 & 1 & 1 & 0 & 0 & 0 & 1 & 0 & 1 & 0 & 0 & 1 & 0 & 0 & 0 & 0 & 0 & 0 & 0 & 0 \\
1 & 0 & 0 & 0 & 1 & 1 & 1 & 1 & 0 & 1 & 0 & 0 & 0 & 0 & 0 & 0 & 0 & 0 & 0 & 0 & 0 & 0 & 0 & 0 & 0 \\
1 & 1 & 1 & 0 & 1 & 0 & 0 & 1 & 1 & 0 & 0 & 0 & 0 & 0 & 0 & 0 & 0 & 0 & 0 & 0 & 0 & 0 & 0 & 0 & 0 \\
0 & 1 & 0 & 1 & 0 & 0 & 1 & 1 & 0 & 1 & 0 & 1 & 0 & 0 & 0 & 0 & 1 & 0 & 0 & 0 & 0 & 1 & 0 & 0 & 0 \\
0 & 0 & 1 & 0 & 1 & 1 & 0 & 1 & 1 & 1 & 0 & 0 & 1 & 0 & 1 & 0 & 0 & 0 & 0 & 0 & 0 & 0 & 0 & 0 & 0 \\
1 & 1 & 1 & 1 & 1 & 1 & 1 & 0 & 0 & 0 & 1 & 0 & 0 & 0 & 0 & 0 & 0 & 0 & 0 & 0 & 0 & 0 & 0 & 0 & 0 \\
1 & 1 & 0 & 0 & 1 & 0 & 1 & 0 & 1 & 1 & 0 & 1 & 0 & 1 & 1 & 0 & 0 & 0 & 0 & 1 & 0 & 0 & 0 & 0 & 0 \\
1 & 0 & 1 & 1 & 0 & 1 & 1 & 1 & 1 & 1 & 0 & 1 & 0 & 0 & 0 & 0 & 0 & 0 & 1 & 0 & 0 & 0 & 0 & 0 & 0 \\
1 & 1 & 0 & 1 & 0 & 1 & 0 & 1 & 0 & 1 & 0 & 1 & 0 & 1 & 0 & 1 & 0 & 0 & 0 & 1 & 0 & 1 & 0 & 1 & 0 \\
1 & 1 & 1 & 0 & 0 & 1 & 1 & 0 & 0 & 1 & 1 & 0 & 0 & 1 & 1 & 0 & 0 & 0 & 1 & 0 & 0 & 1 & 1 & 0 & 0 \\
1 & 1 & 1 & 1 & 1 & 0 & 0 & 0 & 0 & 1 & 1 & 1 & 1 & 0 & 0 & 0 & 0 & 0 & 1 & 1 & 1 & 0 & 0 & 0 & 0 \\
1 & 1 & 1 & 1 & 1 & 1 & 1 & 1 & 1 & 0 & 0 & 0 & 0 & 0 & 0 & 0 & 0 & 0 & 1 & 1 & 1 & 1 & 1 & 1 & 1 \\
1 & 1 & 1 & 1 & 1 & 1 & 1 & 1 & 1 & 1 & 1 & 1 & 1 & 1 & 1 & 1 & 1 & 1 & 0 & 0 & 0 & 0 & 0 & 0 & 0
\end{pmatrix}; \text{or}$$

-continued $$K'_{25} = \begin{pmatrix}
1&0&0&0&0&0&0&0&0&0&0&0&0&0&0&0&0&0&0&0&0&0&0&0&0\\
1&0&0&0&1&0&0&0&0&0&0&0&0&0&0&0&0&0&0&0&0&0&0&0&0\\
1&1&0&0&0&0&0&0&0&0&0&0&0&0&0&0&0&0&0&0&0&0&0&0&0\\
1&0&1&0&0&0&0&0&0&0&0&0&0&0&0&0&0&0&0&0&0&0&0&0&0\\
1&0&0&0&0&0&0&0&0&1&0&0&0&0&0&0&0&0&0&0&0&0&0&0&0\\
0&0&1&0&1&0&0&0&1&1&0&0&0&0&0&0&0&0&0&0&0&0&0&0&0\\
1&1&0&0&0&0&0&0&1&0&0&0&0&0&0&0&1&0&0&0&0&0&0&0&0\\
1&0&1&0&0&0&0&0&1&0&0&0&1&0&0&0&0&0&0&0&0&0&0&0&0\\
1&0&0&0&0&0&0&0&1&0&1&0&0&0&0&0&0&0&0&0&0&0&1&0&0\\
0&1&1&0&1&0&1&0&0&0&0&0&0&0&0&0&0&0&0&0&0&0&0&0&0\\
1&1&0&0&1&1&0&0&0&0&0&0&0&0&0&0&0&0&0&0&0&0&0&0&0\\
1&1&1&1&0&0&0&0&0&0&0&0&0&0&0&0&0&0&0&0&0&0&0&0&0\\
0&0&0&1&1&1&1&0&1&0&1&0&0&0&0&0&1&0&0&0&0&0&0&0&1\\
0&1&1&0&1&1&0&0&0&0&1&0&1&0&0&0&1&0&0&0&1&0&0&0&0\\
1&1&0&1&1&0&0&0&1&0&0&0&1&0&0&0&1&0&1&0&0&0&0&0&0\\
0&1&1&0&1&0&1&0&1&1&0&0&0&0&0&0&1&1&0&0&0&0&0&0&0\\
1&0&1&0&1&0&1&0&1&0&1&0&1&0&1&0&0&0&0&0&0&0&0&0&0\\
0&0&1&1&1&1&0&0&1&1&0&0&1&1&0&0&0&0&0&0&0&0&0&0&0\\
1&1&0&0&1&1&0&0&1&1&1&1&0&0&0&0&0&0&0&0&0&0&0&0&0\\
1&1&1&1&1&1&1&1&1&0&0&0&0&0&0&0&0&0&0&0&0&0&0&0&0\\
1&1&0&0&1&1&0&0&1&1&0&0&1&1&0&0&1&1&0&0&1&1&0&0&0\\
1&1&1&1&0&0&0&0&1&1&1&1&0&0&0&0&1&1&1&1&0&0&0&0&0\\
1&1&1&1&1&1&1&1&0&0&0&0&0&0&0&0&1&1&1&1&1&1&1&1&0\\
1&1&1&1&1&1&1&1&1&1&1&1&1&1&1&1&0&0&0&0&0&0&0&0&0
\end{pmatrix}; \text{ or}$$

$$K_{28} = \begin{pmatrix}
1&0&0&0&0&0&0&0&0&0&0&0&0&0&0&0&0&0&0&0&0&0&0&0&0&0&0&0\\
1&0&0&0&0&0&0&0&0&0&0&0&0&0&0&0&1&0&0&0&0&0&0&0&0&0&0&0\\
1&0&0&0&0&0&0&0&1&0&0&0&0&0&0&0&0&0&0&0&0&0&0&0&0&0&0&0\\
1&0&0&0&0&0&0&0&1&0&0&0&0&0&0&0&1&0&0&0&1&0&0&0&0&0&0&0\\
1&0&0&0&1&0&0&0&0&0&0&0&0&0&0&0&0&0&0&0&0&0&0&0&0&0&0&0\\
1&0&0&0&1&0&0&0&0&0&0&0&0&0&0&0&1&0&1&0&0&0&0&0&0&0&0&0\\
1&0&1&0&0&0&0&0&0&0&0&0&0&0&0&0&0&0&0&0&0&0&0&0&0&0&0&0\\
0&0&0&0&0&0&0&0&1&0&1&0&0&0&0&0&0&0&0&0&1&0&1&0&0&0&0&0\\
1&0&0&0&1&0&0&0&0&0&1&0&1&0&0&0&0&0&0&0&1&0&1&0&0&0&0&0\\
1&0&0&0&1&0&0&0&1&0&0&0&1&0&0&0&1&0&1&0&1&0&0&0&1&0&0&0\\
1&1&0&0&0&0&0&0&0&0&0&0&0&0&0&0&0&0&0&0&0&0&0&0&0&0&0&0\\
1&1&0&0&0&0&0&0&0&0&0&0&0&0&0&0&1&1&0&0&0&0&0&0&0&0&0&0\\
0&1&1&0&0&0&0&0&1&0&1&0&0&0&0&0&1&1&0&0&0&0&0&0&0&0&0&0\\
1&0&1&0&1&0&1&0&0&0&0&0&0&0&0&0&0&0&0&0&0&0&0&0&0&0&0&0\\
0&1&1&0&1&0&1&0&1&1&0&0&0&0&0&0&0&0&0&0&0&0&0&0&0&0&0&0\\
1&1&0&0&0&0&0&0&1&1&0&0&0&0&0&0&1&1&0&0&1&1&0&0&0&0&0&0\\
1&1&0&0&0&0&0&0&0&1&1&0&1&0&1&0&1&1&0&0&0&1&1&0&1&0&1&0\\
1&1&0&0&1&1&0&0&0&0&0&0&0&0&0&0&0&0&0&0&0&0&0&0&0&0&0&0\\
1&1&0&0&1&1&0&0&0&0&0&0&0&0&0&0&1&1&1&1&0&0&0&0&0&0&0&0\\
0&1&1&0&0&1&1&0&1&0&1&0&1&0&1&0&1&1&1&1&0&0&0&0&0&0&0&0\\
1&1&1&1&0&0&0&0&0&0&0&0&0&0&0&0&0&0&0&0&0&0&0&0&0&0&0&0\\
0&0&0&0&0&0&0&0&1&1&1&1&0&0&0&0&0&0&0&0&1&1&1&1&0&0&0&0\\
1&1&0&0&1&1&0&0&0&0&1&1&1&1&0&0&0&0&0&0&1&1&1&1&0&0&0&0\\
1&1&0&0&1&1&0&0&1&1&0&0&1&1&0&0&1&1&1&1&1&1&0&0&1&1&0&0\\
1&1&1&1&0&0&0&0&1&1&1&1&0&0&0&0&0&0&0&0&0&0&0&0&0&0&0&0\\
1&1&1&1&1&1&1&1&0&0&0&0&0&0&0&0&0&0&0&0&0&0&0&0&0&0&0&0\\
0&0&0&0&0&0&0&0&1&1&1&1&1&1&1&1&0&0&0&0&1&1&1&1&1&1&1&1\\
1&1&1&1&1&1&1&1&1&1&1&1&1&1&1&1&0&0&0&0&0&0&0&0&0&0&0&0
\end{pmatrix}; \text{ or}$$

-continued $$K_{32}=\begin{pmatrix}
1&0&0&0&0&0&0&0&0&0&0&0&0&0&0&0&0&0&0&0&0&0&0&0&0&0&0&0&0&0&0&0\\
1&0&0&0&0&0&0&0&0&0&0&0&0&0&0&0&1&0&0&0&0&0&0&0&0&0&0&0&0&0&0&0\\
1&0&0&0&0&0&0&0&1&0&0&0&0&0&0&0&0&0&0&0&0&0&0&0&0&0&0&0&0&0&0&0\\
1&0&0&0&0&0&0&0&1&0&0&0&0&0&0&0&1&0&0&0&0&0&0&0&1&0&0&0&0&0&0&0\\
1&0&0&0&1&0&0&0&0&0&0&0&0&0&0&0&0&0&0&0&0&0&0&0&0&0&0&0&0&0&0&0\\
1&0&0&0&1&0&0&0&0&0&0&0&0&0&0&0&1&0&0&0&1&0&0&0&0&0&0&0&0&0&0&0\\
1&0&1&0&0&0&0&0&0&0&0&0&0&0&0&0&0&0&0&0&0&0&0&0&0&0&0&0&0&0&0&0\\
1&0&1&0&0&0&0&0&0&0&0&0&0&0&0&0&1&0&1&0&0&0&0&0&0&0&0&0&0&0&0&0\\
0&0&1&0&1&0&0&0&1&0&0&0&1&0&0&0&1&0&1&0&0&0&0&0&0&0&0&0&0&0&0&0\\
1&0&0&0&1&0&0&0&1&0&0&0&1&0&0&0&1&0&0&0&1&0&0&0&1&0&0&0&1&0&0&0\\
1&1&0&0&0&0&0&0&0&0&0&0&0&0&0&0&0&0&0&0&0&0&0&0&0&0&0&0&0&0&0&0\\
1&1&0&0&0&0&0&0&0&0&0&0&0&0&0&0&1&1&0&0&0&0&0&0&0&0&0&0&0&0&0&0\\
0&1&1&0&0&0&0&0&1&0&1&0&0&0&0&0&1&1&0&0&0&0&0&0&0&0&0&0&0&0&0&0\\
1&0&1&0&0&0&0&0&1&0&1&0&0&0&0&0&1&0&1&0&0&0&0&0&1&0&1&0&0&0&0&0\\
1&0&1&0&1&0&1&0&0&0&0&0&0&0&0&0&0&0&0&0&0&0&0&0&0&0&0&0&0&0&0&0\\
0&1&1&0&1&0&1&0&1&1&0&0&0&0&0&0&0&0&0&0&0&0&0&0&0&0&0&0&0&0&0&0\\
1&1&0&0&0&0&0&0&1&1&0&0&0&0&0&0&1&1&0&0&0&0&0&0&1&1&0&0&0&0&0&0\\
0&1&1&0&1&0&1&0&1&1&0&0&0&0&0&0&0&1&1&0&1&0&1&0&1&1&0&0&0&0&0&0\\
1&1&0&0&1&1&0&0&0&0&0&0&0&0&0&0&0&0&0&0&0&0&0&0&0&0&0&0&0&0&0&0\\
1&1&0&0&1&1&0&0&0&0&0&0&0&0&0&0&1&1&0&0&1&1&0&0&0&0&0&0&0&0&0&0\\
0&1&1&0&0&1&1&0&1&0&1&0&1&0&1&0&1&1&0&0&1&1&0&0&0&0&0&0&0&0&0&0\\
1&0&1&0&1&0&1&0&1&0&1&0&1&0&1&0&1&0&1&0&1&0&1&0&1&0&1&0&1&0&1&0\\
1&1&1&1&0&0&0&0&0&0&0&0&0&0&0&0&0&0&0&0&0&0&0&0&0&0&0&0&0&0&0&0\\
1&1&1&1&0&0&0&0&0&0&0&0&0&0&0&0&1&1&1&1&0&0&0&0&0&0&0&0&0&0&0&0\\
0&0&1&1&1&1&0&0&1&1&0&0&1&1&0&0&1&1&1&1&0&0&0&0&0&0&0&0&0&0&0&0\\
1&1&0&0&1&1&0&0&1&1&0&0&1&1&0&0&1&1&0&0&1&1&0&0&1&1&0&0&1&1&0&0\\
1&1&1&1&0&0&0&0&1&1&1&1&0&0&0&0&0&0&0&0&0&0&0&0&0&0&0&0&0&0&0&0\\
1&1&1&1&0&0&0&0&1&1&1&1&0&0&0&0&1&1&1&1&0&0&0&0&1&1&1&1&0&0&0&0\\
1&1&1&1&1&1&1&1&0&0&0&0&0&0&0&0&0&0&0&0&0&0&0&0&0&0&0&0&0&0&0&0\\
1&1&1&1&1&1&1&1&0&0&0&0&0&0&0&0&1&1&1&1&1&1&1&1&0&0&0&0&0&0&0&0\\
1&1&1&1&1&1&1&1&1&1&1&1&1&1&1&1&0&0&0&0&0&0&0&0&0&0&0&0&0&0&0&0\\
1&1&1&1&1&1&1&1&1&1&1&1&1&1&1&1&1&1&1&1&1&1&1&1&1&1&1&1&1&1&1&1
\end{pmatrix}.$$

According to a second aspect, a decoding method is provided. The method is performed by a decoder device, or is performed by a chip, a chip system, or a circuit set in the decoder device. This is not limited in at least one embodiment.

The method includes: obtaining a to-be-decoded sequence; and decoding the to-be-decoded sequence based on a plurality of trellises, and reusing an intermediate result obtained from decoding performed based on a first trellis in the plurality of trellises in response to decoding being performed based on a second trellis in the plurality of trellises, where the first trellis is used for a $t^{th}$ stage of decoding the to-be-decoded sequence, the second trellis is used for a $(t+i)^{th}$ stage of decoding the to-be-decoded sequence, t is an integer greater than 0 or equal to 0, and i is an integer greater than 1 or equal to 1.

For example, the obtaining the to-be-decoded sequence represents receiving the to-be-decoded sequence from outside.

For example, the first trellis corresponds to the $t^{th}$ stage of decoding. In other words, in the $t^{th}$ stage of decoding, decoding is performed based on the first trellis; or in response to decoding being performed on an information bit of the to-be-decoded sequence, decoding is performed based on the first trellis. For example, the second trellis corresponds to the $(t+i)^{th}$ stage of decoding. In other words, in the $(t+i)^{th}$ stage of decoding, decoding is performed based on the second trellis; or in response to decoding being performed on another information bit of the to-be-decoded sequence, decoding is performed based on the second trellis.

For example, the intermediate result obtained through decoding performed based on the first trellis indicates a result obtained through processing based on the first trellis or a result obtained at the $t^{th}$ stage of decoding. The intermediate result includes, for example, a decoding path obtained through decoding performed based on the first trellis and a corresponding path measure value.

For example, a plurality of combinations are obtained after paths in a trellis of a smaller level are spliced, and an optimal path and a path value of a trellis of a larger level are obtained by selecting a path with a largest score in these combinations.

Based on the foregoing technical solution, in response to the to-be-decoded sequence being decoded according to a decoding algorithm based on the trellis, intermediate results obtained in different decoding stages is reused. In other words, in response to calculation being performed on different trellises, some calculation steps is the same. Therefore, reusing is performed for a plurality of times, so that decoding complexity is greatly reduced, and decoding speed is improved.

With reference to the second aspect, in some implementations of the second aspect, each of the plurality of trellises is split into a plurality of sub-trellises.

Based on the foregoing technical solution, in response to the to-be-decoded sequence being decoded according to a decoding algorithm based on the trellis, the trellis is first split, and decoding based on a complete trellis is split into decoding based on a sub-trellis, thereby reducing decoding complexity.

With reference to the second aspect, in some implementations of the second aspect, locations of split points of the plurality of sub-trellises are related to decoding complexity.

In other words, the location of the split point at which the trellis is split is related to decoding complexity.

Based on the foregoing technical solution, an appropriate location of the split point is selected based on an actual situation. The location of the split point affects decoding complexity. Therefore, some split points is selected, to reduce decoding complexity.

With reference to the second aspect, in some implementations of the second aspect, the method further includes: determining, based on a correlation between the first trellis and the second trellis, whether to reuse the intermediate result obtained through decoding performed based on the first trellis in response to decoding being performed based on the second trellis.

For example, the correlation between the first trellis and the second trellis indicates whether the first trellis is the same as or similar to the second trellis; or indicates whether a plurality of sub-trellises corresponding to the first trellis are the same as or similar to a plurality of sub-trellises corresponding to the second trellis; or indicates whether a same calculation step exists in response to the processing being performed based on the first trellis and the second trellis.

Based on the foregoing technical solution, whether the intermediate results obtained in different decoding stages is reused is determined based on the correlation between the trellises, for example, whether the first trellis is the same as or similar to the second trellis.

With reference to the second aspect, in some implementations of the second aspect, the decoding method further includes: determining, based on the following information, whether to reuse the intermediate result obtained through decoding performed based on the first trellis in response to decoding being performed based on the second trellis: a code obtained by performing a shortening operation on a linear code C in the $(t+i)^{th}$ stage of decoding and a code obtained by performing the shortening operation on the linear code C in the $t^{th}$ stage of decoding; and/or a code obtained by performing a puncturing operation on the linear code C in the $(t+i)^{th}$ stage of decoding and a code obtained by performing the puncturing operation on the linear code C in the $t^{th}$ stage of decoding.

Based on the foregoing technical solution, whether the intermediate results obtained in different decoding stages is reused is determined by comparing the code obtained by performing the shortening operation on the linear code C in different decoding stages and/or the code obtained by performing the puncturing operation on the linear code C in different decoding stages.

With reference to the second aspect, in some implementations of the second aspect, in response to $s_{x,y}(C^{(t+i)})=s_{x,y}(C^{(t)})$, and $p_{x,y}(C^{(t+i)})\subset p_{x,y}(C^{(t)})$, reusing the intermediate result obtained through decoding performed based on the first trellis in response to decoding being performed based on the second trellis; or in response to $s_{x,y}(C^{(t+i)})\subset s_{x,y}(C^{(t)})$, reusing the intermediate result obtained through decoding performed based on the first trellis in response to decoding being performed based on the second trellis, where $s_{x,y}(C^{(t+i)})$ indicates a code obtained by performing the shortening operation on the linear code C at a location except $x\leq z<y$ in the $(t+i)^{th}$ stage of decoding, $s_{x,y}(C^{(t)})$ indicates a code obtained by performing the shortening operation on the linear code C at the location except $x\leq z<y$ in the $t^{th}$ stage of decoding, $p_{x,y}(C^{(t+i)})$ indicates a code obtained by performing the puncturing operation on the linear code C at the location except $x\leq z<y$ in the $(t+i)^{th}$ stage of decoding, and $p_{x,y}(C^{(t)})$ indicates a code obtained by performing the puncturing operation on the linear code C at the location except $x\leq z<y$ in the $t^{th}$ stage of decoding.

Based on the foregoing technical solution, whether the intermediate results obtained in different decoding stages is reused is determined based on the foregoing conditions.

With reference to the second aspect, in some implementations of the second aspect, the reusing the intermediate result obtained through decoding performed based on the first trellis in response to decoding being performed based on the second trellis includes: in response to processing being performed based on the second trellis in the $(t+i)^{th}$ stage of decoding, directly using the intermediate result obtained through decoding performed based on the first trellis as an intermediate result obtained through decoding performed based on the second trellis; or in response to processing being performed based on the second trellis in the $(t+i)^{th}$ stage of decoding, performing processing based on a result of a maximization operation in a process of the first trellis.

With reference to the second aspect, in some implementations of the second aspect, decoding is polar decoding.

In other words, the to-be-decoded sequence is an obtained to-be-decoded sequence after the polar encoding.

Based on the foregoing technical solution, in response to the encoding being performed by using a high-dimensional kernel matrix and decoding is performed according to a conventional trellis algorithm, decoding complexity of a polar code decoder is high. In at least one embodiment, decoding complexity is reduced by performing the decoding on the sub-trellis. In addition, compared with a conventional solution in which encoding is performed by using an Arikan kernel and decoding is performed by using an SCL, lower decoding complexity is provided while the same performance is ensured in this solution.

According to a third aspect, at least one embodiment provides an encoding apparatus. The encoding apparatus has a function of implementing the method in any one of the first aspect and the implementations of the first aspect. The function is implemented by hardware, or is implemented by hardware executing corresponding software. The hardware or the software includes one or more units corresponding to the foregoing function.

In at least one embodiment, in response to some or all of the functions being implemented by hardware, the encoding apparatus includes: an input interface circuit, configured to obtain information bits; a logic circuit, configured to perform the encoding method in the first aspect to perform polar encoding on the information bits; and an output interface circuit, configured to output an encoded sequence.

Optionally, the encoding apparatus is a chip or an integrated circuit.

In at least one embodiment, in response to some or all of the functions being implemented by software, the encoding apparatus includes: a memory, configured to store a computer program; and a processor, configured to execute the computer program stored in the memory, where in response to the computer program being executed, the encoding apparatus implements the encoding method according to the first aspect.

Optionally, the memory is a physically independent unit, or is integrated with the processor.

In at least one embodiment, in response to some or all of the functions being implemented by using software, the encoding apparatus includes only a processor. The memory configured to store the program is located outside the encoding apparatus. The processor is connected to the memory by using a circuit/wire, and is configured to read and run the program stored in the memory, to perform the encoding method in the first aspect.

During specific implementation, the encoding apparatus is the chip or the integrated circuit.

According to a fourth aspect, at least one embodiment provides a decoding apparatus. The decoding apparatus has a function of implementing the method in any one of the second aspect and the implementations of the second aspect. The function is implemented by hardware, or is implemented by hardware executing corresponding software. The hardware or the software includes one or more units corresponding to the foregoing function.

In at least one embodiment, in response to some or all of the functions being implemented by hardware, the decoding apparatus includes: an input interface circuit, configured to obtain a to-be-decoded sequence; a logic circuit, configured to perform the decoding method in the second aspect to decode the to-be-decoded sequence to obtain a decoding result; and an output interface circuit, configured to output the decoding result.

Optionally, the decoding apparatus is a chip or an integrated circuit.

In at least one embodiment, in response to some or all of the functions being implemented by software, the decoding apparatus includes: a memory, configured to store a computer program; and a processor, configured to execute the computer program stored in the memory, where in response to the computer program being executed, the decoding apparatus implements the decoding method according to the second aspect.

Optionally, the memory is a physically independent unit, or is integrated with the processor.

In at least one embodiment, in response to some or all of the functions being implemented by using software, the decoding apparatus includes only a processor. The memory configured to store the program is located outside the decoding apparatus. The processor is connected to the memory by using a circuit/wire, and is configured to read and run the program stored in the memory, to perform the decoding method in the second aspect.

During specific implementation, the decoding apparatus is the chip or the integrated circuit.

According to a fifth aspect, at least one embodiment provides a network device, including a transceiver, a processor, and a memory. The processor is configured to control the transceiver to receive and send a signal, the memory is configured to store a computer program, and the processor is configured to invoke and run the computer program stored in the memory, so that the network device performs the method in any implementation of the first aspect.

In response to the network device serving as a transmit end of information and/or data, the network device performs the encoding method in the first aspect to encode sent information bits.

According to a sixth aspect, at least one embodiment provides a network device, including a transceiver, a processor, and a memory. The processor is configured to control the transceiver to receive and send a signal, the memory is configured to store a computer program, and the processor is configured to invoke and run the computer program stored in the memory, so that the network device performs the method in any implementation of the second aspect.

In response to the network device serving as a receive end of information and/or data, the network device performs the decoding method in the second aspect, to decode a to-be-decoded sequence received from a transmit end.

According to a seventh aspect, at least one embodiment provides a terminal device, including a transceiver, a processor, and a memory. The processor is configured to control the transceiver to receive and send a signal, the memory is configured to store a computer program, and the processor is configured to invoke and run the computer program stored in the memory, so that the terminal device performs the method in any implementation of the first aspect.

In response to the terminal device serving as a transmit end of information and/or data, the terminal device performs the encoding method in the first aspect to encode sent information bits.

According to an eighth aspect, at least one embodiment provides a terminal device, including a transceiver, a processor, and a memory. The processor is configured to control the transceiver to receive and send a signal, the memory is configured to store a computer program, and the processor is configured to invoke and run the computer program stored in the memory, so that the terminal device performs the method in any implementation of the second aspect.

In response to the terminal device serving as a receive end of information and/or data, the terminal device performs the decoding method in the second aspect, to decode a to-be-decoded sequence received from a transmit end.

According to a ninth aspect, at least one embodiment provides a computer-readable storage medium. The computer-readable storage medium stores instructions, and in response to the instructions are run on a computer, the computer is enabled to perform the method in any one of the implementations of the first aspect or the second aspect.

According to a tenth aspect, at least one embodiment provides a computer program product, where the computer program product includes a computer program code, and in response to the computer program code running on a computer, the computer is enabled to perform the method in any one of the implementations of the first aspect or the second aspect.

According to an eleventh aspect, at least one embodiment provides a chip, including a logic circuit and a communication interface, where the communication interface is configured to receive to-be-processed data and/or information, and transmit the to-be-processed data and/or information to the logic circuit, the logic circuit is configured to perform encoding, and the communication interface is further configured to output the processed data/information.

The chip is a chip set at a transmit end, and the to-be-processed data and/or information is information bits. The chip obtains information bits by using the communication interface, and transmits the information bits to the logic circuit. The logic circuit encodes the information bits by using the encoding method described in the first aspect. The chip outputs an encoded polar code by using the communication interface.

Optionally, the communication interface includes an input interface and an output interface. The input interface is configured to obtain the information bits, and the output interface is configured to output the encoded polar code.

Optionally, the chip is a chip set at a transmit end. The logic circuit is configured to generate the information bits, and encode the information bits by using the encoding method described in the first aspect. The chip outputs the encoded polar code by using the communication interface.

Optionally, the communication interface includes an input output interface. The input output interface is configured to output the encoded polar code.

According to a twelfth aspect, at least one embodiment provides a chip, including a logic circuit and a communication interface, where the communication interface is configured to receive to-be-processed data and/or information, and transmit the to-be-processed data and/or information to the logic circuit, the logic circuit is configured to perform decoding, and the communication interface is further configured to output the processed data/information.

The chip is a chip configured in a receive end, and the to-be-processed data and/or information is a to-be-decoded sequence. The chip receives the to-be-decoded sequence by using the communication interface, and transmits the to-be-decoded sequence to the logic circuit. The logic circuit decodes the to-be-decoded sequence by using the decoding method described in the second aspect. The chip outputs a decoding result by using the communication interface.

Optionally, the communication interface includes an input interface and an output interface. The input interface is configured to receive the to-be-decoded sequence, and the output interface is configured to output the decoding result.

Optionally, the chip is a chip configured at a receive end. The logic circuit is configured to obtain the to-be-decoded sequence, and decode the to-be-decoded sequence by using the decoding method described in the second aspect. The chip outputs the decoding result by using the communication interface.

Optionally, the communication interface includes an input output interface. The input output interface is configured to output the decoding result.

According to a thirteenth aspect, at least one embodiment provides a communication system, including an encoder device and a decoder device.

BRIEF DESCRIPTION OF DRAWINGS

FIG. 7 shows a kernel matrix $K_{16}$;

FIG. 8 shows a kernel matrix $K'_{16}$;

FIG. 10 shows a kernel matrix $K_{32}$;

FIG. 11 shows a kernel matrix $K'_{32}$;

FIG. 12 is a schematic diagram of decoding performed based on a trellis according to a Viterbi algorithm;

FIG. 19 is a schematic diagram of a constructed kernel matrix whose dimension is 20×20;

FIG. 20 to FIG. 22 are schematic diagrams of a kernel matrix whose dimension is 20;

FIG. 23 and FIG. 24 are schematic diagrams of a kernel matrix whose dimension is 21;

FIG. 25 to FIG. 27 are schematic diagrams of a kernel matrix whose dimension is 24;

FIG. 28 and FIG. 29 are schematic diagrams of a kernel matrix whose dimension is 25;

FIG. 30 is a schematic diagram of a kernel matrix whose dimension is 28;

FIG. 35 to FIG. 37 are schematic diagrams of a kernel processing on an Arikan matrix with two iterations;

FIG. 38 is a schematic diagram of a kernel matrix $K_1$;

DESCRIPTION OF EMBODIMENTS

Figure 1:
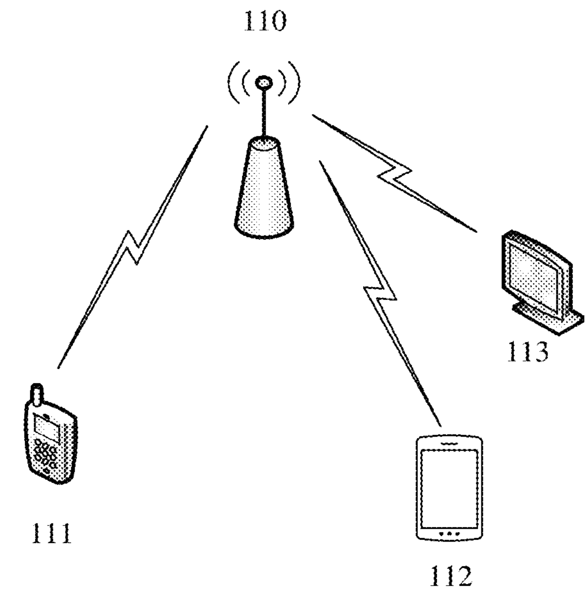
FIG. 1 is a schematic diagram of a wireless communication system applicable to at least one embodiment.

The following describes technical solutions of at least one embodiment with reference to the accompanying drawings.

The technical solutions in embodiments described herein are applied to various wireless communication systems. For example, the wireless communication system includes but is not limited to a wireless local area network (WLAN) system, a narrow band-internet of things (NB-IoT) system, a 5G system, a new radio (NR) system, a long term evolution (LTE) system, or a communication system after 5G. The technical solutions in embodiments described herein are further applied to device to device (D2D) communication, machine to machine (M2M) communication, machine type communication (MTC), satellite communication, and communication in an Internet of Vehicles system. Communication modes in the Internet of Vehicles system are collectively referred to as V2X (X indicates everything). For example, the V2X communication includes vehicle to vehicle (V2V) communication, vehicle to infrastructure (V2I) communication, vehicle to pedestrian (V2P) communication, or vehicle to network (V2N) communication.

For example, the technical solutions in embodiments described herein are applied to an application scenario of a 5G mobile communication system, such as enhanced mobile broadband (eMBB), ultra reliable low latency communication (URLLC), and enhanced massive machine type communication (eMTC).

Based on a network device mentioned in at least one embodiment, the network device is any device having a wireless transceiver function. The device includes but is not limited to: an evolved NodeB (eNB), a Radio Network Controller (RNC), a NodeB (NB), a Base Station Controller (BSC), a base transceiver station (BTS), a home base station (for example, a Home evolved NodeB, or a Home NodeB, HNB), a Baseband unit (BBU), an Access Point (AP) in a Wireless Fidelity (Wi-Fi) system, a wireless relay node, a wireless backhaul node, a transmission point (TP), or a transmission and reception point (TRP). Alternatively, the device is 5G, for example, NR, a gNB in a system, a transmission point (TRP or TP), or one or a group of (including a plurality of antenna panels) antenna panels of a base station in the 5G system, or is a network node that forms the gNB or the transmission point, for example, the Baseband unit (BBU) or a distributed unit (DU).

In some deployments, the gNB includes a central unit (CU) and the DU. The gNB further includes an active antenna unit (AAU). The CU implements some functions of the gNB, and the DU implements some functions of the gNB. For example, the CU is responsible for processing a non-real-time protocol and a service, to implement functions of a radio resource control (RRC) layer and a packet data convergence protocol (PDCP) layer. The DU is responsible for processing a physical layer protocol and a real-time service, and implements functions of a radio link control (RLC) layer, a media access control (MAC) layer, and a physical (PHY) layer. The AAU implements some physical layer processing functions, radio frequency processing, and a function related to the active antenna. Information at the RRC layer is eventually converted into information at the PHY layer, or is converted from information at the PHY layer. Therefore, in this architecture, higher layer signaling such as RRC layer signaling is also considered as being sent by the DU or sent by the DU and the AAU. The network device is a device including one or more of a CU node, a DU node, and an AAU node. In addition, the CU is a network device in a radio access network (RAN), or is a network device in a core network (CN). This is not limited in embodiments described herein.

The terminal device in at least one embodiment is also referred to as user equipment (UE), an access terminal, a subscriber unit, a subscriber station, a mobile station, a remote station, a remote terminal, a mobile device, a user terminal, a terminal, a wireless communication device, a user agent, a user apparatus, or the like. The terminal device in at least one embodiment is a mobile phone, a Pad, a computer with a wireless transceiver function, a virtual reality (VR) terminal device, an augmented reality (AR) terminal device, a wireless terminal in industrial control, a wireless terminal in self driving, a wireless terminal in remote medical, a wireless terminal in a smart grid, or a wireless terminal in transportation security, a wireless terminal in a smart city, a wearable wireless terminal, a wireless terminal in a smart home, and the like. Application scenarios are not limited in embodiments described herein.

For ease of understanding embodiments described herein, a communication system to which an at least one embodiment is applicable is first described in detail with reference to FIG. 1 and FIG. 2.

FIG. 1 is a schematic diagram of a wireless communication system applicable to at least one embodiment. As shown in FIG. 1, the wireless communication system includes at least one network device 110 and at least one terminal device (for example, 111, 112, and 113 shown in FIG. 1). The network device 110 performs wireless communication with the terminal device. In response to the network device 110 sending a signal to the terminal device, the network device 110 is an encoder, and the terminal device is a decoder. In response to the terminal device sending a signal to the network device 110, the terminal device is an encoder, and the network device is a decoder.

In the wireless communication system shown in FIG. 1, after being encoded by an encoder, original information is transmitted through a channel, received by a decoder, and decoded by the decoder to restore the original information.

The encoder is also referred to as a transmit end (or a sending device), and the decoder is also referred to as a receive end (or a receiving device) of information or data. The sending device is a network device, and the receiving device is a terminal device. Alternatively, the sending device is a terminal device, and the receiving device is a network device. Alternatively, the sending device is a terminal device, and the receiving device is a terminal device. Alternatively, the sending device is a network device, and the receiving device is a network device.

FIG. 1 is merely an example for description, and embodiments described herein not limited thereto. For example, at least one embodiment is further applied to any communication scenario of uplink/downlink control channel coding in a 5G eMBB scenario.

Figure 2:
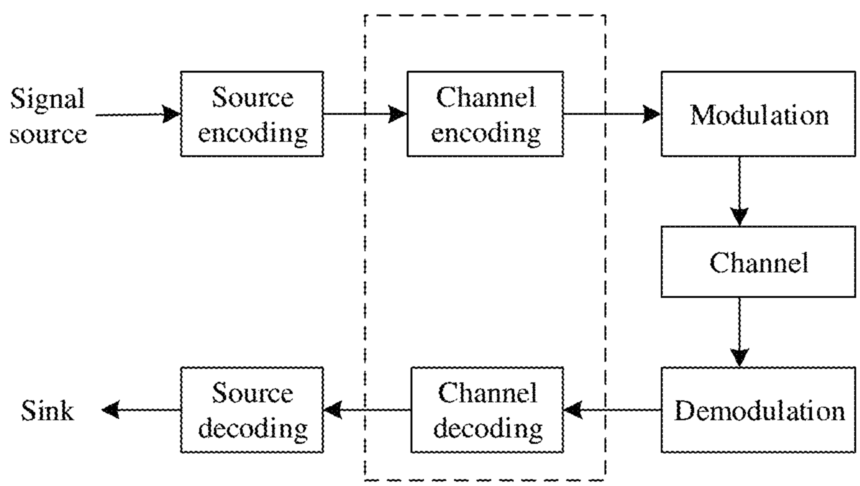
FIG. 2 is a basic flowchart of performing communication by using a wireless technology.

FIG. 2 is a basic flowchart of performing communication by using a wireless technology. A signal source at a transmit end is sent on a channel after signal source encoding, channel encoding, rate matching, and modulation in sequence. After receiving the signal, a receive end sequentially performs demodulation, rate de-matching, channel decoding, and signal source decoding to obtain a sink. The technical solutions provided in embodiments described herein are applied to a channel encoding module and a channel decoding module shown in a dashed box in FIG. 2.

Channel coding is one of core technologies in the wireless communication field, and performance improvement of channel coding directly improves network coverage and a user transmission rate. Currently, a polar code is strictly proved to be a channel encoding scheme that reaches a channel capacity, and has features such as high performance, low complexity, and a flexible matching manner. Currently, the polar code is determined by the 3GPP as a control channel coding scheme in a 5G control channel eMBB scenario (uplink/downlink).

For ease of understanding of embodiments described herein, the following first briefly describes several terms used herein.

1. Encoding Scheme of a Polar Code

Figure 3:
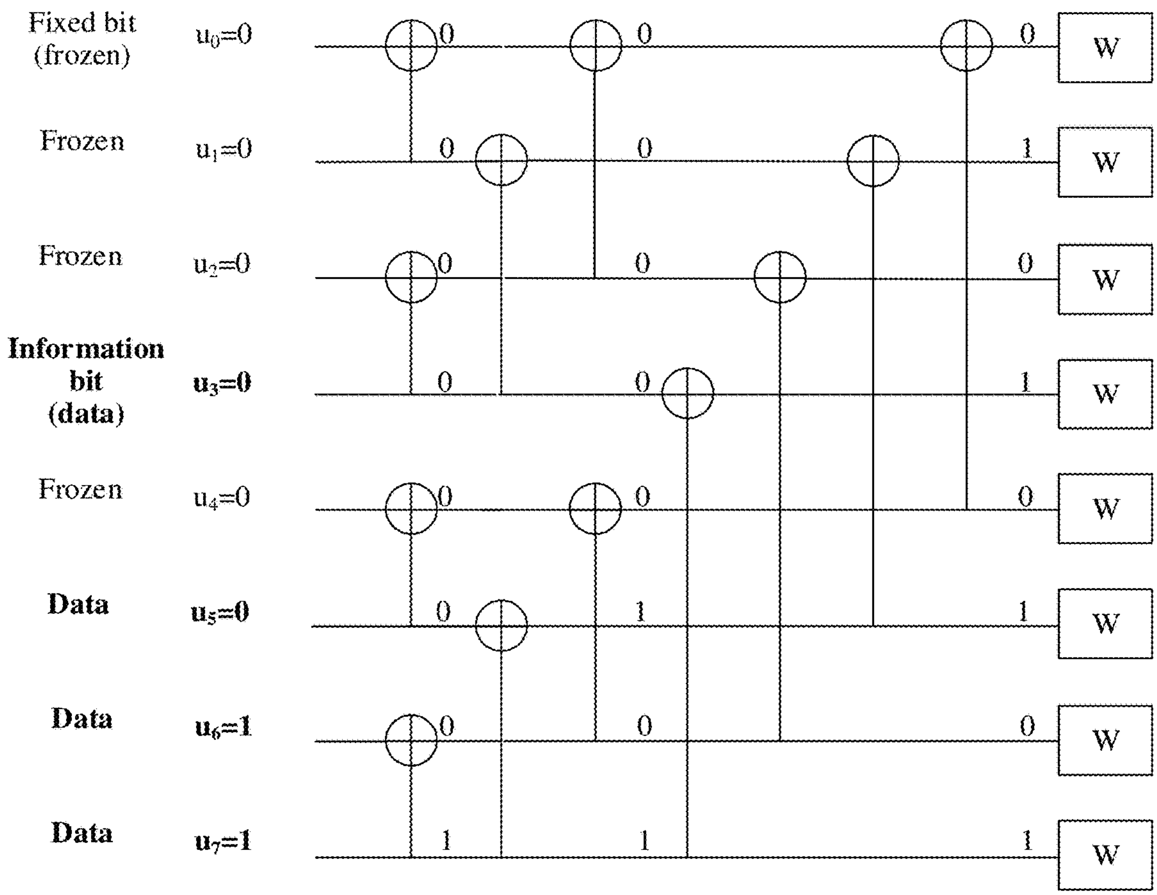
FIG. 3 is a schematic diagram of encoding a polar code.

FIG. 3 is a schematic diagram of encoding a polar code. As shown in FIG. 3, a symbol "⊕" indicates binary summation, input of the symbol is at a left side and a lower side, and output of the symbol is at a right side. Each solid line in FIG. 3 indicates 1 bit. $\{u_0, u_1, u_2, u_4\}$ is set as fixed bits (or frozen bits), and polar encoding is performed on a total of four information bits $\{u_3, u_5, u_6, u_7\}$, to obtain eight encoded bits. After encoding, the eight encoded bits are modulated and then sent through a noisy channel.

To-be-encoded bits are sorted based on their respective reliability. Generally, a bit with high reliability is set to an information bit (data), a bit with low reliability is set to a frozen bit, and a value of the frozen bit is usually set to 0, which is known to both a transmit end and a receive end in actual transmission. As shown in FIG. 3, $u_7$, $u_6$, $u_5$, and $u_3$ are four bits with high reliability, and are set as information bits (data). $u_4$, $u_2$, $u_1$, and $u_0$ are four bits with low reliability, and are set as frozen bits.

2. Linear Block Code Trellis Representation

Decoding based on a trellis is a conventional decoding manner of a convolutional code. For a linear block code, decoding is also performed based on the trellis. Decoding based on the trellis is a maximum likelihood (ML)/MAP decoding manner. In this manner of decoding, decoding performance is good, but correspondingly, decoding complexity is very high. Given a linear block code whose check matrix is H, all code words comply with: $0=c_H^T=\sum_{i=0}^{n-1}c_iH^{(i)}$.

$H^{(i)}$ indicates the $i^{th}$ column of the check matrix H. A node at the $j^{th}$ moment in a trellis diagram is marked as: $S^{(j)}=\sum_{i=0}^{j-1}c_iH^{(i)}$.

Figure 4:
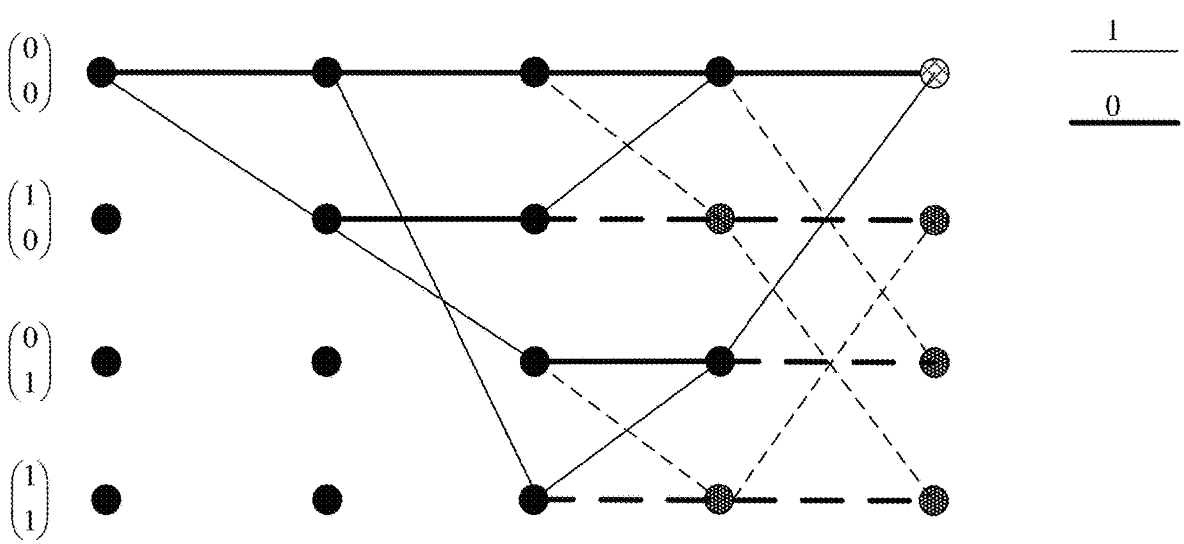
FIG. 4 is a schematic diagram of a trellis representation.

FIG. 4 is a schematic diagram of trellis representation. Refer to FIG. 4. A basic component unit in trellis representation is a trellis node (for example, nodes 1, 2, . . . , and 20 in FIG. 4). For example, trellis representation of a check matrix $$H = \begin{pmatrix} 1 & 1 & 1 & 0 \\ 0 & 1 & 0 & 1 \end{pmatrix}$$

is shown in FIG. 4. For a detailed solution of performing decoding based on the trellis, refer to existing descriptions. This is not limited herein.

3. Channel Parameter

A polar code is a constructable channel encoding scheme that reaches a binary input discrete memoryless channel capacity.

W: {0,1}→Y is a symmetric binary discrete memoryless channel(B-DMC), an input letter set of W: {0,1}→Y is x=10,11, and an output letter set of W: {0,1}→Y is Y. In response to input x and channel output y being given, a channel condition transition probability is expressed as W(y|x).

A capacity of the B-DM channel (B-DMC) W is defined as follows:

$$I(W) = \sum_{y \in Y} \sum_{x \in \{0,1\}} \frac{1}{2} W(y|x) \log \frac{W(y|x)}{\frac{1}{2} W(y|0) + \frac{1}{2} W(y|1)}.$$

A B-DM channel Bhattacharyya parameter is defined as:

$$Z(W) = \sum_{y \in Y} \sqrt{W(y|0) + \frac{1}{2} W(y|1)}.$$

4. Kernel Matrix

In the literature, Arikan infers that polarization is a common phenomenon and is not limited to the given $G=F_2^{\otimes m}$, where $$F_2 = \begin{pmatrix} 1 & 0 \\ 1 & 1 \end{pmatrix},$$

and "⊗m" indicates an m-time Kronecker product. Korada and so on prove the conclusion and extend the conclusion to a high-dimensional kernel matrix, and prove that a condition for polarization of any l×l matrix is a permutation matrix of any column in the l×l matrix but not an upper triangular matrix. In addition, Korada and so on also prove that in response to l≤15, a polarization exponent β of any kernel matrix cannot exceed ½. In a case of a same code length, a larger polarization exponent β indicates a lower decoding error probability of a corresponding polar code, and corresponding decoding performance is better. However, a main problem of the high-dimensional kernel matrix polar code is that its decoding algorithm is complex, which is one of bottlenecks in high-dimensional kernel matrix research.

5. Polarization Exponent

Several theorems are briefly described for the polarization exponent. For details, refer to descriptions in the conventional technology. This is not limited herein.

Theorem 1: Given a B-DM channel W (that is, B-DWC W), for $F_2$ and any β<½, the following is obtained:

$$\lim_{m \to \infty} \inf P\left(Z_m \le 2^{-n^{\beta}}\right) = \lim_{m \to \infty} \inf P\left(Z_m \le 2^{-2m\beta}\right) = I(W).$$

Correspondingly, in response to I(W)<1, for any β>½, the following is obtained:

$$\lim_{m \to \infty} \inf P\left(Z_m \ge 2^{-n^{\beta}}\right) = \lim_{m \to \infty} \inf P\left(Z_m \ge 2^{-2^{m\beta}}\right) = 1.$$

β is referred to as a polarization exponent, and a code length is $n=2^m$.

Korada and so on extend the above theorem to any high-dimensional kernel matrix. In this case, the code length is $n=l^m$. This is described in the following.

Theorem 2: For any B-DM channel W (that is, B-DWC W), in response to 0<I(W)<1 and the following conditions are met, an l×l-dimensional kernel matrix K has a polarization exponent E(K). The conditions are:

$$\text{For any } \beta < E(K): \quad \lim_{m \to \infty} \inf P\left(Z_m \le 2^{-l^{m\beta}}\right) = I(W); \text{ and} \tag{1}$$

$$\text{For any } \beta > E(K): \quad \lim_{m \to \infty} \inf P\left(Z_m \ge 2^{-l^{m\beta}}\right) = 1. \tag{2}$$

Here, E(K) indicates the polarization exponent. For the arikan kernel, the polarization exponent of the arikan kernel is ½.

Given the matrix K and the corresponding E(K), theorem 2 shows that:

(1) In response to m tending to infinity, in response to 0<R<I(W) and β<E(K), there is a set A whose size is NR that meets: $\Sigma_{i \in A} Z^{(i)} \le 2^{-n^{\beta}}$, where A is an information bit set. Through successive cancellation (SC) decoding, a bound of a frame error ratio in SC decoding is:

$$P_e(n) \le 2^{-n^{\beta}}.$$

(2) In response to m tending to infinity, in response to R>0 and β>E(K), any set A whose size is NR meets:

$$\max_{i \in A} Z^{(i)} > 2^{-n^{\beta}},$$

where A is an information bit set, and a bound of a frame error ratio under SC decoding is:

$$P_e(n) \ge 2^{-n^{\beta}}.$$

The polarization exponent measures a convergence speed of decoding performance, and a larger polarization exponent indicates a faster convergence speed, so that better decoding performance is obtained in response to the code length being short.

6. Scaling Exponent

Another key feature of a polar kernel is a scaling exponent. The scaling exponent indicates kernel matrix performance. At least one embodiment focuses on a function of the scaling exponent.

For example, given a channel W whose channel capacity is I(W) and an expected error probability $P_e$, a kernel matrix of a polar code corresponding to (N, k) is K. In response to transmission being expected to be performed at a rate of R=I(W)−Δ, a code length N meets:

$$N = O\left(\frac{1}{(I(W)-R)^{\mu(K)}}\right) = O(\Delta^{-\mu(K)}).$$

μ(K) is the scaling exponent.

The scaling exponent is a parameter related to the channel. For a random code, μ=2. For the polar code, in response to l→∞, let $K=F_l$, and the following is obtained:

$$\lim_{l\to\infty}\mu(F_l) = 2.$$

On a BEC channel, a scaling exponent of the polar code with an Arikan kernel is 3.627.

7. Partial Distance

In an l×l matrix K, K[i] indicates the $i^{th}$ line of the matrix, and a part distance $D_i$(i=0, . . . , l−1) of the matrix is:

$$D_i \square d_H,(K[i], \langle K[i+1], \ldots, K[l-1]\rangle), i=0, \ldots, l-2$$

$$d_{l-1} \square d_H(K[l-1],0).$$

$d_H$(a,b) indicates a Hamming distance between a vector a and a vector b, and a vector D is defined as a partial distance profile (PDP). For any B-DMC W, any l×l polar matrix K, and a partial distance $\{D_i\}_{i=0}^{l-1}$ thereof, a corresponding polarization exponent E(K) is expressed as:

$$E(K) = \frac{1}{l}\sum_{i=0}^{l-1}\log_l D_i.$$

Actually, with l→∞, an l×l kernel that makes the polarization exponent infinitely close to 1 is obtained.

The foregoing theorem is merely a brief description for understanding, and does not limit the protection scope of embodiments described herein. For details, refer to existing descriptions. This is not limited herein.

8. Kernel Matrix Encoding

For one (n, k) polar code (a code length n is: $n=l^m$), given an l×l kernel matrix K, $G=M^{(m)}K^{\otimes m}$, where $M^{(m)}$ is a digital rotated matrix, a corresponding mapping relationship is $\Sigma_{i=0}^{m-1} t_i l^i \rightarrow \Sigma_{i=0}^{m-1} t_{m-1-i} l^i$. $t_i \in [l]$, [l] indicates a set {0, 1, . . . , l−1}, a corresponding code is represented as $C_0^{n-1}=u_0^{n-1}G$, $u_i$, i∈F is a frozen bit, |F|=n−k, and a remaining bit is an information bit.

9. Kernel Processing

During polar code decoding, a posterior probability $W_m^{(j)}(u_0^j|y_0^l)$ is to be calculated. $W_m^{(j)}(u_0^j|y_0^l)$ is obtained through recursion. For simple description, let m=1, and a corresponding task is referred to as kernel processing. The kernel processing is the following:

$$W_1^{(j)}(u_0^j \mid y_0^l) = \sum\nolimits_{u_{j+1}^{l-1}} W_1^{(l-1)}(u_0^{l-1} \mid y_0^{l-1}) = \sum\nolimits_{u_{j+1}^{l-1}} \prod_{i=0}^{l-1} W\left((u_0^{l-1}K)_i \mid y_i\right).$$

The foregoing formula is also approximately expressed as:

$$\tilde{W}_1^{(j)}(u_0^j \mid y_0^l) = \max_{u_{j+1}^{l-1}} W_1^{(l-1)}(u_0^{l-1} \mid y_0^{l-1}) = \max_{u_{j+1}^{l-1}} \prod_{i=0}^{l-1} W\left((u_0^{l-1}K)_i \mid y_i\right).$$

The probability in the foregoing formula corresponds to a path with a maximum possibility in a decoding number $u_0^j$. A log-likelihood ratio (LLR) is approximately expressed as:

$$S_{1j}(u_0^{i-1} \mid y_0^{n-1}) = \max_{u_{i+1}^{l-1}} \ln W_1^{(l-1)}(u(0)^i \mid y_0^{l-1}) = \max_{u_{i+1}^{l-1}} \ln W_1^{(l-1)}(u(1)^i \mid y_0^{l-1}).$$

$u(a)^i=(u_o^{i-1},a,u_{i+1}^{l-1})$. For all $u_j$, i<j<l is of equal probability, and a matrix formed by the last (l−i+1) lines of the kernel K generates corresponding codewords. In this case, $S_{1j}$ is obtained by performing ML decoding on a coset of these codewords, and a coset leader is obtained by multiplying $u_0^{i-1}$ and a matrix formed by the first i lines of the kernel K.

A person skilled in the art should understand the meaning of coset mentioned for a plurality of times. For example, in response to G being a set, H is a subset of G, and g is an element of G, gH={gh: all h∈H} indicates a left coset of H, and Hg={hg: all h∈H} indicates a right coset of H. Details are not described in the following.

10. Extended Kernel Codes

An (l+1, l−i) code $\square^{(i)}$ generated by K considered, and $K^{(i)}$ is obtained from K according to the following rules:

(1) The first l columns of $K^{(i)}$ are obtained by obtaining the last (l−i) lines of K.

(2) The first line in the last column of $K^{(i)}$ is set to 1, and other lines are set to 0.

Figure 5:
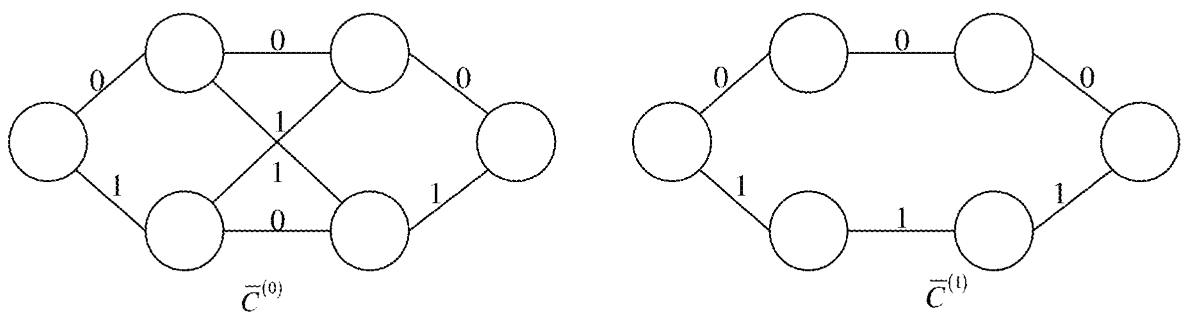
FIG. 5 is a schematic diagram of an extended trellis of an Arikan kernel matrix.

For example, an Arikan kernel is $$\begin{pmatrix}1&0\\1&1\end{pmatrix}, K^{(0)}=\begin{pmatrix}1&0&1\\1&1&0\end{pmatrix} \text{ and } K^{(1)}=(1\ \ 1\ \ 1)$$

is obtained. A trellis corresponding to the Arikan kernel is shown in FIG. 5.

11. Correlation Discrepancy

In response to decoding being performed based on a trellis, different paths (which indicates different decoding results) are to be selected and compared. A definition of a path value (a score of c) is provided in a plurality of manners, for example:

(1) Logarithm of probability, for example, is expressed as: log W(c|y).

(2) Correlation, for example, is expressed as: $\Sigma_i(-1)^{c_i}S(y_i)$. $S(y_i)$ is the $i^{th}$ LLR.

(3) Correlation discrepancy, for example, is expressed as: $\Sigma_i\tau(S(y_i),c_i)$.

The correlation discrepancy of $c_0^{l-1}$ and $y_0^{l-1}$ is defined as: $\varepsilon(c_0^{l-1},y_0^{l-1})=\Sigma_{i=0}^{l-1}\tau(c_i,y_i)$.

$$\tau(c, y) = \begin{cases} -|S(y)|, & (-1)^c \neq \operatorname{sign} S(y) \\ 0 & \text{otherwise} \end{cases}.$$

In addition, $$S(y) = \log\frac{W(0 \mid y)}{W(1 \mid y)}, \text{ and } S_{1,t}(u_0^{l-1} \mid y_0^{n-1}) = \varepsilon(c^{(0)}, y_0^{l-1}) - \varepsilon(c^{(1)}, y_0^{l-1})$$

is obtained. $c^{(ut)}=(u_0^t, U(u_0^{t-1}, u_t))K$, and $U(u_0^{t-1}, u_t)=u_{t+1}^{t-1}$. The solution of the foregoing formula is equivalent to searching for a probable codeword in response to the last bit in the coset of codeword $\bar{\square}^{(i)}$ being 0 or 1. The searching is implemented by executing a Viterbi algorithm in a trellis of the codeword $\bar{\square}^{(i)}$. Assuming that the last bit of the codeword is erased, the corresponding trellis is defined as the $i^{th}$ extended trellis. Generally, complexity of the Viterbi algorithm is $O(2^{min(i+1,l-i)})$.

In at least one embodiment, in response to a polar kernel being selected, kernel processing complexity during decoding is also considered. Sometimes, a kernel with better performance brings higher decoding complexity. Therefore, comprehensive consideration is to be further considered during kernel matrix construction or selection.

Figure 6:
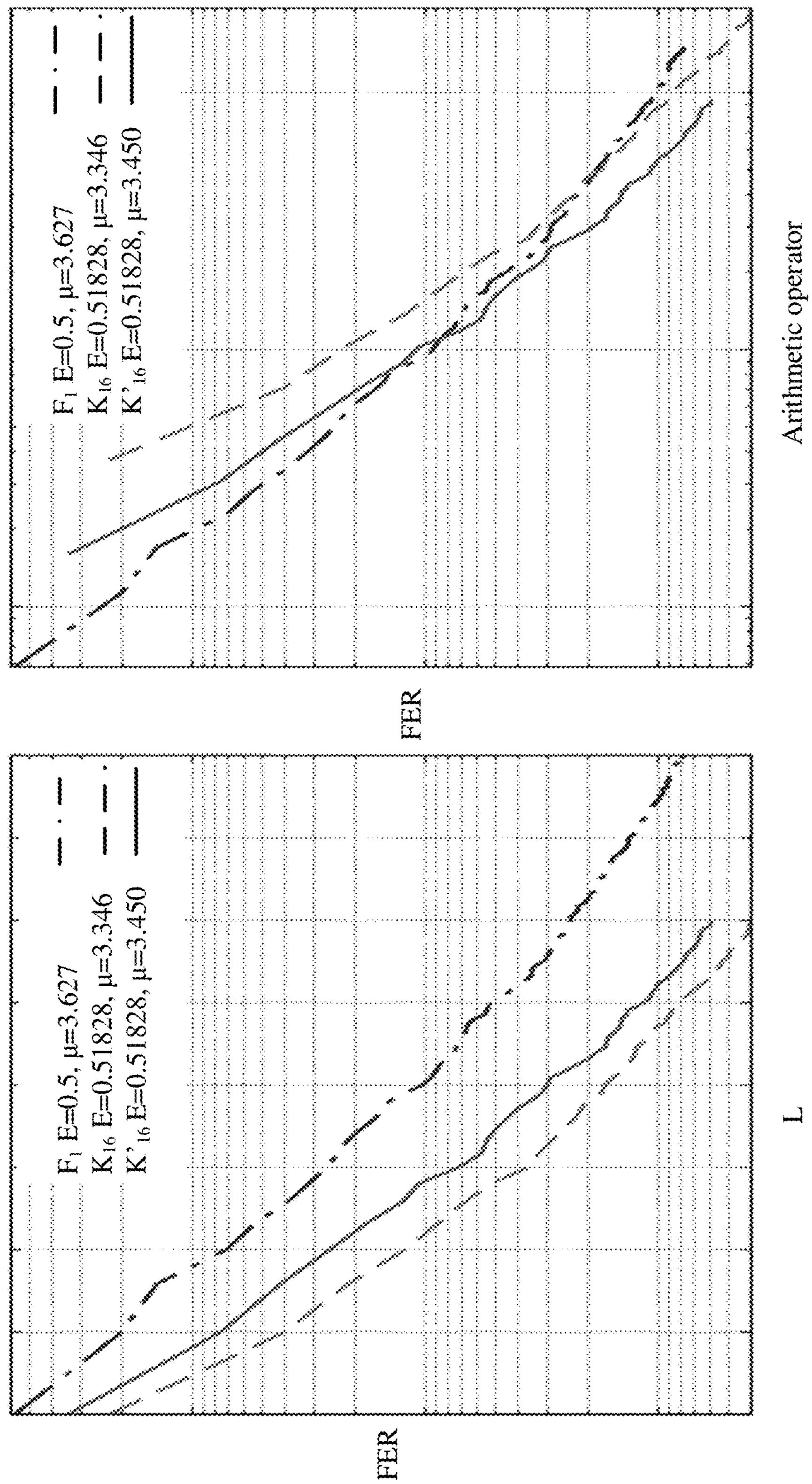
FIG. 6 is a comparison of decoding performance and complexity of a (4096, 2048) polar subcode in response to different polar kernels being used on an encoding side.

For example, FIG. 6 is a comparison of performance and complexity of a (4096, 2048) polar subcode in response to different polar kernels $K_{16}$ and $K'_{16}$ being used on an encoder side and in response to SCL decoding being used on a decoding side. The kernel $K_{16}$ and the kernel $K'_{16}$ are shown in FIG. 7 and FIG. 8.

$E(K_{16})=E(K'_{16})=0.51828$; $\mu(K_{16})=3.346$ and $\mu(K'_{16})=3.45$; and $\phi(K_{16})=472$ and $\phi(K'_{16})=183$. $\phi(K)$ indicates processing complexity of the kernel $\bar{K}$. A recursive-based kernel processing algorithm is mainly used as an example for description herein.

Using $K_{16}$ brings better performance than using $K'_{16}$ but decoding complexity is higher. Therefore, in this case, both performance and complexity is to be considered for selecting a kernel matrix.

Figure 9:
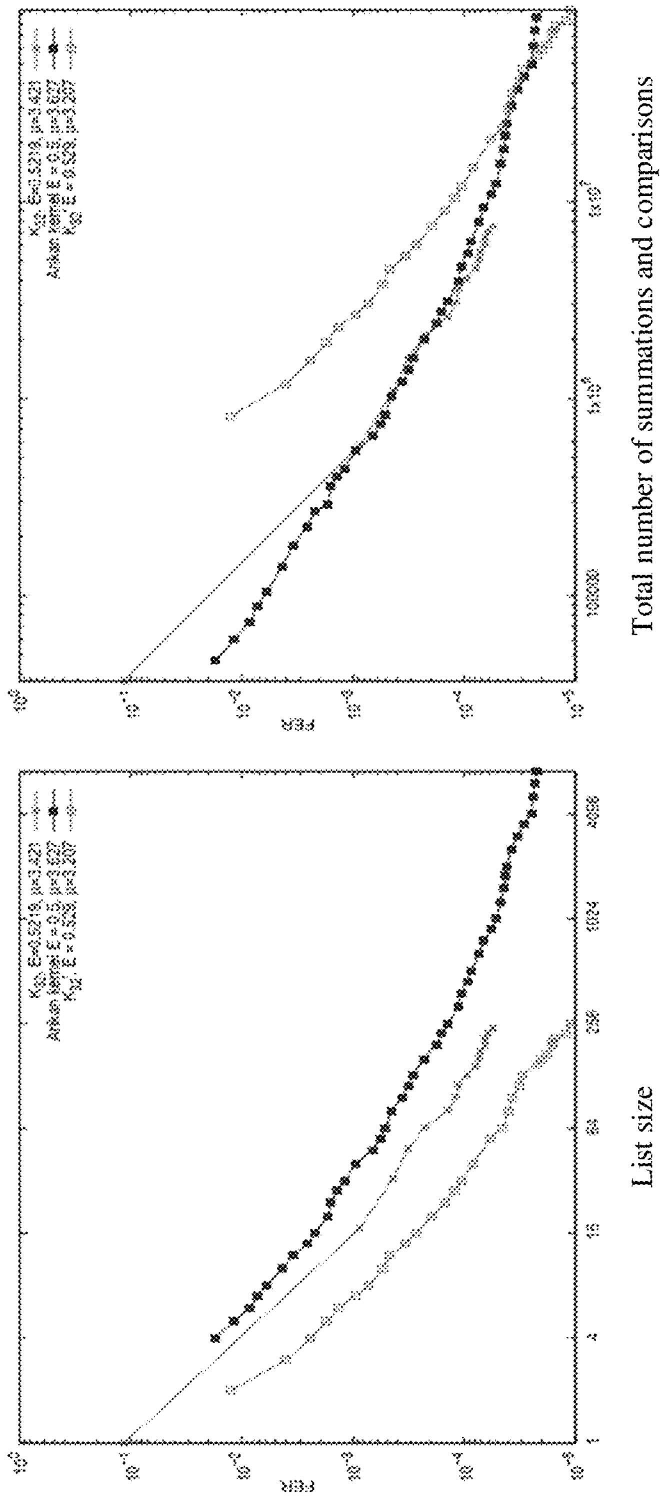
FIG. 9 is a comparison of decoding performance and complexity of a (1024, 512) polar subcode in response to different polar kernels being used on an encoding side.

In still another example, FIG. 9 shows a comparison of performance and complexity in response to a polar subcode (1024, 512) in response to $K'^{32}$ and polar kernel $K_{32}$ are used on an encoding side and in response to SCL decoding being used on a decoding side. Kernel $K_{32}$ and $K'_{32}$ are shown in FIG. 10 and FIG. 11.

$E(K_{32})=0.5219$ and $E(K'_{32})=0.529$; $\mu(K_{32})=3.421$ and $\mu(K'_{32})=3.207$; and $\phi(K_{32})=532$ and $\phi(K'_{32})=6770$. Using $K'_{32}$ brings better performance than using $K_{32}$, but decoding complexity of using $K'_{32}$ is higher, and decoding complexity of using $K'_{32}$ is more than 10 times of decoding complexity of using $K_{32}$.

From the foregoing, during encoding, selection of the kernel matrix affects decoding complexity.

In addition, as mentioned above, the linear block code is decoded by using a trellis-based method, and the polar code is also a linear block code, and is also decoded by using such a method. For example, specific decoding steps is shown as follows:

(1) Let l(j, s) be a set of all states connected, at a moment j−1, to a state s at a moment j.

(2) Set $c_{j-1,s',s}$ to a value on a corresponding connection edge.

(3) Define a node value as $$\varepsilon_{j,s} = \max_{s' \in l(j,s)} \left(\varepsilon_{j-1,s'} - \tau\left(S(y_{i-1}),\, c_{j-1,s',s}\right)\right),$$

$\varepsilon_{0,0}=0$.

(4) LLR is obtained through calculation according to $S_1^{(t)}(u_0^{t-1}, y_0^{t-1})=\varepsilon_{t,0}-\varepsilon_{t,1}$.

For example, in response to the Viterbi algorithm being used for the Arikan kernel, the Arikan kernel is $$\begin{pmatrix} 1 & 0 \\ 1 & 1 \end{pmatrix}, K^{(0)} = \begin{pmatrix} 1 & 0 & 1 \\ 1 & 1 & 0 \end{pmatrix}$$

is obtained. A corresponding trellis diagram of the Arikan kernel is shown in FIG. 12. The following is obtained through calculation:

$$\begin{aligned} \varepsilon_{2,0} - \varepsilon_{2,1} &= \max(\tau(S_0, 0) + \tau(S_1, 0)\tau(S_0, 1) + \tau(S_1, 1)) - \\ &\quad \max(\tau(S_0, 0) + \tau(S_1, 1), \tau(S_0, 1) + \tau(S_1, 0)) \\ &= \max(\tau(S_0, 0) - \tau(S_0, 1) + \tau(S_1, 0) - \tau(S_1, 1), 0) - \\ &\quad \max(\tau(S_0, 0) - \tau(S_o, 1), \tau(S_1, 0) - \tau(S_1, 1)) \\ &= \max(S_0 + S_1, 0) - \max(S_0, S_1) = \\ &\quad \text{sgn}(S_0)\text{sgn}(S_1)\min(|S_0|, |S_1|) \end{aligned}.$$

The foregoing method is an ML/MAP algorithm. In response to the code length being long, decoding complexity is very high, and is difficult to be accepted.

In view of this, embodiments described herein propose that improvement is made on an encoder and/or a decoder, so as to reduce decoding complexity. For example, a kernel matrix is selected from a plurality of constructed kernel matrices after comprehensive consideration based on an actual situation, so that both the performance and decoding complexity is considered. For another example, decoding based on trellis code is used, and the trellis diagram is split. A final trellis optimization path is obtained by processing each split result, so that decoding complexity is reduced.

The following describes in detail embodiments provided in at least one embodiment with reference to the accompanying drawings.

Figure 13:
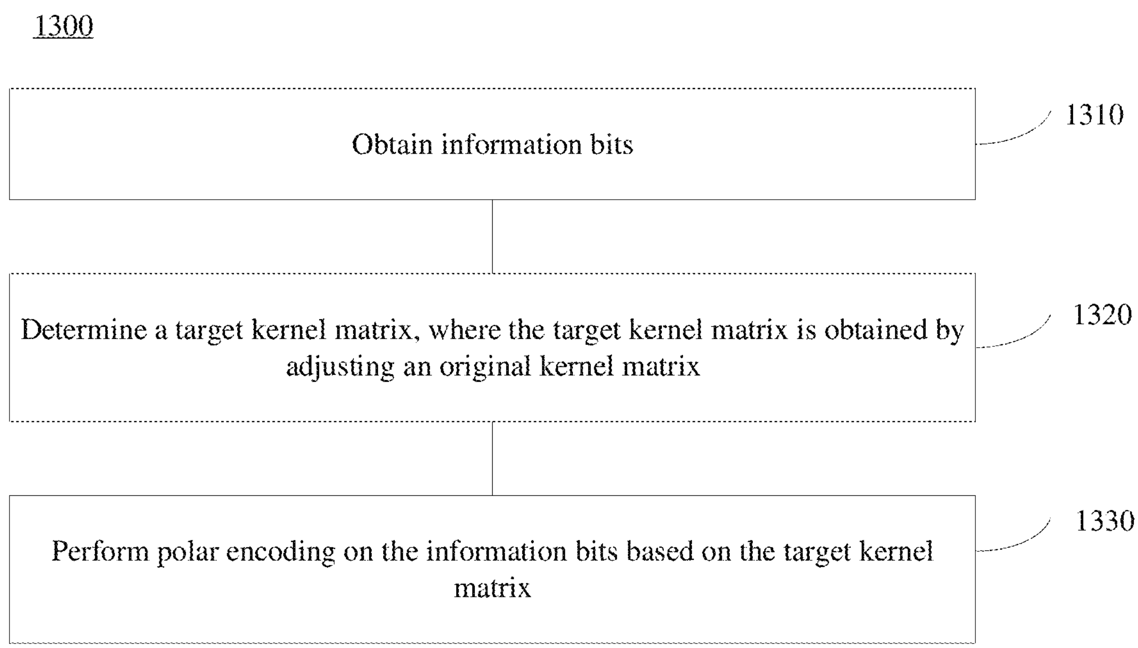
FIG. 13 is a schematic block diagram of a decoding method according to at least one embodiment.

FIG. 13 is a schematic block diagram of an encoding method 1300 according to at least one embodiment.

1310. Obtain information bits.

In other words, an encoder device obtains to-be-encoded information bits. The information bits is generated internally, or is received from outside. This is not limited herein.

1320. Determine a target kernel matrix, where the target kernel matrix is obtained by adjusting an original kernel matrix.

In at least one embodiment, the adjusting an original kernel matrix includes at least the following two solutions.

Solution 1. One or more kernel matrices are obtained by adjusting a PD of the original kernel matrix. One or more kernel matrices are obtained based on Solution 1, and an appropriate target kernel matrix is selected from the one or more kernel matrices.

Solution 2. A plurality of kernel matrices whose dimensions are different from a dimension of the original kernel matrix are constructed by adjusting the dimension of the original kernel matrix. One or more kernel matrices are obtained based on Solution 2, and an appropriate target kernel matrix is selected from the one or more kernel matrices.

In Solution 2, the adjusting the dimension of the original kernel matrix indicates that the dimension of the kernel matrix is changed by modulating the original kernel matrix. For example, corresponding processing is performed on a line and/or a column of the original kernel matrix, so that a line of the constructed kernel matrix is less than the line of the original kernel matrix, and a column of the constructed kernel matrix is less than the column of the original kernel matrix.

The following describes the preceding two solutions in detail.

1330. Perform polar encoding on the information bits based on the target kernel matrix.

In at least one embodiment, in response to the polar encoding being performed, a plurality of kernel matrices are first constructed, and an appropriate kernel matrix is selected for encoding based on the constructed kernel matrices and an actual communication status. In this manner, in response to the kernel matrix being constructed or selected, performance and decoding complexity are comprehensively considered, so that decoding complexity is reduced by selecting the appropriate kernel matrix used during encoding.

For example, in actual communication, one or more kernel matrices are constructed by adjusting the original kernel matrix, and an appropriate target kernel matrix is selected from the one or more kernel matrices. Then, a data vector and a Kronecker product of the corresponding constructed target kernel matrix are multiplied to implement encoding. Then, data is transmitted through a channel after passing through a rate matching module and a modulation module.

A specific solution on the encoder is described in detail in the following.

Figure 14:
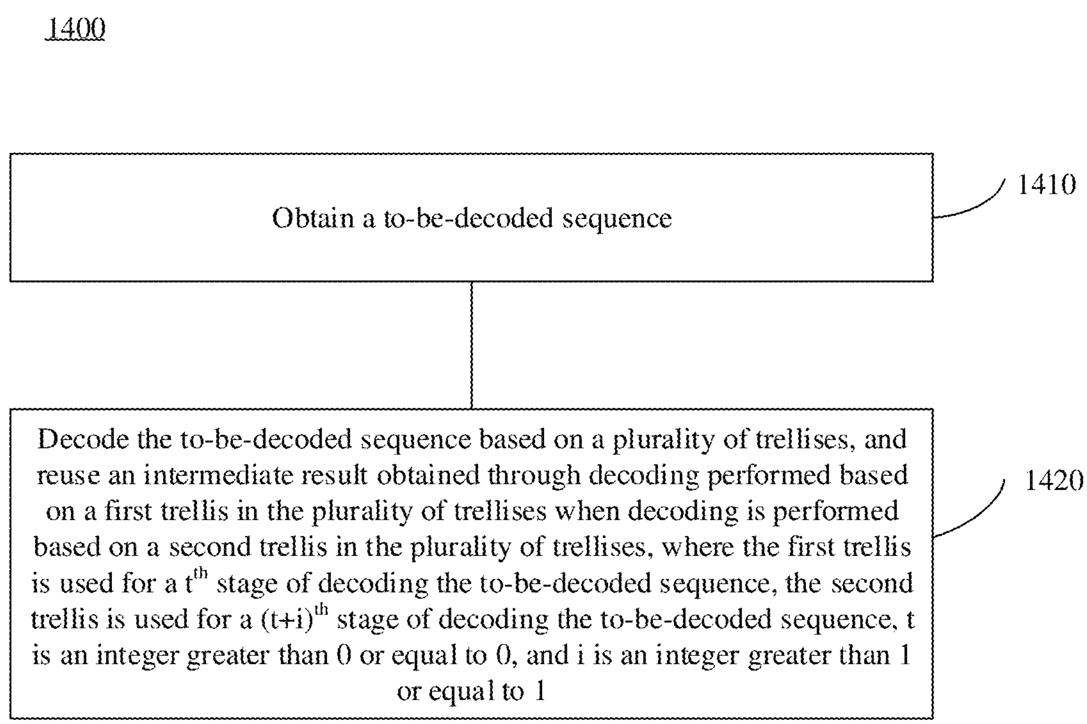
FIG. 14 is a schematic block diagram of an encoding method according to at least one embodiment.

FIG. 14 is a schematic block diagram of a decoding method 1400 according to at least one embodiment.

1410. Obtain a to-be-decoded sequence.

1420. Decode the to-be-decoded sequence based on a plurality of trellises, and reuse an intermediate result obtained from decoding performed based on a first trellis in the plurality of trellises in response to decoding being performed based on a second trellis in the plurality of trellises, where the first trellis is used for a $t^{th}$ stage of decoding the to-be-decoded sequence, the second trellis is used for a $(t+i)^{th}$ stage of decoding the to-be-decoded sequence, t is an integer greater than 0 or equal to 0, and i is an integer greater than 1 or equal to 1.

For example, the first trellis corresponds to the $t^{th}$ decoding stage, and the second trellis corresponds to the $(t+i)^{th}$ decoding stage. In other words, in the $t^{th}$ decoding stage, decoding is performed based on the first trellis, and in the $(t+i)^{th}$ decoding stage, decoding is performed based on the second trellis. For example, in the $t^{th}$ decoding stage, decoding is performed based on the first trellis, and in the $(t+1)^{th}$ decoding stage, decoding is performed based on the second trellis.

In addition, a result obtained through processing in each decoding stage is denoted as an intermediate result. For example, in the $t^{th}$ decoding stage, in response to decoding being performed based on the first trellis, an obtained result is denoted as the intermediate result obtained through decoding performed based on the first trellis. The intermediate result includes, for example, a decoding path obtained through decoding performed in the $t^{th}$ decoding stage and a corresponding path measure value. In the following embodiments, for brevity, a composite branch table (CBT) is used for representation. In other words, content stored in the CBT includes the corresponding path and the corresponding path value during the decoding. Each decoding stage corresponds to one CBT.

In at least one embodiment, in response to the to-be-decoded sequence being decoded according to a decoding algorithm based on the trellis, intermediate results obtained in different decoding stages is reused. In other words, in response to calculation being performed on different trellises, some calculation steps is the same. Therefore, reusing is performed for a plurality of times, so that decoding complexity is greatly reduced, and decoding speed is improved.

In at least one embodiment, the first trellis and the second trellis are mainly used as examples for description. For each trellis in the plurality of sub-trellises, or in each decoding stage, a determination is made whether an intermediate result of decoding in another decoding stage is reused in the decoding stage.

Optionally, each of the plurality of trellises is split into a plurality of sub-trellises.

In at least one embodiment, in response to the to-be-decoded sequence being decoded according to a decoding algorithm based on the trellis, the trellis is first split, and the decoding based on a complete trellis is split into decoding based on a sub-trellis, thereby reducing decoding complexity.

For example, the decoding method provided in at least one embodiment is also denoted as recursive trellis decoding or recursive trellis splitting decoding.

For example, in actual communication, after rate de-matching and demodulation are performed, decoding is performed by using the recursive trellis splitting algorithm proposed in at least one embodiment, so that decoding complexity is low.

A specific solution of the decoder (that is, a recursive trellis splitting algorithm) is described in detail in the following.

The following separately describes the solutions in embodiments described herein from the encoder and the decoder.

Encoding Side

Optionally, in at least one embodiment, a plurality of kernel matrices is constructed by using Solution 1 and/or Solution 2. During the kernel matrix construction or selection, the appropriate kernel matrix is selected for encoding based on an actual situation.

Solution 1. A plurality of kernel matrices are constructed by adjusting a PD of an original kernel matrix.

Solution 2. A plurality of kernel matrices whose dimensions are different from a dimension of the original kernel matrix are constructed by adjusting the dimension of the original kernel matrix.

The two solutions are described in the following.

Solution 1. A plurality of kernel matrices are constructed by adjusting a PD of an original kernel matrix.

Optionally, a plurality of kernel matrices are constructed based on an existing PDP by adjusting the PDP.

Optionally, a given PDP is adjusted, and depth-first search is performed based on the adjusted PDP.

Another algorithm similar to the depth-first search algorithm or implements a same function is applicable to at least one embodiment. For ease of understanding, the depth-first algorithm is mainly used as an example for description in the following.

In at least one embodiment, in response to the depth-first search being performed, some constraint conditions is designed to reduce search space and a quantity of search times. The constraint conditions, for example, is considered from one or more of the following aspects.

Aspect 1. A constraint condition about a candidate line set M is designed. In other words, the candidate line set meeting a specific condition is limited.

In at least one embodiment, the candidate line set M is to meet: $M[i]=\{v_0^{t-1}\in F_2^t \mid wt(v_0^{t-1})=D_i\}$.

Aspect 2. A constraint condition on a selected line is designed. In other words, the selected line meeting a specific condition is limited.

A condition is that in response to the $i^{th}$ line being selected from the bottom in the candidate line set M, a Hamming weight of a selected line v is greater than or equal to $D_i$, that is, $wt(v) \geq D_i$.

In another condition, the line v from the candidate line set M is selected. In response to $c \in C_{\overline{K}}^{(\varphi+1)} \oplus \overline{K}[\varphi]$, and $wt(c) < D_\varphi$, the operation is able to not be continued, the line v is directly discarded, and a new line from the candidate line set M is selected. $\oplus$ indicates a logical operation, or an exclusive OR logical operation.

Another condition is that a line belongs to a same coset cannot be selected, or a line belongs to a same coset is not selected again.

The foregoing constraint condition listed for the candidate line set M and the selected line is merely an example for description, and are not limited thereto. For example, in response to another constraint condition for the candidate line set M or the selected line belonging to a variant form of the foregoing constraint condition, the constraint condition is also applicable to at least one embodiment.

For understanding, an algorithm procedure applicable to Solution 1 is described in the following. An algorithm procedure includes the following steps.

Step 1. Adjust a PDP to obtain one or more new PDPs.

In step 1, a given PDP is manually adjusted. For example, during adjustment, the PDP is made to be close to a PDP of an Arikan matrix.

For example, for a 16×16 kernel $K_{16}$, the corresponding PDP is [1,2,2,2,2,4,4,4,4,6,6,8,8,8,8,16], $E(K_{16})=0.51828$; $\mu(K_{16})=3.346$, and $\phi(K_{16})=472$.

As described above, in at least one embodiment, E(K) indicates a polarization exponent. The polarization exponent is used to measure convergence speed of the decoding performance, and a larger polarization exponent indicates a faster convergence speed, so that better decoding performance is obtained even in response to the code length being short. $\mu(K)$ indicates a scaling exponent, and the scaling exponent indicates kernel matrix performance. $\phi(K)$ indicates complexity, that is, processing complexity of the kernel $\overline{K}$. This is not described in the following.

The PDP is manually adjusted to obtain a PDP of a kernel $K'_{16}$: [1,2,2,4,2,2,4,4,6,6,8,8,4,8,8,16], $E(K'_{16})=0.51828$, $\mu(K'_{16})=3.45$, and $\phi(K'_{16}=183$.

For another example, a PDP corresponding to a 32×32 kernel $K'_{32}$ is [1,2,2,2,2,4,4,4,6,2,4,4,6,6,8,4,8,4,8,8,8,12,12, 12,12,12,16,16,16,16,16,32], $E(K'_{32})=0.529$, $\mu(K'_{32})=3.207$, and $\phi(K'_{32})=6770$.

The PDP is manually adjusted to obtain a PDP of a kernel $K_{32}$: [1,2,2,4,2,4,2,4,6,8,2,4,6,8,4,6,8,12,4,8,12,16,4,8,12, 16,8,16,8,16,16,32], $E(K_{32})=0.5219$, $\mu(K_{32})=3.421$, and $\phi(K_{32})=532$.

The foregoing enumerated constructed new PDPs are merely examples for description, and a larger quantity of PDPs is further constructed.

Step 2. For each new PDP, perform kernel construction method based on depth-first search.

One or more new PDPs is obtained by manually adjusting the given PDP. On the basis of these new PDPs, kernel matrix construction method in the following based on the depth-first search is performed for each new PDP.

(1) Select a given PDP: D and a line vector candidate set M (or candidate line set M).

(2) Construct the kernel matrix from the last but one line $\overline{K}[l-1]$. Weight of this line is to be equal to the last value of D, that is, $D_{l-1}=d_H(\overline{K}[l-1],0)$.

(3) Construct the next line to the last $\overline{K}[l-2]$. This line is to meet: $D_{l-2}=d_H(\overline{K}[l-2],\langle \overline{K}[l-1]\rangle)$.

(4) Construct the third line from the last $\overline{K}[l-3]$. This line is to meet:

$$D_{l-3}=d_H(\overline{K}[l-3],\langle \overline{K}[l-2],\overline{K}[l-1]\rangle)$$

(5) Continue the preceding steps. Similarly, the $i^{th}$ line from the last is to meet:

$$D_{l-i}=d_H(\overline{K}[l-i],\langle \overline{K}[l-i+1], \ldots , \overline{K}[l-1]\rangle).$$

In a process of constructing the kernel matrix, in response to a line that meets the foregoing conditions cannot be found in the candidate line set M, the process is rolled back to a previous step, a new line $\overline{K}[l-i+1]$ is found, and then a subsequent process continues.

In the process of constructing the kernel matrix, in response to any one of the following conditions being met, the algorithm is stopped or the kernel construction is stopped: in response to an appropriate kernel matrix being found; or after lines of all candidate sets are searched while an algorithm that meets the conditions cannot be found to enable the algorithm to be continued.

A plurality of constructed kernel matrices is obtained by performing the foregoing steps. Next, a best and most appropriate kernel matrix is selected based on comparing some parameters of these kernel matrices, such as a polarization exponent (for example, E(K)), a scaling exponent (for example $\mu(K)$,), and decoding complexity (for example $\phi(K)$,) of decoding a codeword encoded based on these kernel matrices. In addition, the algorithm of this method is simple, and the calculation is simple and easy to implement.

Further, one or more of constraint conditions in the following is further added, for example, the constraint conditions in the foregoing Aspect 1 and Aspect 2, to reduce a quantity of attempts and duration.

Condition 1. Any kernel $\overline{K}$ adds the $i^{th}$ line to the $j^{th}$ line (j<i) through summation, so that the kernel $\overline{K}$ is converted into kernel $\overline{K}$ of $D_i=wt(K[i])$. In addition, the candidate line set M is further set to:

$$M[i]=\{v_0^{l-1} \in F_2^{l} | wt(v_0^{l-1})=D_i\}.$$

Condition 2. In response to the $i^{th}$ line being selected from the bottom in the candidate wt(v) $D_i$ line set M, a Hamming weight of a selected line v is greater than or equal to $D_i$, that is, $wt(v) \geq D_i$.

Condition 3: In response to the line v being selected from the candidate line set M, and partial distance calculation is performed on the line v and the constructed line, in response to $c \in C_{\overline{K}}^{(\varphi+1)} \oplus \overline{K}[\varphi]$ and $wt(c) < D_\varphi$, in this case, no further operation is to be performed, the current v is directly discarded, and a new line is selected from the candidate line set M.

For example, assuming that a 16×16 kernel $\overline{K}$ is constructed (that is, the currently constructed kernel is a 16×16 kernel $\overline{K}$), the lines that are constructed are as follows:

$$\overline{K}[11]=[1111111100000000]$$

$$\overline{K}[12]=[1111000011110000]$$

$$\overline{K}[13]=[1100110011001100]$$

$$\overline{K}[14]=[1010101010101010]$$

$$\overline{K}[15]=[1111111111111111]$$

A line $\overline{K}[10]$ that meets $d_H(\overline{K}[10], \langle \overline{K}[11], \overline{K}[12], \overline{K}[13], \overline{K}[14], \overline{K}[15] \rangle)=6$ is expected to be found. In this case, v=[1111110000000000] is first selected from the candidate line set M, and $c=v+\overline{K}[11]$=[0000001100000000], and wt(c)=2<6. In this case, subsequent calculation of $d_H(v, \langle \overline{K}[11], \overline{K}[12], \overline{K}[13], \overline{K}[14], \overline{K}[15] \rangle)$ is able to not be continued, and the current v is directly discarded.

Condition 4. A line that belongs to a same coset is not selected again.

In response to a line being selected from the candidate line set M to construct the kernel $\overline{K}$, in response to the line v being selected, a coset $C_{\overline{K}}^{(\varphi)} \oplus v$ is calculated, that is, $\{c \oplus v | c \in C_{\overline{K}}^{(\varphi)}\}$ $d_H(v, \langle C_{\overline{K}}^{(\varphi)} \rangle)$ is calculated. Next, $d_H(v', \langle C_{\overline{K}}^{(\varphi)} \rangle)$ is to be calculated. In response to $v' \in C_{\overline{K}}^{(\varphi)} \oplus v$, then $d_H(v', \langle C_{\overline{K}}^{(\varphi)} \rangle) = d_H(v, \langle C_{\overline{K}}^{(\varphi)} \rangle)$. In other words, the line that belongs to the same coset is not selected again.

the foregoing understood Condition 1 to Condition 4 are merely examples for description, and are not limited thereto. For example, for the candidate line set M, or for the selected line, another constraint condition is further designed, so that a quantity of attempts and duration is reduced.

In addition, optionally, in at least one embodiment, in response to the PDP being adjusted, the PDP is adjusted in a direction in which the PDP is close to the PDP of the Arikan matrix. Adjusting the PDP in a direction close to the PDP of the arikan matrix is merely an adjustment manner. This is not limited herein. For example, a PDP of the constructed best kernel matrix is not necessarily a PDP which is most close to that of the arikan kernel matrix. For another example, in response to the best and most appropriate kernel matrix being selected, the kernel matrix is able to not be selected whose PDP is closest to the PDP of the arikan kernel matrix.

The foregoing describes Solution 1 in detail, and a plurality of kernel matrices is constructed by using Solution 1. Solution 2 is described in the following.

Solution 2. A plurality of kernel matrices whose dimensions are different from a dimension of the original kernel matrix are constructed by adjusting the dimension of the original kernel matrix.

Optionally, a plurality of kernel matrices with small dimensions are constructed based on an existing kernel matrix with a large dimension. Encoding is performed based on the kernel matrix whose dimension is small, so that lower decoding complexity is provided while the same performance is ensured.

In at least one embodiment, the plurality of kernel matrices with small dimensions is constructed based on the existing kernel matrix with a large dimension by using a shortening method. Another algorithm that constructs a kernel matrix with a small dimension based on an existing kernel matrix with a dimension, or an algorithm that implements a same function, is applicable to at least one embodiment. For ease of understanding, the shortening algorithm is mainly used as an example for description in the following.

For understanding, an algorithm procedure applicable to Solution 2 is described in the following. An algorithm procedure includes the following steps.

Step 1. Consider an l×l kernel, that is, determine an original kernel matrix.

Step 2. Select a column $j \in [l]$.

Step 3. Add the $i^{th}$ line to all lines with 1 in the $j^{th}$ column, where i is a line corresponding to the last 1 in the column.

Step 4. Delete the $i^{th}$ line and the $j^{th}$ column to obtain an $(l-1)\times(l-1)$ kernel $\overline{K}'$. $\phi(K')<\phi(K)$, that is, decoding complexity corresponding to a kernel with a small dimension is lower.

The kernel matrix constructed in the foregoing manner has lower decoding complexity, and the $(l-t)\times(l-t)$ kernel is obtained by repeating the foregoing manner for t times.

For ease of understanding, the following uses a kernel $K_{24}$ as an example to describe a specific example with reference to FIG. 15 to FIG. 19.

Figure 15:
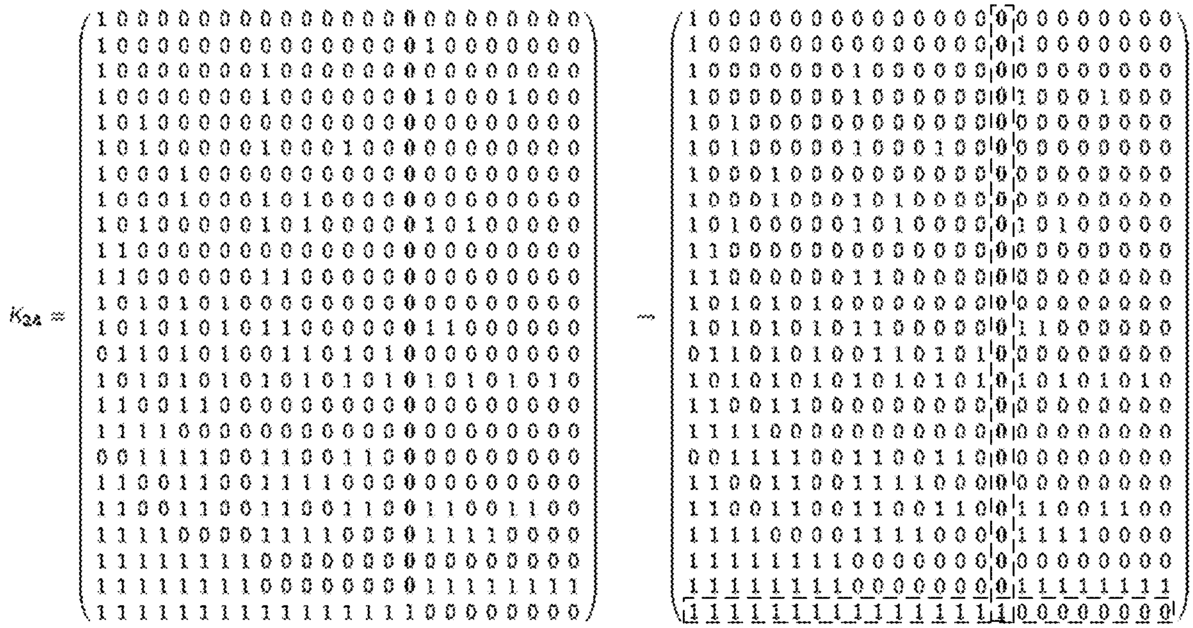
FIG. 15 to FIG. 18 are schematic diagrams of constructing a kernel whose dimension is 20×20 based on a kernel $\overline{K}_{24}$.

In at least one embodiment, an original kernel matrix is the kernel $K_{24}$ shown in FIG. 15. For a kernel $K_{24}$ whose dimension is 24×24, a polarization exponent of the kernel is $E(K_{24})=0.502911$, $\mu(K_{24})=3.61903$, and $\phi(K_{24})=374$. A new kernel whose dimension is 20×20 is able to be constructed based on the kernel $K_{24}$. A specific process is described in the following. In at least one embodiment, both a line sequence number and a column sequence start from 0.

(1) Select the $15^{th}$ column. The last line (that is, line 23) in this column display a value 1. As shown in FIG. 15, the $15^{th}$ column and the 23rd line is deleted to obtain $K_{23}$. As shown in FIG. 15, the $15^{th}$ column and the 23rd line are framed by using dashed boxes.

Figure 16:
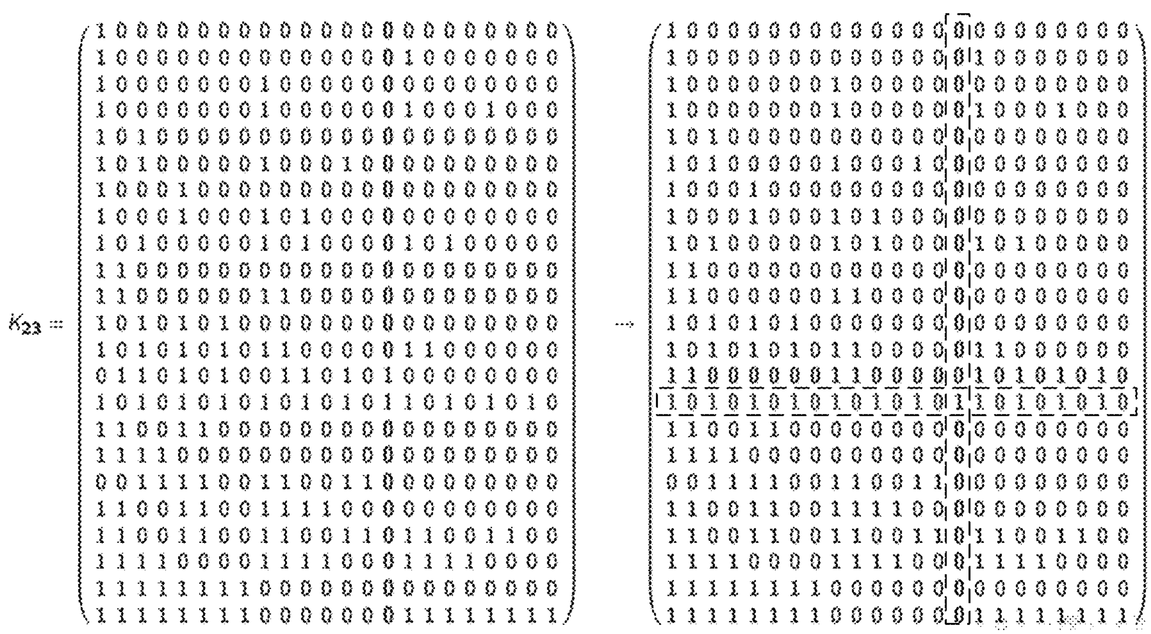

(2) Select the $14^{th}$ column, the $13^{th}$ line and the $14^{th}$ line in this column display the value 1. As shown in FIG. 16, the $14^{th}$ line is added to the $13^{th}$ line, so that a result of the $13^{th}$ line is changed. The $14^{th}$ column and the $14^{th}$ line are deleted to obtain $K_{22}$. In FIG. 16, the $14^{th}$ column and the $14^{th}$ line are framed by using dashed boxes.

Figure 17:
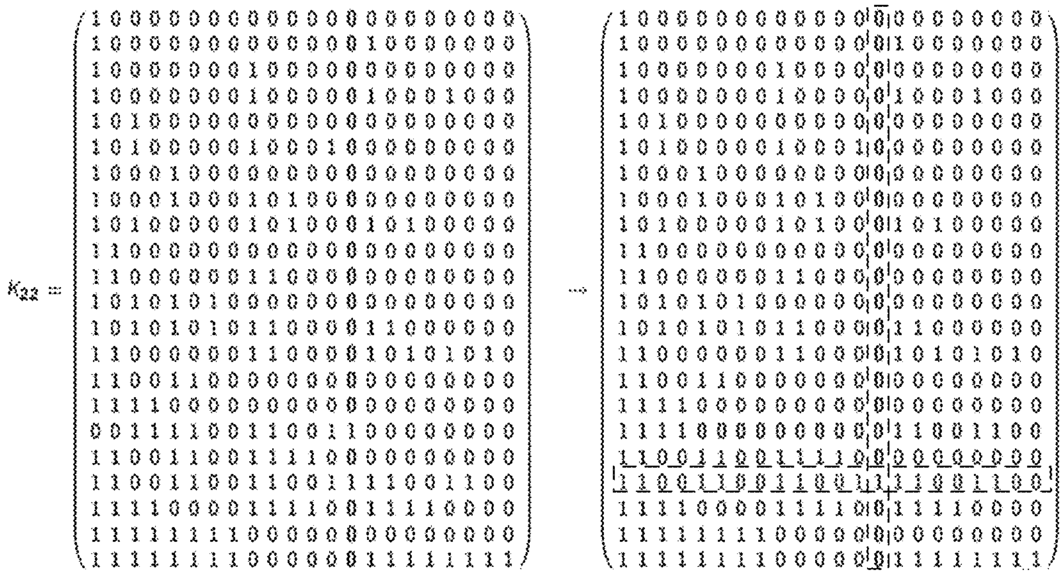

(3) Select the $13^{th}$ line, the $16^{th}$ line and the $18^{th}$ line in this column display the value 1. As shown in FIG. 17, the $18^{th}$ line is added to the $16^{th}$ line, so that a result of the $16^{th}$ line is changed. The $13^{th}$ column and the $18^{th}$ line are deleted to obtain $K_{21}$. In FIG. 17, the $13^{th}$ column and the $18^{th}$ line are framed by using dashed boxes.

Figure 18:
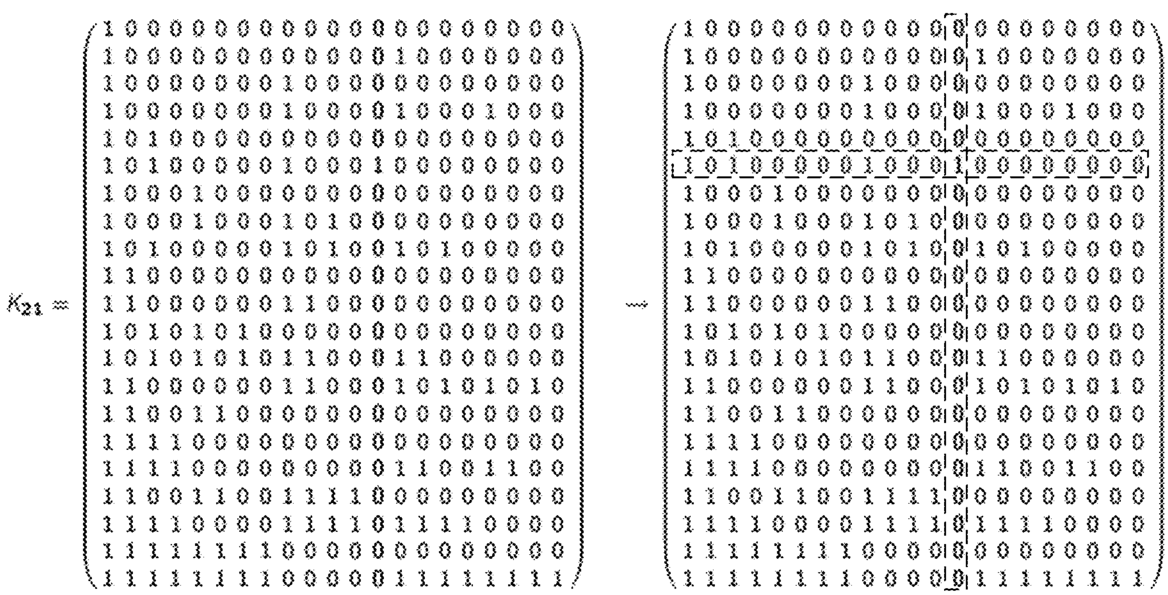

(4) Select the $12^{th}$ column, the $5^{th}$ line in this column displays the value 1. As shown in FIG. 18, the $12^{th}$ column and the $5^{th}$ line is deleted to obtain $K_{20}$. In FIG. 18, the $12^{th}$ column and the $5^{th}$ line are framed by using dashed boxes.

Through the foregoing processing, a kernel matrix $K_{20}$ shown in FIG. 19 is obtained.

Alternatively, a kernel matrix constructed based on the kernel $K_{24}$ includes one or more of the following: the kernel $K_{23}$ shown in FIG. 16, the kernel $K_{22}$ shown in FIG. 17, the kernel $K_{21}$ shown in FIG. 18, and the kernel $K_{20}$ shown in FIG. 19. In an actual communication process, after comprehensive consideration, for example, performance and complexity, an appropriate kernel matrix is selected from the foregoing plurality of kernel matrices based on an actual situation.

The foregoing is merely an example for ease of understanding, and an intermediate processing process also has other variations. This is not limited herein.

In response to a same decoding algorithm being used, decoding complexity of the kernel matrix obtained by using the foregoing method is lower, for example, $\phi(K_{20})<\phi(K_{24})$. Based on this, after comprehensive consideration, for example, performance and complexity, the kernel matrix is selected based on an actual situation.

The foregoing describes the kernel matrix construction method provided in at least one embodiment with reference to Solution 1 and Solution 2. Solution 1 and Solution 2 is used separately, or is used in combination. This is not limited herein.

As an example, the following lists forms of several kernel matrices constructed by using at least one embodiment.

For example, a kernel matrix whose dimension is 20 is shown in FIG. 20 to FIG. 22.

In still another example, a kernel matrix whose dimension is 21 is shown in FIG. 23 and FIG. 24.

In still another example, a kernel matrix whose dimension is 24 is shown in FIG. 25 to FIG. 27.

In still another example, a kernel matrix whose dimension is 25 is shown in FIG. 28 and FIG. 29.

In still another example, a kernel matrix whose dimension is 28 is shown in FIG. 30.

In still another example, a kernel matrix whose dimension is 32 is shown in FIG. 10.

The kernel matrices listed in FIG. 20 to FIG. 30 are merely examples for description, and are not limited thereto.

Based on the encoding method provided in at least one embodiment, in response to polar encoding being used, a plurality of kernel matrices is first constructed, for example, the plurality of kernel matrices are constructed by using Solution 1 and/or Solution 2. Based on the constructed kernel matrices, an appropriate kernel matrix is selected for encoding based on an actual communication situation. In this manner, in response to the kernel matrix being constructed or selected, performance and decoding complexity are comprehensively considered, so that decoding complexity is reduced by selecting the appropriate kernel matrix used during encoding.

Decoding Side

As described above, in response to decoding being performed based on trellis, a trellis diagram is first split, and the decoding based on a complete trellis is split into decoding based on a sub-trellis. Then, an optimal path is selected by combining the intermediate results of decoding based on each small trellis diagram.

For example, a plurality of combinations are obtained after all paths in a trellis of a smaller level are spliced, and an optimal path and a path value of a trellis of a larger level are obtained by selecting a path with a largest score in these combinations.

For ease of understanding, the following shows an algorithm procedure. An algorithm procedure includes content in the following several aspects.

Aspect 1. Trellis splitting of a linear block code.

In at least one embodiment, multi-level splitting is performed on a trellis diagram of each stage t during polar code decoding.

A linear code C (8, 4) is given, and a generator matrix of the linear code C is $$G=\begin{pmatrix}1&1&1&1&1&1&1&1\\1&1&1&1&0&0&0&0\\1&1&0&0&1&1&0&0\\1&0&1&0&1&0&1&0\end{pmatrix}.$$

Let $C_{h,h'}$ be a subcode of the linear code C, and non-zero bits appear only in a location h≤i<h'; let $p_{h,h'}(C)$ be a linear code obtained by performing a puncturing operation on the linear code C at a location except h≤i<h'; and let $S_{h,h'}(C)=p_{h,h'}(C_{h,h'})$ be a code obtained by performing a shortening operation on the linear code C at a location except h≤<h'. For example, in response to 0≤i<4, that is, h=0 and h'=4, the following is obtained:

$$p_{0,4}(C)\colon\ G_{0,4}^{(p)}=\begin{pmatrix}1&1&1&1\\1&1&0&0\\1&0&1&0\end{pmatrix}$$

-continued $$s_{0,4}(C)\colon\ G_{0,4}^{(s)}=(1\ \ 1\ \ 1\ \ 1).$$

On the trellis diagram, the path from a moment h to a moment h' corresponds to the coset $p_{h,h'}(C)/S_{h,h'}(C)$.

Figure 31:
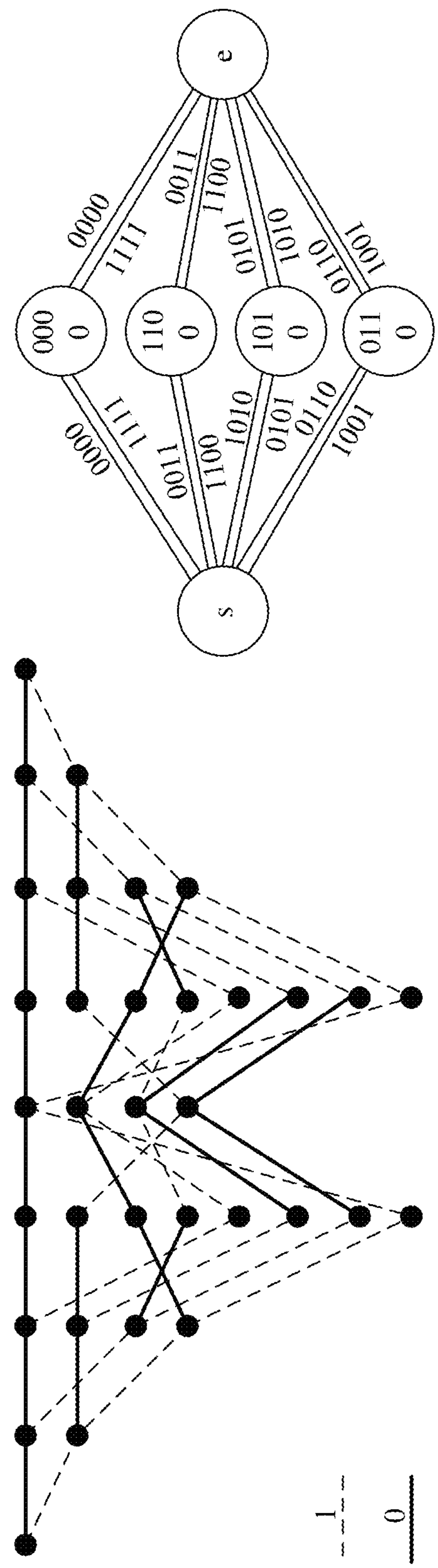
FIG. 31 is a schematic diagram of a general trellis and a splitting trellis of an (8, 4) code.

As shown in FIG. 31, the left figure shows a general trellis diagram of the (8, 4) code, and the right figure shows a splitting trellis diagram of the (8, 4) code. By calculating $p_{0,4}(C)/s_{0,4}(C)$ on the coset, four cosets is obtained, which are respectively:

①{(0000),(1111)}
②{(0011),(1100)}
③{(1010),(0101)}
④{(0110),(1001)}

Based on a correspondence between the left half part of the left figure and the left half part of the right figure in FIG. 31, the left half part of the left figure and the left half part of the right figure each indicate a path from a moment 0 to a moment 4.

Aspect 2. Trellis decoding of linear block code

For each cosec $D\in p_{h,h'}(C)/s_{h,h'}(C)$, the most likely entry l(D) and its corresponding score is to be found. For this, a composite branch table (composite branch table, CBT) is defined to store the two values. A score corresponding to an entry is represented by correlation discrepancy in the foregoing term explanation, for example, is denoted as E(D). As an example, $CBT_{(x,y)}=(/(D),E(D))$. ML decoding is performed on an (n, k) code, that is, only one entry is included in $p_{0,n}(C)/s_{0,n}(C)$. Therefore, $CBT_{(0,n)}$ stores a corresponding path and a corresponding path value in response to the ML decoding being used.

The CBT is merely a name for ease of description, and the name does not limit the protection scope of embodiments described herein. In addition, that the CBT includes only two entries is not limited in at least one embodiment. In actual communication, the CBT further includes another entry. This is not limited herein.

The correlation discrepancy herein indicates a score corresponding to an entry (that is, the path l(D)), and another solution that indicates a score (or a path value) corresponding to the entry is also applicable to at least one embodiment.

Aspect 3. CBT construction.

$CBT_{x,y}$ is constructed, and y−x≥2. Then, for a specific z (x<z<y), $CBT_{x,z}$ and $CBT_{z,y}$ is constructed. For $D_y\in p_{x,y}(C)/s_{x,y}(C)$, all cosecs of $D'\in p_{x,z}(C)/s_{x,z}(C)$ and $D''\in p_{z,y}(C)/s_{z,y}(C)$ is enumerated.

$$E(D)=\max_{\substack{D',D''\\ D'\cdot D''=D_y}}(E(D')+E(D''))$$

is obtained.

A path [x, y] is truncated into two parts. In this case, for the construction of $CBT_{x,y}$, all $D_y\in p_{x,y}(C)/s_{x,y}(C)$ are not enumerated, and the $CBT_{x,y}$ is obtained by using the foregoing truncation processing manner. This reduces complexity.

Figure 32:
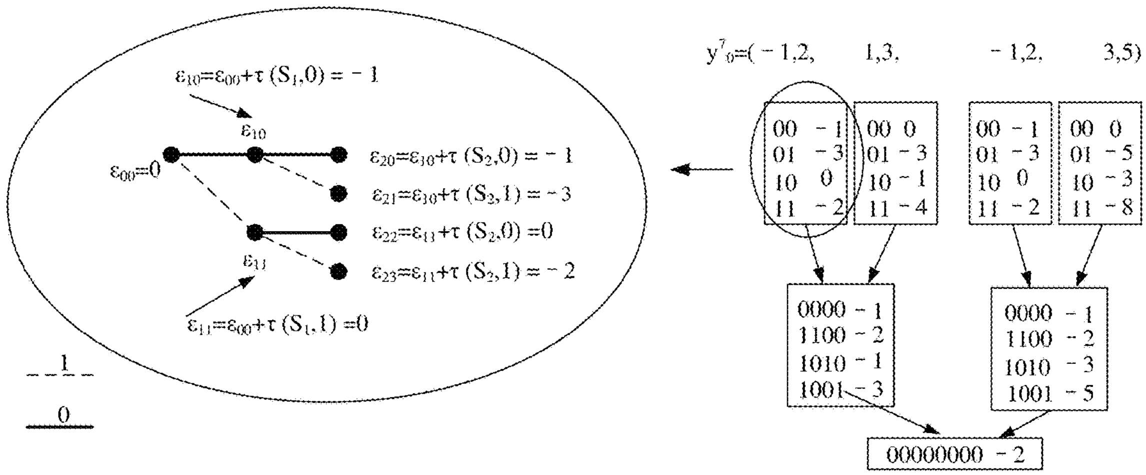
FIG. 32 to FIG. 34 are schematic diagrams of a process of decoding an (8, 4) Hamming code by using a method of separating a trellis.
Figure 33:
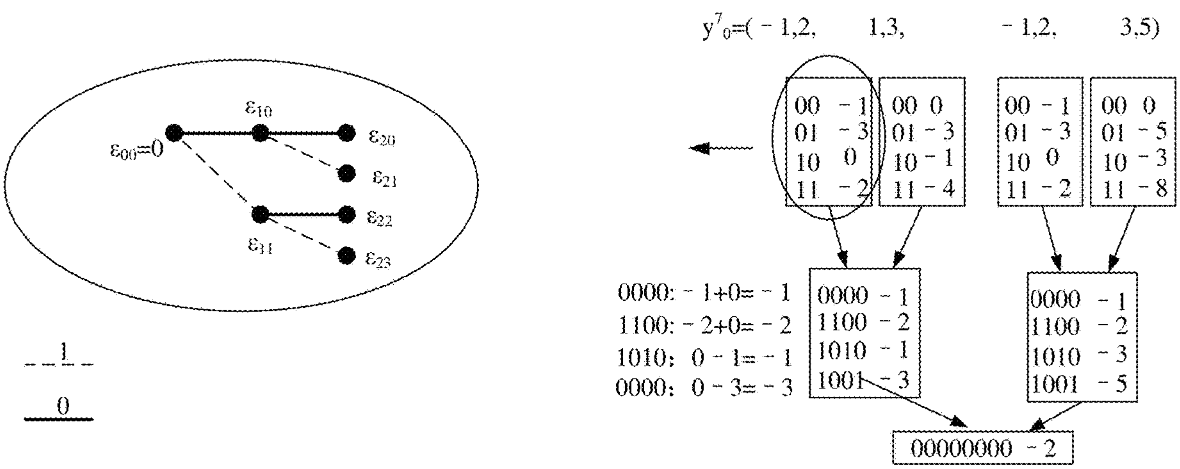
Figure 34:
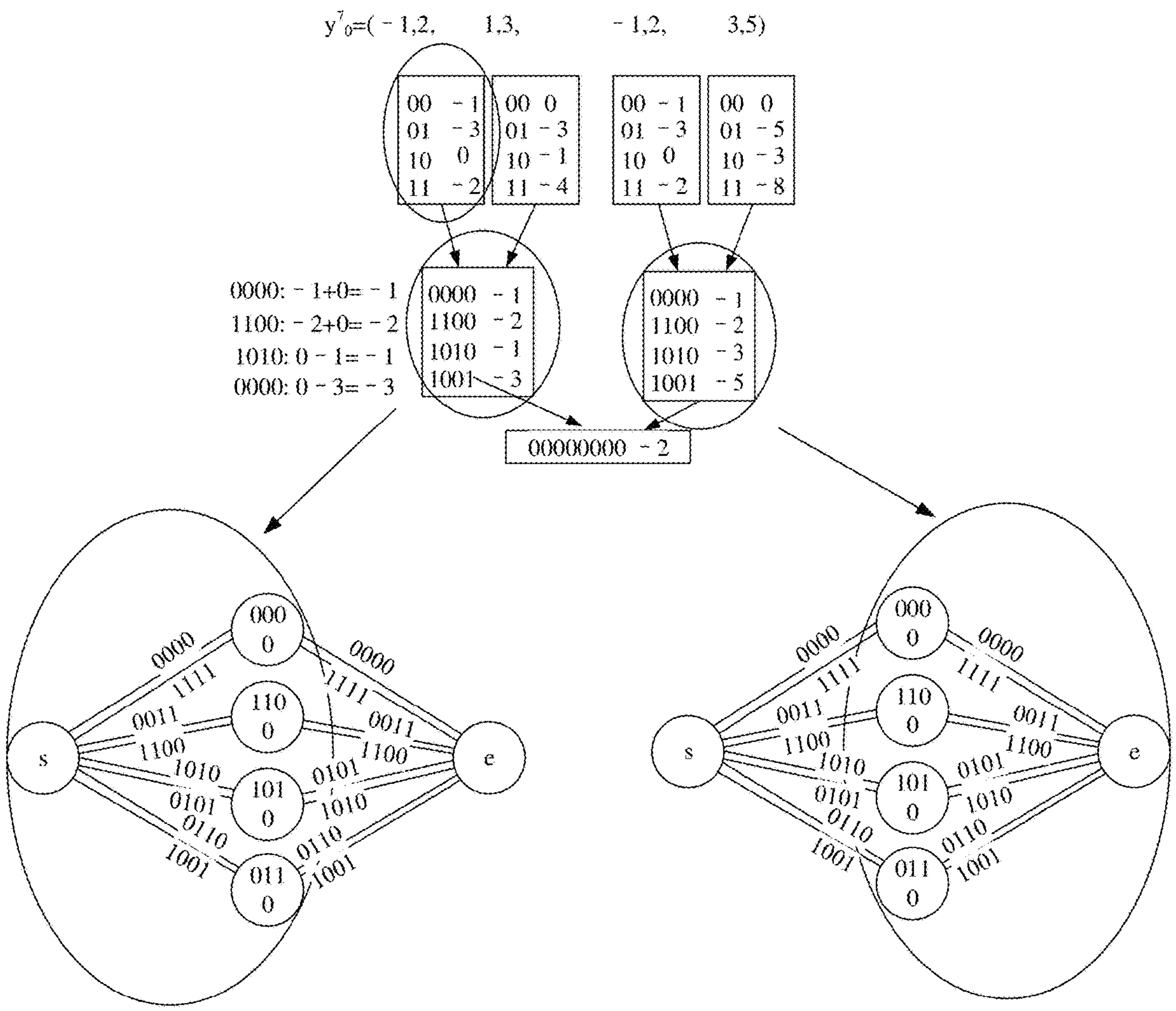

For ease of understanding, as an example, a process of decoding an (8, 4) Hamming code by using a trellis diagram splitting method is described in FIG. 32 to FIG. 34. For the Hamming code (8, 4), after channel transmission, a received signal at a receive end is $y_0^7=(-1, 2, 1, 3, -1, 2, 3, 5)$. The trellis diagram corresponding to a code whose length is 8 is split. As shown in FIG. 32, the trellis diagram is split into four subcodes whose lengths are 2, and the four subcodes whose lengths are 2 are respectively corresponding to one sub-trellis diagram.

FIG. 32 shows a corresponding path and a path value calculation process of an [0, 1] segment. As shown in FIG. 32, for the [0, 1], a corresponding path and the path value of the [0,1] segment is obtained through the following calculation:

For $\varepsilon_{20}$, $\varepsilon_{20}=\varepsilon_{10}+\tau(S_2,0)=-1$.

For $\varepsilon_{21}$, $\varepsilon_{21}=\varepsilon_{10}+\tau(S_2,1)=-3$.

For $\varepsilon_{22}$, $\varepsilon_{22}=\varepsilon_{11}+\tau(S_2,0)=0$.

For $\varepsilon_{23}$, $\varepsilon_{23}=\varepsilon_{11}+\tau(S_2,1)=-2$.

Similarly, [2, 3], [4, 5], [6, 7], and their corresponding sub-trellis diagrams are represented, and various paths, that is, path values, are calculated by using a similar method.

Next, an [0, 3] segment is obtained by combining corresponding paths of the [0, 1] and the [2, 3]. For example, a path with the largest path score is selected as a path of the [0, 3] segment, for example, a part enclosed by dashed lines in FIG. 33. Similarly, a right [4, 7] segment is also obtained by using a same operation. Finally, an entire part of [0, 7] is obtained by combining the [0, 3] and the [4, 7], for example, is obtained by using a path whose path score is the largest in various combinations of the [0, 3] and the [4, 7], as shown in FIG. 34.

In at least one embodiment, an appropriate location of the split point is selected based on an actual situation. The location of the split point affects decoding complexity. Take a kernel 24×24 as an example. For a selection of z (z:x<z<y):

For example, splitting is evenly performed. To be specific, z=(x+y)/2. In this case, 715 times of summations and 449 times of comparisons is used.

In still another example, splitting is performed according to an optimization algorithm. For example, [0, 24) is divided into [0, 16) and [16, 24), and is further evenly split. In this case, 250 times of summations and 124 times of comparisons is used.

Therefore, in actual communication, a location of the split point is selected based on the complexity, for example, some split points is selected, so as to reduce decoding complexity.

Aspect 4. A nested code and a nested generator matrix.

According to the foregoing definition, $s_{x,y}(C)\in p_{x,y}(C)$, and a generator matrix of $p_{x,y}(C)$ is represented as:

$$G_{x,y}^{(p)}=\begin{pmatrix} G_{x,z}^{(s)} & 0 \\ 0 & G_{z,y}^{(s)} \\ G_{x,y}^{(00)} & G_{x,y}^{(01)} \\ \hline G_{x,y}^{(10)} & G_{x,y}^{(11)} \end{pmatrix}.$$

A generator matrix of $s_{x,y}(C)$ is represented as:

$$G_{x,y}^{(s)}=\begin{pmatrix} G_{x,z}^{(s)} & 0 \\ 0 & G_{z,y}^{(s)} \\ G_{x,y}^{(00)} & G_{x,y}^{(01)} \end{pmatrix}.$$

Aspect 5. Recursive trellis decoding.

There is a one-to-one correspondence between a coset $D\in p_{x,y}(C)/s_{x,y}(C)$ and a vector $vG'_{x,y}$. $G'_{x,y}=(G_{x,y}^{(10)}\,G_{x,y}^{(11)})$ is a matrix $k'_{x,y}\times(y-x)$. Let $CBT_{x,y}[v]l:=l(D)$, and $CBT_{x,y}[v].e:=E(D)$, and then:

$$CBT_{x,y}[v]\cdot e=\max_{w\in F_2^{k''_{x-y}}}(CBT_{x,z}[a]\cdot e+CBT_{z,y}[b]\cdot e),$$

and $v\in F_2^{k''x,y}$.

a and b respectively indicate sequence numbers (which is represented in binary) of corresponding entries in coset $D'\in p_{x,z}(C)/s_{x,z}(C)$ and the coset $D''\in s_{z,y}(C)/s_{z,y}(C)$. In response to w and v indicating a sequence number corresponding to a path [x,y] segment, then:

$$(w,v)\begin{pmatrix} G_{x,y}^{(00)} \\ G_{x,y}^{(10)} \end{pmatrix}\in D',\text{ and }(w,v)\begin{pmatrix} G_{x,y}^{(01)} \\ G_{x,y}^{(11)} \end{pmatrix}\in D''.$$

In this case, a and b is obtained by using the following mapping relationship:

$$(a',a)\begin{pmatrix} G_{x,z}^{(s)} \\ G'_{x,z} \end{pmatrix}=(w,v)\begin{pmatrix} G_{x,y}^{(00)} \\ G_{x,y}^{(10)} \end{pmatrix}\Rightarrow a=(w\ \ v)\overline{G}_{x,y}$$

$$(b',b)\begin{pmatrix} G_{z,y}^{(s)} \\ G'_{z,y} \end{pmatrix}=(w,v)\begin{pmatrix} G_{x,y}^{(01)} \\ G_{x,y}^{(11)} \end{pmatrix}\Rightarrow b=(w\ \ v)\tilde{G}_{x,y}.$$

a and b' are unimportant parameters. According to the foregoing formula, the following is obtained:

$$CBT_{x,y}[v]\cdot e=\max_{w\in F_2^{k''_{x-y}}}\left(CBT_{x,z}\left[(w\ \ v)\overline{G}_{x,y}\right]\cdot e+CBT_{z,y}\left[(w\ \ v)\tilde{G}_{x,y}\right]\cdot e\right)$$

and $v\in F_2^{k''x,y}$.

Complexity of the foregoing calculation is approximately $O(2k'_{x,y}+k'_{x,y})$. Complexity of this method is related to a splitting policy, that is, how to select a split point z from x, y affects decoding complexity.

Aspect 6. A kernel processing method based on a recursive trellis.

As an example, let $u_0^{t-1}=0$. From the foregoing, $\varepsilon(c^{(0)},y_0^{l-1})$, and $\varepsilon(c^{(1)},y_0^{l-1})$ are entries of $CBT_{0,l}(\overline{C}^{(i)})$, and is obtained through recursion by using the following formula:

$$\begin{aligned}CBT_{x,y}[v]\cdot e&=\max_{w\in F_2^{k''_{x-y}}}(CBT_{x,z}[a]\cdot e+CBT_{z,y}[b]\cdot e)\\&=\max_{w_0}\max_{w_1}\dots\max_{w_{k''_{x-y}}}(CBT_{x,z}[a]\cdot e+CBT_{z,y}[b]\cdot e)\end{aligned}.$$

$a=(w\ v)\hat{G}_{x,y}$, and $b=(w\ v)\tilde{G}_{x,y}$. Sequence numbers of CBT entries are represented by v, a, and b. $k'=\dim p_{x,y}(C)$, and $k''=\dim s_{x,y}(C)$.

Optionally, decoding complexity is further simplified through processing in the decoding.

Manner 1. Reuse an intermediate decoding result.

In at least one embodiment, whether an intermediate result obtained from decoding performed based on a trellis is reused by decoding performed based on another trellis is determined based on a correlation between trellises.

In an example, in response to the correlation between the trellises being large, for example, in response to trellises being similar or the same, or in response to a specific condition being met, a decoding result obtained through decoding performed based on the trellis is directly used during the decoding performed based on another trellis. For example, a combination CBT of all parts in the polar code decoding stage t is the same as a CBT in t+1 stage. In this case, no calculation is to be performed again in the stage t+1.

Optionally, whether a result of each decoding stage is reused is determined based on a code obtained by performing a shortening operation on the linear code C in different decoding stages and/or a code obtained by performing a puncturing operation on the linear code C in different decoding stages. In other words, a correlation between trellises is determined based on a code obtained by performing a shortening operation on the linear code C in different decoding stages and/or a code obtained by performing a puncturing operation on the linear code C in different decoding stages, so as to determine whether a result of each decoding stage is reused.

In at least one embodiment, whether the intermediate decoding result is reused is determined by checking a relationship between $p_{x,y}(C^{(t+1)})$ and $p_{x,y}(C^{(t)})$ and/or a relationship between $s_{x,y}(C^{(t+1)})$ and $s_{x,y}(C^{(t)})$.

Case 1. In response to $s_{x,y}(C^{(t+1)})=s_{x,y}(C^{(t)})$ and $p_{x,y}(C^{(t+1)}\subset p_{x,y}(C^{(t)})$, the intermediate decoding result is reused. In other words, in response to $s_{x,y}(C^{(t+1)})=s_{x,y}(C^{(t)})$ and $p_{x,y}(C^{(t+1)})\subset p_{x,y}(C^{(t)})$, the CBT in the stage t+1 is a subset of the CBT in the stage t, and is directly obtained without recalculation.

Case 2. In response to $s_{x,y}(C^{(t+1)})\ s_{x,y}(C^{(t)}$, the intermediate decoding result is reused. For example, a maximization operation result in the intermediate process is saved to reduce the calculation amount in the stage t+1.

Manner 1 is used in each stage of polar code decoding. For example, in each stage of polar code decoding, whether the foregoing two cases are met is determined.

Manner 2. Simplify calculation workload.

In at least one embodiment, a same value is subtracted from entries of all CBTs, while the processing does not affect a final result. For understanding, specific examples are listed in the following.

In an example, for k'=2, k"=1, consider calculating:

$$CBT_{x,y}[0]\cdot e=\max(CBT_{x,z}[0]\cdot e+CBT_{z,y}[0]\cdot e, CBT_{x,z}[1]\cdot e+CBT_{z,y}[1]\cdot e)$$

$$CBT_{x,y}[1]\cdot e=\max(CBT_{x,z}[0]\cdot e+CBT_{z,y}[1]\cdot e, CBT_{x,z}[1]\cdot e+CBT_{z,y}[0]\cdot e)$$

$$\Delta=CBT_{x,y}[0]\cdot e-CBT_{x,y}[1]\cdot e=L_{x,z}\boxplus L_{z,y}.$$

Thus:

$$\Delta=CBT_{x,y}[0]\cdot e-CBT_{x,y}[1]\cdot e=L_{x,z}\boxplus L_{z,y}.$$

$$L_{p,q}=CBT_{p,q}[0]\cdot e-CBT_{p,q}[1]\cdot e,\text{ and } a\boxplus b=\mathrm{sgn}(a)\mathrm{sgn}(b)\min(|a|,|b|).$$

For example, $CBT_{x,y}[0]\cdot e=\Delta$ and $CBT_{x,y}[1]\cdot e=0$ is set. In this case, only three operations are used. Compared with a direct method (the direct method used six operations), a lot of calculation amounts is reduced, and decoding duration is reduced.

For another example, in response to $CBT_{p,q}[1]\cdot e=0$, the calculation amount is further reduced, for example, two subtractions is eliminated.

In yet another example, for k'=1, k"=0, consider calculating:

$$CBT_{x,y}[v]\cdot e=CBT_{x,z}[v]\cdot e+CBT_{z,y}[v]\cdot e, v\in\{0,1\}.$$

In response to being guaranteed that for any channel vector $CBT_{x,z}[1]\cdot e=CBT_{z,y}[v]\cdot e=0$, $CBT_{x,z}[1]\cdot e=0$ is set. In this case, only one summation is used.

In kernel processing, the manner of reducing the calculation amount through some calculation processing is applicable to at least one embodiment.

In response to many different kernels being processed, in the foregoing Manner 2, the calculation amount is greatly reduced, and the decoding duration is reduced.

In the foregoing Aspect 6, $u_0^{t-1}=0$ is mainly used as an example for description. In response to $u_0^{t-1}\neq 0$, the formula $CBT_{x,y}[v]\cdot e$ is to be replaced with the following formula:

$$CBT_{x,y}[v]\cdot e=\max_{w\in F_2^{k''_{x-y}}}(CBT_{x,z}[a+\delta']\cdot\varepsilon+CBT_{z,y}[b+\delta'']\cdot\varepsilon).$$

δ', and δ" indicate offsets, that is, δ' and δ" are offsets depending on $u_0^{t-1}$.

The foregoing describes the solutions in the decoder in detail with reference to Aspect 1 to the Aspect 6. For understanding, the following uses specific examples for description.

Example 1. A kernel processing on an Arikan matrix with two iterations.

Let $$K=M^{(2)}F_2^{\otimes 2}=\begin{pmatrix}1&0&0&0\\1&0&1&0\\1&1&0&0\\1&1&1&1\end{pmatrix}.$$

Figure 35:
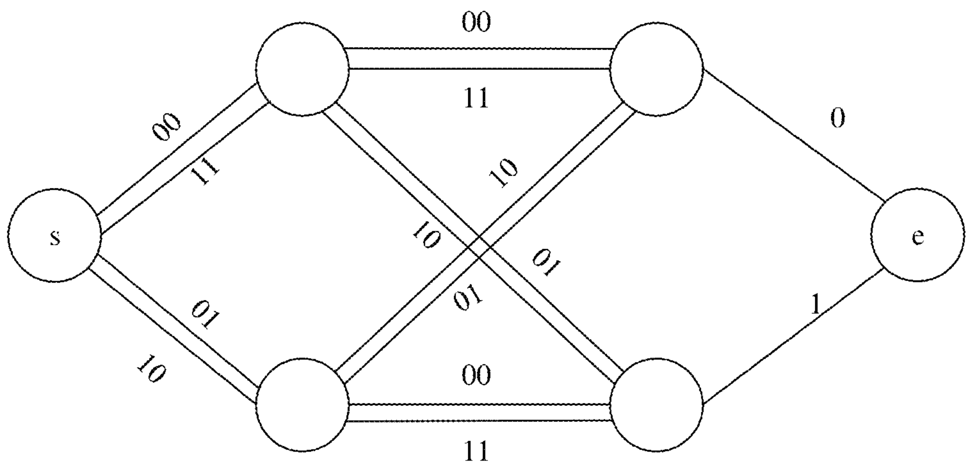

FIG. 35 is used as an example. For $C^{(0)}$, $$K^{(0)}=\begin{pmatrix}1&0&0&0&1\\1&0&1&0&0\\1&1&0&0&0\\1&1&1&1&0\end{pmatrix}.$$

$p_{0,4}(C^{(0)})$ is a (4, 4) code and $s_{0,4}(C^{(0)})$ is a (4, 3) code. Through calculation, leaders of a coset $p_{0,4}(C^{(0)})/s_{0,4}(C^{(0)})$ are (0,0,0,0) and (1,0,0,0).

$p_{0,2}(C^{(0)})$ and $p_{2,4}(C^{(0)})$ are (2, 2) codes, and $s_{0,2}(C^{(0)}$ and $s_{2,4}(C^{(0)})$ are (2, 1) codes. A state at a moment 2 is: $S_2$ (0,0,0,0)={(0,0)} and $S_2$ (1,0,0,0)={(1,0)}. Therefore, the following formula is obtained:

$$CBT_{0,2}^{(0)}=[\max(e_{0,0}+e_{0,1},e_{1,0}+e_{1,1}),\max(e_{1,0}+e_{0,1},e_{0,0}+e_{1,1})]$$

$$CBT_{2,4}^{(0)}=[\max(e_{0,2}+e_{0,3},e_{1,2}+e_{1,3}),\max(e_{1,2}+e_{0,3},e_{0,2}+e_{1,3})]$$

$$CBT_{0,4}^{(0)}=[\max(CBT_{0,2}^{(0)}[0]+CBT_{2,4}^{(0)}[0],CBT_{0,2}^{(0)}[1]+CBT_{2,4}^{(0)}[1]),$$

$$\max(CBT_{0,2}^{(0)}[0]+CBT_{2,4}^{(0)}[1],CBT_{0,2}^{(0)}[1]+CBT_{2,4}^{(0)}[0])].$$

$$e_{i,j}=\tau(S(y_j)i).$$

Figure 36:
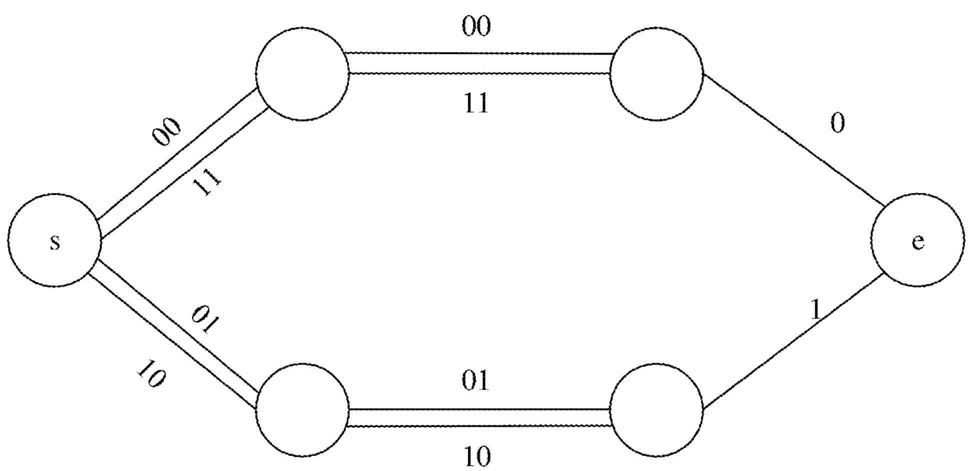

FIG. 36 is used as an example. For $C^{(1)}$, $$K^{(1)}=\begin{pmatrix}1&0&1&0&1\\1&1&0&0&0\\1&1&1&1&0\end{pmatrix}.$$

$p_{x,x+2}(C^{(1)})=p_{x,x+2}(C^{(0)}), s_{x,x+2}(C^{(1)})=s_{x,x+2}(C^{(0)}), \quad x\in\{0, 2\}$, $p_{0,4}(C^{(1)})$ is a (4, 3) code and $s_{0,4}(C^{(1)})$ is a (4, 2) code. Vectors (0,0,0,0) and (1,0,1,0) in the coset of the (4, 3) code and the (4, 2) code are considered. An assumption is that $u_0=0$, the following formula is obtained:

$$CBT_{0,4}^{(0)}=[\max(CBT_{0,2}^{(0)}[0]+CBT_{2,4}^{(0)}[0], CBT_{0,2}^{(0)}[1]+CBT_{2,4}^{(0)}[1])].$$

FIG. 37 is used as an example. For $C^{(2)}$, $$K^{(2)}=\begin{pmatrix}1 & 1 & 0 & 0 & 1\\ 1 & 1 & 1 & 1 & 0\end{pmatrix}.$$

$p_{0,2}(C^{(2)})$ and $p_{2,4}(C^{(2)})$ are (2, 1) codes; $s_{0,2}(C^{(2)})$ and $s_{2,4}(C^{(2)})$ are (2, 0) codes; $p_{0,4}(C^{(2)})$ is a (4, 2) code, and $s_{0,4}(C^{(2)})$ is a (4, 1) code. Vectors (0,0,0,0) and (1,1,0,0) in the coset are considered. Therefore, $S_2(0,0,0,0)=\{(0,0)\}$ and $S_2(1,1,0,0)=\{(1,1)\}$. Therefore, only the coset (0, 0) and (1, 1) of the (2, 0) code is to be considered. Assume $u_0=u_1=0$, the following is obtained:

$$CBT_{0,2}^{(0)}=[e_{0,0}+e_{0,1}, e_{1,0}+e_{1,1}], \text{ and } CBT_{2,4}^{(0)}=[e_{0,2}+e_{0,3}, e_{1,2}+e_{1,3}]$$

$$CBT_{0,4}^{(2)}=[\max(CBT_{0,2}^{(2)}[0]+CBT_{2,4}^{(2)}[0], CBT_{0,2}^{(2)}[1]+CBT_{2,4}^{(2)}[1]),$$

$$\max(CBT_{0,2}^{(2)}[0]+CBT_{2,4}^{(2)}[1], CBT_{0,2}^{(2)}[1]+CBT_{2,4}^{(2)}[0])].$$

For $C^{(3)}$, $K^{(3)}=(1\ 1\ 1\ 1\ 1)$.

$p_{0,2}(C^{(3)})=p_{0,2}(C^{(2)})=p_{2,4}(C^{(2)})=p_{2,4}(C^{(3)})$ is a (2, 1) code, $s_{0,2}(C^{(2)})$ and $s_{2,4}(C^{(2)})$ are (2, 0) codes, $p_{0,4}(C^{(3)})$ is a (4, 1) code, and $s_{0,4}(C^{(4)})$ is a (4, 0) code. The following is obtained:

$$CBT_{0,4}^{(3)}=[CBT_{0,2}^{(2)}[0]+CBT_{2,4}^{(2)}[0], CBT_{0,2}^{(2)}[1]+CBT_{2,4}^{(2)}[1]].$$

The kernel processing on an Arikan matrix with two iterations is described above as an example. The foregoing specific kernel processing is merely an example for description, and is not strictly limited thereto.

Example 2. A kernel processing on a high-dimensional kernel matrix.

Figure 39:
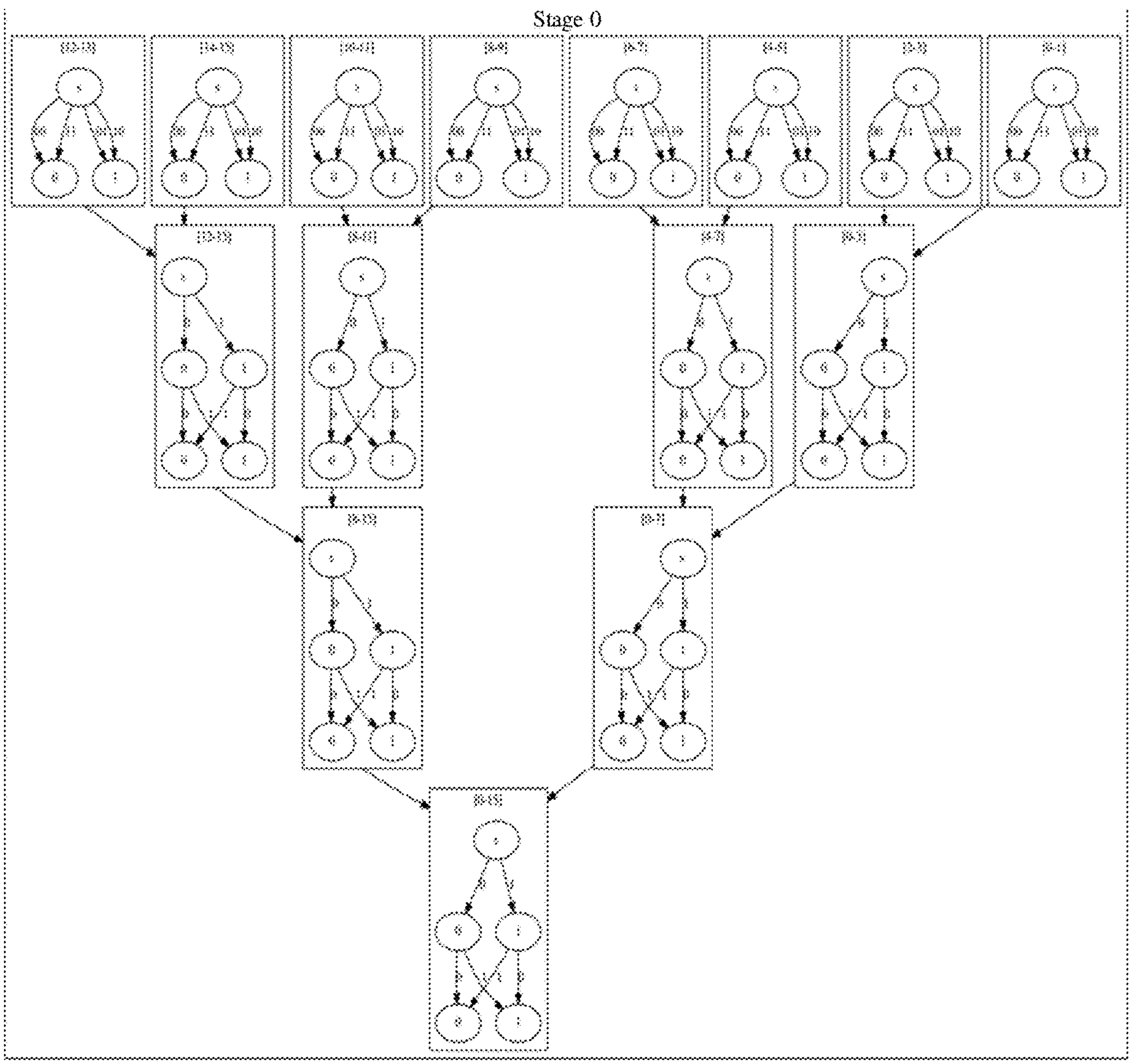
FIG. 39 is a recursive trellis diagram applicable to at least one embodiment.
Figure 39:
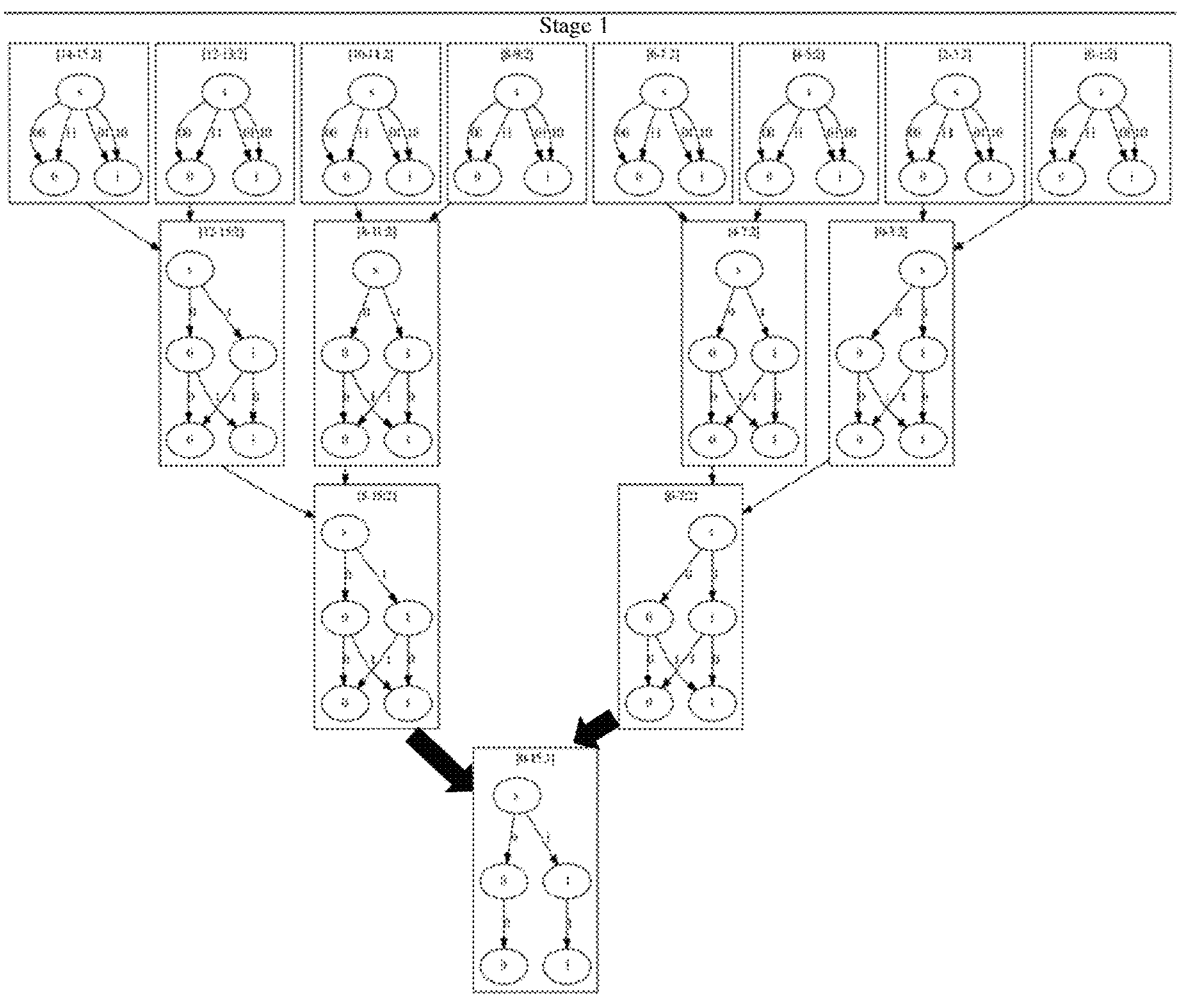
Figure 39:
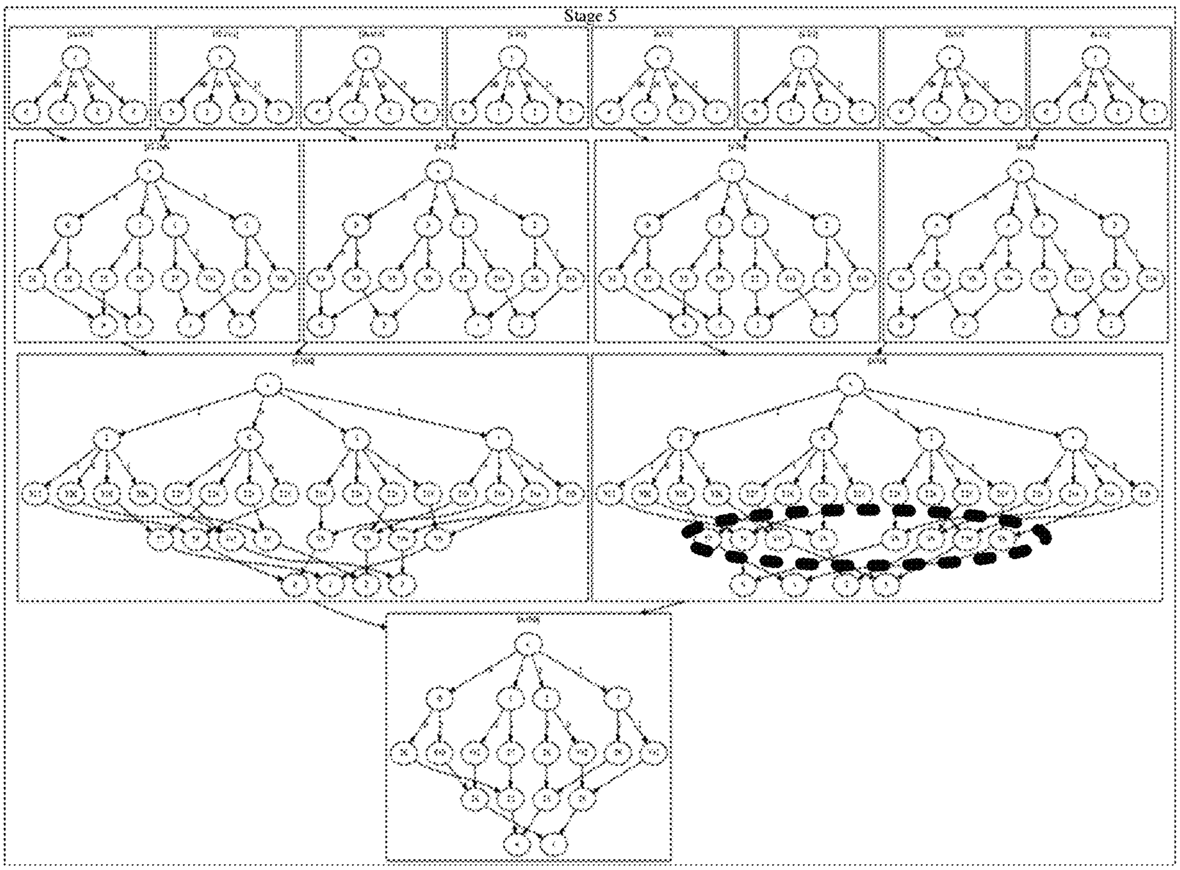
Figure 39:
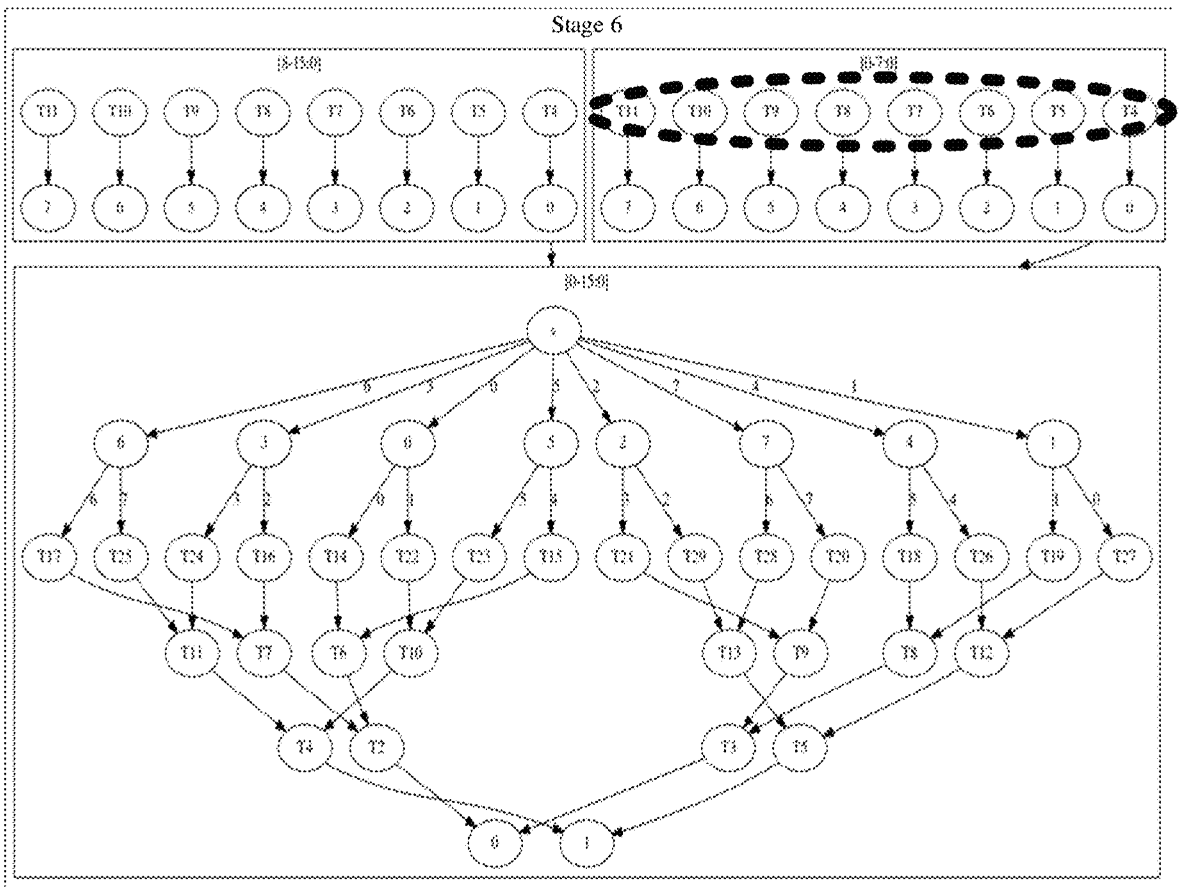

SC decoding is used as an example. The decoding method based on a recursive trellis is applied to each stage of the SC decoding of the polar code. A kernel matrix $K_1$ is shown in FIG. 38. The polar code is decoded based on the decoding method provided in at least one embodiment. FIG. 39 shows a partial recursive trellis diagram corresponding to the kernel.

In some cases, for example, $s_{x,y}(C^{(t+1)})=s_{x,y}(C^{(t)})$ and $p_{x,y}(C^{(t+1)})\subset p_{x,y}(C^{(t)})$, the CBT in the stage t+1 is a subset of the CBT in the stage t, and is directly obtained without recalculation. From FIG. 39 (1) and FIG. 39 (2) that, in a t=1 stage during decoding, except a part indicated by a bold arrow, trellises of other parts are completely the same as those in a t=0 stage. This indicates that in response to decoding being performed in the t=1 stage, a result in the t=0 stage is reused as an intermediate result, and calculation is not performed again. A large amount of calculation is reduced.

In some cases, for example, in response to $s_{x,y}(C^{(t+1)})\subset s_{x,y}(C^{(t)})$, the intermediate result of decoding is reused. For example, a maximization operation result in the intermediate process is saved to reduce the calculation amount in the stage t+1. From FIG. 39 (3) and FIG. 39 (4) that a comparison operation (the result of the maximization selection operation) in the middle of decoding in a t=5 stage is reused in a t=6 stage, thereby reducing the calculation amount.

According to the decoding method provided in at least one embodiment, in different stages of polar code decoding, in response to a step that is calculated in a previous stage reappearing in a subsequent stage, a previous calculation result is directly reused. This reduces polar decoding complexity.

Table 1 shows complexity comparison between the decoding algorithm provided in at least one embodiment and a Viterbi decoding algorithm in response to different kernel matrices being used on an encoding side.

TABLE 1

| | Viterbi Decoding Algorithm | | Decoding Algorithm in This Embodiment | |
|---|---|---|---|---|
| Kernel | summation | comparison | summation | comparison |
| $K_{20}$ | 1189 | 2392 | 497 | 309 |
| $K'_{20}$ | 3346 | 6714 | 1685 | 1279 |
| $K''_{20}$ | 7524 | 15054 | 4051 | 3341 |
| $K_{24}$ | 2102 | 4218 | 715 | 449 |
| $K'_{24}$ | 4705 | 9424 | 2039 | 1483 |
| $K''_{24}$ | 10043 | 20100 | 5523 | 4371 |
| $K_{28}$ | 2865 | 5776 | 1005 | 671 |
| $K_{32}$ | 4536 | 9072 | 341 | 191 |

From Table 1 that complexity of the decoding algorithm provided in at least one embodiment is greatly reduced compared with the existing algorithm.

Optionally, at least one embodiment is used not only in a binary domain, but also in a non-binary domain. Table 2 shows complexity comparison between the decoding algorithm provided in at least one embodiment and the Viterbi decoding algorithm in response to different kernel matrices being used in the non-binary domain. Reed-Solomon indicates a Reed-Solomon code, and Hermitian indicates Hermitian.

TABLE 2

| | Viterbi Decoding Algorithm | | Decoding Algorithm in This Embodiment | |
|---|---|---|---|---|
| Kernel | summation | comparison | summation | comparison |
| 4 × 4 Reed-Solomon over GF ($2^2$) | 177 | 232 | 140 | 116 |
| 8 × 8 Reed-Solomon over GF ($2^3$) | 66017 | 75440 | 46264 | 45896 |
| 8 × 8 Hermitian over GF ($2^2$) | 2484 | 3304 | 1256 | 1072 |

From Table 2, the complexity is still greatly reduced in the non-binary domain by using the decoding algorithm provided in at least one embodiment.

Figure 40:
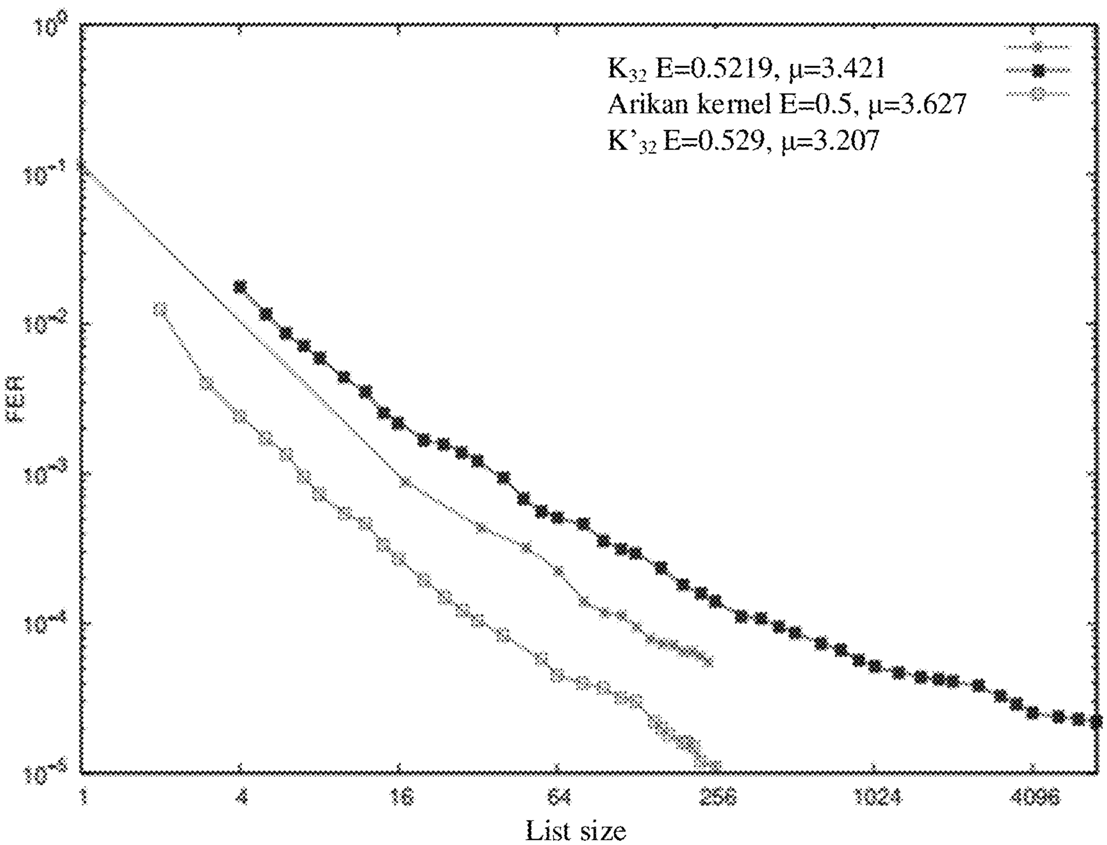
FIG. 40 and FIG. 41 are schematic diagrams of a comparison of performance and complexity of a (1024, 512) polar subcode by using a kernel $K_{32}$, a kernel $K'_{32}$, and an Arikan kernel.
Figure 41:
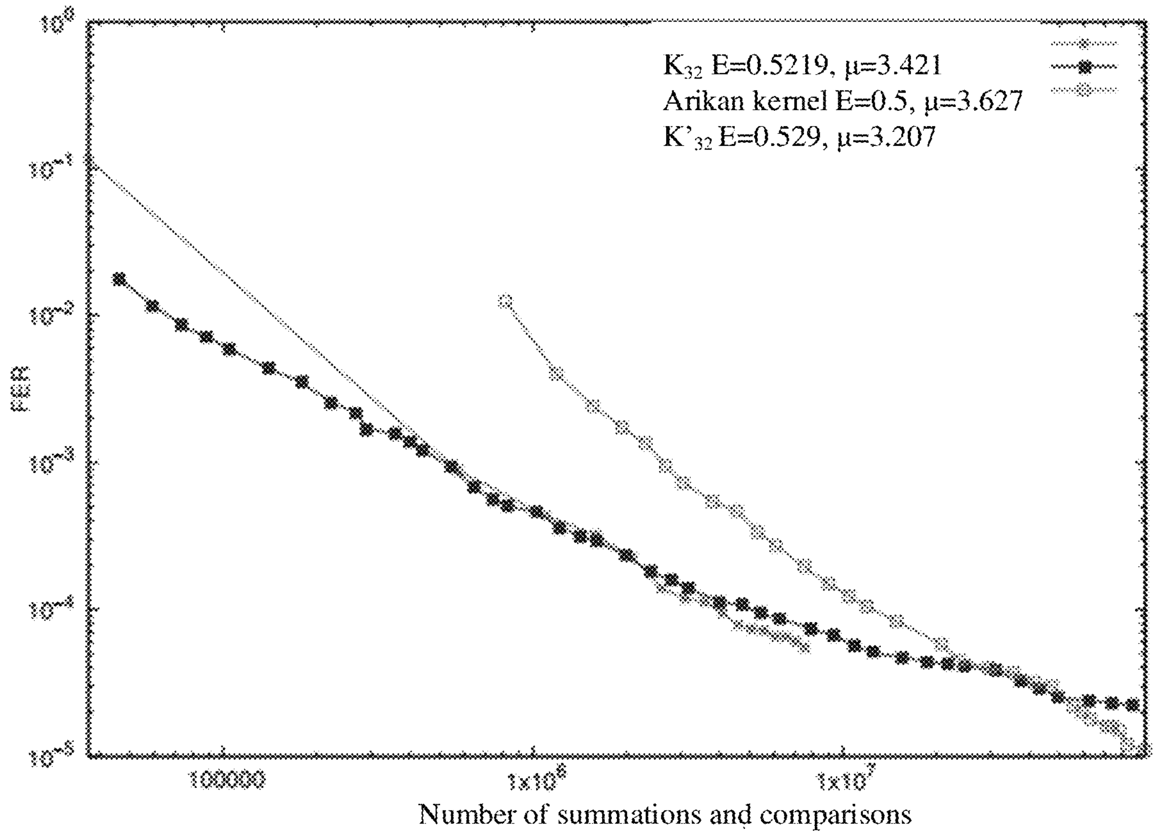

In addition, FIG. 40 and FIG. 41 show a comparison between performance and complexity of decoding on a decoding side in response to a kernel $K_{32}$, a kernel $K'_{32}$, and an Arikan kernel are used on an encoding side for a polar subcode (1024, 512). In FIG. 40 and FIG. 41, a vertical coordinate FER indicates a frame error ratio, a horizontal coordinate in FIG. 40 indicates list size, and a horizontal coordinate in FIG. 41 indicates number of summations and comparisons. From FIG. 40, in response to the kernel $K_{32}$ and the kernel $K'_{32}$ are used in response to their list sizes being the same, performance is improved by using the decoding algorithm provided in at least one embodiment. In terms of complexity, a line indicating the Arikan kernel intersects with lines indicating the kernel $K_{32}$ and the kernel $K'_{32}$ at different FERs. A curve corresponding to the kernel $K_{32}$ and a curve corresponding to the Arikan kernel are at an intersection of FER=$3\times10^{-4}$. A list size of the curve corresponding to the kernel $K_{32}$ is L=32, and a list size of the curve corresponding to the Arikan kernel is L=200. In response to the kernel $K'_{32}$ being used, and the FER is the same as that of the Arikan kernel, the list size is L=96. In this case, the list size of the Arikan kernel is L=4096.

Figure 42:
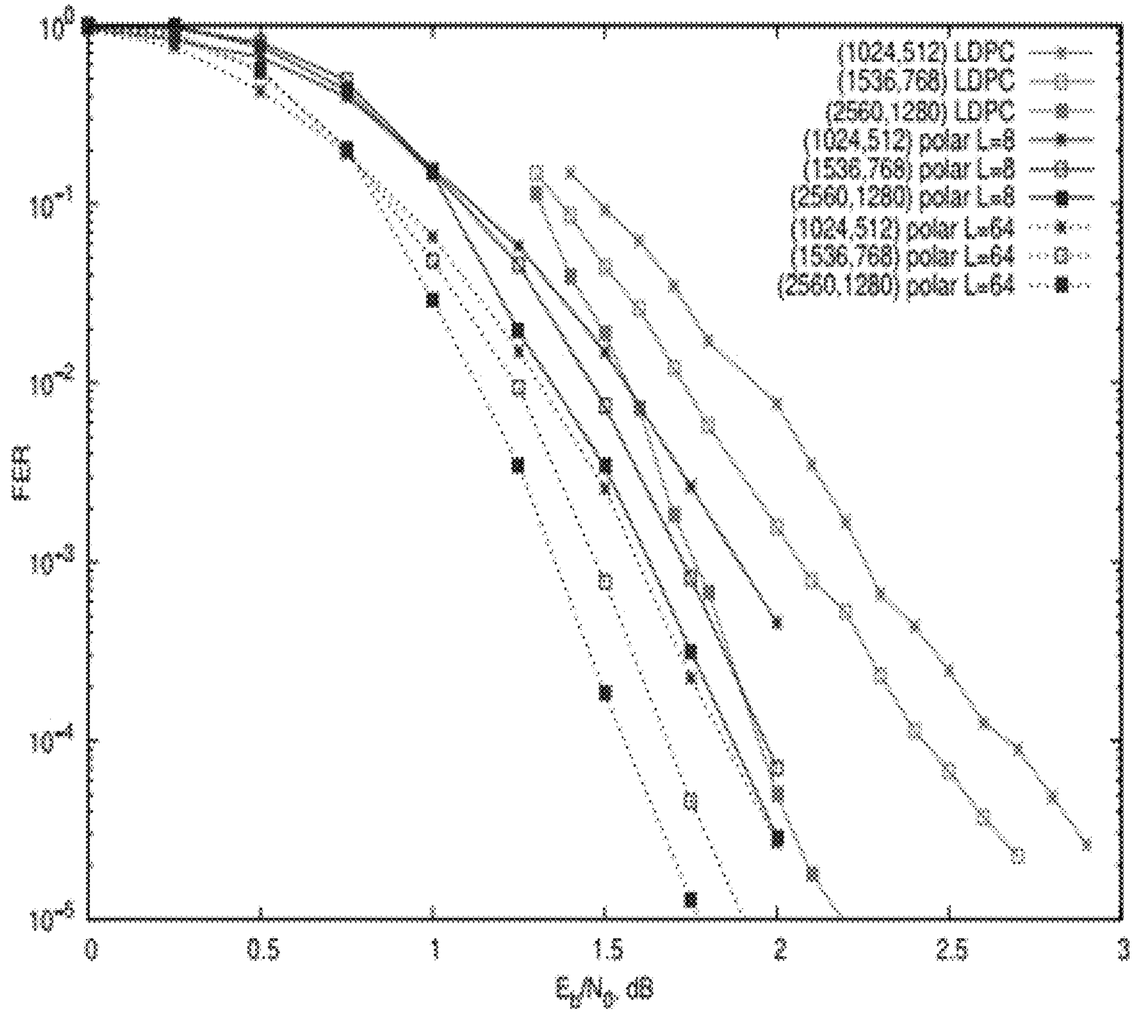
FIG. 42 and FIG. 43 are schematic diagrams of a comparison between a polar code and a 5G LDPC code in terms of performance and complexity.
Figure 43:
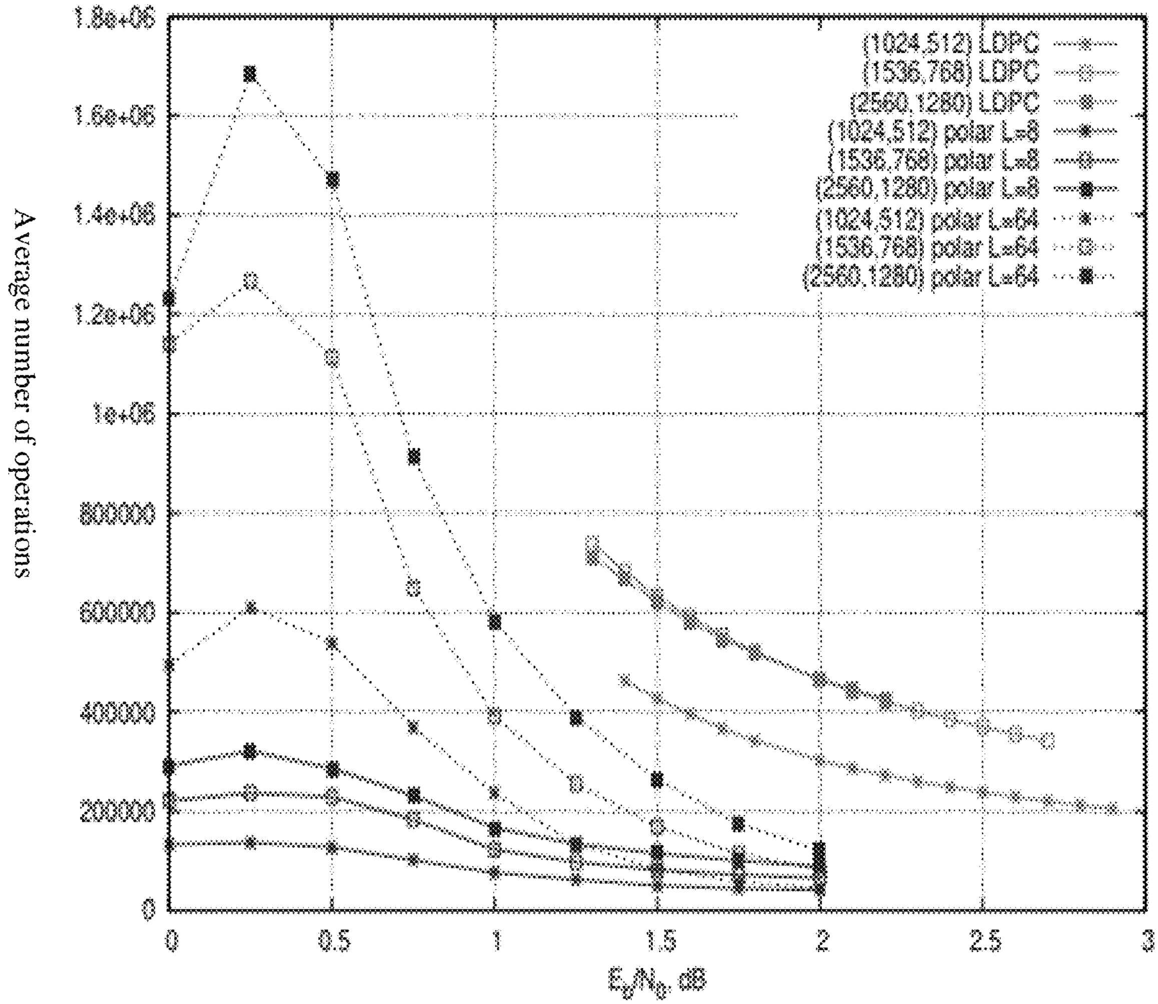

FIG. 42 and FIG. 43 show comparison results in terms of performance and complexity between a polar code and a Low-density Parity-check code (LDPC code). In FIG. 42 and FIG. 43, a horizontal coordinate $E_b/N_0$ indicates an errored bit ratio, $E_b$ indicates signal energy per bit, No indicates a power spectrum density of noise, a vertical coordinate FER in FIG. 42 indicates a frame error ratio, and a vertical coordinate in FIG. 43 indicates an average number of operations. From FIG. 42 and FIG. 43, the polar code has more advantages in both performance and complexity.

The formulas in embodiments described herein are merely examples for description, and do not limit the protection scope of embodiments described herein. The formulas in the foregoing embodiments are mainly examples provided with reference to designs in the prior art, and definitions of the parameters is definitions in a general sense. In a process of calculating the foregoing related parameters, calculation is also performed according to the foregoing formulas, or calculation is performed based on variations of the foregoing formulas, or calculation is performed in another manner to meet a calculation result of the formulas.

The solutions on the encoder and the decoder is used separately, or is used in combination. This is not limited herein. For example, encoding is performed by using the encoding method provided in at least one embodiment, and decoding is performed by using an existing decoding method. For another example, encoding is performed by using an existing encoding method, and decoding is performed by using the decoding method provided in at least one embodiment. For another example, encoding is performed by using the encoding method provided in at least one embodiment, and decoding is performed by using the decoding method provided in at least one embodiment. In an example, encoding (polar code encoding) is implemented by multiplying a data vector and Kronecker products of some matrices (kernel), and decoding is performed at a receive end by using a decoding method based on recursive trellis.

In some of the foregoing examples, SC decoding is used as an example for description. This is not limited herein. For example, embodiments described herein are further used in decoding methods such as SCL, sequence decoding, and SC-Flip.

Based on the foregoing technical solution, in some embodiments, in response to the to-be-decoded sequence being decoded by using a decoding algorithm based on the trellis, the trellis is first split, and the decoding based on a complete trellis is split into decoding based on a sub-trellis, thereby reducing decoding complexity. In other words, in response to calculation being performed on different sub-trellises, some calculation steps is the same. Therefore, reusing is performed for a plurality of times, so that decoding complexity is greatly reduced, and decoding speed is improved.

In addition, based on the foregoing technical solutions, in some embodiments, in response to the polar encoding being performed, a plurality of kernel matrices are first constructed, and an appropriate kernel matrix is selected for encoding based on the constructed kernel matrices and an actual communication status. In this manner, in response to the kernel matrix being constructed or selected, performance and decoding complexity are comprehensively considered, so that decoding complexity is reduced by selecting the appropriate kernel matrix used during encoding.

Embodiments described in this specification is independent solutions, or is combined based on internal logic. All these solutions fall within the protection scope of embodiments described herein. For example, the solutions on the encoder and the decoder is used separately, or is used in combination.

In the foregoing method embodiments, methods and operations implemented by a decoder device (for example, a network device or a terminal device) is also implemented by a component (for example, a chip or a circuit) that is used in the decoder device, and methods and operations implemented by an encoder device (for example, a network device or a terminal device) is also implemented by a component (for example, a chip or a circuit) that is used in the encoder device.

The foregoing describes in detail the method provided in embodiments described herein. The following describes in detail apparatuses provided in embodiments described herein with reference to FIG. 44 to FIG. 46. Descriptions of apparatus embodiments correspond to the descriptions of the method embodiments. Therefore, for content that is not described in detail, refer to the foregoing method embodiments. For brevity, details are not described herein again.

In at least one embodiment, function module division is performed on an encoder device or a decoder device based on the foregoing method example. For example, each function module is obtained through division corresponding to each function, or two or more functions is integrated in one processing module. The integrated module is implemented in a form of hardware, or is implemented in a form of a software functional module. In at least one embodiment, division into the modules is an example and is merely logical function division, and is other division in an actual implementation. An example in which each functional module is obtained through division based on each corresponding function is used below for description.

Figure 44:
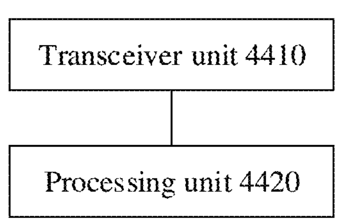
FIG. 44 is a schematic block diagram of an apparatus according to at least one embodiment.

FIG. 44 is a schematic block diagram of an apparatus according to at least one embodiment. An apparatus 4400 includes a transceiver unit 4410 and a processing unit 4420. The transceiver unit 4410 implements a corresponding communication function, and the processing unit 4420 is configured to perform data processing. The transceiver unit 4410 is also referred to as a communication interface or a communication unit.

Optionally, the apparatus 4400 further includes a storage unit. The storage unit is configured to store instructions and/or data. The processing unit 4420 reads the instructions and/or data in the storage unit, to enable the apparatus to implement the foregoing method embodiments.

The apparatus 4400 is configured to perform an action performed by the encoder device in the foregoing method embodiment. In this case, the apparatus 4400 is the encoder device or the component that is disposed in the encoder device. The transceiver unit 4410 is configured to perform operations related to receiving and sending on the encoder device in the foregoing method embodiment. The processing unit 4420 is configured to perform processing-related operations on the encoder device in the foregoing method embodiment.

Alternatively, the apparatus 4400 is configured to perform an action performed by the decoder device in the foregoing method embodiment. In this case, the apparatus 4400 is the decoder device or the component that is disposed in the decoder device. The transceiver unit 4410 is configured to perform operations related to receiving and sending on the decoder device in the foregoing method embodiment. The processing unit 4420 is configured to perform processing-related operations on the decoder device in the foregoing method embodiment.

In another design, the apparatus 4400 is configured to perform an action performed by the encoder device in the embodiment shown in FIG. 14. The transceiver unit 4410 is configured to obtain information bits. The processing unit 4420 is configured to determine a target kernel matrix, where the target kernel matrix is obtained by adjusting an original kernel matrix. The processing unit 4420 is further configured to perform polar encoding on the information bits based on the target kernel matrix.

In an example, a dimension of the target kernel matrix is less than a dimension of the original kernel matrix.

In still another example, the target kernel matrix is obtained by adjusting a partial distance of the original kernel matrix.

As yet another example, the target kernel matrix is obtained by adjusting the partial distance of the original kernel matrix according to a depth-first search algorithm.

In still another example, in response to processing being performed according to the depth-first search algorithm, one or more of the following constraints are used for processing: a candidate line set M meets: $M[i]=\{v_0^{\ell-1}\in F_2^{\ell} \mid wt(v_0^{\ell-1})=D_i\}$; or in response to the $i^{th}$ line being selected from the bottom in the candidate line set M, a Hamming weight of a selected line v is greater than or equal to $D_i$; or selecting the line v from the candidate line set M and performing partial distance calculation on the line v and a constructed line, where in response to $c\in C_{\bar{K}}^{(\varphi+1)}\oplus\bar{K}[\varphi]$, and $wt(c)<D_\varphi$, the line v is directly discarded, and a new line from the candidate line set M is selected; or a line that belongs to a same coset is not selected again, where i indicates a line number, $i\in[0,l-1]$, wt(v) and wt(c) both indicate the Hamming weight, $\bar{K}$ indicates a currently constructed kernel matrix $\bar{K}$, $\bar{K}[\varphi]$ indicates the $q_{th}$ line of the kernel matrix $\bar{K}$, $D_i$ and $D_\varphi$ both indicate the partial distance, K indicates a code corresponding to the kernel matrix $\bar{K}$, and ⊕ indicates a logical operation.

In still another example, the original kernel matrix is a kernel matrix $K_{24}$ whose dimension is (24×24), and the $K_{24}$ is:

| | | | | | | | | | | | | | | | | | | | | | | | |
|---|---|---|---|---|---|---|---|---|---|---|---|---|---|---|---|---|---|---|---|---|---|---|---|
| 1 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 |
| 1 | 0 | 0 | 0 | 0 | 0 | 0 | 0 | 0 | 0 | 0 | 0 | 0 | 0 | 0 | 0 | 1 | 0 | 0 | 0 | 0 | 0 | 0 | 0 |
| 1 | 0 | 0 | 0 | 0 | 0 | 0 | 0 | 1 | 0 | 0 | 0 | 0 | 0 | 0 | 0 | 0 | 0 | 0 | 0 | 0 | 0 | 0 | 0 |
| 1 | 0 | 0 | 0 | 0 | 0 | 0 | 0 | 1 | 0 | 0 | 0 | 0 | 0 | 0 | 0 | 1 | 0 | 0 | 0 | 1 | 0 | 0 | 0 |
| 1 | 0 | 1 | 0 | 0 | 0 | 0 | 0 | 0 | 0 | 0 | 0 | 0 | 0 | 0 | 0 | 0 | 0 | 0 | 0 | 0 | 0 | 0 | 0 |
| 1 | 0 | 1 | 0 | 0 | 0 | 0 | 0 | 1 | 0 | 0 | 0 | 1 | 0 | 0 | 0 | 0 | 0 | 0 | 0 | 0 | 0 | 0 | 0 |
| 1 | 0 | 0 | 0 | 1 | 0 | 0 | 0 | 0 | 0 | 0 | 0 | 0 | 0 | 0 | 0 | 0 | 0 | 0 | 0 | 0 | 0 | 0 | 0 |
| 1 | 0 | 0 | 0 | 1 | 0 | 0 | 0 | 1 | 0 | 1 | 0 | 0 | 0 | 0 | 0 | 0 | 0 | 0 | 0 | 0 | 0 | 0 | 0 |
| 1 | 0 | 1 | 0 | 0 | 0 | 0 | 0 | 1 | 0 | 1 | 0 | 0 | 0 | 0 | 0 | 1 | 0 | 1 | 0 | 0 | 0 | 0 | 0 |
| 1 | 1 | 0 | 0 | 0 | 0 | 0 | 0 | 0 | 0 | 0 | 0 | 0 | 0 | 0 | 0 | 0 | 0 | 0 | 0 | 0 | 0 | 0 | 0 |
| 1 | 1 | 0 | 0 | 0 | 0 | 0 | 0 | 1 | 1 | 0 | 0 | 0 | 0 | 0 | 0 | 0 | 0 | 0 | 0 | 0 | 0 | 0 | 0 |
| 1 | 0 | 1 | 0 | 1 | 0 | 1 | 0 | 0 | 0 | 0 | 0 | 0 | 0 | 0 | 0 | 0 | 0 | 0 | 0 | 0 | 0 | 0 | 0 |
| 1 | 0 | 1 | 0 | 1 | 0 | 1 | 0 | 1 | 1 | 0 | 0 | 0 | 0 | 0 | 0 | 1 | 1 | 0 | 0 | 0 | 0 | 0 | 0 |
| 0 | 1 | 1 | 0 | 1 | 0 | 1 | 0 | 0 | 1 | 1 | 0 | 1 | 0 | 1 | 0 | 0 | 0 | 0 | 0 | 0 | 0 | 0 | 0 |
| 1 | 0 | 1 | 0 | 1 | 0 | 1 | 0 | 1 | 0 | 1 | 0 | 1 | 0 | 1 | 0 | 1 | 0 | 1 | 0 | 1 | 0 | 1 | 0 |
| 1 | 1 | 0 | 0 | 1 | 1 | 0 | 0 | 0 | 0 | 0 | 0 | 0 | 0 | 0 | 0 | 0 | 0 | 0 | 0 | 0 | 0 | 0 | 0 |
| 1 | 1 | 1 | 1 | 0 | 0 | 0 | 0 | 0 | 0 | 0 | 0 | 0 | 0 | 0 | 0 | 0 | 0 | 0 | 0 | 0 | 0 | 0 | 0 |
| 0 | 0 | 1 | 1 | 1 | 1 | 0 | 0 | 1 | 1 | 0 | 0 | 1 | 1 | 0 | 0 | 0 | 0 | 0 | 0 | 0 | 0 | 0 | 0 |
| 1 | 1 | 0 | 0 | 1 | 1 | 0 | 0 | 1 | 1 | 1 | 1 | 0 | 0 | 0 | 0 | 0 | 0 | 0 | 0 | 0 | 0 | 0 | 0 |
| 1 | 1 | 0 | 0 | 1 | 1 | 0 | 0 | 1 | 1 | 0 | 0 | 1 | 1 | 0 | 0 | 1 | 1 | 0 | 0 | 1 | 1 | 0 | 0 |
| 1 | 1 | 1 | 1 | 0 | 0 | 0 | 0 | 1 | 1 | 1 | 1 | 0 | 0 | 0 | 0 | 1 | 1 | 1 | 1 | 0 | 0 | 0 | 0 |
| 1 | 1 | 1 | 1 | 1 | 1 | 1 | 1 | 0 | 0 | 0 | 0 | 0 | 0 | 0 | 0 | 0 | 0 | 0 | 0 | 0 | 0 | 0 | 0 |
| 1 | 1 | 1 | 1 | 1 | 1 | 1 | 1 | 0 | 0 | 0 | 0 | 0 | 0 | 0 | 0 | 1 | 1 | 1 | 1 | 1 | 1 | 1 | 1 |
| 1 | 1 | 1 | 1 | 1 | 1 | 1 | 1 | 1 | 1 | 1 | 1 | 1 | 1 | 1 | 1 | 0 | 0 | 0 | 0 | 0 | 0 | 0 | 0 |

In still another example, the target kernel matrix is any one of the following:

$$K_{20}=\begin{pmatrix}
1&0&0&0&0&0&0&0&0&0&0&0&0&0&0&0&0&0&0&0\\
1&0&0&0&0&0&0&0&0&0&0&0&1&0&0&0&0&0&0&0\\
1&0&0&0&0&0&0&0&1&0&0&0&0&0&0&0&0&0&0&0\\
1&0&0&0&0&0&0&0&1&0&0&0&1&0&0&0&1&0&0&0\\
1&0&1&0&0&0&0&0&0&0&0&0&0&0&0&0&0&0&0&0\\
1&0&0&0&1&0&0&0&0&0&0&0&0&0&0&0&0&0&0&0\\
1&0&0&0&1&0&0&0&1&0&1&0&0&0&0&0&0&0&0&0\\
1&0&1&0&0&0&0&0&1&0&1&0&1&0&1&0&0&0&0&0\\
1&1&0&0&0&0&0&0&0&0&0&0&0&0&0&0&0&0&0&0\\
1&1&0&0&0&0&0&0&1&1&0&0&0&0&0&0&0&0&0&0\\
1&0&1&0&1&0&1&0&0&0&0&0&0&0&0&0&0&0&0&0\\
1&0&1&0&1&0&1&0&1&1&0&0&1&1&0&0&0&0&0&0\\
1&1&0&0&0&0&0&0&1&1&0&0&1&0&1&0&1&0&1&0\\
1&1&0&0&1&1&0&0&0&0&0&0&0&0&0&0&0&0&0&0\\
1&1&1&1&0&0&0&0&0&0&0&0&0&0&0&0&0&0&0&0\\
1&1&1&1&0&0&0&0&0&0&0&0&1&1&0&0&1&1&0&0\\
1&1&0&0&1&1&0&0&1&1&1&1&0&0&0&0&0&0&0&0\\
1&1&1&1&0&0&0&0&1&1&1&1&1&1&1&1&0&0&0&0\\
1&1&1&1&1&1&1&1&0&0&0&0&0&0&0&0&0&0&0&0\\
1&1&1&1&1&1&1&1&0&0&0&0&1&1&1&1&1&1&1&1
\end{pmatrix};$$

$$\text{or } K'_{20}=\begin{pmatrix}
1&0&0&0&0&0&0&0&0&0&0&0&0&0&0&0&0&0&0&0\\
1&0&0&0&0&0&0&0&0&0&0&0&1&0&0&0&0&0&0&0\\
1&0&0&0&0&0&0&0&1&0&0&0&0&0&0&0&0&0&0&0\\
1&0&0&0&1&0&0&0&0&0&0&0&0&0&0&0&0&0&0&0\\
1&0&1&0&0&0&0&0&0&0&0&0&0&0&0&0&0&0&0&0\\
1&0&0&0&1&0&0&0&1&0&1&0&0&0&0&0&0&0&0&0\\
1&1&0&0&0&0&0&0&0&0&0&0&0&0&0&0&0&0&0&0\\
0&1&1&0&1&0&1&0&0&0&0&0&0&0&0&0&0&0&0&0\\
1&1&1&1&0&0&0&0&0&0&0&0&0&0&0&0&0&0&0&0\\
0&1&0&1&1&0&0&0&1&0&0&0&1&0&0&0&1&0&0&0\\
1&0&1&0&1&1&0&0&0&0&0&0&0&0&0&0&0&0&0&0\\
0&0&0&0&1&1&0&0&1&0&1&0&1&0&1&0&0&0&0&0\\
1&0&1&0&1&1&0&0&0&0&0&0&1&0&1&0&1&0&1&0\\
0&1&1&0&1&1&0&0&1&0&1&0&0&0&0&0&1&1&0&0\\
1&0&1&0&1&0&1&0&1&1&0&0&0&0&0&0&0&0&0&0\\
0&0&1&1&1&1&0&0&1&1&0&0&1&1&0&0&0&0&0&0\\
1&1&0&0&1&1&0&0&1&1&0&0&1&1&0&0&1&1&1&1\\
1&1&1&1&0&0&0&0&1&1&1&1&0&0&0&0&0&0&0&0\\
1&1&1&1&1&1&1&1&0&0&0&0&0&0&0&0&0&0&0&0\\
1&1&1&1&1&1&1&1&1&1&1&1&1&1&1&1&0&0&0&0
\end{pmatrix};$$

$$\text{or } K''_{20}=\begin{pmatrix}
1&0&0&0&0&0&0&0&0&0&0&0&0&0&0&0&0&0&0&0\\
1&0&0&0&0&0&0&0&0&0&0&0&1&0&0&0&0&0&0&0\\
1&0&0&0&0&0&0&0&1&0&0&0&0&0&0&0&0&0&0&0\\
1&0&0&0&1&0&0&0&0&0&0&0&0&0&0&0&0&0&0&0\\
1&0&1&0&0&0&0&0&0&0&0&0&0&0&0&0&0&0&0&0\\
1&0&0&0&1&0&0&0&1&0&1&0&0&0&0&0&0&0&0&0\\
1&1&0&0&0&0&0&0&0&0&0&0&0&0&0&0&0&0&0&0\\
0&1&1&0&1&0&1&0&0&0&0&0&0&0&0&0&0&0&0&0\\
1&1&1&1&0&0&0&0&0&0&0&0&0&0&0&0&0&0&0&0\\
0&1&0&1&1&0&0&0&1&0&0&0&1&0&0&0&1&0&0&0\\
1&0&1&0&1&1&0&0&0&0&0&0&0&0&0&0&0&0&0&0\\
0&0&0&0&1&1&0&0&1&0&1&0&1&0&1&0&0&0&0&0\\
1&0&1&0&1&1&0&0&0&0&0&0&1&0&1&0&1&0&1&0\\
0&1&1&0&1&1&0&0&1&0&1&0&0&0&0&0&1&1&0&0\\
1&0&1&0&1&0&1&0&1&1&0&0&0&0&0&0&0&0&0&0\\
0&0&1&1&1&1&0&0&1&1&0&0&1&1&0&0&0&0&0&0\\
1&1&0&0&1&1&0&0&1&1&0&0&1&1&0&0&1&1&1&1\\
1&1&1&1&0&0&0&0&1&1&1&1&0&0&0&0&0&0&0&0\\
1&1&1&1&1&1&1&1&0&0&0&0&0&0&0&0&0&0&0&0\\
1&1&1&1&1&1&1&1&1&1&1&1&1&1&1&1&0&0&0&0
\end{pmatrix};$$

-continued $$\text{or } K_{21}=\begin{pmatrix}
1&0&0&0&0&0&0&0&0&0&0&0&0&0&0&0&0&0&0&0&0\\
1&0&0&0&0&0&1&0&0&0&0&0&0&0&0&0&0&0&0&0&0\\
1&0&1&0&0&0&0&0&0&0&0&0&0&0&0&0&0&0&0&0&0\\
1&1&0&0&0&0&0&0&0&0&0&0&0&0&0&0&0&0&0&0&0\\
1&0&0&0&0&1&0&0&0&0&0&0&0&0&0&0&0&0&0&0&0\\
0&1&0&1&0&0&0&0&0&0&0&0&0&0&0&0&0&0&0&0&0\\
1&1&1&0&1&0&0&0&0&0&0&0&0&0&0&0&0&0&0&0&0\\
0&0&1&1&1&0&1&0&0&0&0&0&0&0&0&0&0&0&0&0&0\\
0&1&0&0&1&0&0&1&0&1&0&0&0&0&0&0&0&0&0&0&0\\
0&0&0&1&0&1&1&1&0&0&0&0&0&0&0&0&0&0&0&0&0\\
1&0&1&0&1&0&1&0&0&0&1&0&0&0&1&0&0&0&0&0&0\\
1&1&1&0&0&0&0&0&1&1&0&0&0&1&0&0&0&0&0&0&0\\
1&0&1&1&0&0&1&1&0&0&0&1&0&0&0&0&0&0&0&0&0\\
1&0&0&1&0&0&0&0&1&1&0&1&1&0&0&0&0&0&0&0&0\\
1&0&1&0&0&0&1&0&1&0&1&1&1&0&0&0&1&0&0&0&0\\
1&0&1&0&1&0&0&1&0&1&0&1&0&1&0&1&0&0&0&0&0\\
1&1&0&1&0&1&0&1&1&1&1&0&0&0&0&0&0&0&0&0&0\\
1&1&1&0&0&1&1&0&0&1&1&0&0&1&1&0&0&0&0&1&0\\
1&1&1&1&1&0&0&0&0&1&1&1&1&0&0&0&0&0&1&0&0\\
1&1&1&1&1&1&1&1&1&0&0&0&0&0&0&0&0&0&1&1&1\\
1&1&1&1&1&1&1&1&1&1&1&1&1&1&1&1&1&1&0&0&0
\end{pmatrix};$$

$$\text{or } K'_{21}=\begin{pmatrix}
1&0&0&0&0&0&0&0&0&0&0&0&0&0&0&0&0&0&0&0&0\\
1&0&0&0&0&1&0&0&0&0&0&0&0&0&0&0&0&0&0&0&0\\
1&0&0&1&0&0&0&0&0&0&0&0&0&0&0&0&0&0&0&0&0\\
1&0&0&0&1&0&0&0&0&0&0&0&0&0&0&0&0&0&0&0&0\\
1&0&1&0&0&0&0&0&0&0&0&0&0&0&0&0&0&0&0&0&0\\
1&1&0&0&0&0&0&0&0&0&0&0&0&0&0&0&0&0&0&0&0\\
1&0&0&1&1&0&0&1&0&0&0&0&0&0&0&0&0&0&0&0&0\\
0&0&1&1&1&0&0&0&1&0&0&0&0&0&0&0&0&0&0&0&0\\
0&0&1&0&0&1&1&1&0&0&0&0&0&0&0&0&0&0&0&0&0\\
0&1&1&0&1&0&1&1&0&0&0&0&0&0&1&0&0&0&0&0&0\\
1&0&0&0&0&0&0&0&1&1&1&0&0&0&0&0&0&0&0&0&0\\
0&1&1&1&0&1&1&0&0&0&0&0&1&0&0&0&0&0&0&0&0\\
0&1&0&0&0&1&1&1&0&1&0&0&0&1&0&0&0&0&0&0&0\\
1&0&1&1&0&1&0&1&0&0&1&0&0&0&0&0&0&0&0&0&0\\
1&1&0&0&1&1&0&0&1&0&0&0&1&0&1&0&1&0&0&0&0\\
1&0&1&1&0&1&0&0&1&0&1&0&1&1&0&0&1&0&1&0&0\\
0&0&0&0&0&1&1&0&1&1&0&0&1&1&1&1&0&0&0&0&0\\
1&1&0&0&0&1&1&0&1&1&1&1&0&0&0&0&0&0&0&0&0\\
1&1&1&1&1&0&0&0&1&1&0&0&0&0&0&0&0&0&0&0&1\\
1&1&1&1&1&1&1&1&0&0&0&0&0&0&0&0&0&0&1&1&0\\
1&1&1&1&1&1&1&1&1&1&1&1&1&1&1&1&1&1&0&0&0
\end{pmatrix};$$

-continued $$
\text{or } K_{24}=\begin{pmatrix}
1&0&0&0&0&0&0&0&0&0&0&0&0&0&0&0&0&0&0&0&0&0&0&0\\
1&0&0&0&0&0&0&0&0&0&0&0&0&0&0&0&1&0&0&0&0&0&0&0\\
1&0&0&0&0&0&0&0&1&0&0&0&0&0&0&0&0&0&0&0&0&0&0&0\\
1&0&0&0&0&0&0&0&1&0&0&0&0&0&0&0&1&0&0&0&1&0&0&0\\
1&0&1&0&0&0&0&0&0&0&0&0&0&0&0&0&0&0&0&0&0&0&0&0\\
1&0&1&0&0&0&0&0&1&0&0&0&1&0&0&0&0&0&0&0&0&0&0&0\\
1&0&0&0&1&0&0&0&0&0&0&0&0&0&0&0&0&0&0&0&0&0&0&0\\
1&0&0&0&1&0&0&0&1&0&1&0&0&0&0&0&0&0&0&0&0&0&0&0\\
1&0&1&0&0&0&0&0&1&0&1&0&0&0&0&0&0&1&0&1&0&0&0&0\\
1&1&0&0&0&0&0&0&0&0&0&0&0&0&0&0&0&0&0&0&0&0&0&0\\
1&1&0&0&0&0&0&0&1&1&0&0&0&0&0&0&0&0&0&0&0&0&0&0\\
1&0&1&0&1&0&1&0&0&0&0&0&0&0&0&0&0&0&0&0&0&0&0&0\\
1&0&1&0&1&0&1&0&1&1&0&0&0&0&0&0&1&1&0&0&0&0&0&0\\
0&1&1&0&1&0&1&0&0&1&1&0&1&0&1&0&0&0&0&0&0&0&0&0\\
1&0&1&0&1&0&1&0&1&0&1&0&1&0&1&0&1&0&1&0&1&0&1&0\\
1&1&0&0&1&1&0&0&0&0&0&0&0&0&0&0&0&0&0&0&0&0&0&0\\
1&1&1&1&0&0&0&0&0&0&0&0&0&0&0&0&0&0&0&0&0&0&0&0\\
0&0&1&1&1&1&0&0&1&1&0&0&1&1&0&0&0&0&0&0&0&0&0&0\\
1&1&0&0&1&1&0&0&1&1&1&1&0&0&0&0&0&0&0&0&0&0&0&0\\
1&1&0&0&1&1&0&0&1&1&0&0&1&1&0&0&1&1&0&0&1&1&0&0\\
1&1&1&1&0&0&0&0&1&1&1&1&0&0&0&0&1&1&1&1&0&0&0&0\\
1&1&1&1&1&1&1&1&0&0&0&0&0&0&0&0&0&0&0&0&0&0&0&0\\
1&1&1&1&1&1&1&1&0&0&0&0&0&0&0&0&1&1&1&1&1&1&1&1\\
1&1&1&1&1&1&1&1&1&1&1&1&1&1&1&1&0&0&0&0&0&0&0&0
\end{pmatrix};
$$

$$
\text{or } K'_{24}=\begin{pmatrix}
1&0&0&0&0&0&0&0&0&0&0&0&0&0&0&0&0&0&0&0&0&0&0&0\\
1&0&0&0&0&0&0&0&0&0&0&0&0&0&0&0&0&1&0&0&0&0&0&0\\
1&0&0&0&0&0&0&0&1&0&0&0&0&0&0&0&0&0&0&0&0&0&0&0\\
1&0&0&0&1&0&0&0&0&0&0&0&0&0&0&0&0&0&0&0&0&0&0&0\\
1&0&1&0&0&0&0&0&0&0&0&0&0&0&0&0&0&0&0&0&0&0&0&0\\
1&0&0&0&1&0&0&0&1&0&0&0&1&0&0&0&0&0&0&0&0&0&0&0\\
1&0&1&0&0&0&0&0&1&0&1&0&0&0&0&0&0&0&0&0&0&0&0&0\\
1&1&0&0&0&0&0&0&0&0&0&0&0&0&0&0&0&0&0&0&0&0&0&0\\
1&1&0&0&0&0&0&0&1&1&0&0&0&0&0&0&0&0&0&0&0&0&0&0\\
1&0&1&0&1&0&1&0&0&0&0&0&0&0&0&0&0&0&0&0&0&0&0&0\\
1&0&0&0&1&0&0&0&1&0&1&0&0&0&0&0&1&0&1&0&0&0&0&0\\
1&1&0&0&1&1&0&0&0&0&0&0&0&0&0&0&0&0&0&0&0&0&0&0\\
0&0&0&0&0&1&1&0&1&1&1&0&1&0&0&0&1&0&0&0&1&0&0&0\\
1&0&1&0&1&0&1&0&1&1&0&0&0&0&0&0&1&1&0&0&0&0&0&0\\
0&1&1&0&1&0&1&0&0&1&1&0&1&0&1&0&0&0&0&0&0&0&0&0\\
1&0&1&0&1&0&1&0&1&0&1&0&1&0&1&0&1&0&1&0&1&0&1&0\\
1&1&1&1&0&0&0&0&0&0&0&0&0&0&0&0&0&0&0&0&0&0&0&0\\
0&0&1&1&1&1&0&0&1&1&0&0&1&1&0&0&0&0&0&0&0&0&0&0\\
1&1&0&0&1&1&0&0&1&1&1&1&0&0&0&0&0&0&0&0&0&0&0&0\\
1&1&0&0&1&1&0&0&1&1&0&0&1&1&0&0&1&1&0&0&1&1&0&0\\
1&1&1&1&1&1&1&1&0&0&0&0&0&0&0&0&0&0&0&0&0&0&0&0\\
1&1&1&1&0&0&0&0&1&1&1&1&0&0&0&0&1&1&1&1&0&0&0&0\\
1&1&1&1&1&1&1&1&0&0&0&0&0&0&0&0&0&1&1&1&1&1&1&1\\
1&1&1&1&1&1&1&1&1&1&1&1&1&1&1&1&0&0&0&0&0&0&0&0
\end{pmatrix};
$$

-continued $$\text{or } K''_{24} = \begin{pmatrix}
1 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 \\
1 & 0 & 0 & 0 & 0 & 0 & 0 & 0 & 0 & 0 & 0 & 0 & 0 & 0 & 0 & 0 & 0 & 1 & 0 & 0 & 0 & 0 & 0 & 0 \\
1 & 0 & 0 & 0 & 0 & 0 & 0 & 0 & 1 & 0 & 0 & 0 & 0 & 0 & 0 & 0 & 0 & 0 & 0 & 0 & 0 & 0 & 0 & 0 \\
1 & 0 & 0 & 0 & 1 & 0 & 0 & 0 & 0 & 0 & 0 & 0 & 0 & 0 & 0 & 0 & 0 & 0 & 0 & 0 & 0 & 0 & 0 & 0 \\
1 & 0 & 1 & 0 & 0 & 0 & 0 & 0 & 0 & 0 & 0 & 0 & 0 & 0 & 0 & 0 & 0 & 0 & 0 & 0 & 0 & 0 & 0 & 0 \\
1 & 0 & 0 & 0 & 1 & 0 & 0 & 0 & 1 & 0 & 0 & 0 & 1 & 0 & 0 & 0 & 0 & 0 & 0 & 0 & 0 & 0 & 0 & 0 \\
1 & 0 & 1 & 0 & 0 & 0 & 0 & 0 & 1 & 0 & 1 & 0 & 0 & 0 & 0 & 0 & 0 & 0 & 0 & 0 & 0 & 0 & 0 & 0 \\
1 & 1 & 0 & 0 & 0 & 0 & 0 & 0 & 0 & 0 & 0 & 0 & 0 & 0 & 0 & 0 & 0 & 0 & 0 & 0 & 0 & 0 & 0 & 0 \\
1 & 1 & 0 & 0 & 0 & 0 & 0 & 0 & 1 & 1 & 0 & 0 & 0 & 0 & 0 & 0 & 0 & 0 & 0 & 0 & 0 & 0 & 0 & 0 \\
1 & 0 & 1 & 0 & 1 & 0 & 1 & 0 & 0 & 0 & 0 & 0 & 0 & 0 & 0 & 0 & 0 & 0 & 0 & 0 & 0 & 0 & 0 & 0 \\
1 & 0 & 0 & 0 & 1 & 0 & 0 & 0 & 1 & 0 & 1 & 0 & 0 & 0 & 0 & 0 & 1 & 0 & 1 & 0 & 0 & 0 & 0 & 0 \\
1 & 1 & 0 & 0 & 1 & 1 & 0 & 0 & 0 & 0 & 0 & 0 & 0 & 0 & 0 & 0 & 0 & 0 & 0 & 0 & 0 & 0 & 0 & 0 \\
0 & 0 & 0 & 0 & 0 & 1 & 1 & 0 & 1 & 1 & 1 & 0 & 1 & 0 & 0 & 0 & 1 & 0 & 0 & 0 & 1 & 0 & 0 & 0 \\
1 & 0 & 1 & 0 & 1 & 0 & 1 & 0 & 1 & 1 & 0 & 0 & 0 & 0 & 0 & 0 & 1 & 1 & 0 & 0 & 0 & 0 & 0 & 0 \\
0 & 1 & 1 & 0 & 1 & 0 & 1 & 0 & 0 & 1 & 1 & 0 & 1 & 0 & 1 & 0 & 0 & 0 & 0 & 0 & 0 & 0 & 0 & 0 \\
1 & 0 & 1 & 0 & 1 & 0 & 1 & 0 & 1 & 0 & 1 & 0 & 1 & 0 & 1 & 0 & 1 & 0 & 1 & 0 & 1 & 0 & 1 & 0 \\
1 & 1 & 1 & 1 & 0 & 0 & 0 & 0 & 0 & 0 & 0 & 0 & 0 & 0 & 0 & 0 & 0 & 0 & 0 & 0 & 0 & 0 & 0 & 0 \\
0 & 0 & 1 & 1 & 1 & 1 & 0 & 0 & 1 & 1 & 0 & 0 & 1 & 1 & 0 & 0 & 0 & 0 & 0 & 0 & 0 & 0 & 0 & 0 \\
1 & 1 & 0 & 0 & 1 & 1 & 0 & 0 & 1 & 1 & 1 & 1 & 0 & 0 & 0 & 0 & 0 & 0 & 0 & 0 & 0 & 0 & 0 & 0 \\
1 & 1 & 0 & 0 & 1 & 1 & 0 & 0 & 1 & 1 & 0 & 0 & 1 & 1 & 0 & 0 & 1 & 1 & 0 & 0 & 1 & 1 & 0 & 0 \\
1 & 1 & 1 & 1 & 1 & 1 & 1 & 1 & 0 & 0 & 0 & 0 & 0 & 0 & 0 & 0 & 0 & 0 & 0 & 0 & 0 & 0 & 0 & 0 \\
1 & 1 & 1 & 1 & 0 & 0 & 0 & 0 & 1 & 1 & 1 & 1 & 0 & 0 & 0 & 0 & 1 & 1 & 1 & 1 & 0 & 0 & 0 & 0 \\
1 & 1 & 1 & 1 & 1 & 1 & 1 & 1 & 0 & 0 & 0 & 0 & 0 & 0 & 0 & 0 & 0 & 1 & 1 & 1 & 1 & 1 & 1 & 1 \\
1 & 1 & 1 & 1 & 1 & 1 & 1 & 1 & 1 & 1 & 1 & 1 & 1 & 1 & 1 & 1 & 0 & 0 & 0 & 0 & 0 & 0 & 0 & 0
\end{pmatrix};$$

$$\text{or } K_{25} = \begin{pmatrix}
1 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 \\
1 & 0 & 0 & 0 & 0 & 0 & 0 & 0 & 1 & 0 & 0 & 0 & 0 & 0 & 0 & 0 & 0 & 0 & 0 & 0 & 0 & 0 & 0 & 0 & 0 \\
1 & 0 & 0 & 0 & 1 & 0 & 0 & 0 & 0 & 0 & 0 & 0 & 0 & 0 & 0 & 0 & 0 & 0 & 0 & 0 & 0 & 0 & 0 & 0 & 0 \\
1 & 1 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 \\
0 & 1 & 0 & 0 & 0 & 1 & 0 & 0 & 0 & 0 & 0 & 0 & 0 & 0 & 0 & 0 & 0 & 0 & 0 & 0 & 0 & 0 & 0 & 0 & 0 \\
0 & 1 & 1 & 0 & 0 & 0 & 0 & 0 & 0 & 0 & 0 & 0 & 0 & 0 & 0 & 0 & 0 & 0 & 0 & 0 & 0 & 0 & 0 & 0 & 0 \\
0 & 0 & 1 & 0 & 1 & 0 & 0 & 1 & 0 & 0 & 0 & 0 & 1 & 0 & 0 & 0 & 0 & 0 & 0 & 0 & 0 & 0 & 0 & 0 & 0 \\
1 & 0 & 1 & 0 & 1 & 0 & 0 & 0 & 0 & 0 & 0 & 0 & 1 & 0 & 0 & 0 & 0 & 0 & 0 & 0 & 0 & 0 & 0 & 0 & 0 \\
0 & 0 & 0 & 1 & 1 & 0 & 0 & 0 & 0 & 0 & 0 & 0 & 0 & 0 & 1 & 1 & 0 & 0 & 0 & 0 & 0 & 0 & 0 & 0 & 0 \\
1 & 1 & 0 & 0 & 0 & 1 & 1 & 0 & 0 & 0 & 0 & 0 & 0 & 0 & 0 & 0 & 0 & 0 & 0 & 0 & 0 & 0 & 0 & 0 & 0 \\
1 & 1 & 1 & 1 & 0 & 0 & 0 & 0 & 0 & 0 & 0 & 0 & 0 & 0 & 0 & 0 & 0 & 0 & 0 & 0 & 0 & 0 & 0 & 0 & 0 \\
0 & 1 & 0 & 1 & 0 & 0 & 1 & 0 & 0 & 0 & 0 & 0 & 1 & 0 & 0 & 1 & 1 & 0 & 0 & 0 & 0 & 0 & 0 & 0 & 0 \\
0 & 0 & 0 & 0 & 0 & 1 & 1 & 1 & 0 & 0 & 0 & 1 & 0 & 1 & 0 & 0 & 1 & 0 & 0 & 0 & 0 & 0 & 0 & 0 & 0 \\
1 & 0 & 0 & 0 & 1 & 1 & 1 & 1 & 0 & 1 & 0 & 0 & 0 & 0 & 0 & 0 & 0 & 0 & 0 & 0 & 0 & 0 & 0 & 0 & 0 \\
1 & 1 & 1 & 0 & 1 & 0 & 0 & 1 & 1 & 0 & 0 & 0 & 0 & 0 & 0 & 0 & 0 & 0 & 0 & 0 & 0 & 0 & 0 & 0 & 0 \\
0 & 1 & 0 & 1 & 0 & 0 & 1 & 1 & 0 & 1 & 0 & 1 & 0 & 0 & 0 & 0 & 1 & 0 & 0 & 0 & 0 & 1 & 0 & 0 & 0 \\
0 & 0 & 1 & 0 & 1 & 1 & 0 & 1 & 1 & 1 & 0 & 0 & 1 & 0 & 1 & 0 & 0 & 0 & 0 & 0 & 0 & 0 & 0 & 0 & 0 \\
1 & 1 & 1 & 1 & 1 & 1 & 1 & 1 & 0 & 0 & 0 & 1 & 0 & 0 & 0 & 0 & 0 & 0 & 0 & 0 & 0 & 0 & 0 & 0 & 0 \\
1 & 1 & 0 & 0 & 1 & 0 & 1 & 0 & 1 & 1 & 0 & 1 & 0 & 1 & 1 & 0 & 0 & 0 & 0 & 1 & 0 & 0 & 0 & 0 & 0 \\
1 & 0 & 1 & 1 & 0 & 1 & 1 & 1 & 1 & 1 & 0 & 1 & 0 & 0 & 0 & 0 & 0 & 0 & 1 & 0 & 0 & 0 & 0 & 0 & 0 \\
1 & 1 & 0 & 1 & 0 & 1 & 0 & 1 & 0 & 1 & 0 & 1 & 0 & 1 & 0 & 1 & 0 & 0 & 0 & 1 & 0 & 1 & 0 & 1 & 0 \\
1 & 1 & 1 & 0 & 0 & 1 & 1 & 0 & 0 & 1 & 1 & 0 & 0 & 1 & 1 & 0 & 0 & 0 & 1 & 0 & 0 & 1 & 1 & 0 & 0 \\
1 & 1 & 1 & 1 & 1 & 0 & 0 & 0 & 0 & 1 & 1 & 1 & 1 & 0 & 0 & 0 & 0 & 0 & 1 & 1 & 1 & 0 & 0 & 0 & 0 \\
1 & 1 & 1 & 1 & 1 & 1 & 1 & 1 & 1 & 0 & 0 & 0 & 0 & 0 & 0 & 0 & 0 & 0 & 1 & 1 & 1 & 1 & 1 & 1 & 1 \\
1 & 1 & 1 & 1 & 1 & 1 & 1 & 1 & 1 & 1 & 1 & 1 & 1 & 1 & 1 & 1 & 1 & 1 & 0 & 0 & 0 & 0 & 0 & 0 & 0
\end{pmatrix};$$

-continued $$\text{or } K'_{25} = \begin{pmatrix}
1&0&0&0&0&0&0&0&0&0&0&0&0&0&0&0&0&0&0&0&0&0&0&0&0\\
1&0&0&0&0&0&0&0&1&0&0&0&0&0&0&0&0&0&0&0&0&0&0&0&0\\
1&0&0&0&1&0&0&0&0&0&0&0&0&0&0&0&0&0&0&0&0&0&0&0&0\\
1&1&0&0&0&0&0&0&0&0&0&0&0&0&0&0&0&0&0&0&0&0&0&0&0\\
0&1&0&0&0&1&0&0&0&0&0&0&0&0&0&0&0&0&0&0&0&0&0&0&0\\
0&1&1&0&0&0&0&0&0&0&0&0&0&0&0&0&0&0&0&0&0&0&0&0&0\\
0&0&1&0&1&0&0&1&0&0&0&0&1&0&0&0&0&0&0&0&0&0&0&0&0\\
1&0&1&0&1&0&0&0&0&0&0&0&1&0&0&0&0&0&0&0&0&0&0&0&0\\
0&0&0&1&1&0&0&0&0&0&0&0&0&0&1&1&0&0&0&0&0&0&0&0&0\\
1&1&0&0&0&1&1&0&0&0&0&0&0&0&0&0&0&0&0&0&0&0&0&0&0\\
1&1&1&1&0&0&0&0&0&0&0&0&0&0&0&0&0&0&0&0&0&0&0&0&0\\
0&1&0&1&0&0&1&0&0&0&0&0&1&0&0&1&1&0&0&0&0&0&0&0&0\\
0&0&0&0&0&1&1&1&0&0&0&1&0&1&0&0&1&0&0&0&0&0&0&0&0\\
1&0&0&0&1&1&1&1&0&1&0&0&0&0&0&0&0&0&0&0&0&0&0&0&0\\
1&1&1&0&1&0&0&1&1&0&0&0&0&0&0&0&0&0&0&0&0&0&0&0&0\\
0&1&0&1&0&0&1&1&0&1&0&1&0&0&0&0&1&0&0&0&0&1&0&0&0\\
0&0&1&0&1&1&0&1&1&1&0&0&1&0&1&0&0&0&0&0&0&0&0&0&0\\
1&1&1&1&1&1&1&1&0&0&0&1&0&0&0&0&0&0&0&0&0&0&0&0&0\\
1&1&0&0&1&0&1&0&1&1&0&1&0&1&1&0&0&0&0&1&0&0&0&0&0\\
1&0&1&1&0&1&1&1&1&1&0&1&0&0&0&0&0&0&1&0&0&0&0&0&0\\
1&1&0&1&0&1&0&1&0&1&0&1&0&1&0&1&0&0&0&1&0&1&0&1&0\\
1&1&1&0&0&1&1&0&0&1&1&0&0&1&1&0&0&0&1&0&0&1&1&0&0\\
1&1&1&1&1&0&0&0&0&1&1&1&1&0&0&0&0&0&1&1&1&0&0&0&0\\
1&1&1&1&1&1&1&1&1&0&0&0&0&0&0&0&0&0&1&1&1&1&1&1&1\\
1&1&1&1&1&1&1&1&1&1&1&1&1&1&1&1&1&1&0&0&0&0&0&0&0
\end{pmatrix};$$

$$\text{or } K_{28} = \begin{pmatrix}
1&0&0&0&0&0&0&0&0&0&0&0&0&0&0&0&0&0&0&0&0&0&0&0&0&0&0&0\\
1&0&0&0&0&0&0&0&0&0&0&0&0&0&0&0&1&0&0&0&0&0&0&0&0&0&0&0\\
1&0&0&0&0&0&0&0&1&0&0&0&0&0&0&0&0&0&0&0&0&0&0&0&0&0&0&0\\
1&0&0&0&0&0&0&0&1&0&0&0&0&0&0&0&1&0&0&0&1&0&0&0&0&0&0&0\\
1&0&0&0&1&0&0&0&0&0&0&0&0&0&0&0&0&0&0&0&0&0&0&0&0&0&0&0\\
1&0&0&0&1&0&0&0&0&0&0&0&0&0&0&0&1&0&1&0&0&0&0&0&0&0&0&0\\
1&0&1&0&0&0&0&0&0&0&0&0&0&0&0&0&0&0&0&0&0&0&0&0&0&0&0&0\\
0&0&0&0&0&0&0&0&1&0&1&0&0&0&0&0&0&0&0&0&1&0&1&0&0&0&0&0\\
1&0&0&0&1&0&0&0&0&0&1&0&1&0&0&0&0&0&0&0&1&0&1&0&0&0&0&0\\
1&0&0&0&1&0&0&0&1&0&0&0&1&0&0&0&1&0&1&0&1&0&0&0&1&0&0&0\\
1&1&0&0&0&0&0&0&0&0&0&0&0&0&0&0&0&0&0&0&0&0&0&0&0&0&0&0\\
1&1&0&0&0&0&0&0&0&0&0&0&0&0&0&0&1&1&0&0&0&0&0&0&0&0&0&0\\
0&1&1&0&0&0&0&0&1&0&1&0&0&0&0&0&1&1&0&0&0&0&0&0&0&0&0&0\\
1&0&1&0&1&0&1&0&0&0&0&0&0&0&0&0&0&0&0&0&0&0&0&0&0&0&0&0\\
0&1&1&0&1&0&1&0&1&1&0&0&0&0&0&0&0&0&0&0&0&0&0&0&0&0&0&0\\
1&1&0&0&0&0&0&0&1&1&0&0&0&0&0&0&1&1&0&0&1&1&0&0&0&0&0&0\\
1&1&0&0&0&0&0&0&0&1&1&0&1&0&1&0&1&1&0&0&0&1&1&0&1&0&1&0\\
1&1&0&0&1&1&0&0&0&0&0&0&0&0&0&0&0&0&0&0&0&0&0&0&0&0&0&0\\
1&1&0&0&1&1&0&0&0&0&0&0&0&0&1&1&1&1&0&0&0&0&0&0&0&0&0&0\\
0&1&1&0&0&1&1&0&1&0&1&0&1&0&1&0&1&1&1&1&0&0&0&0&0&0&0&0\\
1&1&1&1&0&0&0&0&0&0&0&0&0&0&0&0&0&0&0&0&0&0&0&0&0&0&0&0\\
0&0&0&0&0&0&0&0&1&1&1&1&0&0&0&0&0&0&0&0&1&1&1&1&0&0&0&0\\
1&1&0&0&1&1&0&0&0&0&1&1&1&1&0&0&0&0&0&0&1&1&1&1&0&0&0&0\\
1&1&0&0&1&1&0&0&1&1&0&0&1&1&0&0&1&1&1&1&1&1&0&0&1&1&0&0\\
1&1&1&1&0&0&0&0&1&1&1&1&0&0&0&0&0&0&0&0&0&0&0&0&0&0&0&0\\
1&1&1&1&1&1&1&1&0&0&0&0&0&0&0&0&0&0&0&0&0&0&0&0&0&0&0&0\\
0&0&0&0&0&0&0&0&1&1&1&1&1&1&1&1&0&0&0&0&1&1&1&1&1&1&1&1\\
1&1&1&1&1&1&1&1&1&1&1&1&1&1&1&1&0&0&0&0&0&0&0&0&0&0&0&0
\end{pmatrix};$$

-continued $$
\text{or } K_{32} = \begin{pmatrix}
1&0&0&0&0&0&0&0&0&0&0&0&0&0&0&0&0&0&0&0&0&0&0&0&0&0&0&0&0&0&0&0\\
1&0&0&0&0&0&0&0&0&0&0&0&0&0&0&0&1&0&0&0&0&0&0&0&0&0&0&0&0&0&0&0\\
1&0&0&0&0&0&0&0&1&0&0&0&0&0&0&0&0&0&0&0&0&0&0&0&0&0&0&0&0&0&0&0\\
1&0&0&0&0&0&0&0&1&0&0&0&0&0&0&0&1&0&0&0&0&0&0&0&1&0&0&0&0&0&0&0\\
1&0&0&0&1&0&0&0&0&0&0&0&0&0&0&0&0&0&0&0&0&0&0&0&0&0&0&0&0&0&0&0\\
1&0&0&0&1&0&0&0&0&0&0&0&0&0&0&0&1&0&0&0&1&0&0&0&0&0&0&0&0&0&0&0\\
1&0&1&0&0&0&0&0&0&0&0&0&0&0&0&0&0&0&0&0&0&0&0&0&0&0&0&0&0&0&0&0\\
1&0&1&0&0&0&0&0&0&0&0&0&0&0&0&0&1&0&1&0&0&0&0&0&0&0&0&0&0&0&0&0\\
0&0&1&0&1&0&0&0&1&0&0&0&1&0&0&0&1&0&1&0&0&0&0&0&0&0&0&0&0&0&0&0\\
1&0&0&0&1&0&0&0&1&0&0&0&1&0&0&0&1&0&0&0&1&0&0&0&1&0&0&0&1&0&0&0\\
1&1&0&0&0&0&0&0&0&0&0&0&0&0&0&0&0&0&0&0&0&0&0&0&0&0&0&0&0&0&0&0\\
1&1&0&0&0&0&0&0&0&0&0&0&0&0&0&0&1&1&0&0&0&0&0&0&0&0&0&0&0&0&0&0\\
0&1&1&0&0&0&0&0&1&0&1&0&0&0&0&0&1&1&0&0&0&0&0&0&0&0&0&0&0&0&0&0\\
1&0&1&0&0&0&0&0&1&0&1&0&0&0&0&0&1&0&1&0&0&0&0&0&1&0&1&0&0&0&0&0\\
1&0&1&0&1&0&1&0&0&0&0&0&0&0&0&0&0&0&0&0&0&0&0&0&0&0&0&0&0&0&0&0\\
0&1&1&0&1&0&1&0&1&1&0&0&0&0&0&0&0&0&0&0&0&0&0&0&0&0&0&0&0&0&0&0\\
1&1&0&0&0&0&0&0&1&1&0&0&0&0&0&0&1&1&0&0&0&0&0&0&1&1&0&0&0&0&0&0\\
0&1&1&0&1&0&1&0&1&1&0&0&0&0&0&0&0&1&1&0&1&0&1&0&1&1&0&0&0&0&0&0\\
1&1&0&0&1&1&0&0&0&0&0&0&0&0&0&0&0&0&0&0&0&0&0&0&0&0&0&0&0&0&0&0\\
1&1&0&0&1&1&0&0&0&0&0&0&0&0&0&0&1&1&0&0&1&1&0&0&0&0&0&0&0&0&0&0\\
0&1&1&0&0&1&1&0&1&0&1&0&1&0&1&0&1&1&0&0&1&1&0&0&0&0&0&0&0&0&0&0\\
1&0&1&0&1&0&1&0&1&0&1&0&1&0&1&0&1&0&1&0&1&0&1&0&1&0&1&0&1&0&1&0\\
1&1&1&1&0&0&0&0&0&0&0&0&0&0&0&0&0&0&0&0&0&0&0&0&0&0&0&0&0&0&0&0\\
1&1&1&1&0&0&0&0&0&0&0&0&0&0&0&0&1&1&1&1&0&0&0&0&0&0&0&0&0&0&0&0\\
0&0&1&1&1&1&0&0&1&1&0&0&1&1&0&0&1&1&1&1&0&0&0&0&0&0&0&0&0&0&0&0\\
1&1&0&0&1&1&0&0&1&1&0&0&1&1&0&0&1&1&0&0&1&1&0&0&1&1&0&0&1&1&0&0\\
1&1&1&1&0&0&0&0&1&1&1&1&0&0&0&0&0&0&0&0&0&0&0&0&0&0&0&0&0&0&0&0\\
1&1&1&1&0&0&0&0&1&1&1&1&0&0&0&0&1&1&1&1&0&0&0&0&1&1&1&1&0&0&0&0\\
1&1&1&1&1&1&1&1&0&0&0&0&0&0&0&0&0&0&0&0&0&0&0&0&0&0&0&0&0&0&0&0\\
1&1&1&1&1&1&1&1&0&0&0&0&0&0&0&0&1&1&1&1&1&1&1&1&0&0&0&0&0&0&0&0\\
1&1&1&1&1&1&1&1&1&1&1&1&1&1&1&1&0&0&0&0&0&0&0&0&0&0&0&0&0&0&0&0\\
1&1&1&1&1&1&1&1&1&1&1&1&1&1&1&1&1&1&1&1&1&1&1&1&1&1&1&1&1&1&1&1
\end{pmatrix}.
$$

The apparatus 4400 implements steps or procedures corresponding to the encoder device in the method embodiments described herein. The apparatus 4400 includes units configured to perform the methods performed by the encoder device in the method embodiments in FIG. 13 to FIG. 43. In addition, the units in the apparatus 4400 and the foregoing other operations and/or functions are separately used to implement corresponding procedures in the method embodiments in FIG. 13 to FIG. 43.

In response to the apparatus 4400 being configured to perform method 1300 in FIG. 13, the transceiver unit 4410 is configured to perform Step 1310 in the method 1300, and the processing unit 4420 is configured to perform Step 1320 and step 1330 in the method 1300.

A specific process in which the units perform the foregoing corresponding steps is described in detail in the foregoing method embodiments. For brevity, details are not described herein again.

In another design, the apparatus 4400 is configured to perform an action performed by the decoder device in the embodiment shown in FIG. 14, and the transceiver unit 4410 is configured to obtain a to-be-decoded sequence. The processing unit 4420 is configured to decode the to-be-decoded sequence based on a plurality of trellises, and reuse an intermediate result obtained from decoding performed based on a first trellis in the plurality of trellises in response to decoding being performed based on a second trellis in the plurality of trellises, where the first trellis is used for the $t^{th}$ stage of decoding the to-be-decoded sequence, the second trellis is used for the $(t+i)^{th}$ stage of decoding the to-be-decoded sequence, t is an integer greater than 0 or equal to 0, and i is an integer greater than 1 or equal to 1.

As an example, each of the plurality of trellises is split into a plurality of sub-trellises.

In still another example, locations of split points of the plurality of sub-trellises are related to decoding complexity.

In still another example, the processing unit 4420 is further configured to determine, based on a correlation between the first trellis and the second trellis, whether to reuse the intermediate result obtained through decoding performed based on the first trellis in response to decoding being performed based on the second trellis.

In still another example, the processing unit 4420 is configured to determine, based on the following information, whether to reuse the intermediate result obtained through decoding performed based on the first trellis in response to decoding being performed based on the second trellis: a code obtained by performing a shortening operation on a linear code C in the $(t+i)^{th}$ stage of decoding and a code obtained by performing the shortening operation on the linear code C in the $t^{th}$ stage of decoding; and/or a code obtained by performing a puncturing operation on the linear code C in the $(t+i)^{th}$ stage of decoding and a code obtained by performing a puncturing operation on the linear code C in the $t^{th}$ stage of decoding.

In still another example, in response to $s_{x,y}(C^{(t+i)})=s_{x,y}(C^{(t)})$, and $p_{x,y}(C^{(t+i)})\subset p_{x,y}(C^{(t)})$, reusing the intermediate result obtained through decoding performed based on the first trellis in response to decoding being performed based on the second trellis; or in response to $s_{x,y}(C^{(t+i)})\subset s_{x,y}(C^{(t)})$, reusing the intermediate result obtained through decoding performed based on the first trellis in response to decoding being performed based on the second trellis, where $s_{x,y}(C^{(t+i)})$ indicates a code obtained by performing the shortening operation on the linear code C at a location except $x \le z < y$ in the $(t+i)^{th}$ stage of decoding, $s_{x,y}(C^{(t)})$ indicates a code obtained by performing the shortening operation on the linear code C at the location except $x \le z < y$ in the $t^{th}$ stage of decoding, $p_{x,y}(C^{(t+i)})$ indicates a code obtained by performing the puncturing operation on the linear code C at the location except $x \le z < y$ in the $(t+i)^{th}$ stage of decoding, and $p_{x,y}(C^{(t)})$ indicates a code obtained by performing the puncturing operation on the linear code C at the location except $x \le z < y$ in the $t^{th}$ stage of decoding.

In still another example, the processing unit 4420 is configured to: directly use the intermediate result obtained through decoding performed based on the first trellis as an intermediate result obtained through decoding performed based on the second trellis in response to processing being performed based on the second trellis in the $(t+i)^{th}$ stage of decoding; or process based on a result of a maximization operation in a process of the first trellis in response to processing being performed based on the second trellis in the $(t+i)^{th}$ stage of decoding.

The apparatus 4400 implements steps or procedures corresponding to the decoder device in the method embodiments described herein. The apparatus 4400 includes units configured to perform the methods performed by the decoder device in the method embodiments in FIG. 13 to FIG. 43. In addition, the units in the apparatus 4400 and the foregoing other operations and/or functions are separately used to implement corresponding procedures in the method embodiments in FIG. 13 to FIG. 43.

In response to the apparatus 4400 being configured to perform method 1400 in FIG. 14, the transceiver unit 4410 is configured to perform Step 1410 in the method 1400, and the processing unit 4420 is configured to perform Step 1420 in the method 1400.

The processing unit 4420 in the foregoing embodiment is implemented by at least one processor or a processor-related circuit. The transceiver unit 4410 is implemented by using a transceiver or a transceiver-related circuit. The transceiver unit 4410 is also referred to as a communication unit or a communication interface. The storage unit is implemented by at least one memory.

In at least one embodiment, the foregoing functions of the apparatus 4400 is implemented by hardware, or is implemented by hardware executing corresponding software.

In an embodiment, the apparatus 4400 includes one or more processors. The one or more processors are configured to execute a computer program stored in the memory, so that the apparatus 4400 performs any method embodiment described herein.

Optionally, the memory configured to store the computer program is located outside the apparatus 4400, and the one or more processors are connected to the memory by using a circuit and/or a wire. There is one or more memories.

Optionally, the apparatus 4400 further includes one or more memories.

Further, optionally, the apparatus 4400 further includes one or more communication interfaces.

In some examples, the one or more communication interfaces is an input output interface or an input output circuit. This is not limited in embodiments described herein.

In another embodiment, the apparatus 4400 is further implemented by using hardware.

Figure 45:
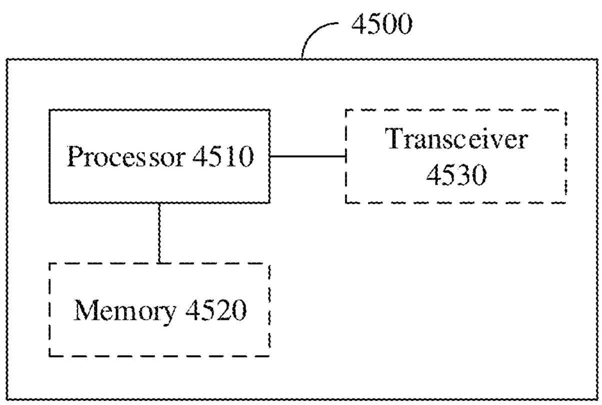
FIG. 45 is a schematic diagram of a structure of an apparatus according to at least one embodiment.
Figure 46:
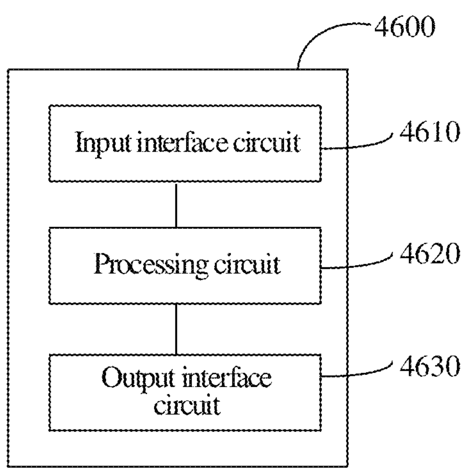
FIG. 46 is still another schematic diagram of a structure of an apparatus according to at least one embodiment.

As shown in FIG. 45, at least one embodiment further provides an apparatus 4500. The apparatus 4500 includes a processor 4510. The processor 4510 is coupled to a memory 4520. The memory 4520 is configured to store a computer program or instructions and/or data. The processor 4510 is configured to execute the computer program or the instructions and/or the data stored in the memory 4520, so that the methods in the foregoing method embodiments are performed.

Optionally, the apparatus 4500 includes one or more processors 4510.

Optionally, as shown in FIG. 45, the apparatus 4500 further includes the memory 4520.

Optionally, the apparatus 4500 includes one or more memories 4520.

Optionally, the memory 4520 and the processor 4510 is integrated together, or is disposed separately.

Optionally, as shown in FIG. 45, the apparatus 4500 further includes a transceiver 4530. The transceiver 4530 is configured to receive and/or send a signal. For example, the processor 4510 is configured to control the transceiver 4530 to receive and/or send a signal.

In a solution, the apparatus 4500 is configured to implement the operations performed by the encoder device in the foregoing method embodiments.

For example, the processor 4510 is configured to perform a processing-related operation performed by the encoder device in the foregoing method embodiment, and the transceiver 4530 is configured to perform operations related to receiving and sending performed by the encoder device in the foregoing method embodiment.

In another solution, the apparatus 4500 is configured to implement the operations performed by the decoder device in the foregoing method embodiments.

For example, the processor 4510 is configured to perform a processing-related operation performed by the decoder device in the foregoing method embodiment, and the transceiver 4530 is configured to perform operations related to receiving and sending performed by the decoder device in the foregoing method embodiment.

At least one embodiment further provides an apparatus 4600. The apparatus 4600 is configured to perform the operation performed by the encoder device in the foregoing method embodiment, or the apparatus 4600 is configured to perform the operation performed by the decoder device in the foregoing method embodiment.

The apparatus 4600 includes an input interface circuit 4610, a logic circuit 4620, and an output interface circuit 4630.

In a solution, the apparatus 4600 is configured to perform the operations performed by the decoder device in the foregoing method embodiments.

Optionally, the apparatus 4600 is also a device or module that is in the decoder and that is configured to implement channel decoding. For example, the apparatus is a channel decoder or a channel decoding circuit. Alternatively, the apparatus 4600 is a chip disposed in a receive end.

In at least one embodiment, the input interface circuit 4610 is configured to obtain a to-be-decoded sequence; the logic circuit 4620 is configured to decode the to-be-decoded sequence according to a decoding algorithm provided in embodiments described herein; and the output interface circuit 4630 is configured to output a decoding result.

In at least one embodiment, the logic circuit 4620 is configured to obtain a to-be-decoded sequence, and decode the to-be-decoded sequence according to a decoding algorithm provided in at least one embodiment. The output interface circuit 4630 outputs a decoding result.

In another solution, the apparatus 4600 is configured to perform the operations performed by the encoder device in the foregoing method embodiments.

Optionally, the apparatus 4600 is also a device or module configured to implement encoding in the encoder. For example, the apparatus is an encoder or an encoding circuit. Alternatively, the apparatus 4600 is a chip disposed at a transmit end.

In at least one embodiment, the input interface circuit 4610 is configured to obtain information bits; the logic circuit 4620 is configured to encode the information bits according to an encoding algorithm provided in at least one embodiment; and the output interface circuit 4630 is configured to output an encoded polar code.

In at least one embodiment, the logic circuit 4620 is configured to generate information bits, and encode the information bits according to the encoding algorithm provided in at least one embodiment; and the output interface circuit 4630 outputs an encoded polar code.

Optionally, the apparatus 4600 is a chip or an integrated circuit. For example, the chip is a system on chip (SOC), or is a baseband chip.

Optionally, the foregoing mainly uses an example in which the input interface circuit 4610 and the output interface circuit 4630 are separate interface circuits for description. This is not limited. For example, the input interface circuit 4610 and the output interface circuit 4630 is integrated into one interface.

At least one embodiment further provides a computer-readable storage medium. The computer-readable storage medium stores computer instructions used to implement the method performed by the encoder device or the method performed by the decoder device in the foregoing method embodiments.

For example, in response to a computer program being executed by a computer, the computer implements the method performed by the encoder device or the method performed by the decoder device in the foregoing method embodiments.

At least one embodiment further provides a computer program product including instructions. In response to the instructions being executed by a computer, the computer is enabled to implement the method performed by the encoder device or the method performed by the decoder device in the foregoing method embodiments.

At least one embodiment further provides a chip, including one or more memories and one or more processors. The one or more memories are configured to store a computer program, and the one or more processors are configured to invoke the computer program from the one or more memories and run the computer program, so that a device in which the chip is installed performs the method in at least one embodiment.

At least one embodiment further provides a communication device, including the apparatus 4500 or the apparatus 4600 described above.

At least one embodiment further provides a communication system. The communication system includes the encoder device and the decoder device in the foregoing embodiments.

The decoder in this specification is a receive end of a signal and/or data. Correspondingly, a party that sends the signal and/or the data is a transmit end. Optionally, the decoder is a network device (for example, a gNB in 5G) in the communication system, or is a terminal device. This is not limited in the solutions of embodiment described herein.

The encoder in this specification is a transmit end of a signal and/or data. Correspondingly, a party that receives the signal and/or the data is the receive end. Optionally, the encoder is a network device (for example, a gNB in 5G) in the communication system, or is a terminal device. This is not limited in the solutions of embodiments described herein.

A person skilled in the art understands that, for convenience and brief description, for explanations and beneficial effects of related content in any communication apparatus provided above, refer to the corresponding method embodiment provided above. Details are not described herein again.

In at least one embodiment, the encoder device or the decoder device includes a hardware layer, an operating system layer running above the hardware layer, and an application layer running above the operating system layer. The hardware layer includes hardware such as a central processing unit (CPU), a memory management unit (MMU), and a memory (also referred to as a primary memory). An operating system at the operating system layer is any one or more computer operating systems that implement service processing through a process, for example, a Linux operating system, a Unix operating system, an Android operating system, an iOS operating system, or a Windows operating system. The application layer includes applications such as a browser, an address book, word processing software, and instant messaging software.

A specific structure of an execution body of a method is not limited in embodiments described herein, provided that a program that records code for the method provided in at least one embodiment is run to perform communication according to the method provided in at least one embodiment. For example, the execution body of the method provided in embodiments described herein is performed by an encoder device or a decoder device, or is a function module that invokes and execute a program in the encoder device or the decoder device.

At least one embodiment is implemented as a method, an apparatus, or a product that uses standard programming and/or engineering technologies. The term "product" used in this specification covers a computer program that is accessed from any computer-readable component, carrier or medium.

The computer-readable storage medium is any usable medium accessible by a computer, or a data storage device, such as a server or a data center, integrating one or more usable media. The usable medium (or the computer-readable medium) includes, for example, but is not limited to, various media that stores program code such as a magnetic medium or a magnetic storage device (for example, a floppy disk, a hard disk (for example, a removable hard disk), or a magnetic tape), an optical medium (for example, an optical disc, a compact disc (compact disc, CD), or a digital versatile disc (DVD)), a smart card, and a flash storage device (for example, an erasable programmable read-only memory (EPROM), a card, a stick, or a key drive), or a semiconductor medium (for example, a solid-state disk (SSD), a USB flash drive, a read-only memory (ROM), or a random access memory (RAM)).

Various storage media described in this specification indicates one or more devices and/or other machine-readable media that are configured to store information. The term "machine-readable media" includes but is not limited to a radio channel and various other media that stores, includes, and/or carries instructions and/or data.

The processor in at least one embodiment described herein is a central processing unit (CPU), or is another general-purpose processor, a digital signal processor (DSP), an application-specific integrated circuit (ASIC), a field programmable gate array (FPGA) or another programmable logic device, a discrete gate or transistor logic device, a discrete hardware component, or the like. The general-purpose processor is a microprocessor, or the processor is any conventional processor or the like.

The memory mentioned in embodiments described herein is a volatile memory or a nonvolatile memory, or includes a volatile memory and a nonvolatile memory. The nonvolatile memory is a read-only memory (ROM), a programmable ROM (PROM), an erasable programmable read-only memory (EPROM), an electrically EPROM (EEPROM), or a flash memory. The volatile memory is a random access memory (RAM). For example, the RAM is used as an external cache. As an example instead of a limitation, the RAM includes the following plurality of forms: a static RAM (SRAM), a dynamic RAM (DRAM), a synchronous DRAM (SDRAM), a double data rate SDRAM (DDR SDRAM), an enhanced SDRAM (ESDRAM), a synchlink DRAM (SLDRAM), and a direct rambus RAM (DR RAM).

In response to the processor being a general-purpose processor, a DSP, an ASIC, an FPGA, another programmable logic device, a discrete gate or a transistor logic device, or a discrete hardware component, the memory (storage module) is integrated into the processor.

The memory described in at least one embodiment aims to include but is not limited to these memories and any memory of another proper type.

In at least one embodiment, the disclosed apparatuses and methods is implemented in other manners. For example, the foregoing apparatus embodiments are only examples. For example, division into the foregoing units is only logical function division, and is another division manner during actual implementation. For example, a plurality of units or components is combined or integrated into another system, or some features is ignored or not performed. In addition, the displayed or discussed mutual couplings or direct couplings or communication connections is implemented by using some interfaces. The indirect couplings or communication connections between the apparatuses or units is implemented in an electronic form, a mechanical form, or another form.

The foregoing units described as separate parts may or may not be physically separate, and parts displayed as units may or may not be physical units, is located in one position, or is distributed on a plurality of network units. Some or all of the units is selected based on actual implementations of the solutions provided in embodiments described herein.

In addition, function units in embodiments described herein are integrated into one unit, or each of the units exist alone physically, or two or more units are integrated into one unit.

All or some of the foregoing embodiments is implemented by using software, hardware, firmware, or any combination thereof.

In response to software being used to implement the embodiments, all or a part of the embodiments is implemented in a form of a computer program product. The computer program product includes one or more computer instructions. In response to the computer program instructions being loaded and executed on a computer, the procedure or functions according to at least one embodiment are completely or partially generated. The computer is a general-purpose computer, a dedicated computer, a computer network, or another programmable apparatus. For example, the computer is a personal computer, a server, or a network device. The computer instructions is stored in a computer-readable storage medium or is transmitted from a computer-readable storage medium to another computer-readable storage medium. For example, the computer instructions is transmitted from a website, computer, server, or data center to another website, computer, server, or data center in a wired (for example, a coaxial cable, an optical fiber, or a digital subscriber line (DSL)) or wireless (for example, infrared, radio, or microwave) manner. For the computer-readable storage medium, refer to the foregoing descriptions.

The foregoing descriptions are merely specific implementations of embodiments described herein, but are not intended to limit the protection scope of embodiments described herein. Any variation or replacement readily figured out by a person skilled in the art within the technical scope disclosed in at least one embodiment shall fall within the protection scope of embodiments described herein. Therefore, the protection scope of embodiments described herein shall be subject to the protection scope of the claims and this specification.

What is claimed is:

1. An encoding method, comprising:

obtaining information bits at a channel encoder;

determining, by the channel encoder, a target kernel matrix, wherein the target kernel matrix is determined by adjusting an original kernel matrix to construct a plurality of kernel matrices, and selecting the target kernel matrix from the plurality of kernel matrices to increase performance and reduce decoding complexity;

performing, by the channel encoder, polar encoding on the information bits based on the selected target kernel matrix to produce an encoded polar code; and sending the encoded polar code to a receiver.

2. The encoding method according to claim 1, wherein a dimension of the target kernel matrix is less than a dimension of the original kernel matrix.

3. The encoding method according to claim 1, wherein the target kernel matrix is determined by adjusting a partial distance of the original kernel matrix.

4. The encoding method according to claim 3, wherein the determining the target kernel matrix includes adjusting the partial distance of the original kernel matrix according to a depth-first search algorithm.

5. The encoding method according to claim 4, wherein when the adjusting is performed according to the depth-first search algorithm, one or more of the following constraints are used for processing:

a candidate line set M meets: $M[i]=\{v_0^{t-1} \in F_2^l | wt(v_0^{t-1})=D_i\}$; or when the $i^{th}$ line being selected from the bottom in the candidate line set M, a Hamming weight of a selected line v is greater than or equal to $D_i$; or selecting the line v from the candidate line set M and performing partial distance calculation on the line v and a constructed line, where in response to $c \in C_{\overline{K}}^{(\varphi+1)} \oplus \overline{K}[\varphi]$, and $wt(c)<D_\varphi$, the line v is directly discarded, and a new line from the candidate line set M is selected; or a line that belongs to a same coset is not selected again, where i indicates a line number, $i \in [0,l-1]$, wt(v) wt(c) and both indicate the Hamming weight, $\overline{K}$ indicates a currently constructed kernel matrix $\overline{K}$, $\overline{K}[\varphi]$ indicates the $q_{th}$ line of the kernel matrix $\overline{K}$, $D_i$ and $D_\varphi$ both indicate the partial distance; $C_{\overline{K}}^{(\varphi+1)}$ indicates a code corresponding to the kernel matrix $\overline{K}$, and $\oplus$ indicates a logical operation.

6. The encoding method according to claim 1, wherein the adjusting the original kernel matrix includes adjusting a kernel matrix $K_{24}$ whose dimension is (24×24), and the $K_{24}$ is:

| | | | | | | | | | | | | | | | | | | | | | | | |
|---|---|---|---|---|---|---|---|---|---|---|---|---|---|---|---|---|---|---|---|---|---|---|---|
| 1 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 |
| 1 | 0 | 0 | 0 | 0 | 0 | 0 | 0 | 0 | 0 | 0 | 0 | 0 | 0 | 0 | 0 | 1 | 0 | 0 | 0 | 0 | 0 | 0 | 0 |
| 1 | 0 | 0 | 0 | 0 | 0 | 0 | 0 | 1 | 0 | 0 | 0 | 0 | 0 | 0 | 0 | 0 | 0 | 0 | 0 | 0 | 0 | 0 | 0 |
| 1 | 0 | 0 | 0 | 0 | 0 | 0 | 0 | 1 | 0 | 0 | 0 | 0 | 0 | 0 | 0 | 1 | 0 | 0 | 0 | 1 | 0 | 0 | 0 |
| 1 | 0 | 1 | 0 | 0 | 0 | 0 | 0 | 0 | 0 | 0 | 0 | 0 | 0 | 0 | 0 | 0 | 0 | 0 | 0 | 0 | 0 | 0 | 0 |
| 1 | 0 | 1 | 0 | 0 | 0 | 0 | 0 | 1 | 0 | 0 | 0 | 1 | 0 | 0 | 0 | 0 | 0 | 0 | 0 | 0 | 0 | 0 | 0 |
| 1 | 0 | 0 | 0 | 1 | 0 | 0 | 0 | 0 | 0 | 0 | 0 | 0 | 0 | 0 | 0 | 0 | 0 | 0 | 0 | 0 | 0 | 0 | 0 |
| 1 | 0 | 0 | 0 | 1 | 0 | 0 | 0 | 1 | 0 | 1 | 0 | 0 | 0 | 0 | 0 | 0 | 0 | 0 | 0 | 0 | 0 | 0 | 0 |
| 1 | 0 | 1 | 0 | 0 | 0 | 0 | 0 | 1 | 0 | 1 | 0 | 0 | 0 | 0 | 0 | 1 | 0 | 1 | 0 | 0 | 0 | 0 | 0 |
| 1 | 1 | 0 | 0 | 0 | 0 | 0 | 0 | 0 | 0 | 0 | 0 | 0 | 0 | 0 | 0 | 0 | 0 | 0 | 0 | 0 | 0 | 0 | 0 |
| 1 | 1 | 0 | 0 | 0 | 0 | 0 | 0 | 1 | 1 | 0 | 0 | 0 | 0 | 0 | 0 | 0 | 0 | 0 | 0 | 0 | 0 | 0 | 0 |
| 1 | 0 | 1 | 0 | 1 | 0 | 1 | 0 | 0 | 0 | 0 | 0 | 0 | 0 | 0 | 0 | 0 | 0 | 0 | 0 | 0 | 0 | 0 | 0 |
| 1 | 0 | 1 | 0 | 1 | 0 | 1 | 0 | 1 | 1 | 0 | 0 | 0 | 0 | 0 | 0 | 1 | 1 | 0 | 0 | 0 | 0 | 0 | 0 |
| 0 | 1 | 1 | 0 | 1 | 0 | 1 | 0 | 0 | 1 | 1 | 0 | 1 | 0 | 1 | 0 | 0 | 0 | 0 | 0 | 0 | 0 | 0 | 0 |
| 1 | 0 | 1 | 0 | 1 | 0 | 1 | 0 | 1 | 0 | 1 | 0 | 1 | 0 | 1 | 0 | 1 | 0 | 1 | 0 | 1 | 0 | 1 | 0 |
| 1 | 1 | 0 | 0 | 1 | 1 | 0 | 0 | 0 | 0 | 0 | 0 | 0 | 0 | 0 | 0 | 0 | 0 | 0 | 0 | 0 | 0 | 0 | 0 |
| 1 | 1 | 1 | 1 | 0 | 0 | 0 | 0 | 0 | 0 | 0 | 0 | 0 | 0 | 0 | 0 | 0 | 0 | 0 | 0 | 0 | 0 | 0 | 0 |
| 0 | 0 | 1 | 1 | 1 | 1 | 0 | 0 | 1 | 1 | 0 | 0 | 1 | 1 | 0 | 0 | 0 | 0 | 0 | 0 | 0 | 0 | 0 | 0 |
| 1 | 1 | 0 | 0 | 1 | 1 | 0 | 0 | 1 | 1 | 1 | 1 | 0 | 0 | 0 | 0 | 0 | 0 | 0 | 0 | 0 | 0 | 0 | 0 |
| 1 | 1 | 0 | 0 | 1 | 1 | 0 | 0 | 1 | 1 | 0 | 0 | 1 | 1 | 0 | 0 | 1 | 1 | 0 | 0 | 1 | 1 | 0 | 0 |
| 1 | 1 | 1 | 1 | 0 | 0 | 0 | 0 | 1 | 1 | 1 | 1 | 0 | 0 | 0 | 0 | 1 | 1 | 1 | 1 | 0 | 0 | 0 | 0 |
| 1 | 1 | 1 | 1 | 1 | 1 | 1 | 1 | 0 | 0 | 0 | 0 | 0 | 0 | 0 | 0 | 0 | 0 | 0 | 0 | 0 | 0 | 0 | 0 |
| 1 | 1 | 1 | 1 | 1 | 1 | 1 | 1 | 0 | 0 | 0 | 0 | 0 | 0 | 0 | 0 | 1 | 1 | 1 | 1 | 1 | 1 | 1 | 1 |
| 1 | 1 | 1 | 1 | 1 | 1 | 1 | 1 | 1 | 1 | 1 | 1 | 1 | 1 | 1 | 1 | 0 | 0 | 0 | 0 | 0 | 0 | 0 | 0. |

7. The encoding method according to claim 1, wherein the determining the target kernel matrix includes determining the target kernel matrix is any one of the following:

$$K_{20}=\begin{pmatrix}
1&0&0&0&0&0&0&0&0&0&0&0&0&0&0&0&0&0&0&0\\
1&0&0&0&0&0&0&0&0&0&0&0&1&0&0&0&0&0&0&0\\
1&0&0&0&0&0&0&0&1&0&0&0&0&0&0&0&0&0&0&0\\
1&0&0&0&0&0&0&0&1&0&0&0&1&0&0&0&1&0&0&0\\
1&0&1&0&0&0&0&0&0&0&0&0&0&0&0&0&0&0&0&0\\
1&0&0&0&1&0&0&0&0&0&0&0&0&0&0&0&0&0&0&0\\
1&0&0&0&1&0&0&0&1&0&1&0&0&0&0&0&0&0&0&0\\
1&0&1&0&0&0&0&0&1&0&1&0&1&0&1&0&0&0&0&0\\
1&1&0&0&0&0&0&0&0&0&0&0&0&0&0&0&0&0&0&0\\
1&1&0&0&0&0&0&0&1&1&0&0&0&0&0&0&0&0&0&0\\
1&0&1&0&1&0&1&0&0&0&0&0&0&0&0&0&0&0&0&0\\
1&0&1&0&1&0&1&0&1&1&0&0&1&1&0&0&0&0&0&0\\
1&1&0&0&0&0&0&0&1&1&0&0&1&0&1&0&1&0&1&0\\
1&1&0&0&1&1&0&0&0&0&0&0&0&0&0&0&0&0&0&0\\
1&1&1&1&0&0&0&0&0&0&0&0&0&0&0&0&0&0&0&0\\
1&1&1&1&0&0&0&0&0&0&0&0&1&1&0&0&1&1&0&0\\
1&1&0&0&1&1&0&0&1&1&1&1&0&0&0&0&0&0&0&0\\
1&1&1&1&0&0&0&0&1&1&1&1&1&1&1&1&0&0&0&0\\
1&1&1&1&1&1&1&1&0&0&0&0&0&0&0&0&0&0&0&0\\
1&1&1&1&1&1&1&1&0&0&0&0&1&1&1&1&1&1&1&1
\end{pmatrix};$$

$$\text{or } K'_{20}=\begin{pmatrix}
1&0&0&0&0&0&0&0&0&0&0&0&0&0&0&0&0&0&0&0\\
1&0&0&0&0&0&0&0&0&0&0&0&1&0&0&0&0&0&0&0\\
1&0&0&0&0&0&0&0&1&0&0&0&0&0&0&0&0&0&0&0\\
1&0&0&0&1&0&0&0&0&0&0&0&0&0&0&0&0&0&0&0\\
1&0&1&0&0&0&0&0&0&0&0&0&0&0&0&0&0&0&0&0\\
1&0&0&0&1&0&0&0&1&0&1&0&0&0&0&0&0&0&0&0\\
1&1&0&0&0&0&0&0&0&0&0&0&0&0&0&0&0&0&0&0\\
0&1&1&0&1&0&1&0&0&0&0&0&0&0&0&0&0&0&0&0\\
1&1&1&1&0&0&0&0&0&0&0&0&0&0&0&0&0&0&0&0\\
0&1&0&1&1&0&0&0&1&0&0&0&1&0&0&0&1&0&0&0\\
1&0&1&0&1&1&0&0&0&0&0&0&0&0&0&0&0&0&0&0\\
0&0&0&0&1&1&0&0&1&0&1&0&1&0&1&0&0&0&0&0\\
1&0&1&0&1&1&0&0&0&0&0&0&1&0&1&0&1&0&1&0\\
0&1&1&0&1&1&0&0&1&0&1&0&0&0&0&0&1&1&0&0\\
1&0&1&0&1&0&1&0&1&1&0&0&0&0&0&0&0&0&0&0\\
0&0&1&1&1&1&0&0&1&1&0&0&1&1&0&0&0&0&0&0\\
1&1&0&0&1&1&0&0&1&1&0&0&1&1&0&0&1&1&1&1\\
1&1&1&1&0&0&0&0&1&1&1&1&0&0&0&0&0&0&0&0\\
1&1&1&1&1&1&1&1&0&0&0&0&0&0&0&0&0&0&0&0\\
1&1&1&1&1&1&1&1&1&1&1&1&1&1&1&1&0&0&0&0
\end{pmatrix};$$

-continued $$\text{or } K''_{20} = \begin{pmatrix}
1&0&0&0&0&0&0&0&0&0&0&0&0&0&0&0&0&0&0&0\\
1&0&0&0&0&0&0&0&0&0&0&0&1&0&0&0&0&0&0&0\\
1&0&0&0&0&0&0&0&1&0&0&0&0&0&0&0&0&0&0&0\\
1&0&0&0&1&0&0&0&0&0&0&0&0&0&0&0&0&0&0&0\\
1&0&1&0&0&0&0&0&0&0&0&0&0&0&0&0&0&0&0&0\\
1&0&0&0&1&0&0&0&1&0&1&0&0&0&0&0&0&0&0&0\\
1&1&0&0&0&0&0&0&0&0&0&0&0&0&0&0&0&0&0&0\\
0&1&1&0&1&0&1&0&0&0&0&0&0&0&0&0&0&0&0&0\\
1&1&1&1&0&0&0&0&0&0&0&0&0&0&0&0&0&0&0&0\\
0&1&0&1&1&0&0&0&1&0&0&0&1&0&0&0&1&0&0&0\\
1&0&1&0&1&1&0&0&0&0&0&0&0&0&0&0&0&0&0&0\\
0&0&0&0&1&1&0&0&1&0&1&0&1&0&1&0&0&0&0&0\\
1&0&1&0&1&1&0&0&0&0&0&0&1&0&1&0&1&0&1&0\\
0&1&1&0&1&1&0&0&1&0&1&0&0&0&0&0&1&1&0&0\\
1&0&1&0&1&0&1&0&1&1&0&0&0&0&0&0&0&0&0&0\\
0&0&1&1&1&1&0&0&1&1&0&0&1&1&0&0&0&0&0&0\\
1&1&0&0&1&1&0&0&1&1&0&0&1&1&0&0&1&1&1&1\\
1&1&1&1&0&0&0&0&1&1&1&1&0&0&0&0&0&0&0&0\\
1&1&1&1&1&1&1&1&0&0&0&0&0&0&0&0&0&0&0&0\\
1&1&1&1&1&1&1&1&1&1&1&1&1&1&1&1&0&0&0&0
\end{pmatrix};$$

$$\text{or } K_{21} = \begin{pmatrix}
1&0&0&0&0&0&0&0&0&0&0&0&0&0&0&0&0&0&0&0&0\\
1&0&0&0&0&0&1&0&0&0&0&0&0&0&0&0&0&0&0&0&0\\
1&0&1&0&0&0&0&0&0&0&0&0&0&0&0&0&0&0&0&0&0\\
1&1&0&0&0&0&0&0&0&0&0&0&0&0&0&0&0&0&0&0&0\\
1&0&0&0&0&1&0&0&0&0&0&0&0&0&0&0&0&0&0&0&0\\
0&1&0&1&0&0&0&0&0&0&0&0&0&0&0&0&0&0&0&0&0\\
1&1&1&0&1&0&0&0&0&0&0&0&0&0&0&0&0&0&0&0&0\\
0&0&1&1&1&0&1&0&0&0&0&0&0&0&0&0&0&0&0&0&0\\
0&1&0&0&1&0&0&1&0&1&0&0&0&0&0&0&0&0&0&0&0\\
0&0&0&1&0&1&1&1&0&0&0&0&0&0&0&0&0&0&0&0&0\\
1&0&1&0&1&0&1&0&0&0&1&0&0&0&1&0&0&0&0&0&0\\
1&1&1&0&0&0&0&0&1&1&0&0&0&1&0&0&0&0&0&0&0\\
1&0&1&1&0&0&1&1&0&0&0&1&0&0&0&0&0&0&0&0&0\\
1&0&0&1&0&0&0&0&1&1&0&1&1&0&0&0&0&0&0&0&0\\
1&0&1&0&0&0&1&0&1&0&1&1&1&0&0&0&1&0&0&0&0\\
1&0&1&0&1&0&0&1&0&1&0&1&0&1&0&1&0&0&0&0&0\\
1&1&0&1&0&1&0&1&1&1&1&0&0&0&0&0&0&0&0&0&0\\
1&1&1&0&0&1&1&0&0&1&1&0&0&1&1&0&0&0&0&1&0\\
1&1&1&1&1&0&0&0&0&1&1&1&1&0&0&0&0&0&1&0&0\\
1&1&1&1&1&1&1&1&1&0&0&0&0&0&0&0&0&0&1&1&1\\
1&1&1&1&1&1&1&1&1&1&1&1&1&1&1&1&1&1&0&0&0
\end{pmatrix};$$

$$\text{or } K'_{21} = \begin{pmatrix}
1&0&0&0&0&0&0&0&0&0&0&0&0&0&0&0&0&0&0&0&0\\
1&0&0&0&0&1&0&0&0&0&0&0&0&0&0&0&0&0&0&0&0\\
1&0&0&1&0&0&0&0&0&0&0&0&0&0&0&0&0&0&0&0&0\\
1&0&0&0&1&0&0&0&0&0&0&0&0&0&0&0&0&0&0&0&0\\
1&0&1&0&0&0&0&0&0&0&0&0&0&0&0&0&0&0&0&0&0\\
1&1&0&0&0&0&0&0&0&0&0&0&0&0&0&0&0&0&0&0&0\\
1&0&0&1&1&0&0&1&0&0&0&0&0&0&0&0&0&0&0&0&0\\
0&0&1&1&1&0&0&0&1&0&0&0&0&0&0&0&0&0&0&0&0\\
0&0&1&0&0&1&1&1&0&0&0&0&0&0&0&0&0&0&0&0&0\\
0&1&1&0&1&0&1&1&0&0&0&0&0&0&1&0&0&0&0&0&0\\
1&0&0&0&0&0&0&0&1&1&1&0&0&0&0&0&0&0&0&0&0\\
0&1&1&1&0&1&1&0&0&0&0&0&1&0&0&0&0&0&0&0&0\\
0&1&0&0&0&1&1&1&0&1&0&0&0&1&0&0&0&0&0&0&0\\
1&0&1&1&0&1&0&1&0&0&1&0&0&0&0&0&0&0&0&0&0\\
1&1&0&0&1&1&0&0&1&0&0&0&1&0&1&0&1&0&0&0&0\\
1&0&1&1&0&1&0&0&1&0&1&0&1&1&0&0&1&0&1&0&0\\
0&0&0&0&0&1&1&0&1&1&0&0&1&1&1&1&0&0&0&0&0\\
1&1&0&0&0&1&1&0&1&1&1&1&0&0&0&0&0&0&0&0&0\\
1&1&1&1&1&0&0&0&1&1&0&0&0&0&0&0&0&0&0&0&1\\
1&1&1&1&1&1&1&1&0&0&0&0&0&0&0&0&0&0&1&1&0\\
1&1&1&1&1&1&1&1&1&1&1&1&1&1&1&1&1&1&0&0&0
\end{pmatrix};$$

-continued $$\text{or } K_{24} = \begin{pmatrix}
1&0&0&0&0&0&0&0&0&0&0&0&0&0&0&0&0&0&0&0&0&0&0&0\\
1&0&0&0&0&0&0&0&0&0&0&0&0&0&0&0&1&0&0&0&0&0&0&0\\
1&0&0&0&0&0&0&0&1&0&0&0&0&0&0&0&0&0&0&0&0&0&0&0\\
1&0&0&0&0&0&0&0&1&0&0&0&0&0&0&0&1&0&0&0&1&0&0&0\\
1&0&1&0&0&0&0&0&0&0&0&0&0&0&0&0&0&0&0&0&0&0&0&0\\
1&0&1&0&0&0&0&0&1&0&0&0&1&0&0&0&0&0&0&0&0&0&0&0\\
1&0&0&0&1&0&0&0&0&0&0&0&0&0&0&0&0&0&0&0&0&0&0&0\\
1&0&0&0&1&0&0&0&1&0&1&0&0&0&0&0&0&0&0&0&0&0&0&0\\
1&0&1&0&0&0&0&0&1&0&1&0&0&0&0&0&0&1&0&1&0&0&0&0\\
1&1&0&0&0&0&0&0&0&0&0&0&0&0&0&0&0&0&0&0&0&0&0&0\\
1&1&0&0&0&0&0&0&1&1&0&0&0&0&0&0&0&0&0&0&0&0&0&0\\
1&0&1&0&1&0&1&0&0&0&0&0&0&0&0&0&0&0&0&0&0&0&0&0\\
1&0&1&0&1&0&1&0&1&1&0&0&0&0&0&0&1&1&0&0&0&0&0&0\\
0&1&1&0&1&0&1&0&0&1&1&0&1&0&1&0&0&0&0&0&0&0&0&0\\
1&0&1&0&1&0&1&0&1&0&1&0&1&0&1&0&1&0&1&0&1&0&1&0\\
1&1&0&0&1&1&0&0&0&0&0&0&0&0&0&0&0&0&0&0&0&0&0&0\\
1&1&1&1&0&0&0&0&0&0&0&0&0&0&0&0&0&0&0&0&0&0&0&0\\
0&0&1&1&1&1&0&0&1&1&0&0&1&1&0&0&0&0&0&0&0&0&0&0\\
1&1&0&0&1&1&0&0&1&1&1&1&0&0&0&0&0&0&0&0&0&0&0&0\\
1&1&0&0&1&1&0&0&1&1&0&0&1&1&0&0&1&1&0&0&1&1&0&0\\
1&1&1&1&0&0&0&0&1&1&1&1&0&0&0&0&1&1&1&1&0&0&0&0\\
1&1&1&1&1&1&1&1&0&0&0&0&0&0&0&0&0&0&0&0&0&0&0&0\\
1&1&1&1&1&1&1&1&0&0&0&0&0&0&0&0&1&1&1&1&1&1&1&1\\
1&1&1&1&1&1&1&1&1&1&1&1&1&1&1&1&0&0&0&0&0&0&0&0
\end{pmatrix};$$

$$\text{or } K'_{24} = \begin{pmatrix}
1&0&0&0&0&0&0&0&0&0&0&0&0&0&0&0&0&0&0&0&0&0&0&0\\
1&0&0&0&0&0&0&0&0&0&0&0&0&0&0&0&0&1&0&0&0&0&0&0\\
1&0&0&0&0&0&0&0&1&0&0&0&0&0&0&0&0&0&0&0&0&0&0&0\\
1&0&0&0&1&0&0&0&0&0&0&0&0&0&0&0&0&0&0&0&0&0&0&0\\
1&0&1&0&0&0&0&0&0&0&0&0&0&0&0&0&0&0&0&0&0&0&0&0\\
1&0&0&0&1&0&0&0&1&0&0&0&1&0&0&0&0&0&0&0&0&0&0&0\\
1&0&1&0&0&0&0&0&1&0&1&0&0&0&0&0&0&0&0&0&0&0&0&0\\
1&1&0&0&0&0&0&0&0&0&0&0&0&0&0&0&0&0&0&0&0&0&0&0\\
1&1&0&0&0&0&0&0&1&1&0&0&0&0&0&0&0&0&0&0&0&0&0&0\\
1&0&1&0&1&0&1&0&0&0&0&0&0&0&0&0&0&0&0&0&0&0&0&0\\
1&0&0&0&1&0&0&0&1&0&1&0&0&0&0&0&1&0&1&0&0&0&0&0\\
1&1&0&0&1&1&0&0&0&0&0&0&0&0&0&0&0&0&0&0&0&0&0&0\\
0&0&0&0&0&1&1&0&1&1&1&0&1&0&0&0&1&0&0&0&1&0&0&0\\
1&0&1&0&1&0&1&0&1&1&0&0&0&0&0&0&1&1&0&0&0&0&0&0\\
0&1&1&0&1&0&1&0&0&1&1&0&1&0&1&0&0&0&0&0&0&0&0&0\\
1&0&1&0&1&0&1&0&1&0&1&0&1&0&1&0&1&0&1&0&1&0&1&0\\
1&1&1&1&0&0&0&0&0&0&0&0&0&0&0&0&0&0&0&0&0&0&0&0\\
0&0&1&1&1&1&0&0&1&1&0&0&1&1&0&0&0&0&0&0&0&0&0&0\\
1&1&0&0&1&1&0&0&1&1&1&1&0&0&0&0&0&0&0&0&0&0&0&0\\
1&1&0&0&1&1&0&0&1&1&0&0&1&1&0&0&1&1&0&0&1&1&0&0\\
1&1&1&1&1&1&1&1&0&0&0&0&0&0&0&0&0&0&0&0&0&0&0&0\\
1&1&1&1&0&0&0&0&1&1&1&1&0&0&0&0&1&1&1&1&0&0&0&0\\
1&1&1&1&1&1&1&1&0&0&0&0&0&0&0&0&0&1&1&1&1&1&1&1\\
1&1&1&1&1&1&1&1&1&1&1&1&1&1&1&1&0&0&0&0&0&0&0&0
\end{pmatrix};$$

-continued $$
\text{or } K''_{24} = \begin{pmatrix}
1&0&0&0&0&0&0&0&0&0&0&0&0&0&0&0&0&0&0&0&0&0&0&0\\
1&0&0&0&0&0&0&0&0&0&0&0&0&0&0&0&0&1&0&0&0&0&0&0\\
1&0&0&0&0&0&0&0&1&0&0&0&0&0&0&0&0&0&0&0&0&0&0&0\\
1&0&0&0&1&0&0&0&0&0&0&0&0&0&0&0&0&0&0&0&0&0&0&0\\
1&0&1&0&0&0&0&0&0&0&0&0&0&0&0&0&0&0&0&0&0&0&0&0\\
1&0&0&0&1&0&0&0&1&0&0&0&1&0&0&0&0&0&0&0&0&0&0&0\\
1&0&1&0&0&0&0&0&1&0&1&0&0&0&0&0&0&0&0&0&0&0&0&0\\
1&1&0&0&0&0&0&0&0&0&0&0&0&0&0&0&0&0&0&0&0&0&0&0\\
1&1&0&0&0&0&0&0&1&1&0&0&0&0&0&0&0&0&0&0&0&0&0&0\\
1&0&1&0&1&0&1&0&0&0&0&0&0&0&0&0&0&0&0&0&0&0&0&0\\
1&0&0&0&1&0&0&0&1&0&1&0&0&0&0&0&1&0&1&0&0&0&0&0\\
1&1&0&0&1&1&0&0&0&0&0&0&0&0&0&0&0&0&0&0&0&0&0&0\\
0&0&0&0&0&1&1&0&1&1&1&0&1&0&0&0&1&0&0&0&1&0&0&0\\
1&0&1&0&1&0&1&0&1&1&0&0&0&0&0&0&1&1&0&0&0&0&0&0\\
0&1&1&0&1&0&1&0&0&1&1&0&1&0&1&0&0&0&0&0&0&0&0&0\\
1&0&1&0&1&0&1&0&1&0&1&0&1&0&1&0&1&0&1&0&1&0&1&0\\
1&1&1&1&0&0&0&0&0&0&0&0&0&0&0&0&0&0&0&0&0&0&0&0\\
0&0&1&1&1&1&0&0&1&1&0&0&1&1&0&0&0&0&0&0&0&0&0&0\\
1&1&0&0&1&1&0&0&1&1&1&1&0&0&0&0&0&0&0&0&0&0&0&0\\
1&1&0&0&1&1&0&0&1&1&0&0&1&1&0&0&1&1&0&0&1&1&0&0\\
1&1&1&1&1&1&1&1&0&0&0&0&0&0&0&0&0&0&0&0&0&0&0&0\\
1&1&1&1&0&0&0&0&1&1&1&1&0&0&0&0&1&1&1&1&0&0&0&0\\
1&1&1&1&1&1&1&1&0&0&0&0&0&0&0&0&0&1&1&1&1&1&1&1\\
1&1&1&1&1&1&1&1&1&1&1&1&1&1&1&1&0&0&0&0&0&0&0&0
\end{pmatrix};
$$

$$
\text{or } K_{25} = \begin{pmatrix}
1&0&0&0&0&0&0&0&0&0&0&0&0&0&0&0&0&0&0&0&0&0&0&0&0\\
1&0&0&0&0&0&0&0&1&0&0&0&0&0&0&0&0&0&0&0&0&0&0&0&0\\
1&0&0&0&1&0&0&0&0&0&0&0&0&0&0&0&0&0&0&0&0&0&0&0&0\\
1&1&0&0&0&0&0&0&0&0&0&0&0&0&0&0&0&0&0&0&0&0&0&0&0\\
0&1&0&0&0&1&0&0&0&0&0&0&0&0&0&0&0&0&0&0&0&0&0&0&0\\
0&1&1&0&0&0&0&0&0&0&0&0&0&0&0&0&0&0&0&0&0&0&0&0&0\\
0&0&1&0&1&0&0&1&0&0&0&0&1&0&0&0&0&0&0&0&0&0&0&0&0\\
1&0&1&0&1&0&0&0&0&0&0&0&1&0&0&0&0&0&0&0&0&0&0&0&0\\
0&0&0&1&1&0&0&0&0&0&0&0&0&0&1&1&0&0&0&0&0&0&0&0&0\\
1&1&0&0&0&1&1&0&0&0&0&0&0&0&0&0&0&0&0&0&0&0&0&0&0\\
1&1&1&1&0&0&0&0&0&0&0&0&0&0&0&0&0&0&0&0&0&0&0&0&0\\
0&1&0&1&0&0&1&0&0&0&0&0&1&0&0&1&1&0&0&0&0&0&0&0&0\\
0&0&0&0&0&1&1&1&0&0&0&1&0&1&0&0&1&0&0&0&0&0&0&0&0\\
1&0&0&0&1&1&1&1&0&1&0&0&0&0&0&0&0&0&0&0&0&0&0&0&0\\
1&1&1&0&1&0&0&1&1&0&0&0&0&0&0&0&0&0&0&0&0&0&0&0&0\\
0&1&0&1&0&0&1&1&0&1&0&1&0&0&0&0&1&0&0&0&0&1&0&0&0\\
0&0&1&0&1&1&0&1&1&1&0&0&1&0&1&0&0&0&0&0&0&0&0&0&0\\
1&1&1&1&1&1&1&1&0&0&0&1&0&0&0&0&0&0&0&0&0&0&0&0&0\\
1&1&0&0&1&0&1&0&1&1&0&1&0&1&1&0&0&0&0&1&0&0&0&0&0\\
1&0&1&1&0&1&1&1&1&1&0&1&0&0&0&0&0&0&1&0&0&0&0&0&0\\
1&1&0&1&0&1&0&1&0&1&0&1&0&1&0&1&0&0&0&1&0&1&0&1&0\\
1&1&1&0&0&1&1&0&0&1&1&0&0&1&1&0&0&0&1&0&0&1&1&0&0\\
1&1&1&1&1&0&0&0&0&1&1&1&1&0&0&0&0&0&1&1&1&0&0&0&0\\
1&1&1&1&1&1&1&1&1&0&0&0&0&0&0&0&0&0&1&1&1&1&1&1&1\\
1&1&1&1&1&1&1&1&1&1&1&1&1&1&1&1&1&1&0&0&0&0&0&0&0
\end{pmatrix};
$$

-continued $$\text{or } K'_{25} = \begin{pmatrix}
1&0&0&0&0&0&0&0&0&0&0&0&0&0&0&0&0&0&0&0&0&0&0&0&0\\
1&0&0&0&0&0&0&0&1&0&0&0&0&0&0&0&0&0&0&0&0&0&0&0&0\\
1&0&0&0&1&0&0&0&0&0&0&0&0&0&0&0&0&0&0&0&0&0&0&0&0\\
1&1&0&0&0&0&0&0&0&0&0&0&0&0&0&0&0&0&0&0&0&0&0&0&0\\
0&1&0&0&0&1&0&0&0&0&0&0&0&0&0&0&0&0&0&0&0&0&0&0&0\\
0&1&1&0&0&0&0&0&0&0&0&0&0&0&0&0&0&0&0&0&0&0&0&0&0\\
0&0&1&0&1&0&0&1&0&0&0&0&1&0&0&0&0&0&0&0&0&0&0&0&0\\
1&0&1&0&1&0&0&0&0&0&0&0&1&0&0&0&0&0&0&0&0&0&0&0&0\\
0&0&0&1&1&0&0&0&0&0&0&0&0&0&1&1&0&0&0&0&0&0&0&0&0\\
1&1&0&0&0&1&1&0&0&0&0&0&0&0&0&0&0&0&0&0&0&0&0&0&0\\
1&1&1&1&0&0&0&0&0&0&0&0&0&0&0&0&0&0&0&0&0&0&0&0&0\\
0&1&0&1&0&0&1&0&0&0&0&0&1&0&0&1&1&0&0&0&0&0&0&0&0\\
0&0&0&0&0&1&1&1&0&0&0&1&0&1&0&0&1&0&0&0&0&0&0&0&0\\
1&0&0&0&1&1&1&1&0&1&0&0&0&0&0&0&0&0&0&0&0&0&0&0&0\\
1&1&1&0&1&0&0&1&1&0&0&0&0&0&0&0&0&0&0&0&0&0&0&0&0\\
0&1&0&1&0&0&1&1&0&1&0&1&0&0&0&0&1&0&0&0&0&1&0&0&0\\
0&0&1&0&1&1&0&1&1&1&0&0&1&0&1&0&0&0&0&0&0&0&0&0&0\\
1&1&1&1&1&1&1&1&0&0&0&1&0&0&0&0&0&0&0&0&0&0&0&0&0\\
1&1&0&0&1&0&1&0&1&1&0&1&0&1&1&0&0&0&0&1&0&0&0&0&0\\
1&0&1&1&0&1&1&1&1&1&0&1&0&0&0&0&0&0&1&0&0&0&0&0&0\\
1&1&0&1&0&1&0&1&0&1&0&1&0&1&0&1&0&0&0&1&0&1&0&1&0\\
1&1&1&0&0&1&1&0&0&1&1&0&0&1&1&0&0&0&1&0&0&1&1&0&0\\
1&1&1&1&1&0&0&0&0&1&1&1&1&0&0&0&0&0&1&1&1&0&0&0&0\\
1&1&1&1&1&1&1&1&1&0&0&0&0&0&0&0&0&0&1&1&1&1&1&1&1\\
1&1&1&1&1&1&1&1&1&1&1&1&1&1&1&1&1&1&0&0&0&0&0&0&0
\end{pmatrix};$$

$$\text{or } K_{28} = \begin{pmatrix}
1&0&0&0&0&0&0&0&0&0&0&0&0&0&0&0&0&0&0&0&0&0&0&0&0&0&0&0\\
1&0&0&0&0&0&0&0&0&0&0&0&0&0&0&0&1&0&0&0&0&0&0&0&0&0&0&0\\
1&0&0&0&0&0&0&0&1&0&0&0&0&0&0&0&0&0&0&0&0&0&0&0&0&0&0&0\\
1&0&0&0&0&0&0&0&1&0&0&0&0&0&0&0&1&0&0&0&1&0&0&0&0&0&0&0\\
1&0&0&0&1&0&0&0&0&0&0&0&0&0&0&0&0&0&0&0&0&0&0&0&0&0&0&0\\
1&0&0&0&1&0&0&0&0&0&0&0&0&0&0&0&1&0&1&0&0&0&0&0&0&0&0&0\\
1&0&1&0&0&0&0&0&0&0&0&0&0&0&0&0&0&0&0&0&0&0&0&0&0&0&0&0\\
0&0&0&0&0&0&0&0&1&0&1&0&0&0&0&0&0&0&0&0&1&0&1&0&0&0&0&0\\
1&0&0&0&1&0&0&0&0&0&1&0&1&0&0&0&0&0&0&0&1&0&1&0&0&0&0&0\\
1&0&0&0&1&0&0&0&1&0&0&0&1&0&0&0&1&0&1&0&1&0&0&0&1&0&0&0\\
1&1&0&0&0&0&0&0&0&0&0&0&0&0&0&0&0&0&0&0&0&0&0&0&0&0&0&0\\
1&1&0&0&0&0&0&0&0&0&0&0&0&0&0&0&1&1&0&0&0&0&0&0&0&0&0&0\\
0&1&1&0&0&0&0&0&1&0&1&0&0&0&0&0&1&1&0&0&0&0&0&0&0&0&0&0\\
1&0&1&0&1&0&1&0&0&0&0&0&0&0&0&0&0&0&0&0&0&0&0&0&0&0&0&0\\
0&1&1&0&1&0&1&0&1&1&0&0&0&0&0&0&0&0&0&0&0&0&0&0&0&0&0&0\\
1&1&0&0&0&0&0&0&1&1&0&0&0&0&0&0&1&1&0&0&1&1&0&0&0&0&0&0\\
1&1&0&0&0&0&0&0&0&1&1&0&1&0&1&0&1&1&0&0&0&1&1&0&1&0&1&0\\
1&1&0&0&1&1&0&0&0&0&0&0&0&0&0&0&0&0&0&0&0&0&0&0&0&0&0&0\\
1&1&0&0&1&1&0&0&0&0&0&0&0&0&1&1&1&1&0&0&0&0&0&0&0&0&0&0\\
0&1&1&0&0&1&1&0&1&0&1&0&1&0&1&0&1&1&1&1&0&0&0&0&0&0&0&0\\
1&1&1&1&0&0&0&0&0&0&0&0&0&0&0&0&0&0&0&0&0&0&0&0&0&0&0&0\\
0&0&0&0&0&0&0&0&1&1&1&1&0&0&0&0&0&0&0&0&1&1&1&1&0&0&0&0\\
1&1&0&0&1&1&0&0&0&0&1&1&1&1&0&0&0&0&0&0&1&1&1&1&0&0&0&0\\
1&1&0&0&1&1&0&0&1&1&0&0&1&1&0&0&1&1&1&1&1&1&0&0&1&1&0&0\\
1&1&1&1&0&0&0&0&1&1&1&1&0&0&0&0&0&0&0&0&0&0&0&0&0&0&0&0\\
1&1&1&1&1&1&1&1&0&0&0&0&0&0&0&0&0&0&0&0&0&0&0&0&0&0&0&0\\
0&0&0&0&0&0&0&0&1&1&1&1&1&1&1&1&0&0&0&0&1&1&1&1&1&1&1&1\\
1&1&1&1&1&1&1&1&1&1&1&1&1&1&1&1&0&0&0&0&0&0&0&0&0&0&0&0
\end{pmatrix};$$

-continued $$
\text{or } K_{32} = \begin{pmatrix}
1 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 \\
1 & 0 & 0 & 0 & 0 & 0 & 0 & 0 & 0 & 0 & 0 & 0 & 0 & 0 & 0 & 0 & 1 & 0 & 0 & 0 & 0 & 0 & 0 & 0 & 0 & 0 & 0 & 0 & 0 & 0 & 0 & 0 \\
1 & 0 & 0 & 0 & 0 & 0 & 0 & 0 & 1 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 \\
1 & 0 & 0 & 0 & 0 & 0 & 0 & 0 & 1 & 0 & 0 & 0 & 0 & 0 & 0 & 0 & 1 & 0 & 0 & 0 & 0 & 0 & 0 & 0 & 1 & 0 & 0 & 0 & 0 & 0 & 0 & 0 \\
1 & 0 & 0 & 0 & 1 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 \\
1 & 0 & 0 & 0 & 1 & 0 & 0 & 0 & 0 & 0 & 0 & 0 & 0 & 0 & 0 & 0 & 1 & 0 & 0 & 0 & 1 & 0 & 0 & 0 & 0 & 0 & 0 & 0 & 0 & 0 & 0 & 0 \\
1 & 0 & 1 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 \\
1 & 0 & 1 & 0 & 0 & 0 & 0 & 0 & 0 & 0 & 0 & 0 & 0 & 0 & 0 & 0 & 1 & 0 & 1 & 0 & 0 & 0 & 0 & 0 & 0 & 0 & 0 & 0 & 0 & 0 & 0 & 0 \\
0 & 0 & 1 & 0 & 1 & 0 & 0 & 0 & 1 & 0 & 0 & 0 & 1 & 0 & 0 & 0 & 1 & 0 & 1 & 0 & 0 & 0 & 0 & 0 & 0 & 0 & 0 & 0 & 0 & 0 & 0 & 0 \\
1 & 0 & 0 & 0 & 1 & 0 & 0 & 0 & 1 & 0 & 0 & 0 & 1 & 0 & 0 & 0 & 1 & 0 & 0 & 0 & 1 & 0 & 0 & 0 & 1 & 0 & 0 & 0 & 1 & 0 & 0 & 0 \\
1 & 1 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 \\
1 & 1 & 0 & 0 & 0 & 0 & 0 & 0 & 0 & 0 & 0 & 0 & 0 & 0 & 0 & 0 & 1 & 1 & 0 & 0 & 0 & 0 & 0 & 0 & 0 & 0 & 0 & 0 & 0 & 0 & 0 & 0 \\
0 & 1 & 1 & 0 & 0 & 0 & 0 & 0 & 1 & 0 & 1 & 0 & 0 & 0 & 0 & 0 & 1 & 1 & 0 & 0 & 0 & 0 & 0 & 0 & 0 & 0 & 0 & 0 & 0 & 0 & 0 & 0 \\
1 & 0 & 1 & 0 & 0 & 0 & 0 & 0 & 1 & 0 & 1 & 0 & 0 & 0 & 0 & 0 & 1 & 0 & 1 & 0 & 0 & 0 & 0 & 0 & 1 & 0 & 1 & 0 & 0 & 0 & 0 & 0 \\
1 & 0 & 1 & 0 & 1 & 0 & 1 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 \\
0 & 1 & 1 & 0 & 1 & 0 & 1 & 0 & 1 & 1 & 0 & 0 & 0 & 0 & 0 & 0 & 0 & 0 & 0 & 0 & 0 & 0 & 0 & 0 & 0 & 0 & 0 & 0 & 0 & 0 & 0 & 0 \\
1 & 1 & 0 & 0 & 0 & 0 & 0 & 0 & 1 & 1 & 0 & 0 & 0 & 0 & 0 & 0 & 1 & 1 & 0 & 0 & 0 & 0 & 0 & 0 & 1 & 1 & 0 & 0 & 0 & 0 & 0 & 0 \\
0 & 1 & 1 & 0 & 1 & 0 & 1 & 0 & 1 & 1 & 0 & 0 & 0 & 0 & 0 & 0 & 0 & 1 & 1 & 0 & 1 & 0 & 1 & 0 & 1 & 1 & 0 & 0 & 0 & 0 & 0 & 0 \\
1 & 1 & 0 & 0 & 1 & 1 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 \\
1 & 1 & 0 & 0 & 1 & 1 & 0 & 0 & 0 & 0 & 0 & 0 & 0 & 0 & 0 & 0 & 1 & 1 & 0 & 0 & 1 & 1 & 0 & 0 & 0 & 0 & 0 & 0 & 0 & 0 & 0 & 0 \\
0 & 1 & 1 & 0 & 0 & 1 & 1 & 0 & 1 & 0 & 1 & 0 & 1 & 0 & 1 & 0 & 1 & 1 & 0 & 0 & 1 & 1 & 0 & 0 & 0 & 0 & 0 & 0 & 0 & 0 & 0 & 0 \\
1 & 0 & 1 & 0 & 1 & 0 & 1 & 0 & 1 & 0 & 1 & 0 & 1 & 0 & 1 & 0 & 1 & 0 & 1 & 0 & 1 & 0 & 1 & 0 & 1 & 0 & 1 & 0 & 1 & 0 & 1 & 0 \\
1 & 1 & 1 & 1 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 \\
1 & 1 & 1 & 1 & 0 & 0 & 0 & 0 & 0 & 0 & 0 & 0 & 0 & 0 & 0 & 0 & 1 & 1 & 1 & 1 & 0 & 0 & 0 & 0 & 0 & 0 & 0 & 0 & 0 & 0 & 0 & 0 \\
0 & 0 & 1 & 1 & 1 & 1 & 0 & 0 & 1 & 1 & 0 & 0 & 1 & 1 & 0 & 0 & 1 & 1 & 1 & 1 & 0 & 0 & 0 & 0 & 0 & 0 & 0 & 0 & 0 & 0 & 0 & 0 \\
1 & 1 & 0 & 0 & 1 & 1 & 0 & 0 & 1 & 1 & 0 & 0 & 1 & 1 & 0 & 0 & 1 & 1 & 0 & 0 & 1 & 1 & 0 & 0 & 1 & 1 & 0 & 0 & 1 & 1 & 0 & 0 \\
1 & 1 & 1 & 1 & 0 & 0 & 0 & 0 & 1 & 1 & 1 & 1 & 0 & 0 & 0 & 0 & 0 & 0 & 0 & 0 & 0 & 0 & 0 & 0 & 0 & 0 & 0 & 0 & 0 & 0 & 0 & 0 \\
1 & 1 & 1 & 1 & 0 & 0 & 0 & 0 & 1 & 1 & 1 & 1 & 0 & 0 & 0 & 0 & 1 & 1 & 1 & 1 & 0 & 0 & 0 & 0 & 1 & 1 & 1 & 1 & 0 & 0 & 0 & 0 \\
1 & 1 & 1 & 1 & 1 & 1 & 1 & 1 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 \\
1 & 1 & 1 & 1 & 1 & 1 & 1 & 1 & 0 & 0 & 0 & 0 & 0 & 0 & 0 & 0 & 1 & 1 & 1 & 1 & 1 & 1 & 1 & 1 & 0 & 0 & 0 & 0 & 0 & 0 & 0 & 0 \\
1 & 1 & 1 & 1 & 1 & 1 & 1 & 1 & 1 & 1 & 1 & 1 & 1 & 1 & 1 & 1 & 0 & 0 & 0 & 0 & 0 & 0 & 0 & 0 & 0 & 0 & 0 & 0 & 0 & 0 & 0 & 0 \\
1 & 1 & 1 & 1 & 1 & 1 & 1 & 1 & 1 & 1 & 1 & 1 & 1 & 1 & 1 & 1 & 1 & 1 & 1 & 1 & 1 & 1 & 1 & 1 & 1 & 1 & 1 & 1 & 1 & 1 & 1 & 1
\end{pmatrix}.
$$

8. An encoding apparatus, comprising:

at least one non-transitory memory storing instructions;

at least one processor connected to the at least one non-transitory memory, wherein the at least one processor is configured to execute the instructions to perform operations to:

obtain information bits;

determine a target kernel matrix, wherein the target kernel matrix is determined by adjusting an original kernel matrix to construct a plurality of kernel matrices, selecting the target kernel matrix from the plurality of kernel matrices to increase performance and reduce decoding complexity;

perform polar encoding on the information bits based on the selected target kernel matrix to produce an encoded polar code; and sending the encoded polar code to a receiver.

9. The encoding apparatus according to claim 8, wherein the original kernel matrix is a kernel matrix $K_{24}$ whose dimension is (24×24), and the $K_{24}$ is:

| | | | | | | | | | | | | | | | | | | | | | | | |
|---|---|---|---|---|---|---|---|---|---|---|---|---|---|---|---|---|---|---|---|---|---|---|---|
| 1 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 |
| 1 | 0 | 0 | 0 | 0 | 0 | 0 | 0 | 0 | 0 | 0 | 0 | 0 | 0 | 0 | 0 | 1 | 0 | 0 | 0 | 0 | 0 | 0 | 0 |
| 1 | 0 | 0 | 0 | 0 | 0 | 0 | 0 | 1 | 0 | 0 | 0 | 0 | 0 | 0 | 0 | 0 | 0 | 0 | 0 | 0 | 0 | 0 | 0 |
| 1 | 0 | 0 | 0 | 0 | 0 | 0 | 0 | 1 | 0 | 0 | 0 | 0 | 0 | 0 | 0 | 1 | 0 | 0 | 0 | 1 | 0 | 0 | 0 |
| 1 | 0 | 1 | 0 | 0 | 0 | 0 | 0 | 0 | 0 | 0 | 0 | 0 | 0 | 0 | 0 | 0 | 0 | 0 | 0 | 0 | 0 | 0 | 0 |
| 1 | 0 | 1 | 0 | 0 | 0 | 0 | 0 | 1 | 0 | 0 | 0 | 1 | 0 | 0 | 0 | 0 | 0 | 0 | 0 | 0 | 0 | 0 | 0 |
| 1 | 0 | 0 | 0 | 1 | 0 | 0 | 0 | 0 | 0 | 0 | 0 | 0 | 0 | 0 | 0 | 0 | 0 | 0 | 0 | 0 | 0 | 0 | 0 |
| 1 | 0 | 0 | 0 | 1 | 0 | 0 | 0 | 1 | 0 | 1 | 0 | 0 | 0 | 0 | 0 | 0 | 0 | 0 | 0 | 0 | 0 | 0 | 0 |
| 1 | 0 | 1 | 0 | 0 | 0 | 0 | 0 | 1 | 0 | 1 | 0 | 0 | 0 | 0 | 0 | 1 | 0 | 1 | 0 | 0 | 0 | 0 | 0 |
| 1 | 1 | 0 | 0 | 0 | 0 | 0 | 0 | 0 | 0 | 0 | 0 | 0 | 0 | 0 | 0 | 0 | 0 | 0 | 0 | 0 | 0 | 0 | 0 |
| 1 | 1 | 0 | 0 | 0 | 0 | 0 | 0 | 1 | 1 | 0 | 0 | 0 | 0 | 0 | 0 | 0 | 0 | 0 | 0 | 0 | 0 | 0 | 0 |
| 1 | 0 | 1 | 0 | 1 | 0 | 1 | 0 | 0 | 0 | 0 | 0 | 0 | 0 | 0 | 0 | 0 | 0 | 0 | 0 | 0 | 0 | 0 | 0 |
| 1 | 0 | 1 | 0 | 1 | 0 | 1 | 0 | 1 | 1 | 0 | 0 | 0 | 0 | 0 | 0 | 1 | 1 | 0 | 0 | 0 | 0 | 0 | 0 |
| 0 | 1 | 1 | 0 | 1 | 0 | 1 | 0 | 0 | 1 | 1 | 0 | 1 | 0 | 1 | 0 | 0 | 0 | 0 | 0 | 0 | 0 | 0 | 0 |
| 1 | 0 | 1 | 0 | 1 | 0 | 1 | 0 | 1 | 0 | 1 | 0 | 1 | 0 | 1 | 0 | 1 | 0 | 1 | 0 | 1 | 0 | 1 | 0 |
| 1 | 1 | 0 | 0 | 1 | 1 | 0 | 0 | 0 | 0 | 0 | 0 | 0 | 0 | 0 | 0 | 0 | 0 | 0 | 0 | 0 | 0 | 0 | 0 |
| 1 | 1 | 1 | 1 | 0 | 0 | 0 | 0 | 0 | 0 | 0 | 0 | 0 | 0 | 0 | 0 | 0 | 0 | 0 | 0 | 0 | 0 | 0 | 0 |
| 0 | 0 | 1 | 1 | 1 | 1 | 0 | 0 | 1 | 1 | 0 | 0 | 1 | 1 | 0 | 0 | 0 | 0 | 0 | 0 | 0 | 0 | 0 | 0 |
| 1 | 1 | 0 | 0 | 1 | 1 | 0 | 0 | 1 | 1 | 1 | 1 | 0 | 0 | 0 | 0 | 0 | 0 | 0 | 0 | 0 | 0 | 0 | 0 |
| 1 | 1 | 0 | 0 | 1 | 1 | 0 | 0 | 1 | 1 | 0 | 0 | 1 | 1 | 0 | 0 | 1 | 1 | 0 | 0 | 1 | 1 | 0 | 0 |
| 1 | 1 | 1 | 1 | 0 | 0 | 0 | 0 | 1 | 1 | 1 | 1 | 0 | 0 | 0 | 0 | 1 | 1 | 1 | 1 | 0 | 0 | 0 | 0 |
| 1 | 1 | 1 | 1 | 1 | 1 | 1 | 1 | 0 | 0 | 0 | 0 | 0 | 0 | 0 | 0 | 0 | 0 | 0 | 0 | 0 | 0 | 0 | 0 |
| 1 | 1 | 1 | 1 | 1 | 1 | 1 | 1 | 0 | 0 | 0 | 0 | 0 | 0 | 0 | 0 | 1 | 1 | 1 | 1 | 1 | 1 | 1 | 1 |
| 1 | 1 | 1 | 1 | 1 | 1 | 1 | 1 | 1 | 1 | 1 | 1 | 1 | 1 | 1 | 1 | 0 | 0 | 0 | 0 | 0 | 0 | 0 | 0. |

10. The encoding apparatus according to claim 8, wherein the target kernel matrix is any one of the following:

$$K_{20} = \begin{pmatrix}
1&0&0&0&0&0&0&0&0&0&0&0&0&0&0&0&0&0&0&0\\
1&0&0&0&0&0&0&0&0&0&0&0&1&0&0&0&0&0&0&0\\
1&0&0&0&0&0&0&0&1&0&0&0&0&0&0&0&0&0&0&0\\
1&0&0&0&0&0&0&0&1&0&0&0&1&0&0&0&1&0&0&0\\
1&0&1&0&0&0&0&0&0&0&0&0&0&0&0&0&0&0&0&0\\
1&0&0&0&1&0&0&0&0&0&0&0&0&0&0&0&0&0&0&0\\
1&0&0&0&1&0&0&0&1&0&1&0&0&0&0&0&0&0&0&0\\
1&0&1&0&0&0&0&0&1&0&1&0&1&0&1&0&0&0&0&0\\
1&1&0&0&0&0&0&0&0&0&0&0&0&0&0&0&0&0&0&0\\
1&1&0&0&0&0&0&0&1&1&0&0&0&0&0&0&0&0&0&0\\
1&0&1&0&1&0&1&0&0&0&0&0&0&0&0&0&0&0&0&0\\
1&0&1&0&1&0&1&0&1&1&0&0&1&1&0&0&0&0&0&0\\
1&1&0&0&0&0&0&0&1&1&0&0&1&0&1&0&1&0&1&0\\
1&1&0&0&1&1&0&0&0&0&0&0&0&0&0&0&0&0&0&0\\
1&1&1&1&0&0&0&0&0&0&0&0&0&0&0&0&0&0&0&0\\
1&1&1&1&0&0&0&0&0&0&0&0&1&1&0&0&1&1&0&0\\
1&1&0&0&1&1&0&0&1&1&1&1&0&0&0&0&0&0&0&0\\
1&1&1&1&0&0&0&0&1&1&1&1&1&1&1&1&0&0&0&0\\
1&1&1&1&1&1&1&1&0&0&0&0&0&0&0&0&0&0&0&0\\
1&1&1&1&1&1&1&1&0&0&0&0&1&1&1&1&1&1&1&1
\end{pmatrix};$$

$$\text{or } K'_{20} = \begin{pmatrix}
1&0&0&0&0&0&0&0&0&0&0&0&0&0&0&0&0&0&0&0\\
1&0&0&0&0&0&0&0&0&0&0&0&1&0&0&0&0&0&0&0\\
1&0&0&0&0&0&0&0&1&0&0&0&0&0&0&0&0&0&0&0\\
1&0&0&0&1&0&0&0&0&0&0&0&0&0&0&0&0&0&0&0\\
1&0&1&0&0&0&0&0&0&0&0&0&0&0&0&0&0&0&0&0\\
1&0&0&0&1&0&0&0&1&0&1&0&0&0&0&0&0&0&0&0\\
1&1&0&0&0&0&0&0&0&0&0&0&0&0&0&0&0&0&0&0\\
0&1&1&0&1&0&1&0&0&0&0&0&0&0&0&0&0&0&0&0\\
1&1&1&1&0&0&0&0&0&0&0&0&0&0&0&0&0&0&0&0\\
0&1&0&1&1&0&0&0&1&0&0&0&1&0&0&0&1&0&0&0\\
1&0&1&0&1&1&0&0&0&0&0&0&0&0&0&0&0&0&0&0\\
0&0&0&0&1&1&0&0&1&0&1&0&1&0&1&0&0&0&0&0\\
1&0&1&0&1&1&0&0&0&0&0&0&1&0&1&0&1&0&1&0\\
0&1&1&0&1&1&0&0&1&0&1&0&0&0&0&0&1&1&0&0\\
1&0&1&0&1&0&1&0&1&1&0&0&0&0&0&0&0&0&0&0\\
0&0&1&1&1&1&0&0&1&1&0&0&1&1&0&0&0&0&0&0\\
1&1&0&0&1&1&0&0&1&1&0&0&1&1&0&0&1&1&1&1\\
1&1&1&1&0&0&0&0&1&1&1&1&0&0&0&0&0&0&0&0\\
1&1&1&1&1&1&1&1&0&0&0&0&0&0&0&0&0&0&0&0\\
1&1&1&1&1&1&1&1&1&1&1&1&1&1&1&1&0&0&0&0
\end{pmatrix};$$

$$\text{or } K''_{20} = \begin{pmatrix}
1&0&0&0&0&0&0&0&0&0&0&0&0&0&0&0&0&0&0&0\\
1&0&0&0&0&0&0&0&0&0&0&0&1&0&0&0&0&0&0&0\\
1&0&0&0&0&0&0&0&1&0&0&0&0&0&0&0&0&0&0&0\\
1&0&0&0&1&0&0&0&0&0&0&0&0&0&0&0&0&0&0&0\\
1&0&1&0&0&0&0&0&0&0&0&0&0&0&0&0&0&0&0&0\\
1&0&0&0&1&0&0&0&1&0&1&0&0&0&0&0&0&0&0&0\\
1&1&0&0&0&0&0&0&0&0&0&0&0&0&0&0&0&0&0&0\\
0&1&1&0&1&0&1&0&0&0&0&0&0&0&0&0&0&0&0&0\\
1&1&1&1&0&0&0&0&0&0&0&0&0&0&0&0&0&0&0&0\\
0&1&0&1&1&0&0&0&1&0&0&0&1&0&0&0&1&0&0&0\\
1&0&1&0&1&1&0&0&0&0&0&0&0&0&0&0&0&0&0&0\\
0&0&0&0&1&1&0&0&1&0&1&0&1&0&1&0&0&0&0&0\\
1&0&1&0&1&1&0&0&0&0&0&0&1&0&1&0&1&0&1&0\\
0&1&1&0&1&1&0&0&1&0&1&0&0&0&0&0&1&1&0&0\\
1&0&1&0&1&0&1&0&1&1&0&0&0&0&0&0&0&0&0&0\\
0&0&1&1&1&1&0&0&1&1&0&0&1&1&0&0&0&0&0&0\\
1&1&0&0&1&1&0&0&1&1&0&0&1&1&0&0&1&1&1&1\\
1&1&1&1&0&0&0&0&1&1&1&1&0&0&0&0&0&0&0&0\\
1&1&1&1&1&1&1&1&0&0&0&0&0&0&0&0&0&0&0&0\\
1&1&1&1&1&1&1&1&1&1&1&1&1&1&1&1&0&0&0&0
\end{pmatrix};$$

-continued $$
\text{or } K_{21}=\begin{pmatrix}
1&0&0&0&0&0&0&0&0&0&0&0&0&0&0&0&0&0&0&0&0\\
1&0&0&0&0&0&1&0&0&0&0&0&0&0&0&0&0&0&0&0&0\\
1&0&1&0&0&0&0&0&0&0&0&0&0&0&0&0&0&0&0&0&0\\
1&1&0&0&0&0&0&0&0&0&0&0&0&0&0&0&0&0&0&0&0\\
1&0&0&0&0&1&0&0&0&0&0&0&0&0&0&0&0&0&0&0&0\\
0&1&0&1&0&0&0&0&0&0&0&0&0&0&0&0&0&0&0&0&0\\
1&1&1&0&1&0&0&0&0&0&0&0&0&0&0&0&0&0&0&0&0\\
0&0&1&1&1&0&1&0&0&0&0&0&0&0&0&0&0&0&0&0&0\\
0&1&0&0&1&0&0&1&0&1&0&0&0&0&0&0&0&0&0&0&0\\
0&0&0&1&0&1&1&1&0&0&0&0&0&0&0&0&0&0&0&0&0\\
1&0&1&0&1&0&1&0&0&0&1&0&0&0&1&0&0&0&0&0&0\\
1&1&1&0&0&0&0&0&1&1&0&0&0&1&0&0&0&0&0&0&0\\
1&0&1&1&0&0&1&1&0&0&0&1&0&0&0&0&0&0&0&0&0\\
1&0&0&1&0&0&0&0&1&1&0&1&1&0&0&0&0&0&0&0&0\\
1&0&1&0&0&0&1&0&1&0&1&1&1&0&0&0&1&0&0&0&0\\
1&0&1&0&1&0&0&1&0&1&0&1&0&1&0&1&0&0&0&0&0\\
1&1&0&1&0&1&0&1&1&1&1&0&0&0&0&0&0&0&0&0&0\\
1&1&1&0&0&1&1&0&0&1&1&0&0&1&1&0&0&0&0&1&0\\
1&1&1&1&1&0&0&0&0&1&1&1&1&0&0&0&0&0&1&0&0\\
1&1&1&1&1&1&1&1&1&0&0&0&0&0&0&0&0&0&1&1&1\\
1&1&1&1&1&1&1&1&1&1&1&1&1&1&1&1&1&1&0&0&0
\end{pmatrix};
$$

$$
\text{or } K'_{21}=\begin{pmatrix}
1&0&0&0&0&0&0&0&0&0&0&0&0&0&0&0&0&0&0&0&0\\
1&0&0&0&0&1&0&0&0&0&0&0&0&0&0&0&0&0&0&0&0\\
1&0&0&1&0&0&0&0&0&0&0&0&0&0&0&0&0&0&0&0&0\\
1&0&0&0&1&0&0&0&0&0&0&0&0&0&0&0&0&0&0&0&0\\
1&0&1&0&0&0&0&0&0&0&0&0&0&0&0&0&0&0&0&0&0\\
1&1&0&0&0&0&0&0&0&0&0&0&0&0&0&0&0&0&0&0&0\\
1&0&0&1&1&0&0&1&0&0&0&0&0&0&0&0&0&0&0&0&0\\
0&0&1&1&1&0&0&0&1&0&0&0&0&0&0&0&0&0&0&0&0\\
0&0&1&0&0&1&1&1&0&0&0&0&0&0&0&0&0&0&0&0&0\\
0&1&1&0&1&0&1&1&0&0&0&0&0&0&1&0&0&0&0&0&0\\
1&0&0&0&0&0&0&0&1&1&1&0&0&0&0&0&0&0&0&0&0\\
0&1&1&1&0&1&1&0&0&0&0&0&1&0&0&0&0&0&0&0&0\\
0&1&0&0&0&1&1&1&0&1&0&0&0&1&0&0&0&0&0&0&0\\
1&0&1&1&0&1&0&1&0&0&1&0&0&0&0&0&0&0&0&0&0\\
1&1&0&0&1&1&0&0&1&0&0&0&1&0&1&0&1&0&0&0&0\\
1&0&1&1&0&1&0&0&1&0&1&0&1&1&0&0&1&0&1&0&0\\
0&0&0&0&0&1&1&0&1&1&0&0&1&1&1&1&0&0&0&0&0\\
1&1&0&0&0&1&1&0&1&1&1&1&0&0&0&0&0&0&0&0&0\\
1&1&1&1&1&0&0&0&1&1&0&0&0&0&0&0&0&0&0&0&1\\
1&1&1&1&1&1&1&1&0&0&0&0&0&0&0&0&0&0&1&1&0\\
1&1&1&1&1&1&1&1&1&1&1&1&1&1&1&1&1&1&0&0&0
\end{pmatrix};
$$

-continued $$\text{or } K_{24}=\begin{pmatrix}
1&0&0&0&0&0&0&0&0&0&0&0&0&0&0&0&0&0&0&0&0&0&0&0\\
1&0&0&0&0&0&0&0&0&0&0&0&0&0&0&0&1&0&0&0&0&0&0&0\\
1&0&0&0&0&0&0&0&1&0&0&0&0&0&0&0&0&0&0&0&0&0&0&0\\
1&0&0&0&0&0&0&0&1&0&0&0&0&0&0&0&1&0&0&0&1&0&0&0\\
1&0&1&0&0&0&0&0&0&0&0&0&0&0&0&0&0&0&0&0&0&0&0&0\\
1&0&1&0&0&0&0&0&1&0&0&0&1&0&0&0&0&0&0&0&0&0&0&0\\
1&0&0&0&1&0&0&0&0&0&0&0&0&0&0&0&0&0&0&0&0&0&0&0\\
1&0&0&0&1&0&0&0&1&0&1&0&0&0&0&0&0&0&0&0&0&0&0&0\\
1&0&1&0&0&0&0&0&1&0&1&0&0&0&0&0&0&1&0&1&0&0&0&0\\
1&1&0&0&0&0&0&0&0&0&0&0&0&0&0&0&0&0&0&0&0&0&0&0\\
1&1&0&0&0&0&0&0&1&1&0&0&0&0&0&0&0&0&0&0&0&0&0&0\\
1&0&1&0&1&0&1&0&0&0&0&0&0&0&0&0&0&0&0&0&0&0&0&0\\
1&0&1&0&1&0&1&0&1&1&0&0&0&0&0&0&1&1&0&0&0&0&0&0\\
0&1&1&0&1&0&1&0&0&1&1&0&1&0&1&0&0&0&0&0&0&0&0&0\\
1&0&1&0&1&0&1&0&1&0&1&0&1&0&1&0&1&0&1&0&1&0&1&0\\
1&1&0&0&1&1&0&0&0&0&0&0&0&0&0&0&0&0&0&0&0&0&0&0\\
1&1&1&1&0&0&0&0&0&0&0&0&0&0&0&0&0&0&0&0&0&0&0&0\\
0&0&1&1&1&1&0&0&1&1&0&0&1&1&0&0&0&0&0&0&0&0&0&0\\
1&1&0&0&1&1&0&0&1&1&1&1&0&0&0&0&0&0&0&0&0&0&0&0\\
1&1&0&0&1&1&0&0&1&1&0&0&1&1&0&0&1&1&0&0&1&1&0&0\\
1&1&1&1&0&0&0&0&1&1&1&1&0&0&0&0&1&1&1&1&0&0&0&0\\
1&1&1&1&1&1&1&1&0&0&0&0&0&0&0&0&0&0&0&0&0&0&0&0\\
1&1&1&1&1&1&1&1&0&0&0&0&0&0&0&0&1&1&1&1&1&1&1&1\\
1&1&1&1&1&1&1&1&1&1&1&1&1&1&1&1&0&0&0&0&0&0&0&0
\end{pmatrix};$$

$$\text{or } K'_{24}=\begin{pmatrix}
1&0&0&0&0&0&0&0&0&0&0&0&0&0&0&0&0&0&0&0&0&0&0&0\\
1&0&0&0&0&0&0&0&0&0&0&0&0&0&0&0&0&1&0&0&0&0&0&0\\
1&0&0&0&0&0&0&0&1&0&0&0&0&0&0&0&0&0&0&0&0&0&0&0\\
1&0&0&0&1&0&0&0&0&0&0&0&0&0&0&0&0&0&0&0&0&0&0&0\\
1&0&1&0&0&0&0&0&0&0&0&0&0&0&0&0&0&0&0&0&0&0&0&0\\
1&0&0&0&1&0&0&0&1&0&0&0&1&0&0&0&0&0&0&0&0&0&0&0\\
1&0&1&0&0&0&0&0&1&0&1&0&0&0&0&0&0&0&0&0&0&0&0&0\\
1&1&0&0&0&0&0&0&0&0&0&0&0&0&0&0&0&0&0&0&0&0&0&0\\
1&1&0&0&0&0&0&0&1&1&0&0&0&0&0&0&0&0&0&0&0&0&0&0\\
1&0&1&0&1&0&1&0&0&0&0&0&0&0&0&0&0&0&0&0&0&0&0&0\\
1&0&0&0&1&0&0&0&1&0&1&0&0&0&0&0&1&0&1&0&0&0&0&0\\
1&1&0&0&1&1&0&0&0&0&0&0&0&0&0&0&0&0&0&0&0&0&0&0\\
0&0&0&0&0&1&1&0&1&1&1&0&1&0&0&0&1&0&0&0&1&0&0&0\\
1&0&1&0&1&0&1&0&1&1&0&0&0&0&0&0&1&1&0&0&0&0&0&0\\
0&1&1&0&1&0&1&0&0&1&1&0&1&0&1&0&0&0&0&0&0&0&0&0\\
1&0&1&0&1&0&1&0&1&0&1&0&1&0&1&0&1&0&1&0&1&0&1&0\\
1&1&1&1&0&0&0&0&0&0&0&0&0&0&0&0&0&0&0&0&0&0&0&0\\
0&0&1&1&1&1&0&0&1&1&0&0&1&1&0&0&0&0&0&0&0&0&0&0\\
1&1&0&0&1&1&0&0&1&1&1&1&0&0&0&0&0&0&0&0&0&0&0&0\\
1&1&0&0&1&1&0&0&1&1&0&0&1&1&0&0&1&1&0&0&1&1&0&0\\
1&1&1&1&1&1&1&1&0&0&0&0&0&0&0&0&0&0&0&0&0&0&0&0\\
1&1&1&1&0&0&0&0&1&1&1&1&0&0&0&0&1&1&1&1&0&0&0&0\\
1&1&1&1&1&1&1&1&0&0&0&0&0&0&0&0&0&1&1&1&1&1&1&1\\
1&1&1&1&1&1&1&1&1&1&1&1&1&1&1&1&0&0&0&0&0&0&0&0
\end{pmatrix};$$

-continued $$\text{or } K''_{24} = \begin{pmatrix}
1 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 \\
1 & 0 & 0 & 0 & 0 & 0 & 0 & 0 & 0 & 0 & 0 & 0 & 0 & 0 & 0 & 0 & 0 & 1 & 0 & 0 & 0 & 0 & 0 & 0 \\
1 & 0 & 0 & 0 & 0 & 0 & 0 & 0 & 1 & 0 & 0 & 0 & 0 & 0 & 0 & 0 & 0 & 0 & 0 & 0 & 0 & 0 & 0 & 0 \\
1 & 0 & 0 & 0 & 1 & 0 & 0 & 0 & 0 & 0 & 0 & 0 & 0 & 0 & 0 & 0 & 0 & 0 & 0 & 0 & 0 & 0 & 0 & 0 \\
1 & 0 & 1 & 0 & 0 & 0 & 0 & 0 & 0 & 0 & 0 & 0 & 0 & 0 & 0 & 0 & 0 & 0 & 0 & 0 & 0 & 0 & 0 & 0 \\
1 & 0 & 0 & 0 & 1 & 0 & 0 & 0 & 1 & 0 & 0 & 0 & 1 & 0 & 0 & 0 & 0 & 0 & 0 & 0 & 0 & 0 & 0 & 0 \\
1 & 0 & 1 & 0 & 0 & 0 & 0 & 0 & 1 & 0 & 1 & 0 & 0 & 0 & 0 & 0 & 0 & 0 & 0 & 0 & 0 & 0 & 0 & 0 \\
1 & 1 & 0 & 0 & 0 & 0 & 0 & 0 & 0 & 0 & 0 & 0 & 0 & 0 & 0 & 0 & 0 & 0 & 0 & 0 & 0 & 0 & 0 & 0 \\
1 & 1 & 0 & 0 & 0 & 0 & 0 & 0 & 1 & 1 & 0 & 0 & 0 & 0 & 0 & 0 & 0 & 0 & 0 & 0 & 0 & 0 & 0 & 0 \\
1 & 0 & 1 & 0 & 1 & 0 & 1 & 0 & 0 & 0 & 0 & 0 & 0 & 0 & 0 & 0 & 0 & 0 & 0 & 0 & 0 & 0 & 0 & 0 \\
1 & 0 & 0 & 0 & 1 & 0 & 0 & 0 & 1 & 0 & 1 & 0 & 0 & 0 & 0 & 0 & 1 & 0 & 1 & 0 & 0 & 0 & 0 & 0 \\
1 & 1 & 0 & 0 & 1 & 1 & 0 & 0 & 0 & 0 & 0 & 0 & 0 & 0 & 0 & 0 & 0 & 0 & 0 & 0 & 0 & 0 & 0 & 0 \\
0 & 0 & 0 & 0 & 0 & 1 & 1 & 0 & 1 & 1 & 1 & 0 & 1 & 0 & 0 & 0 & 1 & 0 & 0 & 0 & 1 & 0 & 0 & 0 \\
1 & 0 & 1 & 0 & 1 & 0 & 1 & 0 & 1 & 1 & 0 & 0 & 0 & 0 & 0 & 0 & 1 & 1 & 0 & 0 & 0 & 0 & 0 & 0 \\
0 & 1 & 1 & 0 & 1 & 0 & 1 & 0 & 0 & 1 & 1 & 0 & 1 & 0 & 1 & 0 & 0 & 0 & 0 & 0 & 0 & 0 & 0 & 0 \\
1 & 0 & 1 & 0 & 1 & 0 & 1 & 0 & 1 & 0 & 1 & 0 & 1 & 0 & 1 & 0 & 1 & 0 & 1 & 0 & 1 & 0 & 1 & 0 \\
1 & 1 & 1 & 1 & 0 & 0 & 0 & 0 & 0 & 0 & 0 & 0 & 0 & 0 & 0 & 0 & 0 & 0 & 0 & 0 & 0 & 0 & 0 & 0 \\
0 & 0 & 1 & 1 & 1 & 1 & 0 & 0 & 1 & 1 & 0 & 0 & 1 & 1 & 0 & 0 & 0 & 0 & 0 & 0 & 0 & 0 & 0 & 0 \\
1 & 1 & 0 & 0 & 1 & 1 & 0 & 0 & 1 & 1 & 1 & 1 & 0 & 0 & 0 & 0 & 0 & 0 & 0 & 0 & 0 & 0 & 0 & 0 \\
1 & 1 & 0 & 0 & 1 & 1 & 0 & 0 & 1 & 1 & 0 & 0 & 1 & 1 & 0 & 0 & 1 & 1 & 0 & 0 & 1 & 1 & 0 & 0 \\
1 & 1 & 1 & 1 & 1 & 1 & 1 & 1 & 0 & 0 & 0 & 0 & 0 & 0 & 0 & 0 & 0 & 0 & 0 & 0 & 0 & 0 & 0 & 0 \\
1 & 1 & 1 & 1 & 0 & 0 & 0 & 0 & 1 & 1 & 1 & 1 & 0 & 0 & 0 & 0 & 1 & 1 & 1 & 1 & 0 & 0 & 0 & 0 \\
1 & 1 & 1 & 1 & 1 & 1 & 1 & 1 & 0 & 0 & 0 & 0 & 0 & 0 & 0 & 0 & 0 & 1 & 1 & 1 & 1 & 1 & 1 & 1 \\
1 & 1 & 1 & 1 & 1 & 1 & 1 & 1 & 1 & 1 & 1 & 1 & 1 & 1 & 1 & 1 & 0 & 0 & 0 & 0 & 0 & 0 & 0 & 0
\end{pmatrix};$$

$$\text{or } K_{25} = \begin{pmatrix}
1 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 \\
1 & 0 & 0 & 0 & 0 & 0 & 0 & 0 & 1 & 0 & 0 & 0 & 0 & 0 & 0 & 0 & 0 & 0 & 0 & 0 & 0 & 0 & 0 & 0 & 0 \\
1 & 0 & 0 & 0 & 1 & 0 & 0 & 0 & 0 & 0 & 0 & 0 & 0 & 0 & 0 & 0 & 0 & 0 & 0 & 0 & 0 & 0 & 0 & 0 & 0 \\
1 & 1 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 \\
0 & 1 & 0 & 0 & 0 & 1 & 0 & 0 & 0 & 0 & 0 & 0 & 0 & 0 & 0 & 0 & 0 & 0 & 0 & 0 & 0 & 0 & 0 & 0 & 0 \\
0 & 1 & 1 & 0 & 0 & 0 & 0 & 0 & 0 & 0 & 0 & 0 & 0 & 0 & 0 & 0 & 0 & 0 & 0 & 0 & 0 & 0 & 0 & 0 & 0 \\
0 & 0 & 1 & 0 & 1 & 0 & 0 & 1 & 0 & 0 & 0 & 0 & 1 & 0 & 0 & 0 & 0 & 0 & 0 & 0 & 0 & 0 & 0 & 0 & 0 \\
1 & 0 & 1 & 0 & 1 & 0 & 0 & 0 & 0 & 0 & 0 & 0 & 1 & 0 & 0 & 0 & 0 & 0 & 0 & 0 & 0 & 0 & 0 & 0 & 0 \\
0 & 0 & 0 & 1 & 1 & 0 & 0 & 0 & 0 & 0 & 0 & 0 & 0 & 0 & 1 & 1 & 0 & 0 & 0 & 0 & 0 & 0 & 0 & 0 & 0 \\
1 & 1 & 0 & 0 & 0 & 1 & 1 & 0 & 0 & 0 & 0 & 0 & 0 & 0 & 0 & 0 & 0 & 0 & 0 & 0 & 0 & 0 & 0 & 0 & 0 \\
1 & 1 & 1 & 1 & 0 & 0 & 0 & 0 & 0 & 0 & 0 & 0 & 0 & 0 & 0 & 0 & 0 & 0 & 0 & 0 & 0 & 0 & 0 & 0 & 0 \\
0 & 1 & 0 & 1 & 0 & 0 & 1 & 0 & 0 & 0 & 0 & 0 & 1 & 0 & 0 & 1 & 1 & 0 & 0 & 0 & 0 & 0 & 0 & 0 & 0 \\
0 & 0 & 0 & 0 & 0 & 1 & 1 & 1 & 0 & 0 & 0 & 1 & 0 & 1 & 0 & 0 & 1 & 0 & 0 & 0 & 0 & 0 & 0 & 0 & 0 \\
1 & 0 & 0 & 0 & 1 & 1 & 1 & 1 & 0 & 1 & 0 & 0 & 0 & 0 & 0 & 0 & 0 & 0 & 0 & 0 & 0 & 0 & 0 & 0 & 0 \\
1 & 1 & 1 & 0 & 1 & 0 & 0 & 1 & 1 & 0 & 0 & 0 & 0 & 0 & 0 & 0 & 0 & 0 & 0 & 0 & 0 & 0 & 0 & 0 & 0 \\
0 & 1 & 0 & 1 & 0 & 0 & 1 & 1 & 0 & 1 & 0 & 1 & 0 & 0 & 0 & 0 & 1 & 0 & 0 & 0 & 0 & 1 & 0 & 0 & 0 \\
0 & 0 & 1 & 0 & 1 & 1 & 0 & 1 & 1 & 1 & 0 & 0 & 1 & 0 & 1 & 0 & 0 & 0 & 0 & 0 & 0 & 0 & 0 & 0 & 0 \\
1 & 1 & 1 & 1 & 1 & 1 & 1 & 1 & 0 & 0 & 0 & 1 & 0 & 0 & 0 & 0 & 0 & 0 & 0 & 0 & 0 & 0 & 0 & 0 & 0 \\
1 & 1 & 0 & 0 & 1 & 0 & 1 & 0 & 1 & 1 & 0 & 1 & 0 & 1 & 1 & 0 & 0 & 0 & 0 & 1 & 0 & 0 & 0 & 0 & 0 \\
1 & 0 & 1 & 1 & 0 & 1 & 1 & 1 & 1 & 1 & 0 & 1 & 0 & 0 & 0 & 0 & 0 & 0 & 1 & 0 & 0 & 0 & 0 & 0 & 0 \\
1 & 1 & 0 & 1 & 0 & 1 & 0 & 1 & 0 & 1 & 0 & 1 & 0 & 1 & 0 & 1 & 0 & 0 & 0 & 1 & 0 & 1 & 0 & 1 & 0 \\
1 & 1 & 1 & 0 & 0 & 1 & 1 & 0 & 0 & 1 & 1 & 0 & 0 & 1 & 1 & 0 & 0 & 0 & 1 & 0 & 0 & 1 & 1 & 0 & 0 \\
1 & 1 & 1 & 1 & 1 & 0 & 0 & 0 & 0 & 1 & 1 & 1 & 1 & 0 & 0 & 0 & 0 & 0 & 1 & 1 & 1 & 0 & 0 & 0 & 0 \\
1 & 1 & 1 & 1 & 1 & 1 & 1 & 1 & 1 & 0 & 0 & 0 & 0 & 0 & 0 & 0 & 0 & 0 & 1 & 1 & 1 & 1 & 1 & 1 & 1 \\
1 & 1 & 1 & 1 & 1 & 1 & 1 & 1 & 1 & 1 & 1 & 1 & 1 & 1 & 1 & 1 & 1 & 1 & 0 & 0 & 0 & 0 & 0 & 0 & 0
\end{pmatrix};$$

-continued $$\text{or } K'_{25} = \begin{pmatrix}
1 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 \\
1 & 0 & 0 & 0 & 0 & 0 & 0 & 0 & 1 & 0 & 0 & 0 & 0 & 0 & 0 & 0 & 0 & 0 & 0 & 0 & 0 & 0 & 0 & 0 & 0 \\
1 & 0 & 0 & 0 & 1 & 0 & 0 & 0 & 0 & 0 & 0 & 0 & 0 & 0 & 0 & 0 & 0 & 0 & 0 & 0 & 0 & 0 & 0 & 0 & 0 \\
1 & 1 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 \\
0 & 1 & 0 & 0 & 0 & 1 & 0 & 0 & 0 & 0 & 0 & 0 & 0 & 0 & 0 & 0 & 0 & 0 & 0 & 0 & 0 & 0 & 0 & 0 & 0 \\
0 & 1 & 1 & 0 & 0 & 0 & 0 & 0 & 0 & 0 & 0 & 0 & 0 & 0 & 0 & 0 & 0 & 0 & 0 & 0 & 0 & 0 & 0 & 0 & 0 \\
0 & 0 & 1 & 0 & 1 & 0 & 0 & 1 & 0 & 0 & 0 & 0 & 1 & 0 & 0 & 0 & 0 & 0 & 0 & 0 & 0 & 0 & 0 & 0 & 0 \\
1 & 0 & 1 & 0 & 1 & 0 & 0 & 0 & 0 & 0 & 0 & 0 & 1 & 0 & 0 & 0 & 0 & 0 & 0 & 0 & 0 & 0 & 0 & 0 & 0 \\
0 & 0 & 0 & 1 & 1 & 0 & 0 & 0 & 0 & 0 & 0 & 0 & 0 & 0 & 1 & 1 & 0 & 0 & 0 & 0 & 0 & 0 & 0 & 0 & 0 \\
1 & 1 & 0 & 0 & 0 & 1 & 1 & 0 & 0 & 0 & 0 & 0 & 0 & 0 & 0 & 0 & 0 & 0 & 0 & 0 & 0 & 0 & 0 & 0 & 0 \\
1 & 1 & 1 & 1 & 0 & 0 & 0 & 0 & 0 & 0 & 0 & 0 & 0 & 0 & 0 & 0 & 0 & 0 & 0 & 0 & 0 & 0 & 0 & 0 & 0 \\
0 & 1 & 0 & 1 & 0 & 0 & 1 & 0 & 0 & 0 & 0 & 0 & 1 & 0 & 0 & 1 & 1 & 0 & 0 & 0 & 0 & 0 & 0 & 0 & 0 \\
0 & 0 & 0 & 0 & 0 & 1 & 1 & 1 & 0 & 0 & 0 & 1 & 0 & 1 & 0 & 0 & 1 & 0 & 0 & 0 & 0 & 0 & 0 & 0 & 0 \\
1 & 0 & 0 & 0 & 1 & 1 & 1 & 1 & 0 & 1 & 0 & 0 & 0 & 0 & 0 & 0 & 0 & 0 & 0 & 0 & 0 & 0 & 0 & 0 & 0 \\
1 & 1 & 1 & 0 & 1 & 0 & 0 & 1 & 1 & 0 & 0 & 0 & 0 & 0 & 0 & 0 & 0 & 0 & 0 & 0 & 0 & 0 & 0 & 0 & 0 \\
0 & 1 & 0 & 1 & 0 & 0 & 1 & 1 & 0 & 1 & 0 & 1 & 0 & 0 & 0 & 0 & 1 & 0 & 0 & 0 & 0 & 1 & 0 & 0 & 0 \\
0 & 0 & 1 & 0 & 1 & 1 & 0 & 1 & 1 & 1 & 0 & 0 & 1 & 0 & 1 & 0 & 0 & 0 & 0 & 0 & 0 & 0 & 0 & 0 & 0 \\
1 & 1 & 1 & 1 & 1 & 1 & 1 & 1 & 0 & 0 & 0 & 1 & 0 & 0 & 0 & 0 & 0 & 0 & 0 & 0 & 0 & 0 & 0 & 0 & 0 \\
1 & 1 & 0 & 0 & 1 & 0 & 1 & 0 & 1 & 1 & 0 & 1 & 0 & 1 & 1 & 0 & 0 & 0 & 0 & 1 & 0 & 0 & 0 & 0 & 0 \\
1 & 0 & 1 & 1 & 0 & 1 & 1 & 1 & 1 & 1 & 0 & 1 & 0 & 0 & 0 & 0 & 0 & 0 & 1 & 0 & 0 & 0 & 0 & 0 & 0 \\
1 & 1 & 0 & 1 & 0 & 1 & 0 & 1 & 0 & 1 & 0 & 1 & 0 & 1 & 0 & 1 & 0 & 0 & 0 & 1 & 0 & 1 & 0 & 1 & 0 \\
1 & 1 & 1 & 0 & 0 & 1 & 1 & 0 & 0 & 1 & 1 & 0 & 0 & 1 & 1 & 0 & 0 & 0 & 1 & 0 & 0 & 1 & 1 & 0 & 0 \\
1 & 1 & 1 & 1 & 1 & 0 & 0 & 0 & 0 & 1 & 1 & 1 & 1 & 0 & 0 & 0 & 0 & 0 & 1 & 1 & 1 & 0 & 0 & 0 & 0 \\
1 & 1 & 1 & 1 & 1 & 1 & 1 & 1 & 1 & 0 & 0 & 0 & 0 & 0 & 0 & 0 & 0 & 0 & 1 & 1 & 1 & 1 & 1 & 1 & 1 \\
1 & 1 & 1 & 1 & 1 & 1 & 1 & 1 & 1 & 1 & 1 & 1 & 1 & 1 & 1 & 1 & 1 & 1 & 0 & 0 & 0 & 0 & 0 & 0 & 0
\end{pmatrix};$$

$$\text{or } K_{28} = \begin{pmatrix}
1 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 \\
1 & 0 & 0 & 0 & 0 & 0 & 0 & 0 & 0 & 0 & 0 & 0 & 0 & 0 & 0 & 0 & 1 & 0 & 0 & 0 & 0 & 0 & 0 & 0 & 0 & 0 & 0 & 0 \\
1 & 0 & 0 & 0 & 0 & 0 & 0 & 0 & 1 & 0 & 0 & 0 & 0 & 0 & 0 & 0 & 0 & 0 & 0 & 0 & 0 & 0 & 0 & 0 & 0 & 0 & 0 & 0 \\
1 & 0 & 0 & 0 & 0 & 0 & 0 & 0 & 1 & 0 & 0 & 0 & 0 & 0 & 0 & 0 & 1 & 0 & 0 & 0 & 1 & 0 & 0 & 0 & 0 & 0 & 0 & 0 \\
1 & 0 & 0 & 0 & 1 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 \\
1 & 0 & 0 & 0 & 1 & 0 & 0 & 0 & 0 & 0 & 0 & 0 & 0 & 0 & 0 & 0 & 1 & 0 & 1 & 0 & 0 & 0 & 0 & 0 & 0 & 0 & 0 & 0 \\
1 & 0 & 1 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 \\
0 & 0 & 0 & 0 & 0 & 0 & 0 & 0 & 1 & 0 & 1 & 0 & 0 & 0 & 0 & 0 & 0 & 0 & 0 & 0 & 1 & 0 & 1 & 0 & 0 & 0 & 0 & 0 \\
1 & 0 & 0 & 0 & 1 & 0 & 0 & 0 & 0 & 0 & 1 & 0 & 1 & 0 & 0 & 0 & 0 & 0 & 0 & 0 & 1 & 0 & 1 & 0 & 0 & 0 & 0 & 0 \\
1 & 0 & 0 & 0 & 1 & 0 & 0 & 0 & 1 & 0 & 0 & 0 & 1 & 0 & 0 & 0 & 1 & 0 & 1 & 0 & 1 & 0 & 0 & 0 & 1 & 0 & 0 & 0 \\
1 & 1 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 \\
1 & 1 & 0 & 0 & 0 & 0 & 0 & 0 & 0 & 0 & 0 & 0 & 0 & 0 & 0 & 0 & 1 & 1 & 0 & 0 & 0 & 0 & 0 & 0 & 0 & 0 & 0 & 0 \\
0 & 1 & 1 & 0 & 0 & 0 & 0 & 0 & 1 & 0 & 1 & 0 & 0 & 0 & 0 & 0 & 1 & 1 & 0 & 0 & 0 & 0 & 0 & 0 & 0 & 0 & 0 & 0 \\
1 & 0 & 1 & 0 & 1 & 0 & 1 & 0 & 0 & 0 & 0 & 0 & 0 & 0 & 0 & 0 & 0 & 0 & 0 & 0 & 0 & 0 & 0 & 0 & 0 & 0 & 0 & 0 \\
0 & 1 & 1 & 0 & 1 & 0 & 1 & 0 & 1 & 1 & 0 & 0 & 0 & 0 & 0 & 0 & 0 & 0 & 0 & 0 & 0 & 0 & 0 & 0 & 0 & 0 & 0 & 0 \\
1 & 1 & 0 & 0 & 0 & 0 & 0 & 0 & 1 & 1 & 0 & 0 & 0 & 0 & 0 & 0 & 1 & 1 & 0 & 0 & 1 & 1 & 0 & 0 & 0 & 0 & 0 & 0 \\
1 & 1 & 0 & 0 & 0 & 0 & 0 & 0 & 0 & 1 & 1 & 0 & 1 & 0 & 1 & 0 & 1 & 1 & 0 & 0 & 0 & 1 & 1 & 0 & 1 & 0 & 1 & 0 \\
1 & 1 & 0 & 0 & 1 & 1 & 0 & 0 & 0 & 0 & 0 & 0 & 0 & 0 & 0 & 0 & 0 & 0 & 0 & 0 & 0 & 0 & 0 & 0 & 0 & 0 & 0 & 0 \\
1 & 1 & 0 & 0 & 1 & 1 & 0 & 0 & 0 & 0 & 0 & 0 & 0 & 0 & 1 & 1 & 1 & 1 & 0 & 0 & 0 & 0 & 0 & 0 & 0 & 0 & 0 & 0 \\
0 & 1 & 1 & 0 & 0 & 1 & 1 & 0 & 1 & 0 & 1 & 0 & 1 & 0 & 1 & 0 & 1 & 1 & 1 & 1 & 0 & 0 & 0 & 0 & 0 & 0 & 0 & 0 \\
1 & 1 & 1 & 1 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 \\
0 & 0 & 0 & 0 & 0 & 0 & 0 & 0 & 1 & 1 & 1 & 1 & 0 & 0 & 0 & 0 & 0 & 0 & 0 & 0 & 1 & 1 & 1 & 1 & 0 & 0 & 0 & 0 \\
1 & 1 & 0 & 0 & 1 & 1 & 0 & 0 & 0 & 0 & 1 & 1 & 1 & 1 & 0 & 0 & 0 & 0 & 0 & 0 & 1 & 1 & 1 & 1 & 0 & 0 & 0 & 0 \\
1 & 1 & 0 & 0 & 1 & 1 & 0 & 0 & 1 & 1 & 0 & 0 & 1 & 1 & 0 & 0 & 1 & 1 & 1 & 1 & 1 & 1 & 0 & 0 & 1 & 1 & 0 & 0 \\
1 & 1 & 1 & 1 & 0 & 0 & 0 & 0 & 1 & 1 & 1 & 1 & 0 & 0 & 0 & 0 & 0 & 0 & 0 & 0 & 0 & 0 & 0 & 0 & 0 & 0 & 0 & 0 \\
1 & 1 & 1 & 1 & 1 & 1 & 1 & 1 & 0 & 0 & 0 & 0 & 0 & 0 & 0 & 0 & 0 & 0 & 0 & 0 & 0 & 0 & 0 & 0 & 0 & 0 & 0 & 0 \\
0 & 0 & 0 & 0 & 0 & 0 & 0 & 0 & 1 & 1 & 1 & 1 & 1 & 1 & 1 & 1 & 0 & 0 & 0 & 0 & 1 & 1 & 1 & 1 & 1 & 1 & 1 & 1 \\
1 & 1 & 1 & 1 & 1 & 1 & 1 & 1 & 1 & 1 & 1 & 1 & 1 & 1 & 1 & 1 & 0 & 0 & 0 & 0 & 0 & 0 & 0 & 0 & 0 & 0 & 0 & 0
\end{pmatrix};$$

-continued $$
\text{or } K_{32} = \begin{pmatrix}
1&0&0&0&0&0&0&0&0&0&0&0&0&0&0&0&0&0&0&0&0&0&0&0&0&0&0&0&0&0&0&0\\
1&0&0&0&0&0&0&0&0&0&0&0&0&0&0&0&1&0&0&0&0&0&0&0&0&0&0&0&0&0&0&0\\
1&0&0&0&0&0&0&0&1&0&0&0&0&0&0&0&0&0&0&0&0&0&0&0&0&0&0&0&0&0&0&0\\
1&0&0&0&0&0&0&0&1&0&0&0&0&0&0&0&1&0&0&0&0&0&0&0&1&0&0&0&0&0&0&0\\
1&0&0&0&1&0&0&0&0&0&0&0&0&0&0&0&0&0&0&0&0&0&0&0&0&0&0&0&0&0&0&0\\
1&0&0&0&1&0&0&0&0&0&0&0&0&0&0&0&1&0&0&0&1&0&0&0&0&0&0&0&0&0&0&0\\
1&0&1&0&0&0&0&0&0&0&0&0&0&0&0&0&0&0&0&0&0&0&0&0&0&0&0&0&0&0&0&0\\
1&0&1&0&0&0&0&0&0&0&0&0&0&0&0&0&1&0&1&0&0&0&0&0&0&0&0&0&0&0&0&0\\
0&0&1&0&1&0&0&0&1&0&0&0&1&0&0&0&1&0&1&0&0&0&0&0&0&0&0&0&0&0&0&0\\
1&0&0&0&1&0&0&0&1&0&0&0&1&0&0&0&1&0&0&0&1&0&0&0&1&0&0&0&1&0&0&0\\
1&1&0&0&0&0&0&0&0&0&0&0&0&0&0&0&0&0&0&0&0&0&0&0&0&0&0&0&0&0&0&0\\
1&1&0&0&0&0&0&0&0&0&0&0&0&0&0&0&1&1&0&0&0&0&0&0&0&0&0&0&0&0&0&0\\
0&1&1&0&0&0&0&0&1&0&1&0&0&0&0&0&1&1&0&0&0&0&0&0&0&0&0&0&0&0&0&0\\
1&0&1&0&0&0&0&0&1&0&1&0&0&0&0&0&1&0&1&0&0&0&0&0&1&0&1&0&0&0&0&0\\
1&0&1&0&1&0&1&0&0&0&0&0&0&0&0&0&0&0&0&0&0&0&0&0&0&0&0&0&0&0&0&0\\
0&1&1&0&1&0&1&0&1&1&0&0&0&0&0&0&0&0&0&0&0&0&0&0&0&0&0&0&0&0&0&0\\
1&1&0&0&0&0&0&0&1&1&0&0&0&0&0&0&1&1&0&0&0&0&0&0&1&1&0&0&0&0&0&0\\
0&1&1&0&1&0&1&0&1&1&0&0&0&0&0&0&0&1&1&0&1&0&1&0&1&1&0&0&0&0&0&0\\
1&1&0&0&1&1&0&0&0&0&0&0&0&0&0&0&0&0&0&0&0&0&0&0&0&0&0&0&0&0&0&0\\
1&1&0&0&1&1&0&0&0&0&0&0&0&0&0&0&1&1&0&0&1&1&0&0&0&0&0&0&0&0&0&0\\
0&1&1&0&0&1&1&0&1&0&1&0&1&0&1&0&1&1&0&0&1&1&0&0&0&0&0&0&0&0&0&0\\
1&0&1&0&1&0&1&0&1&0&1&0&1&0&1&0&1&0&1&0&1&0&1&0&1&0&1&0&1&0&1&0\\
1&1&1&1&0&0&0&0&0&0&0&0&0&0&0&0&0&0&0&0&0&0&0&0&0&0&0&0&0&0&0&0\\
1&1&1&1&0&0&0&0&0&0&0&0&0&0&0&0&1&1&1&1&0&0&0&0&0&0&0&0&0&0&0&0\\
0&0&1&1&1&1&0&0&1&1&0&0&1&1&0&0&1&1&1&1&0&0&0&0&0&0&0&0&0&0&0&0\\
1&1&0&0&1&1&0&0&1&1&0&0&1&1&0&0&1&1&0&0&1&1&0&0&1&1&0&0&1&1&0&0\\
1&1&1&1&0&0&0&0&1&1&1&1&0&0&0&0&0&0&0&0&0&0&0&0&0&0&0&0&0&0&0&0\\
1&1&1&1&0&0&0&0&1&1&1&1&0&0&0&0&1&1&1&1&0&0&0&0&1&1&1&1&0&0&0&0\\
1&1&1&1&1&1&1&1&0&0&0&0&0&0&0&0&0&0&0&0&0&0&0&0&0&0&0&0&0&0&0&0\\
1&1&1&1&1&1&1&1&0&0&0&0&0&0&0&0&1&1&1&1&1&1&1&1&0&0&0&0&0&0&0&0\\
1&1&1&1&1&1&1&1&1&1&1&1&1&1&1&1&0&0&0&0&0&0&0&0&0&0&0&0&0&0&0&0\\
1&1&1&1&1&1&1&1&1&1&1&1&1&1&1&1&1&1&1&1&1&1&1&1&1&1&1&1&1&1&1&1
\end{pmatrix}.
$$

* * * * *